(12) United States Patent
Lou

(10) Patent No.: US 10,269,765 B2
(45) Date of Patent: Apr. 23, 2019

(54) SEMICONDUCTOR PACKAGE

(71) Applicant: Chengwei Wu, New Taipei (TW)

(72) Inventor: Iou Ming Lou, Taipei (TW)

(73) Assignee: Chengwei Wu, New Taipei (TW)

( * ) Notice: Subject to any disclaimer, the term of this patent is extended or adjusted under 35 U.S.C. 154(b) by 0 days.

(21) Appl. No.: 15/850,403

(22) Filed: Dec. 21, 2017

(65) Prior Publication Data

US 2018/0114774 A1 Apr. 26, 2018

Related U.S. Application Data

(63) Continuation of application No. 15/403,409, filed on Jan. 11, 2017, now Pat. No. 9,887,176, which is a
(Continued)

(51) Int. Cl.
*H01L 25/065* (2006.01)
*H01L 23/522* (2006.01)
(Continued)

(52) U.S. Cl.
CPC ...... *H01L 25/0652* (2013.01); *H01L 23/3114* (2013.01); *H01L 23/3128* (2013.01); *H01L 23/49816* (2013.01); *H01L 23/49838* (2013.01); *H01L 23/5226* (2013.01); *H01L 23/5384* (2013.01); *H01L 23/5385* (2013.01); *H01L 24/05* (2013.01); *H01L 24/08* (2013.01); *H01L 24/09* (2013.01); *H01L 24/13* (2013.01); *H01L 24/16* (2013.01); *H01L 24/17* (2013.01); *H01L 24/19* (2013.01); *H01L 24/20* (2013.01); *H01L 24/24* (2013.01); *H01L 24/82* (2013.01); *H01L 25/0655* (2013.01); *H01L 25/0657* (2013.01); *H01L 25/105* (2013.01); *H01L 25/117* (2013.01); *H01L 25/18* (2013.01); *H01L 25/50* (2013.01); *H01L 21/568* (2013.01); *H01L 23/13* (2013.01); *H01L 23/3192* (2013.01); *H01L 24/02* (2013.01); *H01L 24/29* (2013.01); *H01L 24/32* (2013.01); *H01L 24/48* (2013.01); *H01L 24/49* (2013.01); *H01L 24/81* (2013.01); *H01L 24/83* (2013.01); *H01L 24/92* (2013.01); *H01L 2224/023* (2013.01);
(Continued)

(58) Field of Classification Search
CPC ....... H01L 2924/00; H01L 2924/00014; H01L 2924/181; H01L 2224/73265
See application file for complete search history.

(56) References Cited

U.S. PATENT DOCUMENTS 8,008,125 B2 * 8/2011 McConnelee ....... H01L 23/5383
257/686
8,110,916 B2 * 2/2012 Weng .................. H01L 23/13
257/693
(Continued)

*Primary Examiner* — Jaehwan Oh
(74) *Attorney, Agent, or Firm* — WPAT, PC

(57) ABSTRACT

A semiconductor device is disclosed. The semiconductor device comprises a first die, a second die, and a redistribution structure. The first die and the second die are electrically connected to the redistribution structure. There are no solder bumps between the first die and the redistribution structure. There are no solder bumps between the second die and the redistribution structure. The first die and the second die have a shift with regard to each other from a top view.

20 Claims, 205 Drawing Sheets

1400A

1400B

Related U.S. Application Data continuation of application No. 14/952,920, filed on Nov. 26, 2015.

(60) Provisional application No. 62/198,681, filed on Jul. 30, 2015, provisional application No. 62/085,257, filed on Nov. 27, 2014.

(51) Int. Cl.

| | |
|---|---|
| *H01L 25/18* | (2006.01) |
| *H01L 23/31* | (2006.01) |
| *H01L 23/498* | (2006.01) |
| *H01L 23/538* | (2006.01) |
| *H01L 25/10* | (2006.01) |
| *H01L 23/00* | (2006.01) |
| *H01L 25/11* | (2006.01) |
| *H01L 25/00* | (2006.01) |
| H01L 21/56 | (2006.01) |
| H01L 23/13 | (2006.01) |

(52) U.S. Cl.
CPC ............ *H01L 2224/02331* (2013.01); *H01L 2224/0401* (2013.01); *H01L 2224/05018* (2013.01); *H01L 2224/05026* (2013.01); *H01L 2224/05082* (2013.01); *H01L 2224/05147* (2013.01); *H01L 2224/05155* (2013.01); *H01L 2224/05166* (2013.01); *H01L 2224/05173* (2013.01); *H01L 2224/05183* (2013.01); *H01L 2224/05548* (2013.01); *H01L 2224/05558* (2013.01); *H01L 2224/05559* (2013.01); *H01L 2224/05567* (2013.01); *H01L 2224/05569* (2013.01); *H01L 2224/05573* (2013.01); *H01L 2224/05644* (2013.01); *H01L 2224/05647* (2013.01); *H01L 2224/06051* (2013.01); *H01L 2224/08225* (2013.01); *H01L 2224/1184* (2013.01); *H01L 2224/12105* (2013.01); *H01L 2224/131* (2013.01); *H01L 2224/13005* (2013.01); *H01L 2224/13022* (2013.01); *H01L 2224/13024* (2013.01); *H01L 2224/13111* (2013.01); *H01L 2224/13113* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/13553* (2013.01); *H01L 2224/13582* (2013.01); *H01L 2224/16141* (2013.01); *H01L 2224/16145* (2013.01); *H01L 2224/16227* (2013.01); *H01L 2224/1703* (2013.01); *H01L 2224/17181* (2013.01); *H01L 2224/19* (2013.01); *H01L 2224/2101* (2013.01); *H01L 2224/221* (2013.01); *H01L 2224/24135* (2013.01); *H01L 2224/24137* (2013.01); *H01L 2224/2919* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73209* (2013.01); *H01L 2224/73259* (2013.01); *H01L 2224/73265* (2013.01); *H01L 2224/73267* (2013.01); *H01L 2224/81193* (2013.01); *H01L 2224/81895* (2013.01); *H01L 2224/92244* (2013.01); *H01L 2225/0651* (2013.01); *H01L 2225/0652* (2013.01); *H01L 2225/06568* (2013.01); *H01L 2225/1023* (2013.01); *H01L 2225/1035* (2013.01); *H01L 2225/1041* (2013.01); *H01L 2225/1058* (2013.01); *H01L 2924/00014* (2013.01); *H01L 2924/07025* (2013.01); *H01L 2924/1434* (2013.01); *H01L 2924/15192* (2013.01); *H01L 2924/15311* (2013.01); *H01L 2924/181* (2013.01); *H01L 2924/18162* (2013.01)

(56) References Cited

U.S. PATENT DOCUMENTS

| | | | | |
|---|---|---|---|---|
| 8,114,708 | B2* | 2/2012 | McConnelee | H01L 21/4857 257/678 |
| 8,373,272 | B2* | 2/2013 | Liu | H01L 24/48 257/758 |
| 8,829,676 | B2* | 9/2014 | Yu | H01L 21/568 257/737 |
| 8,916,421 | B2* | 12/2014 | Gong | H01L 21/486 257/676 |
| 2003/0017647 | A1* | 1/2003 | Kwon | H01L 21/568 438/109 |
| 2008/0081457 | A1* | 4/2008 | Lin | H01L 21/76816 438/614 |
| 2010/0207265 | A1* | 8/2010 | Muthukumar | H01L 23/49822 257/692 |
| 2010/0224992 | A1* | 9/2010 | McConnelee | H01L 23/5383 257/723 |
| 2010/0246152 | A1* | 9/2010 | Lin | H01L 21/563 361/783 |
| 2011/0037169 | A1* | 2/2011 | Pagaila | H01L 21/561 257/737 |

* cited by examiner

1600M

1611

SEMICONDUCTOR PACKAGE

CROSS-REFERENCE TO RELATED APPLICATIONS

The present application claims the benefit of priority to U.S. Nonprovisional application Ser. No. 14/952,920, which claims the benefit of priority to U.S. Provisional Application No. 62/085,257, filed Nov. 27, 2014 and claims the benefit of priority to U.S. Provisional Application No. 62/198,681, filed Jul. 30, 2015. The contents of the two provisional applications are incorporated herein by reference in their entirety.

FIELD OF THE INVENTION

The invention relates to semiconductor packages. More particularly, it relates to wafer level chip scale packages (WLCSP).

BACKGROUND OF THE INVENTION

In the semiconductor industry, the integration density within a die is growing rapidly. A die can include a huge amount of active and passive electronic devices so that a lot of functions can be performed within the die. The electronic devices are formed by semiconductor manufacturing processes on a silicon wafer. After the manufacturing processes of the electronic devices are finished, the wafer can be separated into many dies. Each die may then go through packaging processes so that a protection package is formed outside the die. The package for a die can also be an interface for connections between the die and a printed circuit board. Typical applications for integrated circuits include mobile phone systems, television systems, personal computer systems, and networking systems.

Many types of package have been developed, such as dual in-line pin package (DIP), quad flat package (QFP), ball grid array (BGA), and wafer level chip scale package (WLCSP). A DIP has connection pins on two parallel sides. DIPs usually use through-hole-mounting or sockets to be placed on printed circuit boards. DIPs usually comprise insulating materials filled around a metal lead frame.

A QFP usually has wing-like leads extending from four sides of the package. A QFP has connections only from the peripheral area of the package, so its pin count is limited. A BGA can use a whole surface to form an array of connections so that it can provide higher ball count. The length between the array of connections and the die is shorter, which is better for high speed signal transmission. A WLCSP can have a packaged device which is nearly the same size of a die. A WLCSP is generally smaller than a BGA package.

SUMMARY OF THE INVENTION

One objective of the invention is to provide a semiconductor device that has a higher reliability.

Another objective of the invention is to provide a semiconductor device that has finer interconnection pitches than traditional BGA packages.

Still another objective of the invention is to provide a semiconductor device that is cost effective in manufacturing.

According to one aspect of the invention, a semiconductor device is disclosed. The semiconductor device comprises a first die, a second die, a molding material, and a redistribution structure.

The first die has an L1 side and an S1 side. The L1 side is longer than the S1 side. The L1 side is perpendicular to the S1 side. The first die comprises L1 connection ends and S1 connection ends. The L1 connection ends are disposed on an active surface of the first die. The L1 connection ends are substantially disposed along the L1 side. The S1 connection ends are disposed on the active surface of the first die. The S1 connection ends are substantially disposed along the S1 side.

The second die has an L2 side and an S2 side. The L2 side is longer than than the S2 side. The L2 side is perpendicular to the S2 side. The second die comprises a first group of L2 connection ends, a second group of L2 connection ends, and S2 connection ends. The L2 connection ends are substantially disposed along the L2 side.

The molding material covers the first die and the second die. The redistribution structure has a first group of traces and a second group of traces. The first group of traces is electrically connected between the S1 connection ends and the first group of L2 connection ends. The second group of traces is electrically connected between the L1 connection ends and the second group of L2 connection ends.

The S1 side is parallel to the S2 side. No solder bumps are located between the first die and the redistribution structure. No solder bumps are located between the second die and the redistribution structure.

According to another aspect of the invention, a semiconductor device is disclosed. The semiconductor device comprises a first die, a second die, and a redistribution structure. The first die has an L1 side and an S1 side. The L1 side is perpendicular to the S1 side. The first die has a first active surface. The first die comprises an L1 connection area on the first active surface. The L1 connection area is substantially along the L1 side. The first die comprises an S1 connection area on the first active surface. The S1 connection area is substantially along the S1 side.

The second die has an L2 side and an S2 side. The second die has a second active surface. The second die comprises an L2 connection area on the second active surface. The L2 connection area is substantially along the L2 side. The L1 side is parallel to the L2 side. The redistribution structure has a first group of traces and a second group of traces. The first group of traces is electrically connected between the S1 connection area and the L2 connection area. The second group of traces is electrically connected between the L1 connection area and the L2 connection area.

An average length of the second group of traces is shorter than that of the first group of traces. No solder bumps are located between the first die and the redistribution structure. No solder bumps are located between the second die and the redistribution structure. According to still another aspect of the invention, a semiconductor device is disclosed. The semiconductor device comprises a first die, a second die, a molding material, a redistribution structure, a first connection structure, and a second connection structure.

The first die has a first active surface. The first die has an A1 side, an A2 side, an A3 side, and an A4 side. The A1 side is parallel to the A3 side. The A2 side is parallel to the A4 side. The A2 side is longer than the A1 side. The A1 side is along an A1 axis. The A3 side is along an A3 axis.

The second die has a second active surface. The second die has a B1 side, a B2 side, a B3 side, and a B4 side. The B1 side is parallel to the B3 side. The B2 side is parallel to the B4 side. The B2 side is longer than the B1 side. The B1 side is along a B1 axis. The B3 side is along a B3 axis.

The molding material covers the first die and the second die. The first active surface being connected to the redistribution structure through the first connection structure. The second active surface is connected to the redistribution structure through the second connection structure.

The A1 axis intersects the second die. The A3 axis does not intersect the second die. The B1 axis does not intersect the first die. The B3 axis intersects the first die.

According to still another aspect of the invention, a semiconductor device is disclosed. The semiconductor device comprises a first die, a second die, a redistribution structure, a first connection structure, and a second connection structure.

The first die has a first active surface. The first die has an A1 side, an A2 side, an A3 side, and an A4 side. The A1 side is parallel to the A3 side. The A2 side is parallel to the A4 side. The A2 side is longer than the A1 side. The A1 side is along an A1 axis. The A3 side is along an A3 axis.

The second die has a second active surface. The second die has a B1 side, a B2 side, a B3 side, and a B4 side. The B1 side is parallel to the B3 side. The B2 side is parallel to the B4 side. The B2 side is longer than the B1 side. The B1 side is along a B1 axis. The B3 side is along a B3 axis.

The first active surface is connected to the redistribution structure through the first connection structure. The second active surface is connected to the redistribution structure through the second connection structure.

The A1 axis intersects the second die. The A3 axis intersects the second die. The B1 axis does not intersect the first die. The B3 axis does not intersect the first die. No solder bumps are located between the first die and the redistribution structure. No solder bumps are located between the second die and the redistribution structure.

BRIEF DESCRIPTION OF THE DRAWINGS

FIG. 20O shows another embodiment of a semiconductor device;

FIG. 20P shows another embodiment of a semiconductor device;

FIG. 20Q shows another embodiment of a semiconductor device;

FIG. 20R shows another embodiment of a semiconductor device;

FIG. 20S shows one step of a method for manufacturing a memory module;

FIG. 20T shows next step of a method for manufacturing a memory module;

FIG. 20U shows next step of a method for manufacturing a memory module;

FIG. 21A shows an embodiment of a semiconductor device;

FIG. 21B shows another embodiment of a semiconductor device;

FIG. 21C shows another embodiment of a semiconductor device;

FIG. 21D shows an example of two adjacent conductive traces;

FIG. 21E shows another example of two adjacent conductive traces;

Figure 22A:
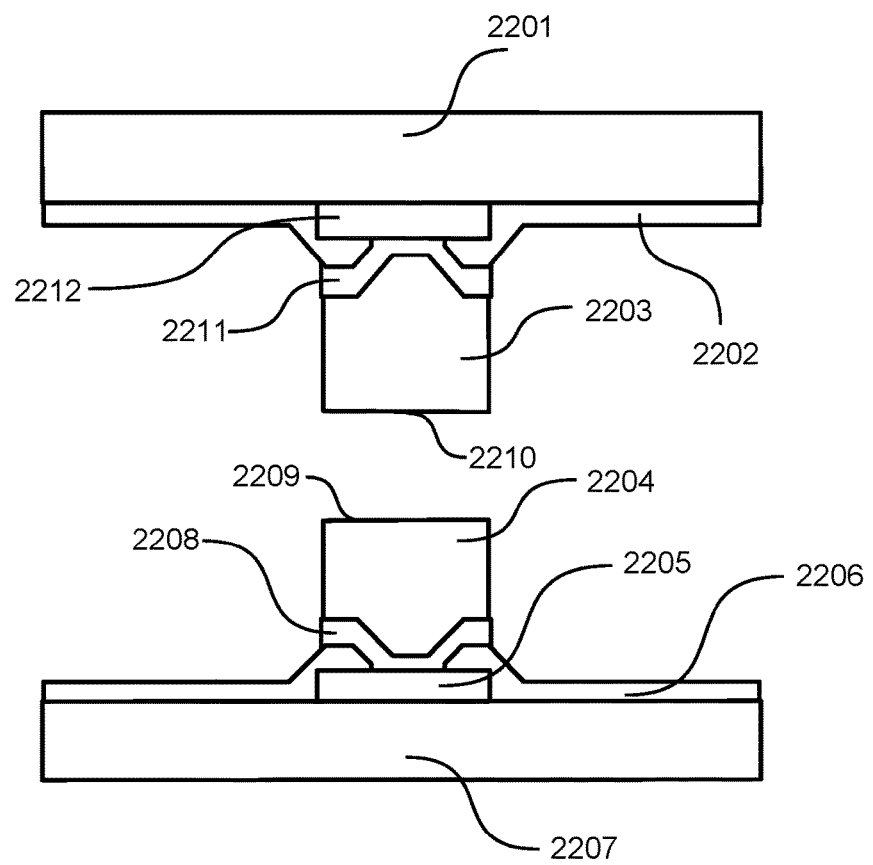
Figure 22B:
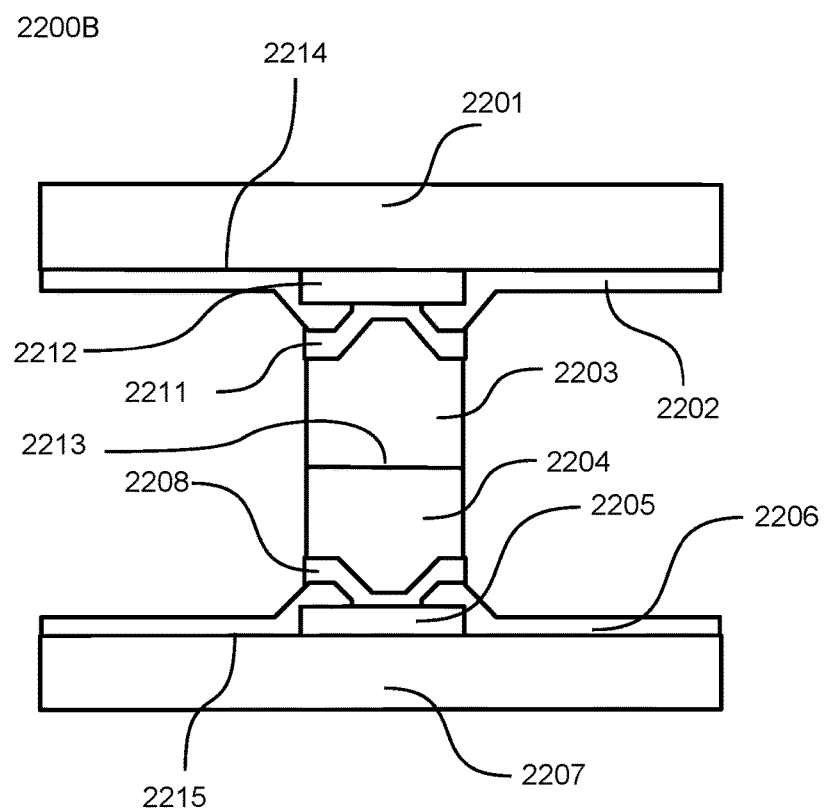
Figure 22C:
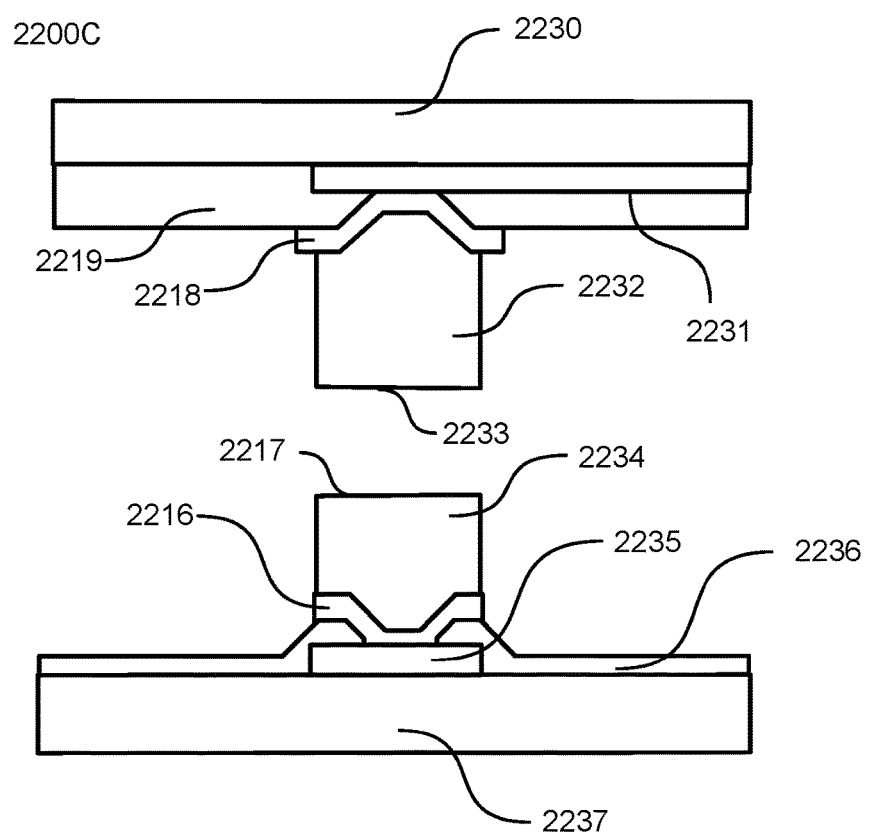
Figure 22D:
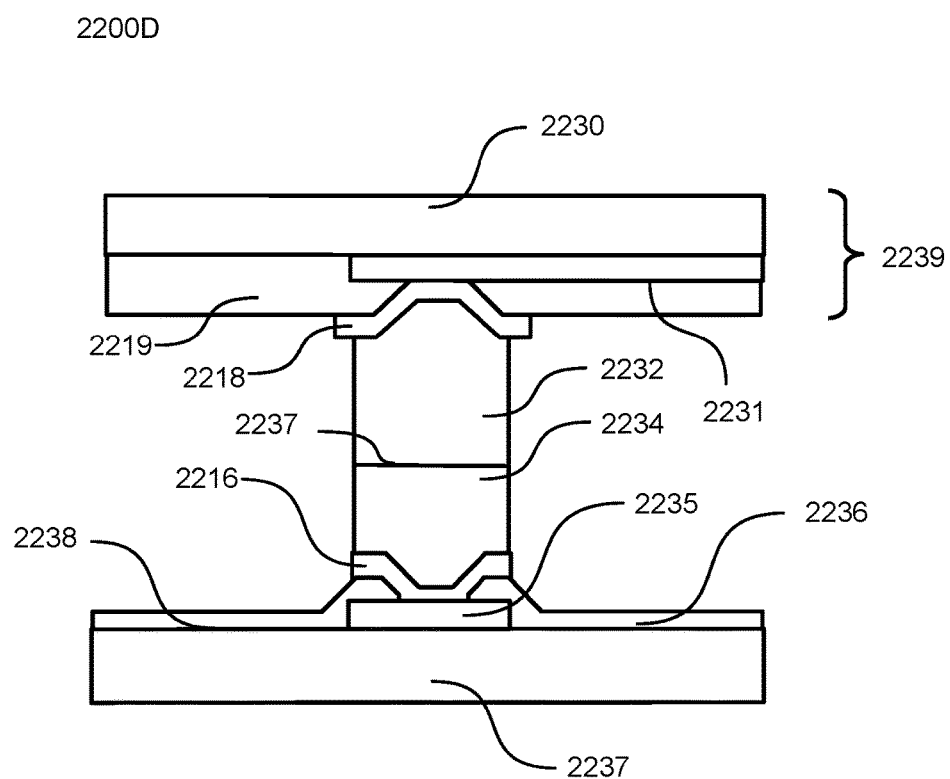
Figure 22E:
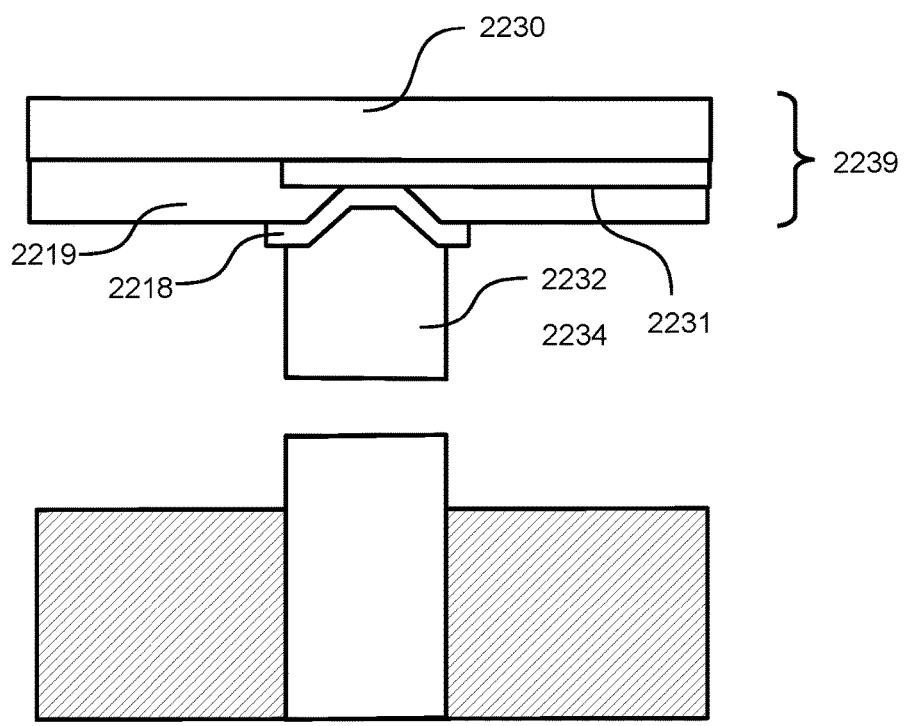
Figure 22F:
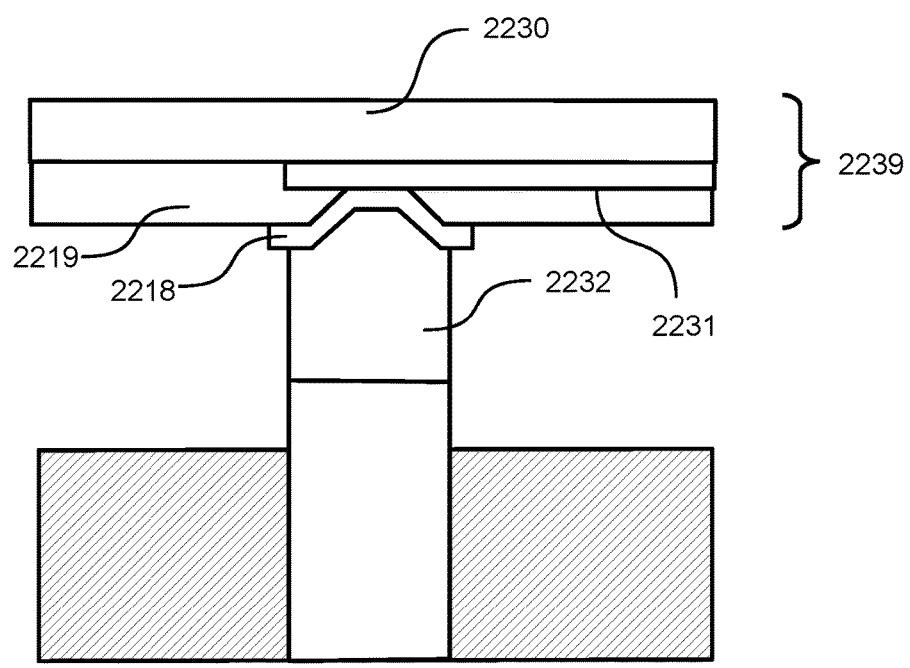
Figure 23A:
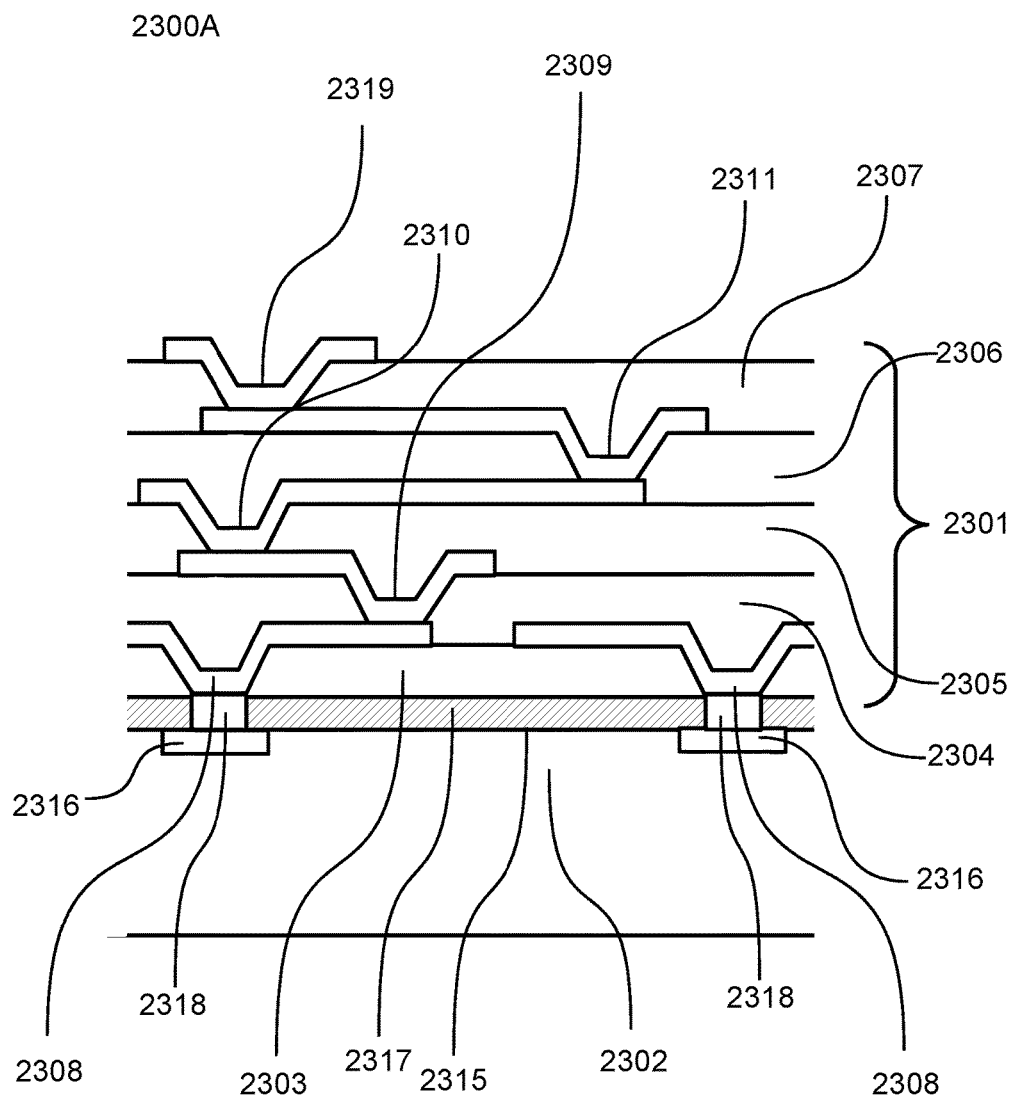
Figure 23B:
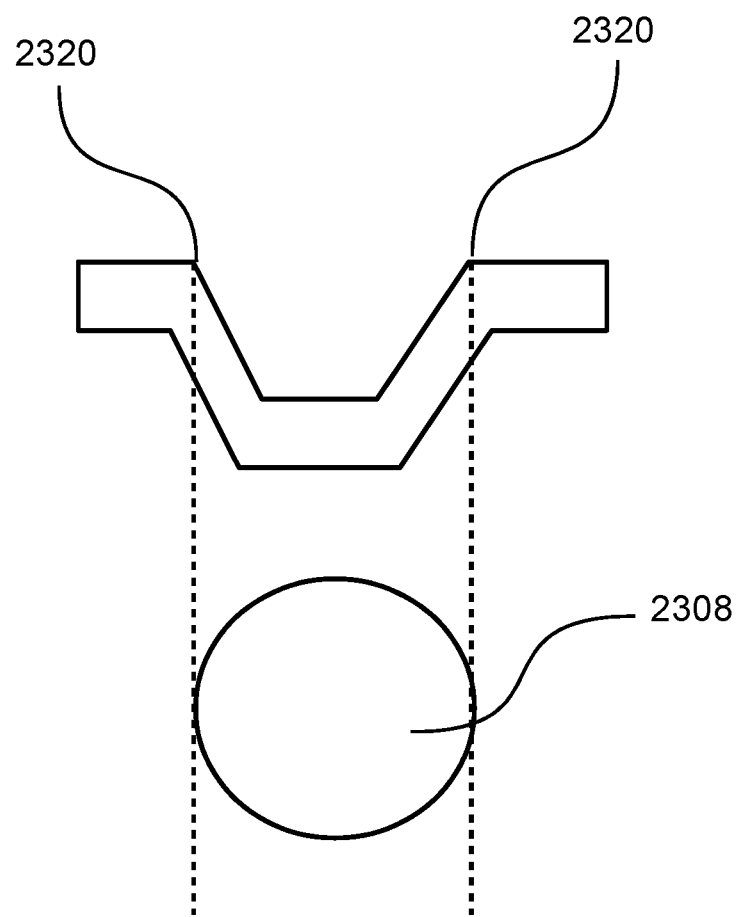
Figure 23C:
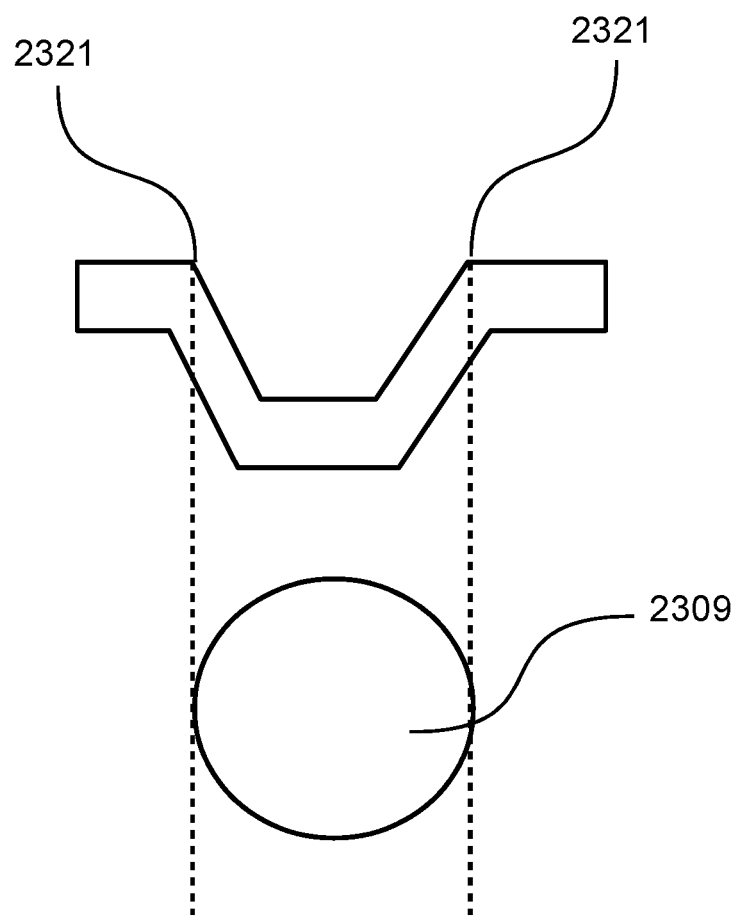
Figure 23D:
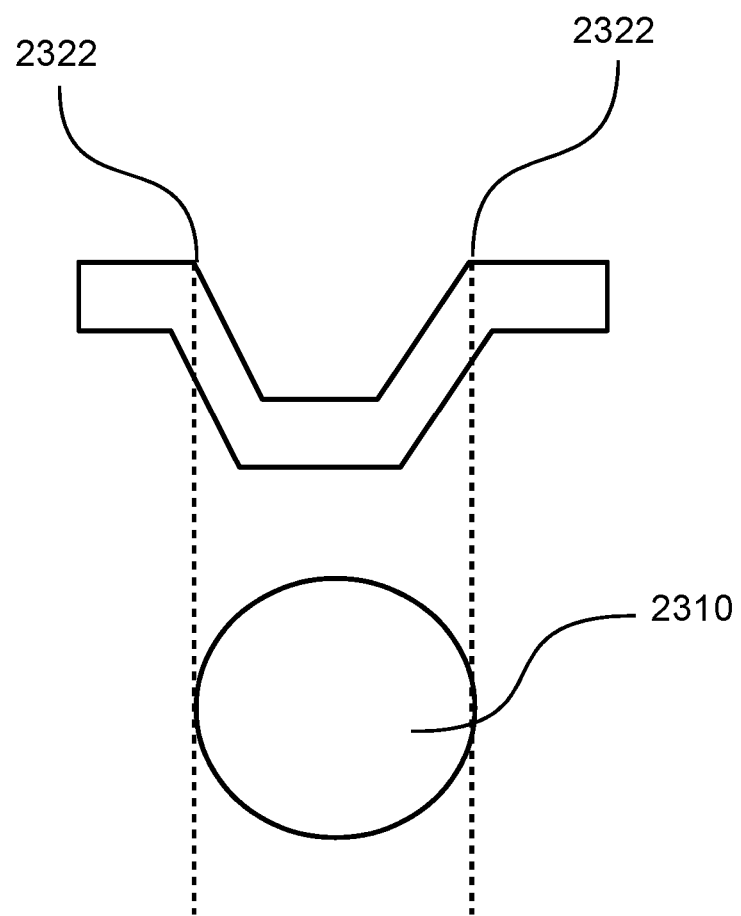
Figure 23E:
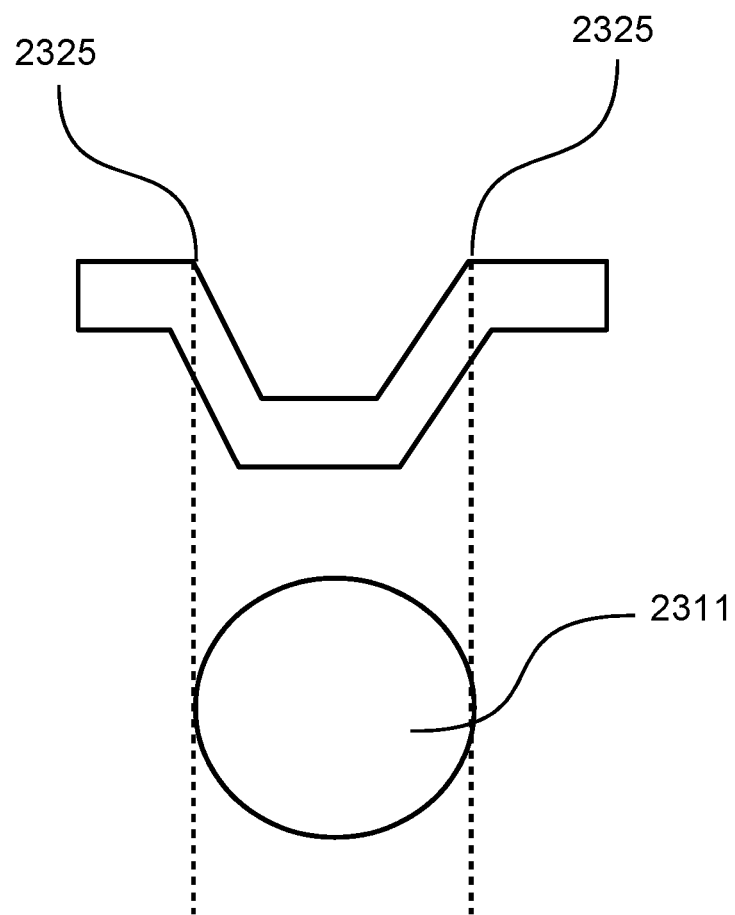
Figure 23F:
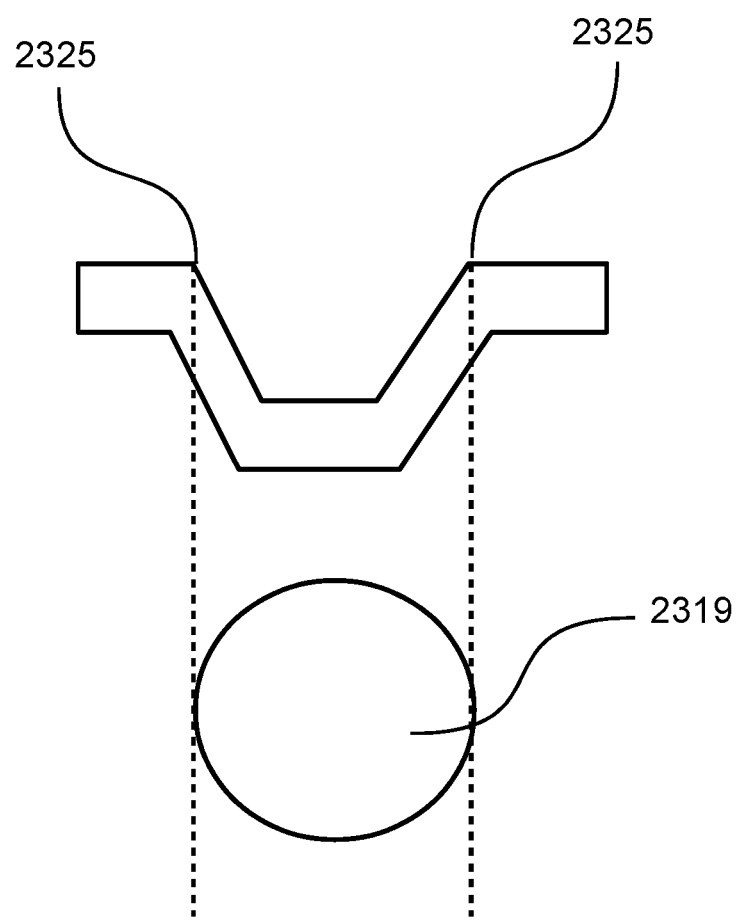
Figure 23G:
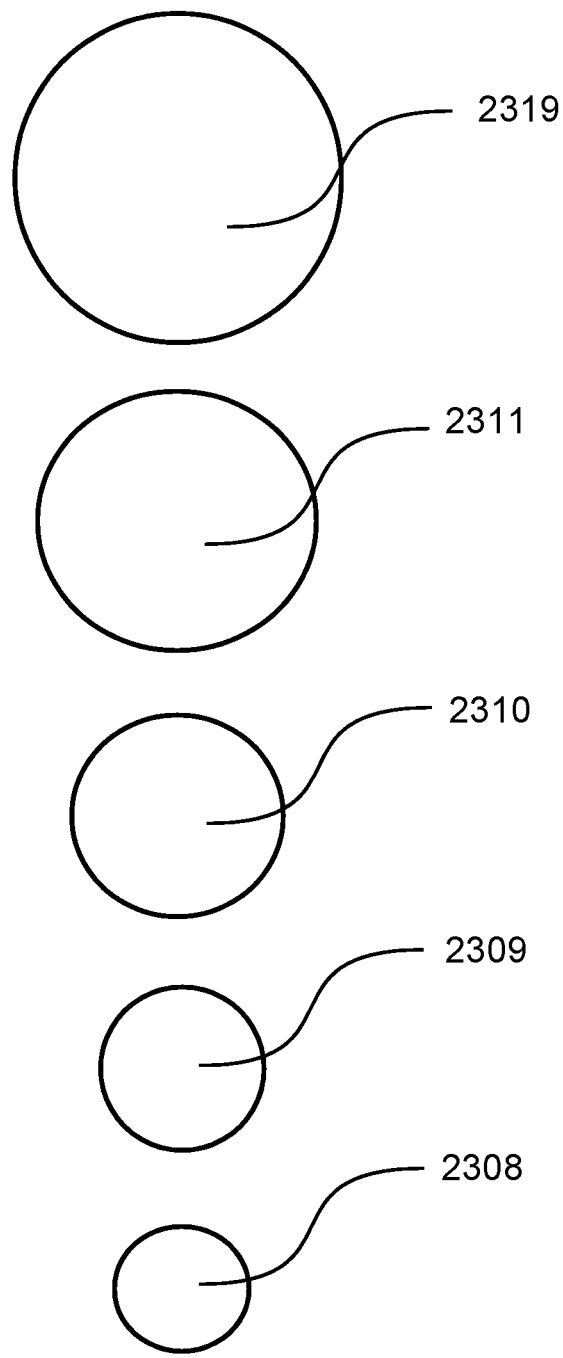
Figure 23H:
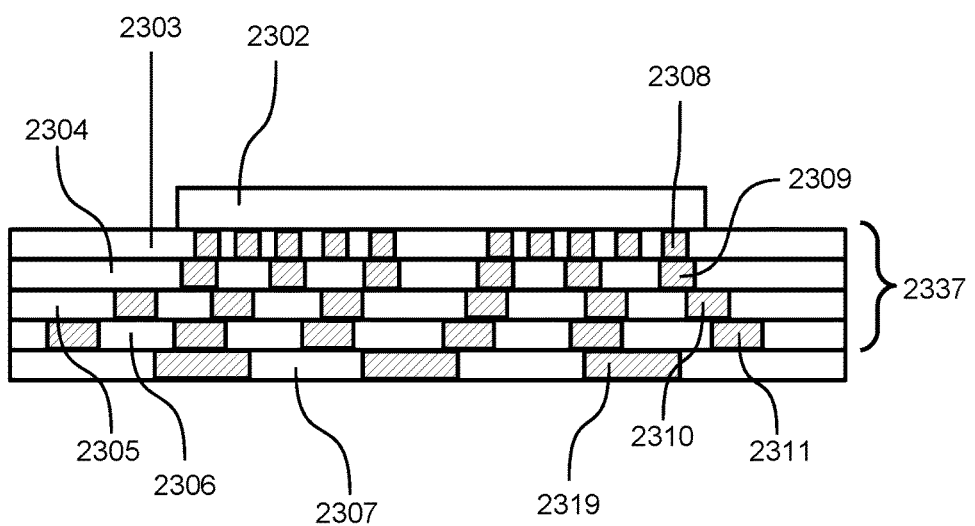
Figure 23I:
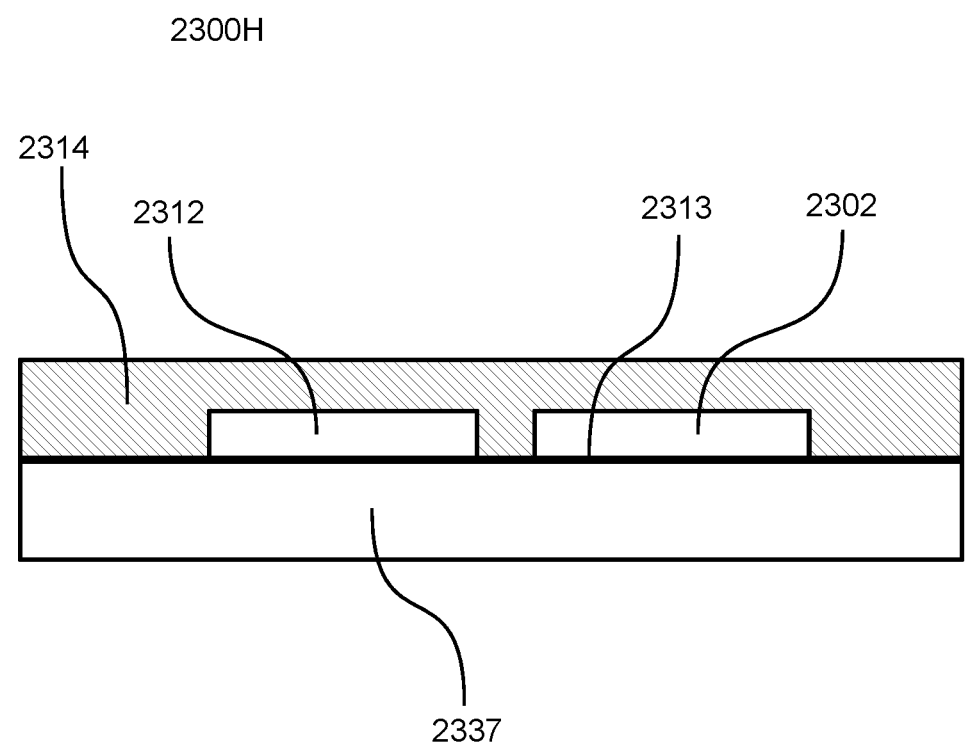
Figure 23J:
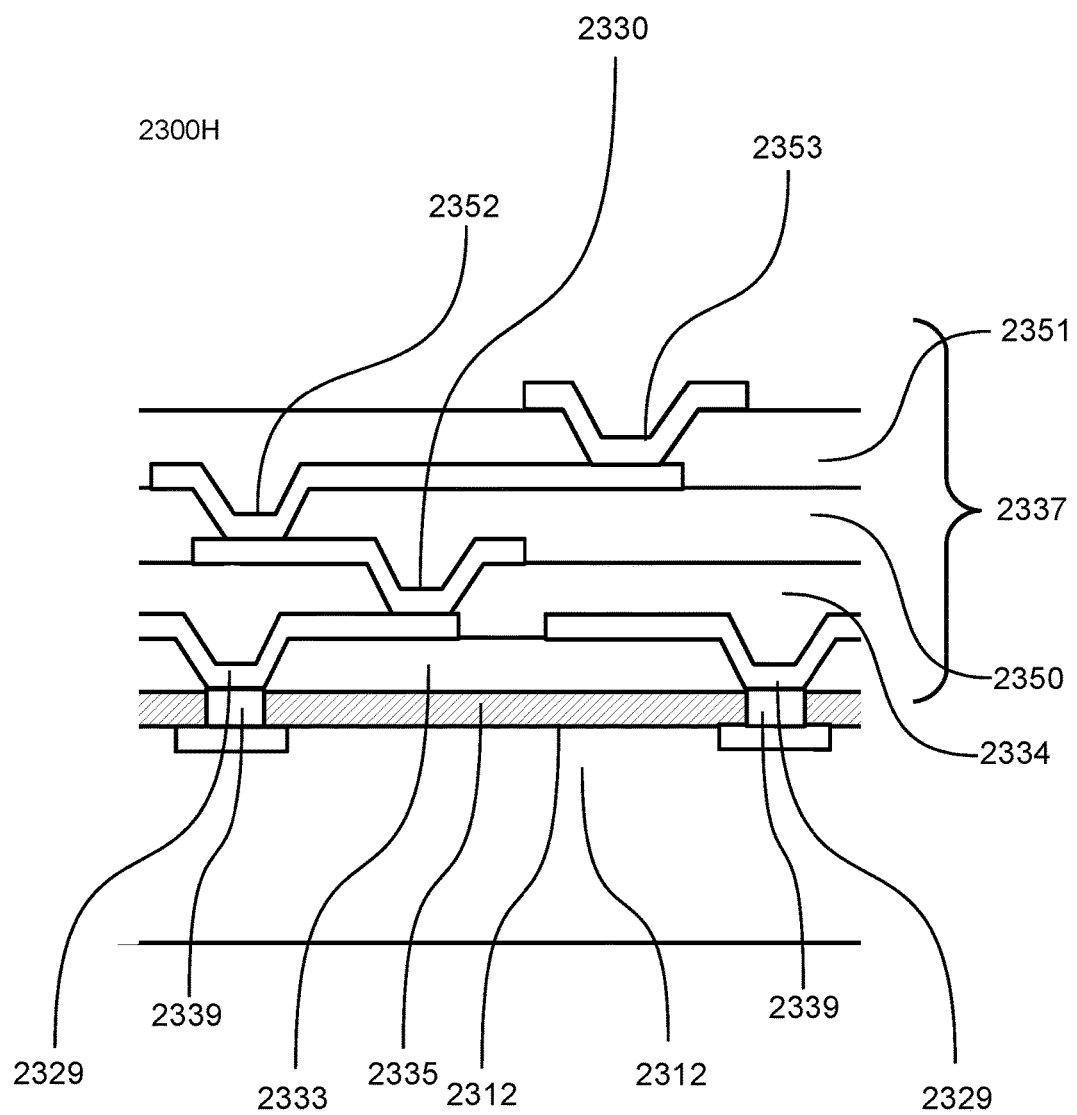
Figure 23K:
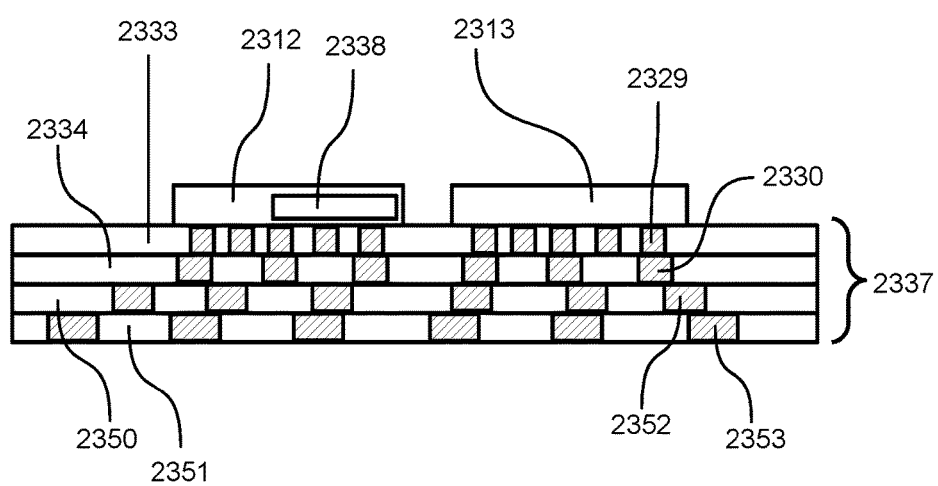
Figure 23L:
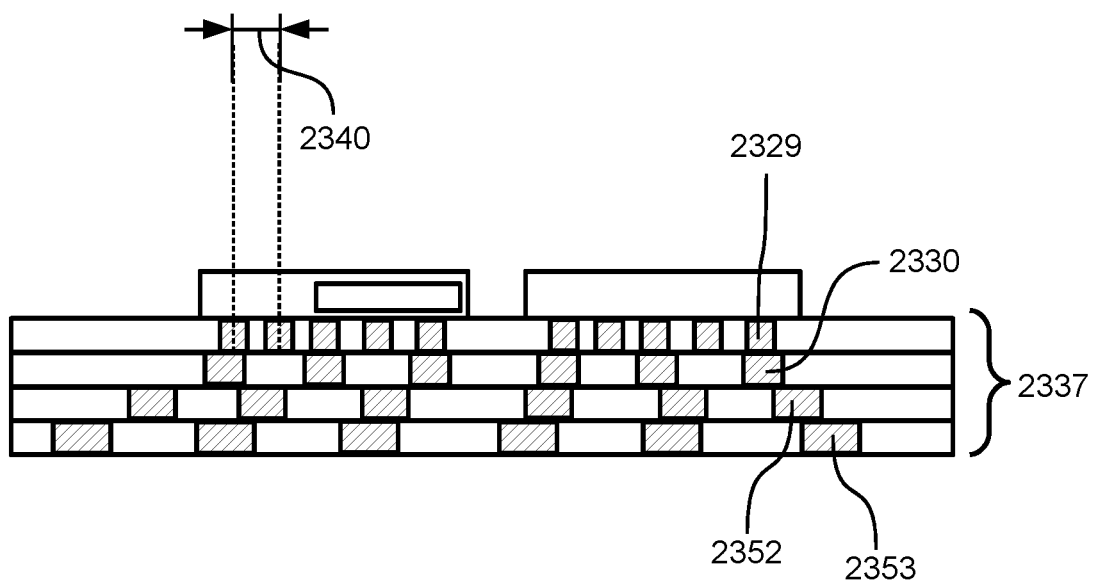
Figure 23M:
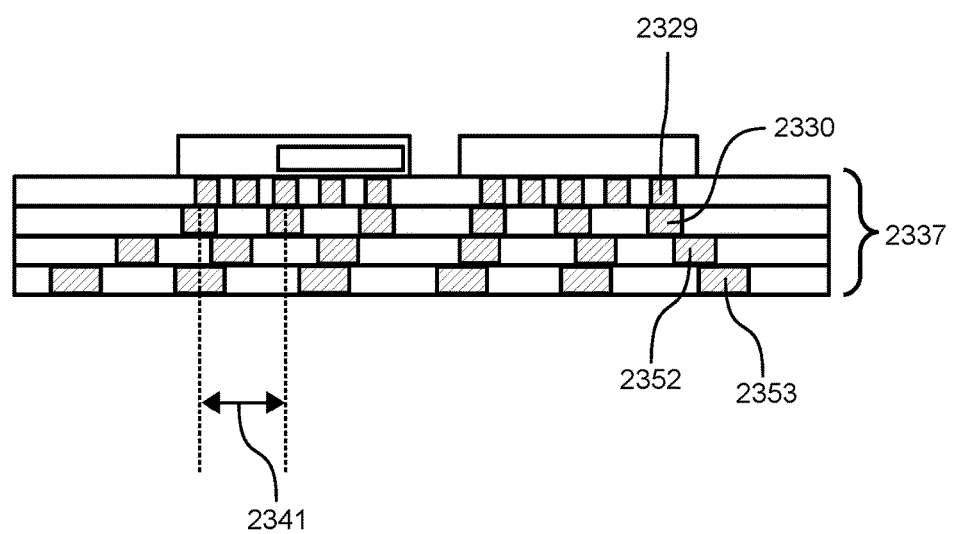
Figure 23N:
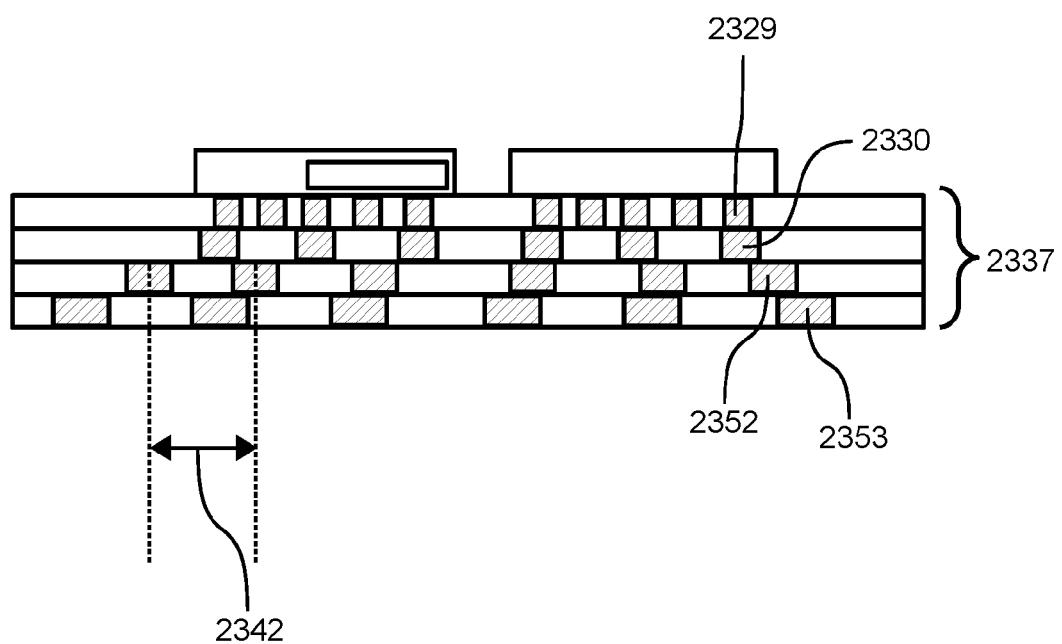
Figure 23O:
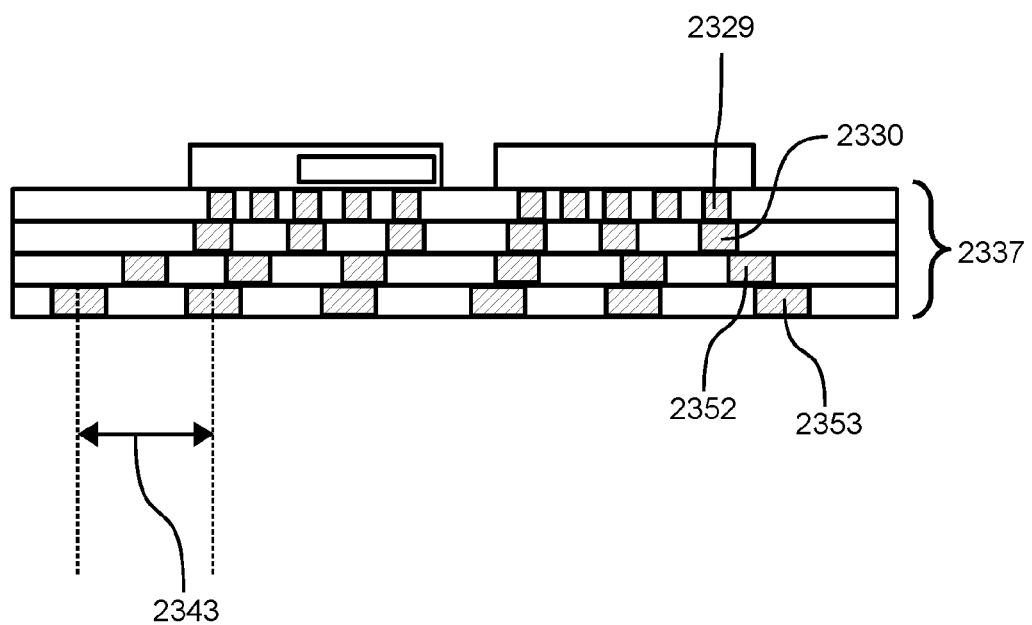
Figure 24A:
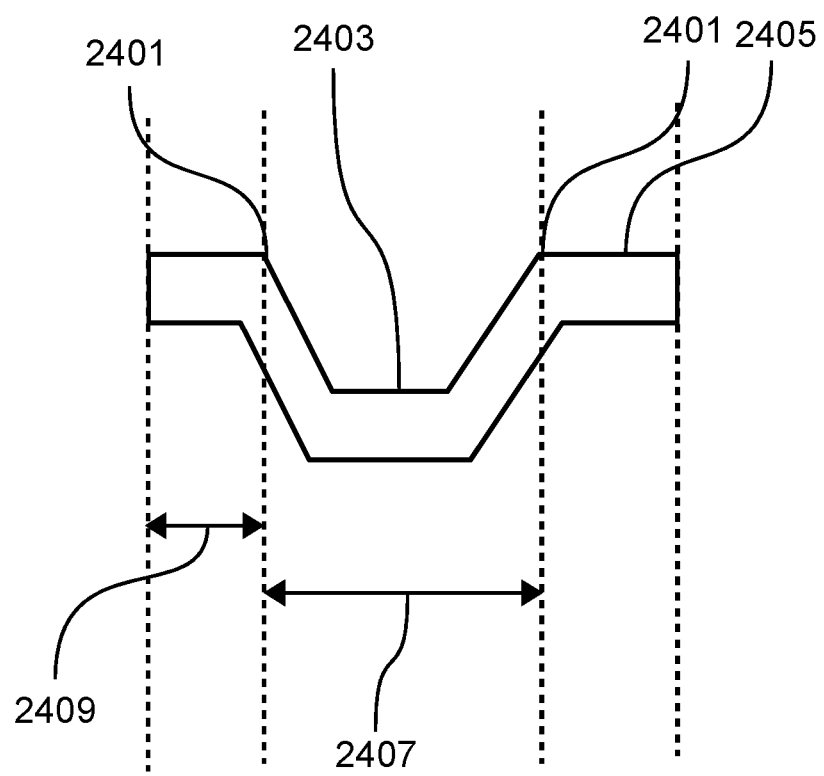
Figure 24B:
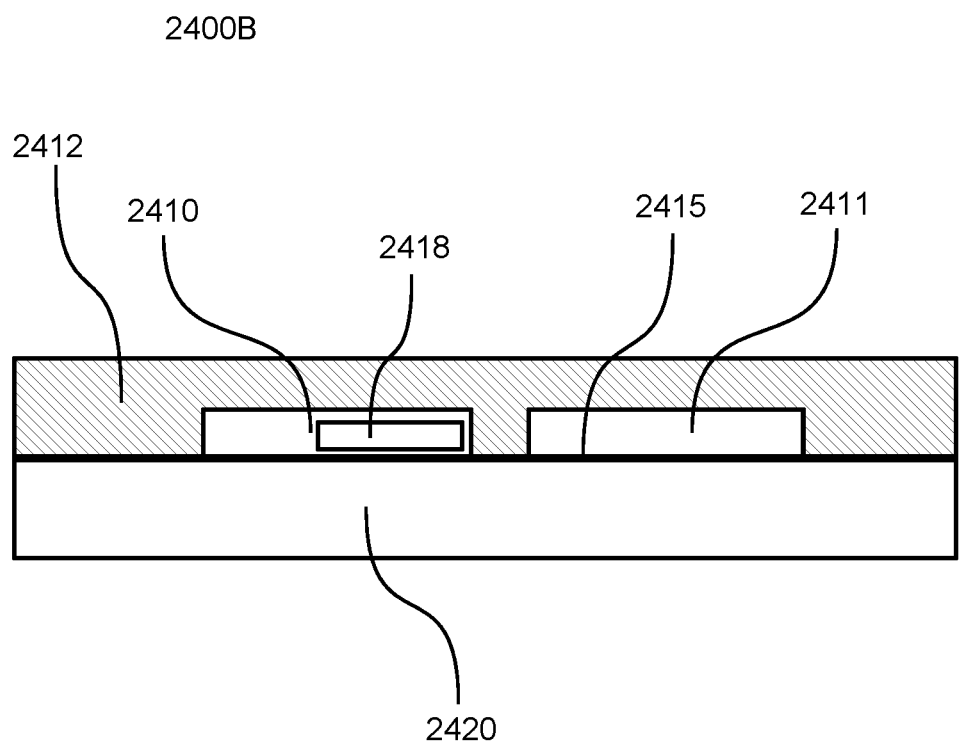
Figure 24C:
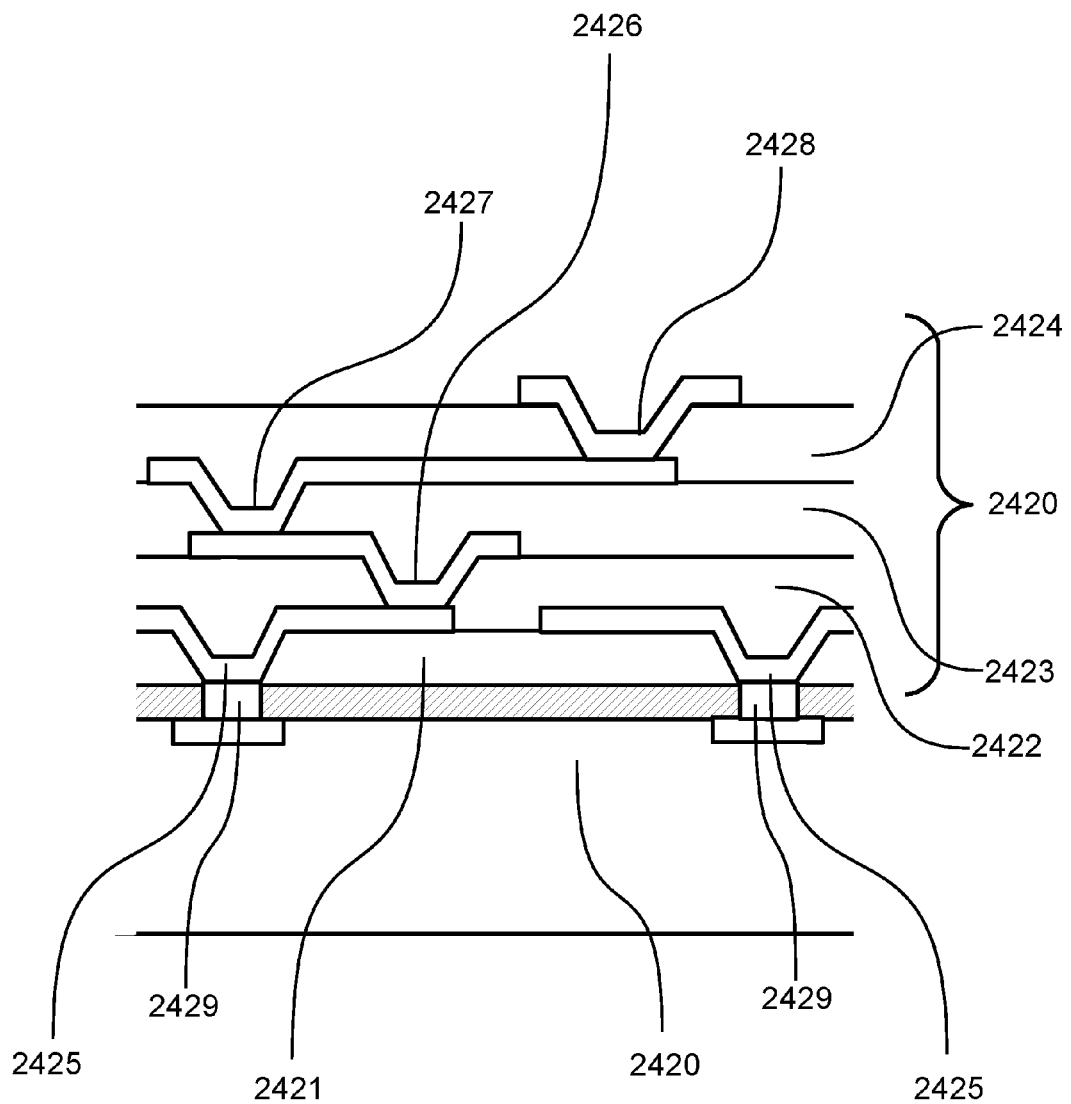

FIG. 22A shows an example of direct metal bonding;

FIG. 22B shows another example of direct metal bonding;

FIG. 22C shows another example of direct metal bonding;

FIG. 22D shows another example of direct metal bonding;

FIG. 22E shows another example of direct metal bonding;

FIG. 22F shows another example of direct metal bonding;

FIG. 23A shows an embodiment of a semiconductor device;

FIG. 23B shows an example of a via;

FIG. 23C shows another example of a via;
FIG. 23D shows another example of a via;
FIG. 23E shows another example of a via;
FIG. 23F shows another example of a via;
FIG. 23G shows a comparison among a plurality of vias;
FIG. 23H shows an embodiment of a semiconductor device;
FIG. 23I shows another embodiment of a semiconductor device;
FIG. 23J shows another embodiment of a semiconductor device;
FIG. 23K shows another embodiment of a semiconductor device;
FIG. 23L shows another embodiment of a semiconductor device;
FIG. 23M shows another embodiment of a semiconductor device;
FIG. 23N shows another embodiment of a semiconductor device;
FIG. 23O shows another embodiment of a semiconductor device;
FIG. 24A shows an exemplary via 2400A;
FIG. 24B shows an embodiment of two dies placed on a redistribution structure; and
FIG. 24C shows an embodiment of a semiconductor device.

DETAILED DESCRIPTION OF THE PREFERRED EMBODIMENTS

Figure 1A:
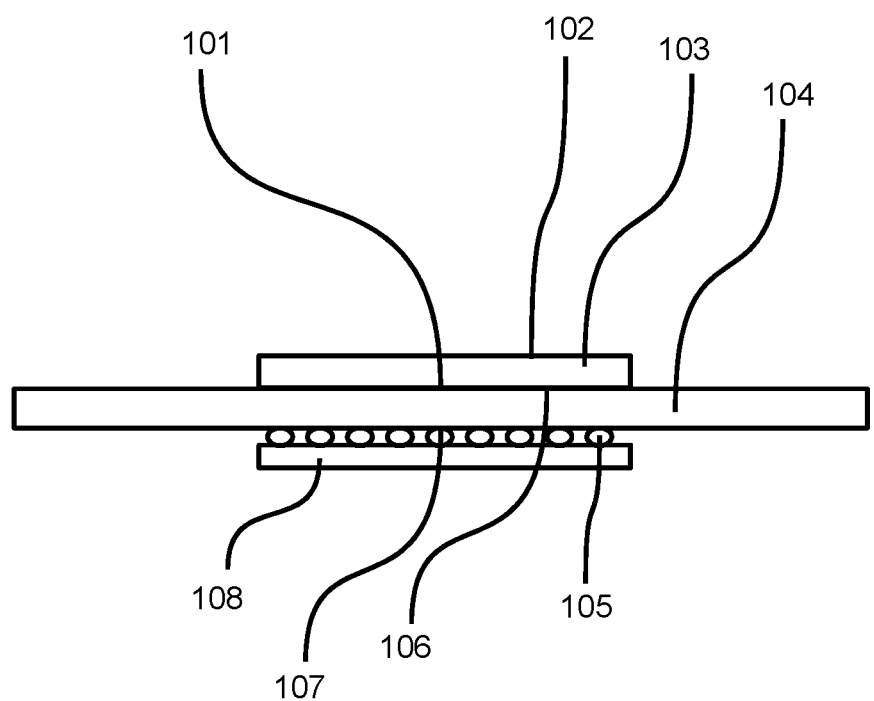
FIG. 1A shows connections of a semiconductor package 100A.

FIG. 1A shows connections of a semiconductor package 100A. Referring to FIG. 1A, a semiconductor package 100A is disclosed. In some embodiments, the semiconductor package 100A comprises a redistribution layer (RDL) 104. The RDL 104 has a first side 101 and a second side 107. The semiconductor package 100A can have a processor 103.

The processor 103 has an active side 106 and a back side 102. The active side 106 is directly connected to the first side 101 of the redistribution layer 104 and no solder connections are located between the redistribution layer 104 and the processor 103. The semiconductor package 100A has a memory module 108 connected to the redistribution layer 104 through solder connections 105. In some embodiments, the memory module 108 is a Wide IO memory.

Figure 1B:
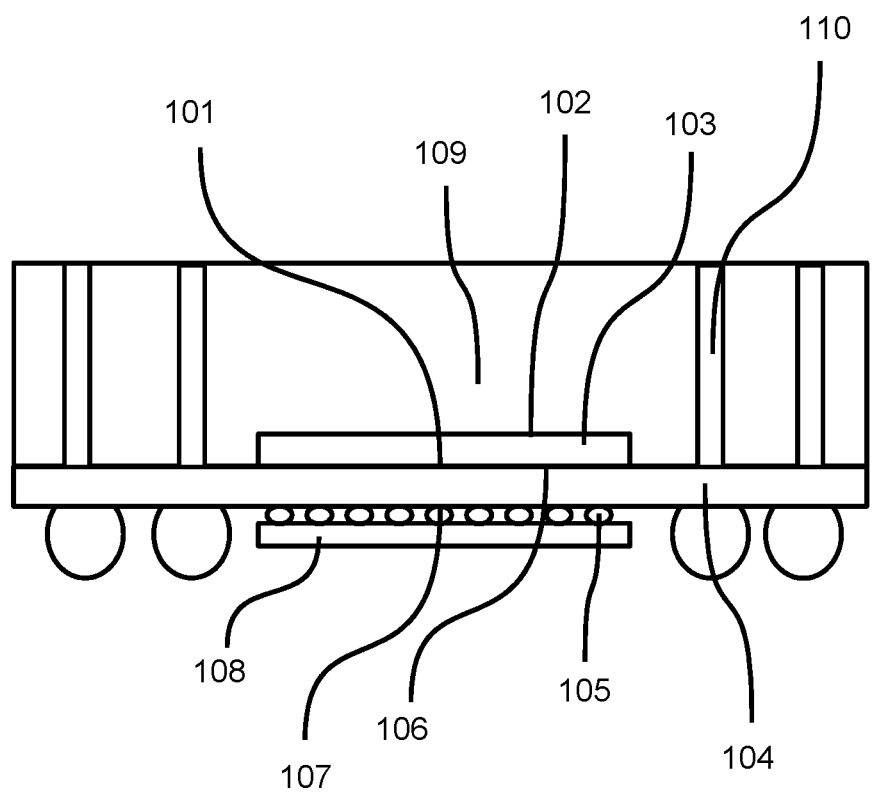
FIG. 1B shows connections of a semiconductor package 100B according to another embodiment.

FIG. 1B shows connections of a semiconductor package 100B according to another embodiment. In this embodiment, the semiconductor package 100B has a plurality of metal vias 110 connecting to the RDL 104. Signals can be transmitted from the processor 103, through the RDL 104, and then to the metal vias 110. Signals can also be transmitted from the metal vias 110, through the RDL 104, and then to the processor 103.

Referring to FIG. 1B, in one embodiment, the semiconductor package 100B comprises redistribution layer 104, a processor 103, and a memory module 108. In one embodiment, The redistribution layer 104 has a first side and a second side. The processor 103 having an active side 101 and a back side 102. The active side 101 is directly connected to the first side 106 of the redistribution layer 104 and no solder connections are located between the redistribution layer 104 and the processor 103. The memory module 108 is connected to the redistribution layer 104 through solder connections. The memory module 104 is a Wide IO memory.

Figure 1C:
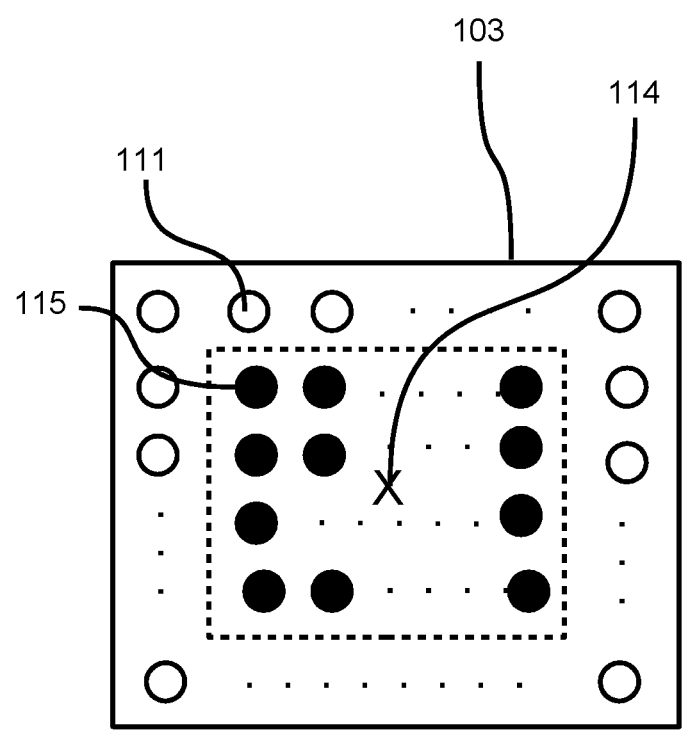
FIG. 1C shows a bottom view of the processor 103.
Figure 1D:
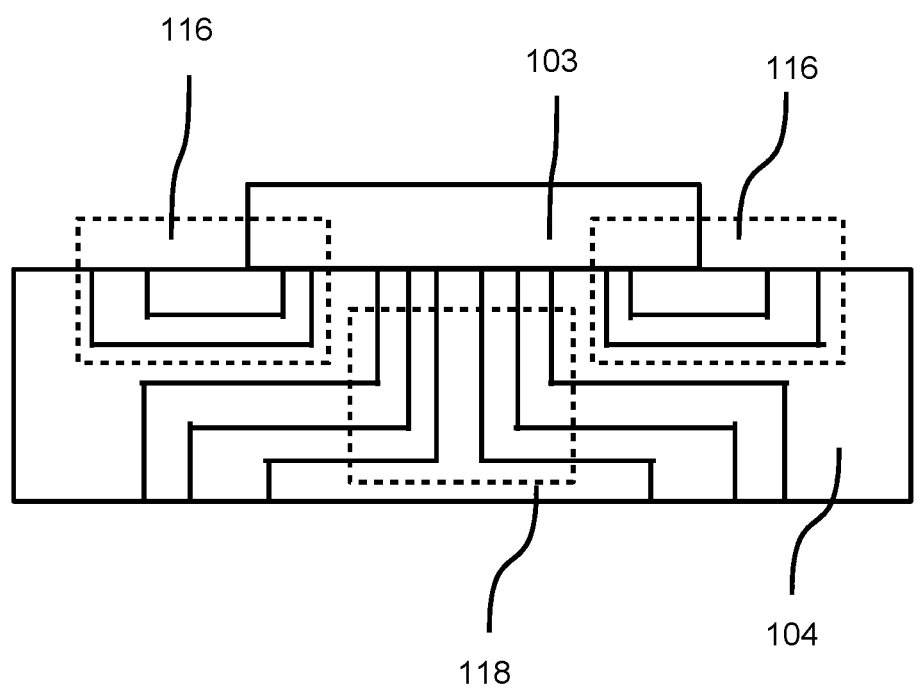
FIG. 1D shows an embodiment of a semiconductor device 100D.

FIG. 1C shows a bottom view of the processor 103. FIG. 1D shows an embodiment of a semiconductor device 100D. With reference to FIG. 1C and FIG. 1D, in one embodiment, the semiconductor device 100D comprises a processor 103, a redistribution layer 104, a first memory module 120, and a second memory module 119. The processor 103 has a first group of IO connections 115 and a second group of IO connections 111. The first group of IO connections 115 is closer to a central point 114 of the processor 103 than the second group of IO connections 111. The redistribution layer 104 is connected to the processor 103.

The redistribution layer 104 comprises a first group of traces 118 and a second group of traces 116. The first group of traces 118 is electrically connected to the first group of IO connections 115. The second group of traces 116 is electrically connected to the second group of IO connections 111. The first memory module 120 is electrically connected to the processor 103 through the first group of traces 118. The second memory module 119 is electrically connected to the processor 103 through the second group of traces 116.

In one example, the first memory module 120 is a Wide IO memory module. In one example, the second memory module 119 is an LPDDR memory module. In one example, the first memory module 120 is connected to the redistribution layer 104 through a first connection structure 122 on a bottom side of the redistribution layer 104. In one example, the second memory module 119 is connected to the redistribution layer 104 through a second connection structure 124 on a peripheral zone 121 of the redistribution layer 104. In one example, a number of connections in the first connection structure 122 is more than a number of connections in the second connection structure 124.

In one embodiment, The semiconductor device 100D comprises a processor 103, a redistribution layer 104, a first memory module 120, and a second memory module 119. The processor 103 has a first group of IO connections 115 and a second group of IO connections 111. The redistribution layer 104 is connected to the processor 103. The redistribution layer 104 comprises a first group of traces 118 and a second group of traces 116.

The first group of traces 118 is electrically connected to the first group of IO connections 115. The second group of traces 116 is electrically connected to the second group of IO connections 111. The first memory module 120 is electrically connected to the processor 103 through the first group of traces 115. The second memory module 119 is electrically connected to the processor 103 through the second group of traces 116. A number of the first group of IO connections 115 is greater than a number of the second group of IO connections 111. In one example, the first memory module 120 is a Wide IO memory module. In one example, the second memory module 119 is an LPDDR memory module.

In FIG. 1C, the bottom view of the processor 103 shows the active side of the processor 103. The processor 103 has a first group of IO connections 115 and a second group of IO connections 111. The first group of IO connections 115 are closer to a central point 114 of the processor 103 than the second group of IO connections 111.

With reference to FIG. 1D, the redistribution layer 104 is connected to the processor 103. In some embodiments, the redistribution layer 104 comprises a first group of traces 118 and a second group of traces 116.

The first group of traces 118 are electrically connected to the first group of IO connections 115. The second group of traces 116 are electrically connected to the second group of IO connections 111. A memory module 108 is electrically connected to the processor 103 through the first group of traces 118. In some embodiments, another memory module 119 is electrically connected to the processor 102 through the second group of traces 116. In one example, the memory module 120 is a Wide IO memory module. In one example, the memory module 119 is an LPDDR memory module.

Figure 1E:
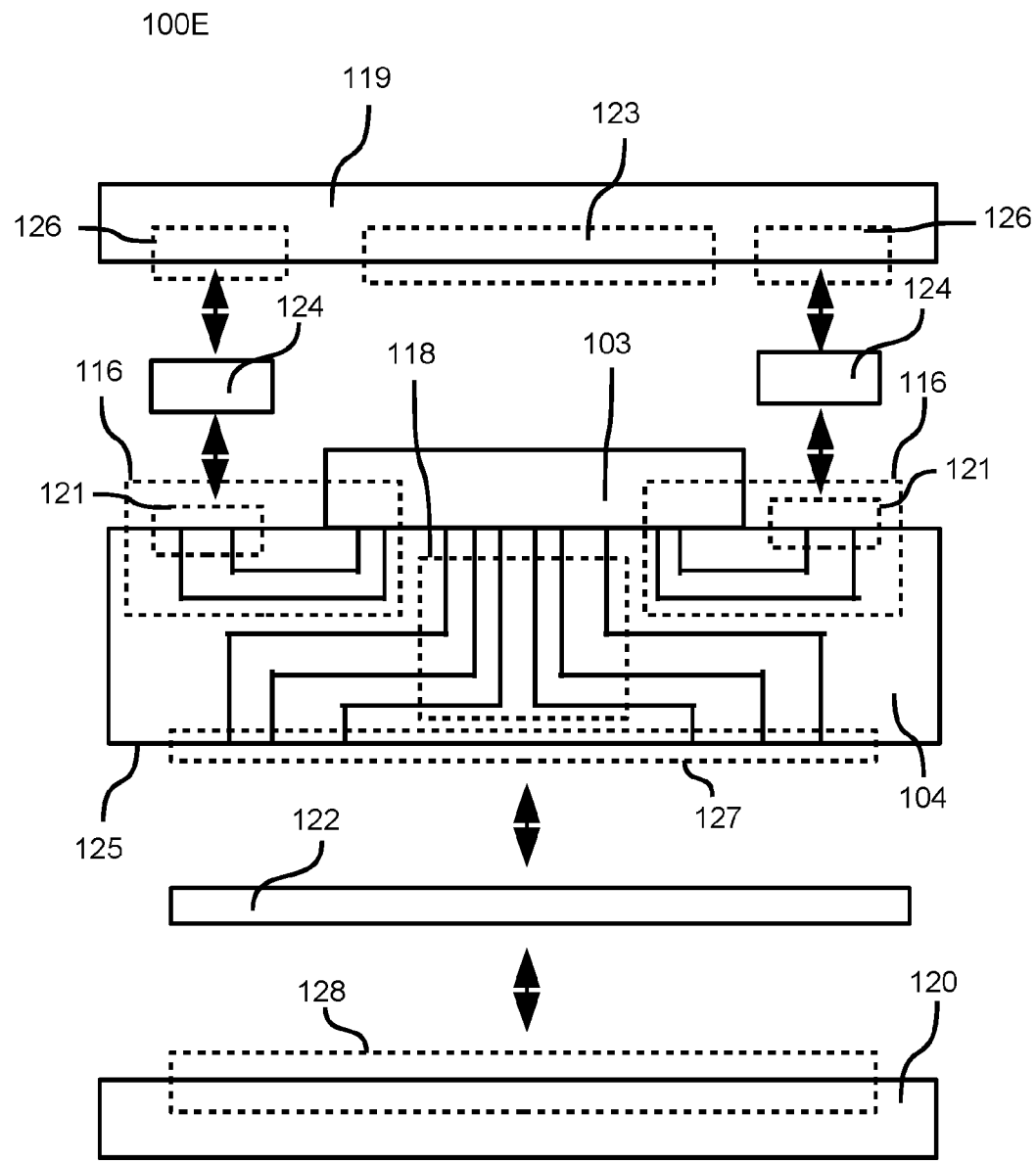
FIG. 1E shows connections between the redistribution layer and the memory modules.

FIG. 1E shows connections between the redistribution layer and the memory modules. The memory module 119 is connected to a peripheral zone 121 of the redistribution layer 104 through a connection structure 124. A central zone 123 of the memory module 119 is not connected to the redistribution layer 104. The memory module 120 is connected to the redistribution layer 104 through a connection structure 122 on a bottom side 125 of the redistribution layer 104.

In some embodiments, a number of connections in the first connection structure 122 is more than a number of connections in the second connection structure 124. For example, when the memory module 120 is a Wide IO memory module and the the memory module 119 is an LPDDR memory module, the number of connections for the Wide IO memory module is more than the number of connections for the LPDDR memory module.

In some embodiments, the peripheral zone 121 is connected to a peripheral zone 126 of the memory module 119. A connection zone 127 is connected to a connection zone 128 of the memory module 120 through the first connection structure 122. In some embodiments, an area of the connection zone 128 is greater than an area of the peripheral zone 126 of the memory module 106 so that the connection zone 128 can provide more area for larger number of IO connections.

Figure 1F:
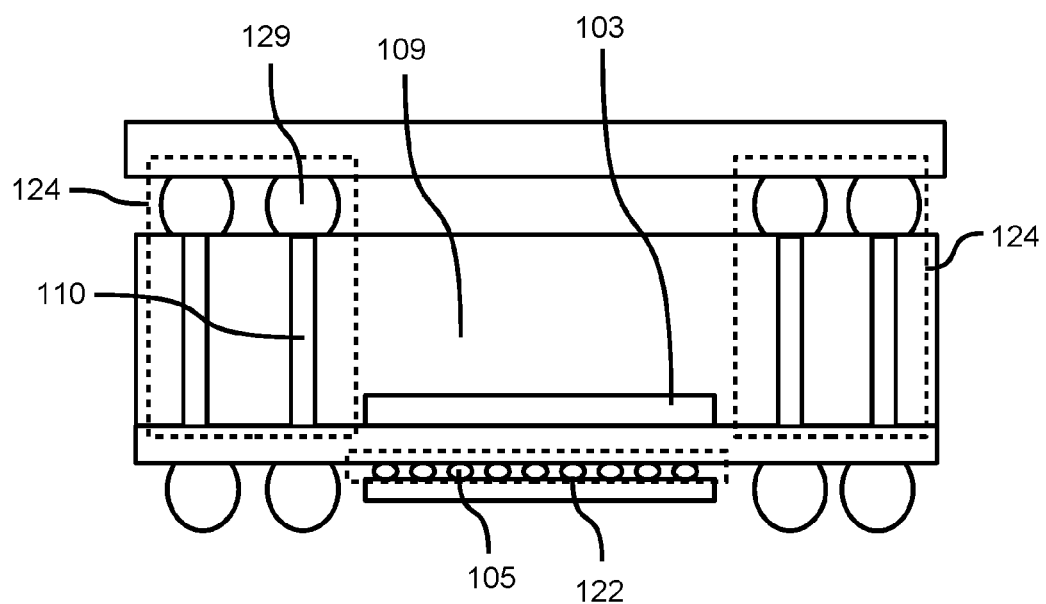
FIG. 1F shows an example of the semiconductor package 100F.

FIG. 1F shows an example of the semiconductor package 100F. With reference to FIG. 1E and FIG. 1F, the connection structure 122 can be a plurality of solder balls 105. The connection structure 124 can be a plurality of metal vias 110 and a plurality of solder balls 129.

Figure 1G:
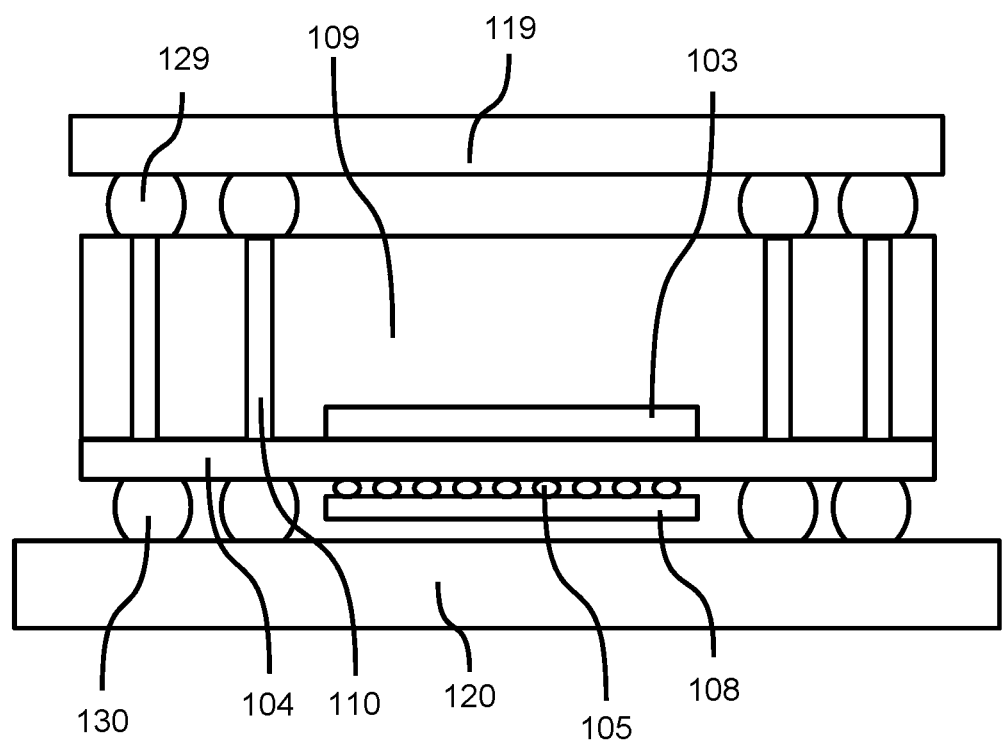
FIG. 1G shows an embodiment of the semiconductor package 100G.

FIG. 1G shows an embodiment of the semiconductor package 100G. The semiconductor package 100G has a processor 103, a memory module 108, and a memory module 119. The processor 103 is connected to a redistribution layer (RDL) 104. The RDL 104 is made by fan-out wafer level packaging technology. The RDL 104 can have multiple layers so that it can provide space for metal traces to redistribute in it. The metal traces in the RDL can help to transmit signals and power/ground connections from or to the processor 103. The semiconductor package 100G has multiple metal vias 110 connecting to the RDL 104. The active side of the processor 103 is connected to the RDL 104, so the processor 103 may need metal vias 110 to help to transmit signals to the back side of the processor 103.

A molding material 109 may be used to encapsulate the processor 103. The memory module 119 is attached onto the metal vias through solder balls 129. The memory module 119 could be an LPDDR memory module. The memory module 108 is connected to the RDL 104 through a connection structure 105. The memory module 108 can be a Wide IO memory module. The connection structure 105 can be solder balls. The solder balls for the connection structure 105 are smaller than the solder balls 129. The semiconductor package 100G can be attached onto a printed circuit board 120 through solder balls 130.

Figure 2A:
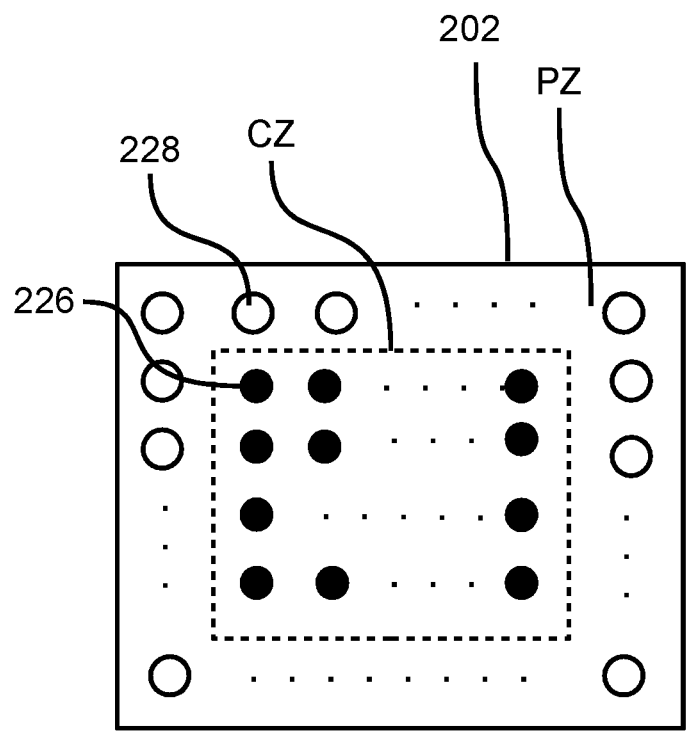
FIG. 2A shows connections on an active side of the processor.
Figure 2B:
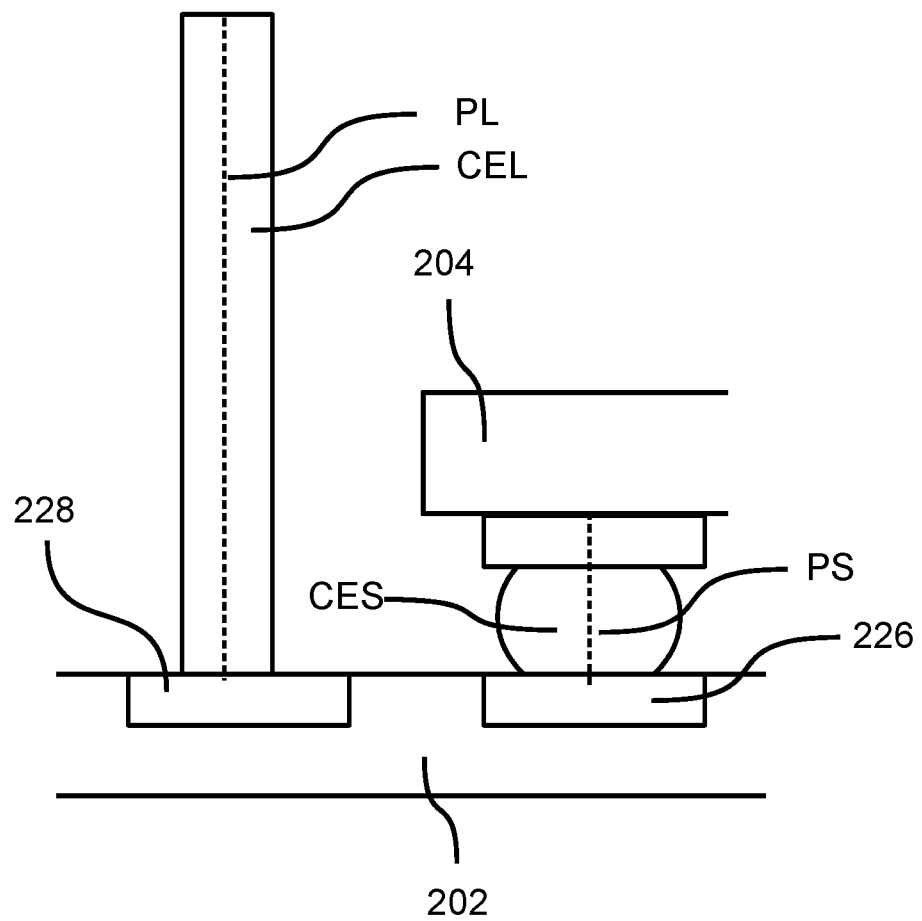
FIG. 2B shows a structural relationship in a semiconductor package.
Figure 2C:
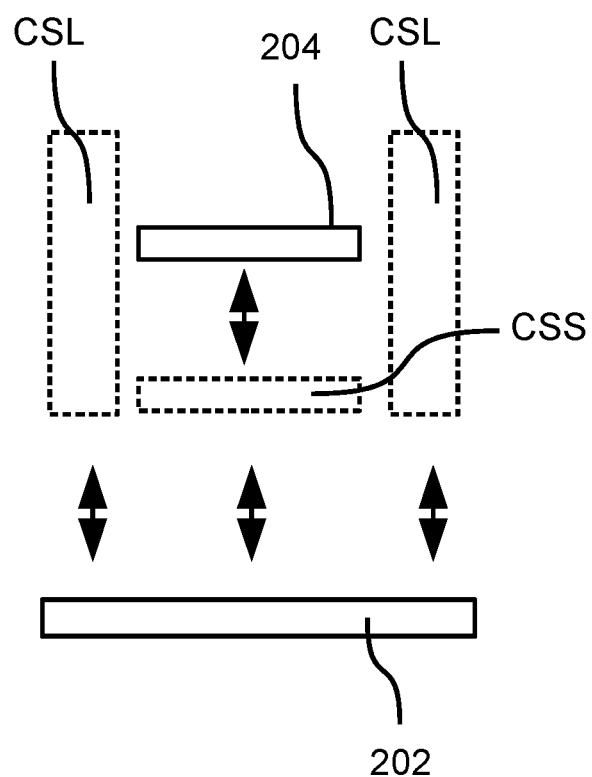
FIG. 2C shows examples of connection elements.
Figure 2D:
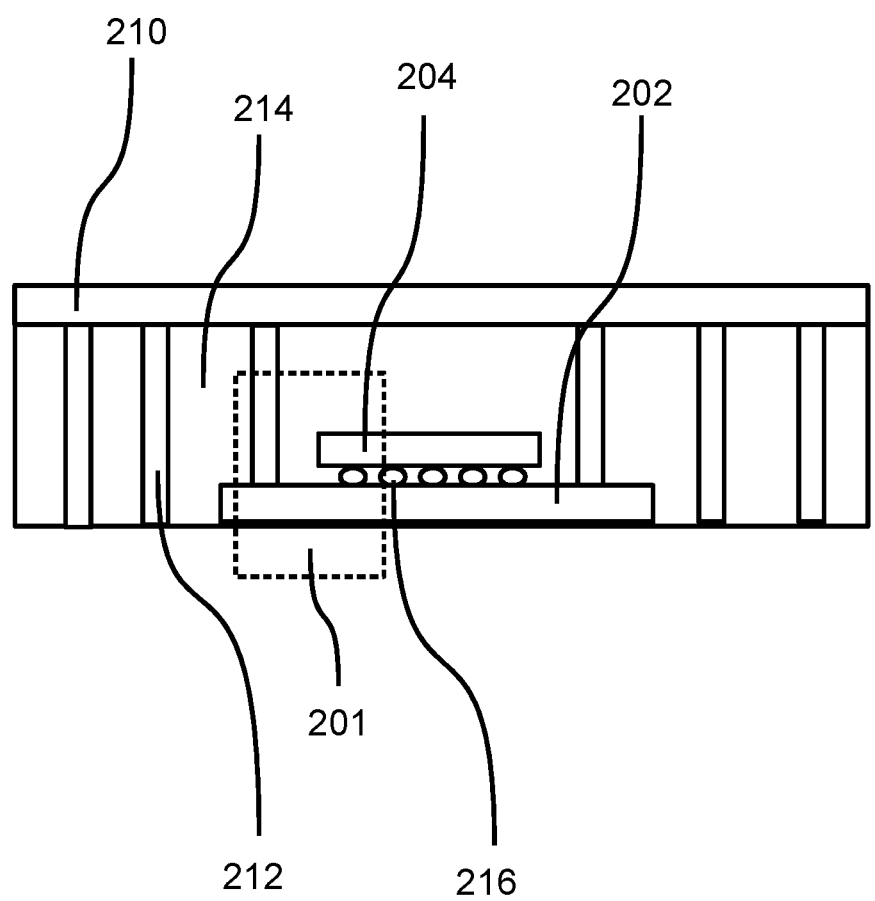
FIG. 2D shows an embodiment of a semiconductor package.

FIG. 2A shows connections on an active side of the processor. FIG. 2B shows a structural relationship in a semiconductor package. FIG. 2C shows examples of connection elements. FIG. 2D shows an embodiment of a semiconductor package. With reference to FIG. 2A, FIG. 2C, and FIG. 2D, a semiconductor package 200D is disclosed. The semiconductor package 200D comprises a processor 202, a connection structure CSS, a connection structure CSL, a memory module 204. The connection structure CSS comprises a plurality of connection elements CES. The connection structure CSS is connected to a central zone CZ of an active side of the processor 202.

The connection structure CSL comprises a plurality of connection elements CEL. The connection structure CSL is connected to a peripheral zone PZ of the active side of the processor 202. An active side of the memory module 204 is connected to the connection structure CSS. The memory module 204 and the processor 202 are face-to-face connected. A path length PS of the connection elements CES is shorter than a path length PL of each of the connection elements CEL. In some embodiments, the connection elements CEL can be metal vias. In some embodiments, the connection elements CES can be solder balls.

Figure 2E:
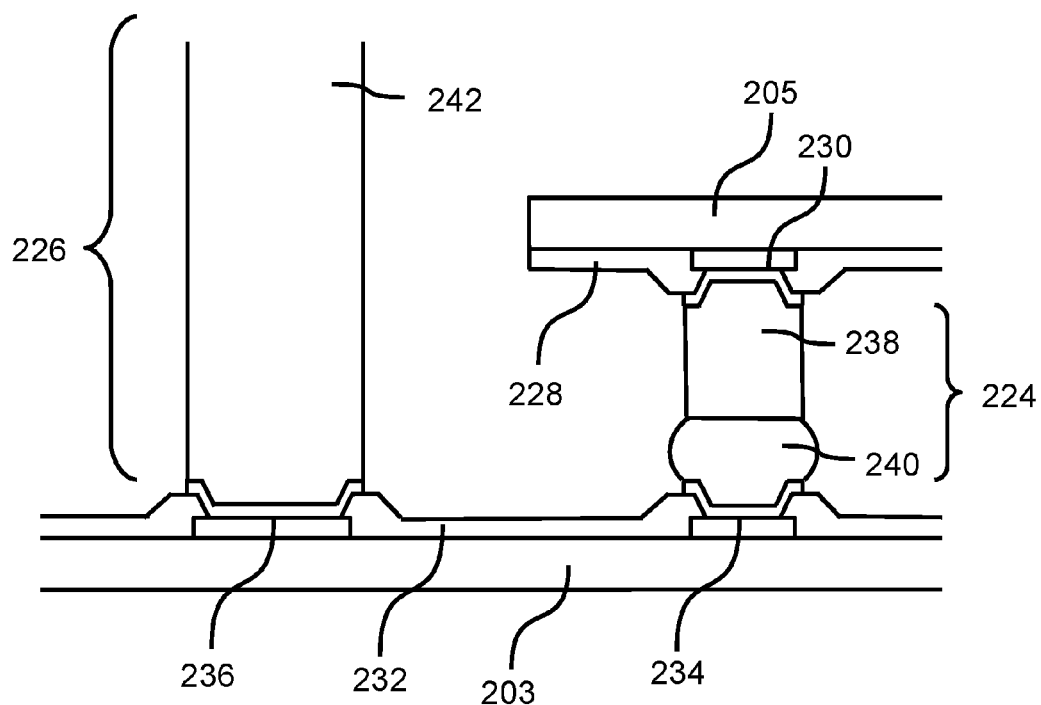
FIG. 2E shows an embodiment of the semiconductor package.

FIG. 2E shows an embodiment of the semiconductor package. With reference to FIG. 2D and FIG. 2E, in some embodiments, the semiconductor package 200D comprises a memory chip 205, a processor chip 203, a connection structure 224, and a connection structure 226. The memory chip having 205 has a passivation layer 228. The passivation layer 228 has a plurality of connection openings 230. Only one connection opening 230 is shown in FIG. 2E, but it is noted that there can be a plurality connection openings 230 in the passivation layer 228. The processor chip 203 has a passivation layer 232. The passivation layer 232 has a plurality of connection openings 234 and connection openings 236.

The connection structure 226 comprises a metal pillar 238 and a solder layer 240. The metal pillar 238 is connected to at least one of the passivation openings 230. The solder layer 240 is connected to at least one of the second passivation openings 234. The connection structure 236 comprises a metal via 242. The metal via 242 is connected to at least one of the connection openings 236. In some embodiments, a height of the metal via 242 is longer than a height of of the metal pillar 238. In some embodiments, an area of at least one of the connection openings 234 is smaller than an area of at least one of the connection openings 236.

Figure 2F:
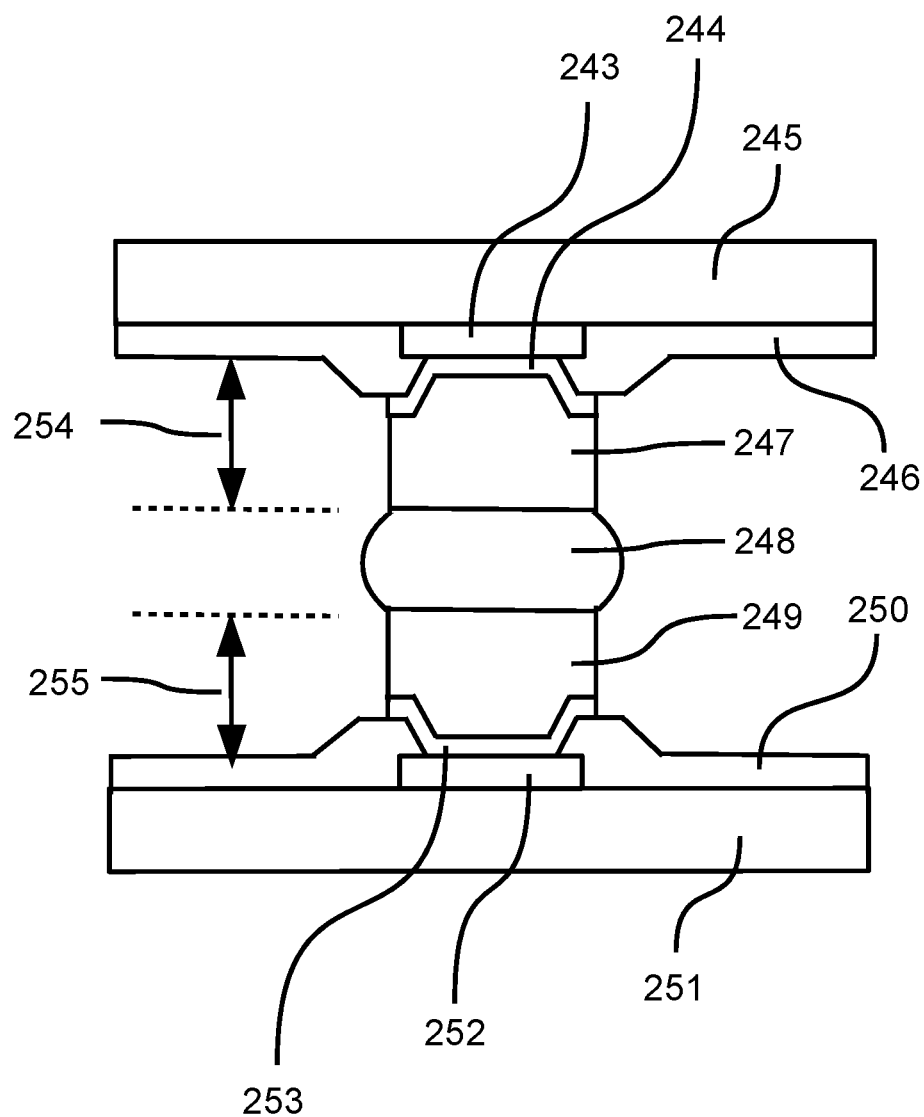
FIG. 2F shows an example of a connection between two dies.

FIG. 2F shows an example of a connection between two dies. With reference to FIG. 2F, a first die 245 and a second die 251 can be connected through a first metal pillar 247, a second metal pillar 249, and a solder bump 248. The first metal pillar 247 is connected to an first UBM (under bump metallization) structure 244. The second metal pillar 249 is connected to a second UMM structure 253. The first UBM structure 244 is connected to a first pad 243. The first pad 243 is located on the first die 245. The second UBM structure 253 is connected to a second pad 252. The second pad is located on the second die 251. A first passivation layer 246 is located on the fist die 245. A second passivation layer 250 is located on the second die 251. The first metal pillar 247 has a first height 254 and the second metal pillar 249 has a second height 255. In one example, the first height 254 is substantially the same as the second height 255. In one example, the first height 254 is greater than the second height 255.

Figure 2G:
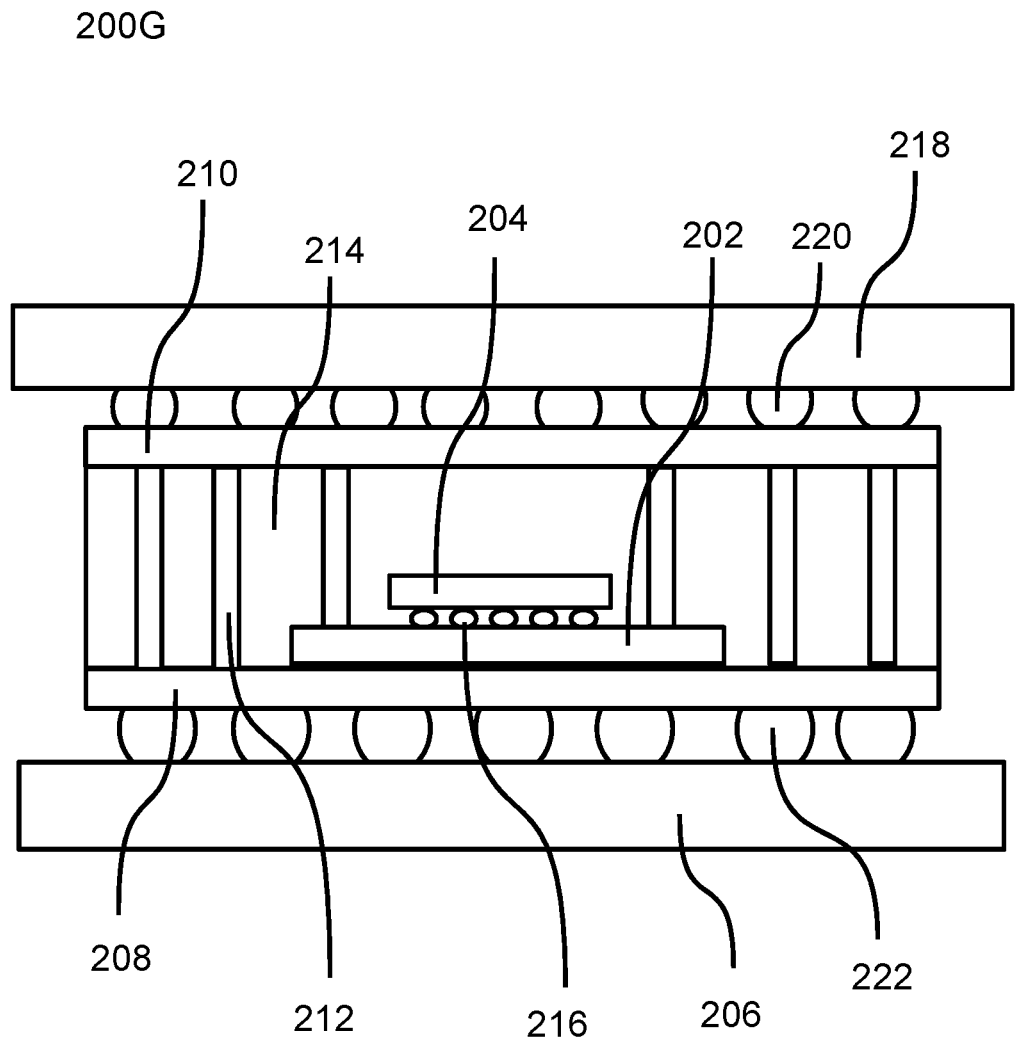
FIG. 2G shows another semiconductor package containing two memory modules.

FIG. 2G shows another semiconductor package containing two memory modules. The semiconductor package 200G has a processor 202, a memory module 204, and a memory module 218. The memory module 204 and the processor 202 are connected face-to-face. An active side of the processor 202 and an active side of the memory module 204 are directly connected through a connection structure 216.

The connection structure can contain a plurality of solder balls. The semiconductor package 200 can further comprise a redistribution layer (RDL) 210 and a redistribution layer (RDL) 208. A plurality of metal vias 212 are connected both to the RDL 210 and the RDL 208. The RDL 210 can have a plurality of sublayers so that it can provide space for metal traces to redistribute in it. The RDL 208 can have a plurality of sublayers so that it can provide space for metal traces to redistribute in it. The memory module 218 is connected to the RDL 210 through solder balls 220. The semiconductor package 200 can be further connected to a printed circuit board 206.

With reference to FIG. 2A, FIG. 2B, FIG. 2C, and FIG. 2D, in one embodiment, a partial structure of the semiconductor package 200D comprises a processor 202, a first connection structure CSL, a second connection structure CSS, and a first memory module 204. The first connection structure CSL comprises a plurality of first connection elements CEL.

The first connection structure CSL is connected to a first zone PZ of an active side of the processor 202. The second connection structure CSS comprises a plurality of second connection elements CES. The second connection structure CSS is connected to a second zone CZ of the active side of the processor 202. An active side of the first memory module 204 is connected to the second connection structure CSS. The first memory module 204 and the processor 202 are face-to-face connected. A path length PL of each of the first connection elements CEL is longer than a path length PS of each of the second connection elements CES.

In one example, the first memory module 204 is a Wide I/O memory module. In one example, the first connection elements CEL are metal vias. In one example, the second connection elements CES are solder balls. In one example, the semiconductor package 200D further comprises a second memory module 210. The second memory module is connected to the metal via 212. In one example, the second memory module 210 is an LPDDR memory. In one example, the semiconductor package 200D further comprises a molding material 214 surrounding the processor 204.

With reference to FIG. 2E, in one embodiment, a partial structure of the semiconductor package 200D comprises a first memory chip 205, a processor chip 203, a first connection structure 224, and a second connection structure 226. The first memory chip 205 has a first passivation layer 228. The first passivation layer 228 has a plurality of first connection openings 230. The processor chip 203 has a second passivation layer 232. The second passivation layer 232 has a plurality of second connection openings 234 and third connection openings 236. The first connection structure 224 comprises a metal pillar 238 and a solder layer 240. The metal pillar 238 is connected to at least one of the first passivation openings 230. The solder layer 240 is connected to at least one of the second passivation openings 234. The second connection structure 226 comprises a metal via 242. The metal via 242 is connected to at least one of the third connection openings 236. A height of the metal via 242 is longer than a height of of the metal pillar 238. An area of at least one of the second connection openings 234 is smaller than an area of at least one of the third connection openings 236.

Figure 3A:
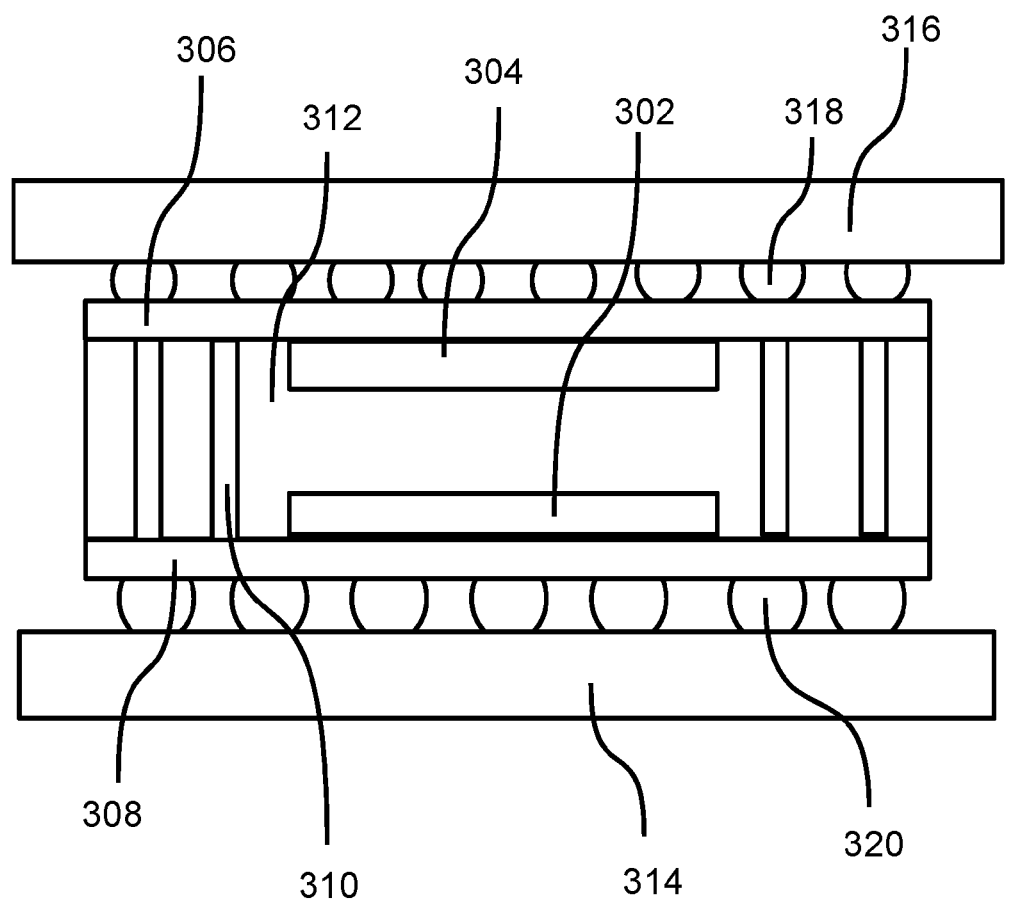
FIG. 3A shows an embodiment of the semiconductor package.
Figure 3B:
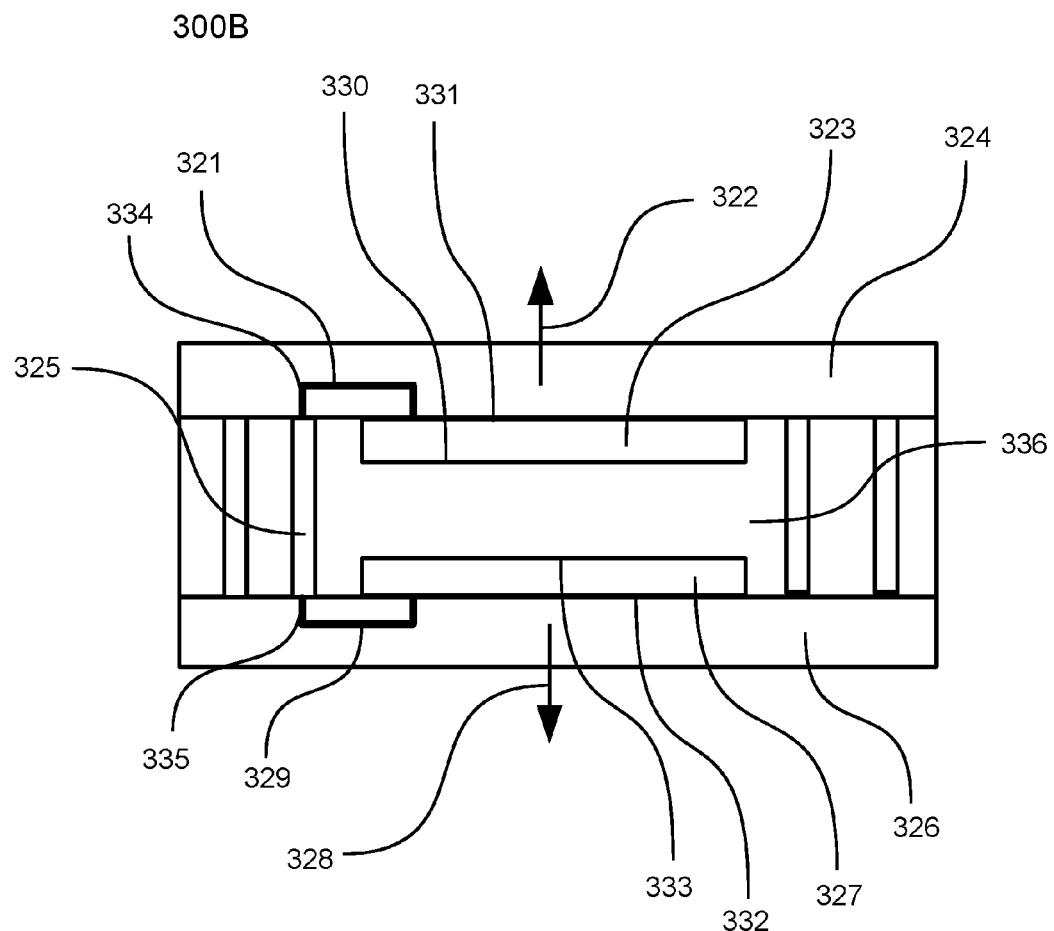
FIG. 3B shows another embodiment of the semiconductor package.
Figure 3C:
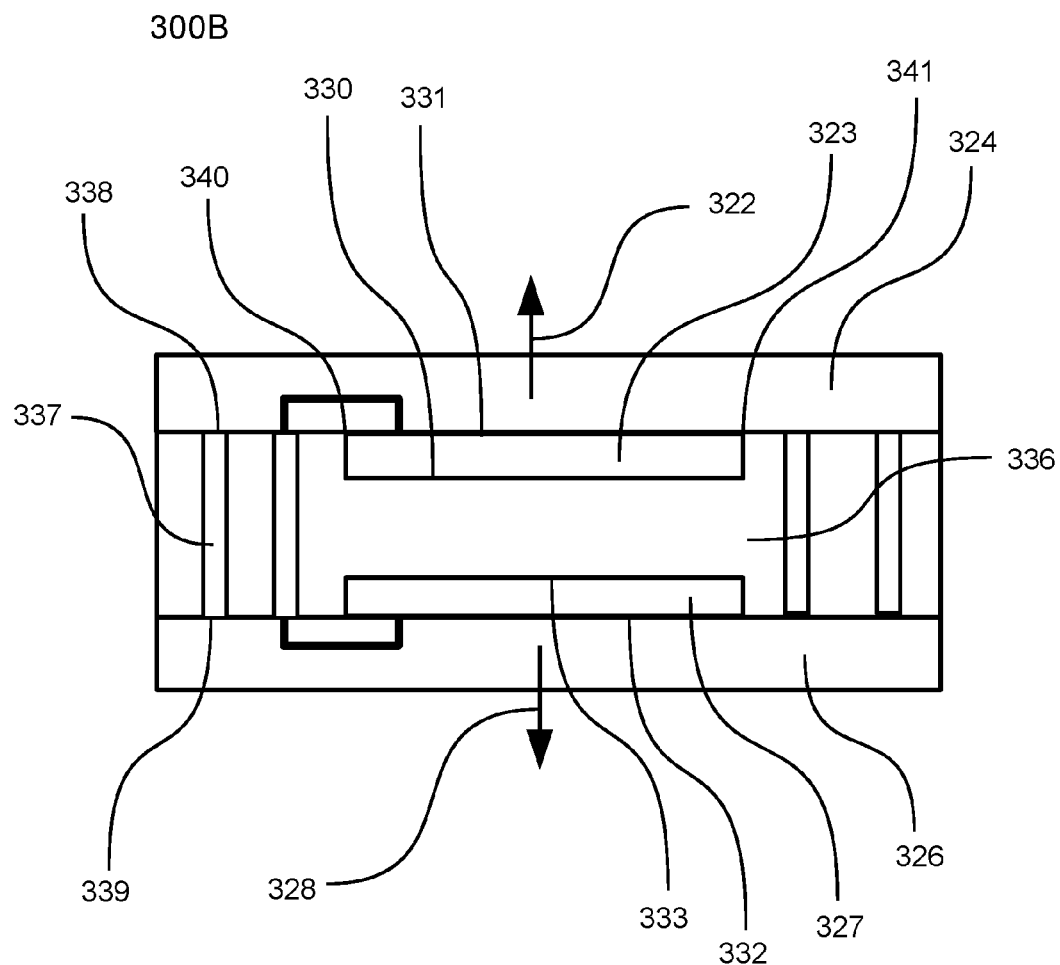
FIG. 3C shows another embodiment of the semiconductor package.
Figure 3D:
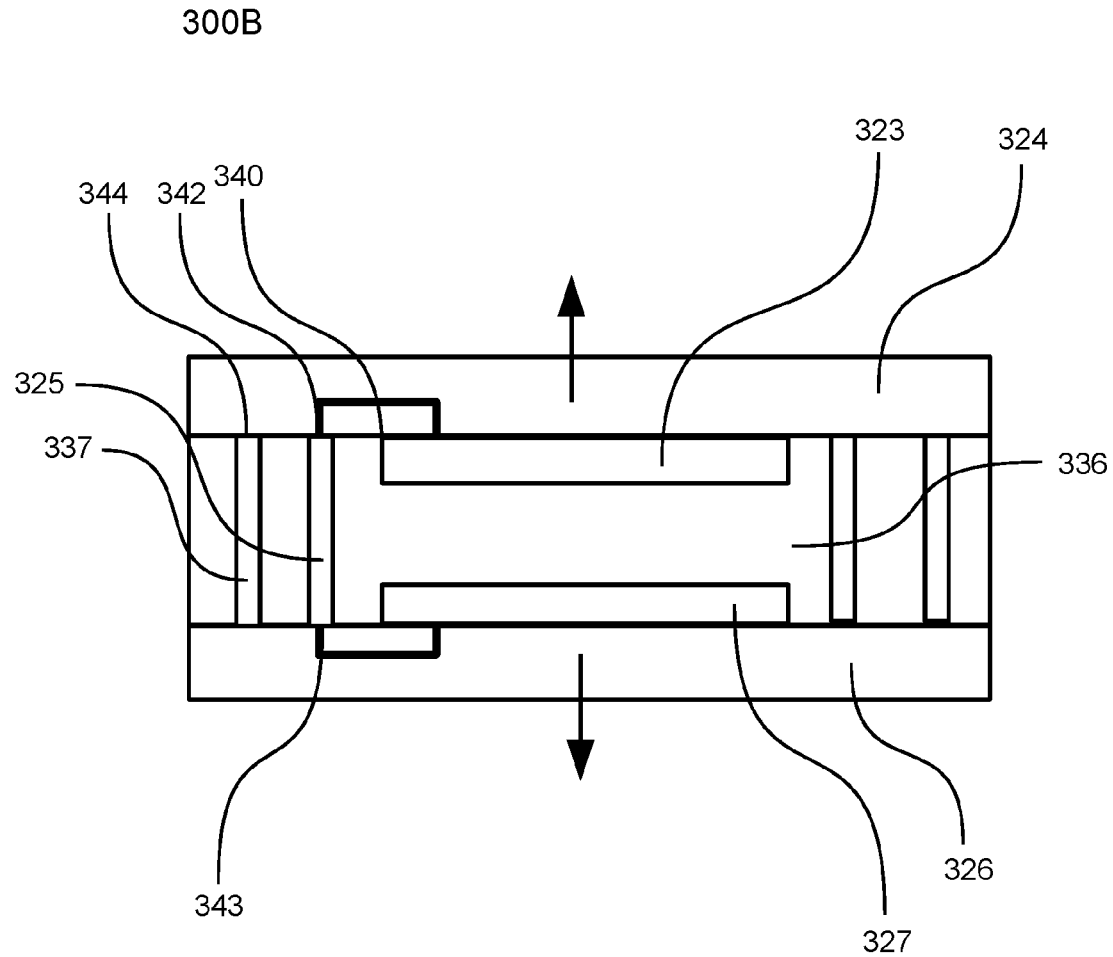
FIG. 3D shows another embodiment of the semiconductor package.
Figure 3E:
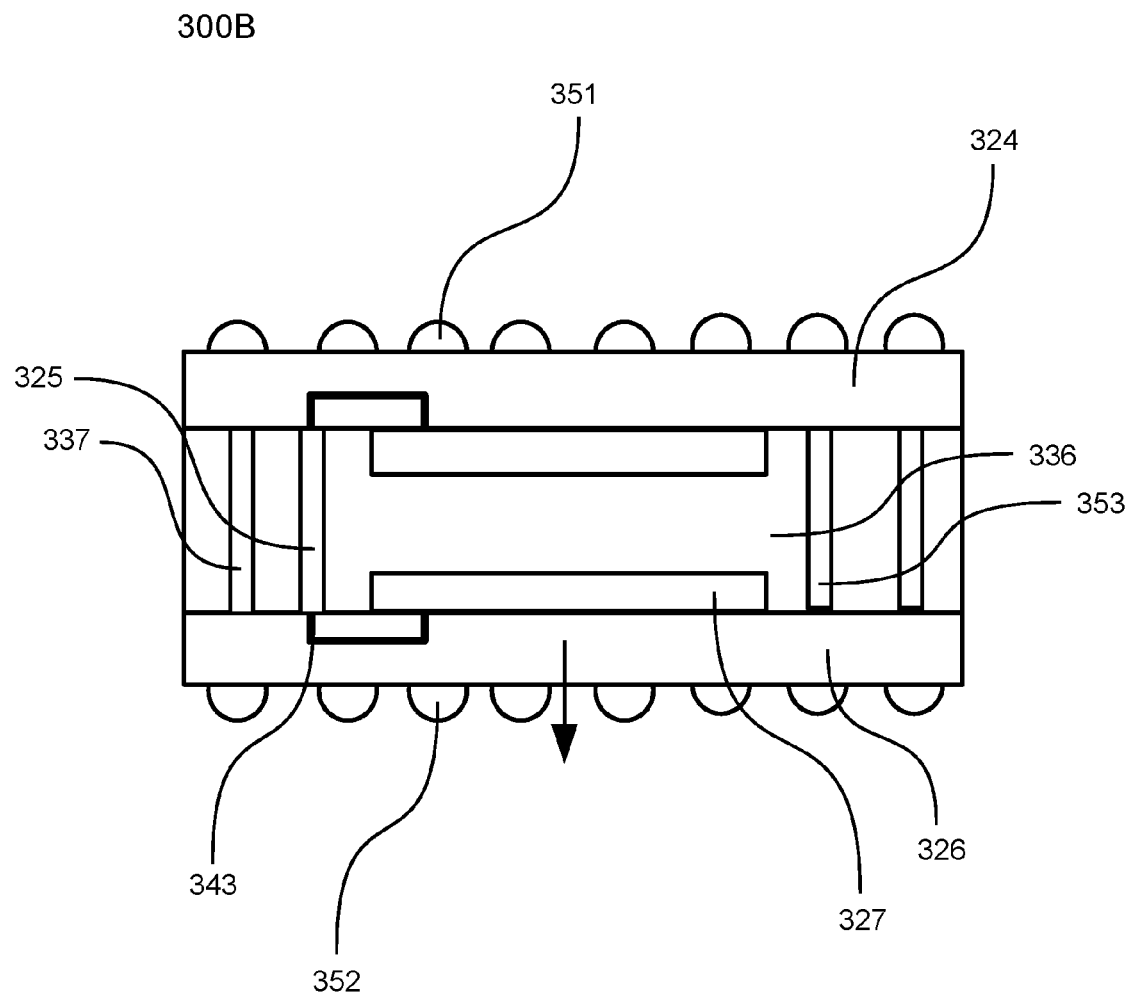
FIG. 3E shows another embodiment of the semiconductor package.
Figure 3F:
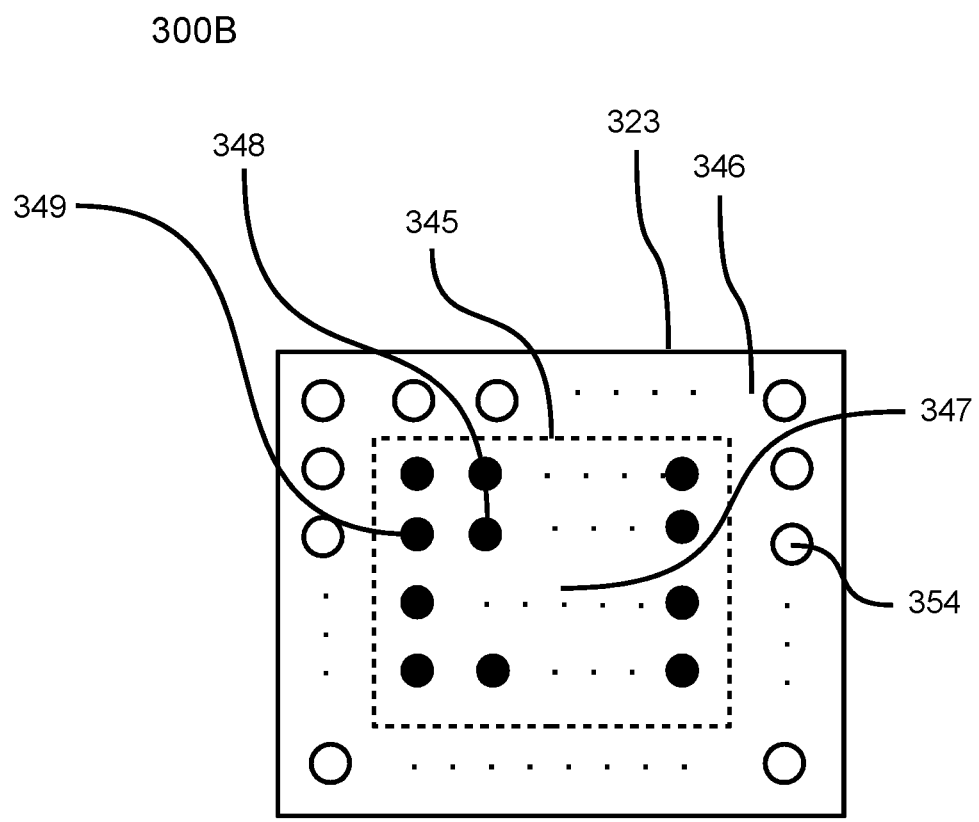
FIG. 3F shows an active surface of a die.
Figure 3G:
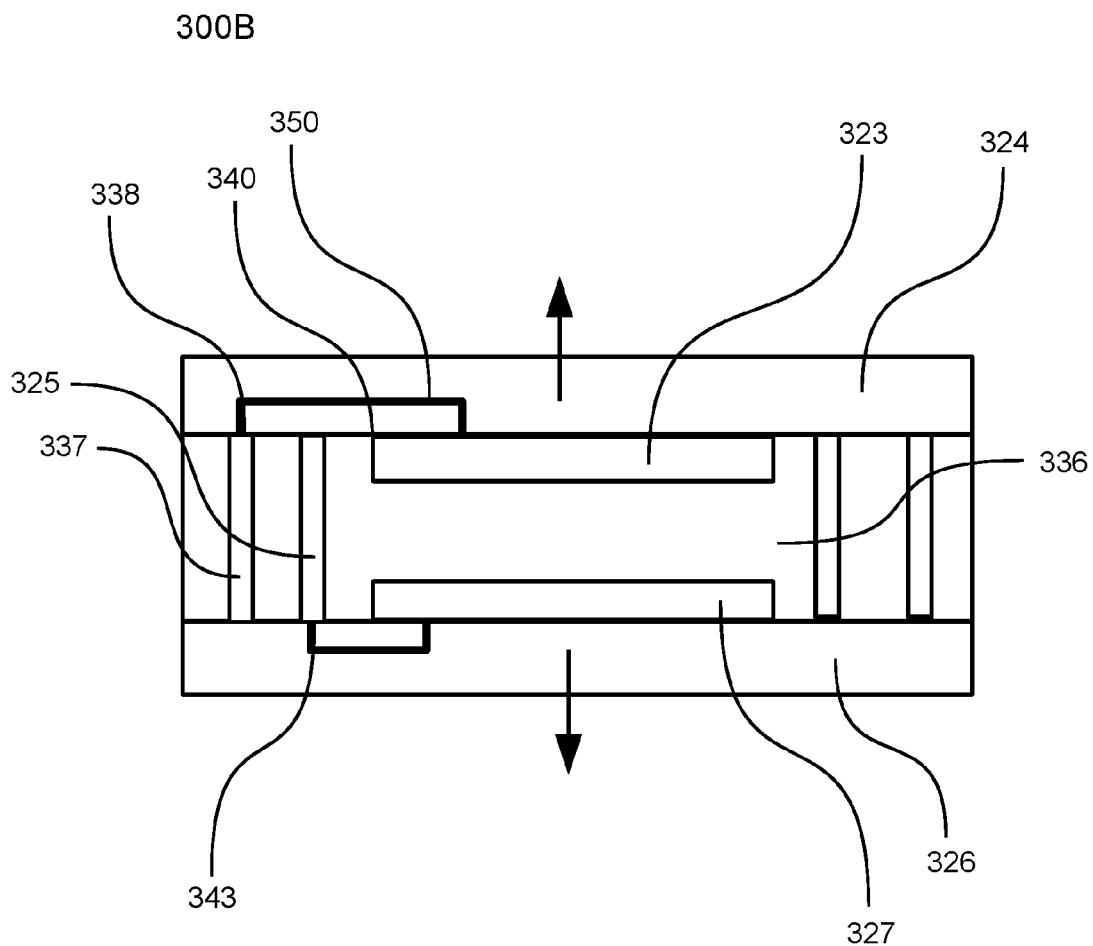
FIG. 3G shows another embodiment of the semiconductor package.
Figure 3H:
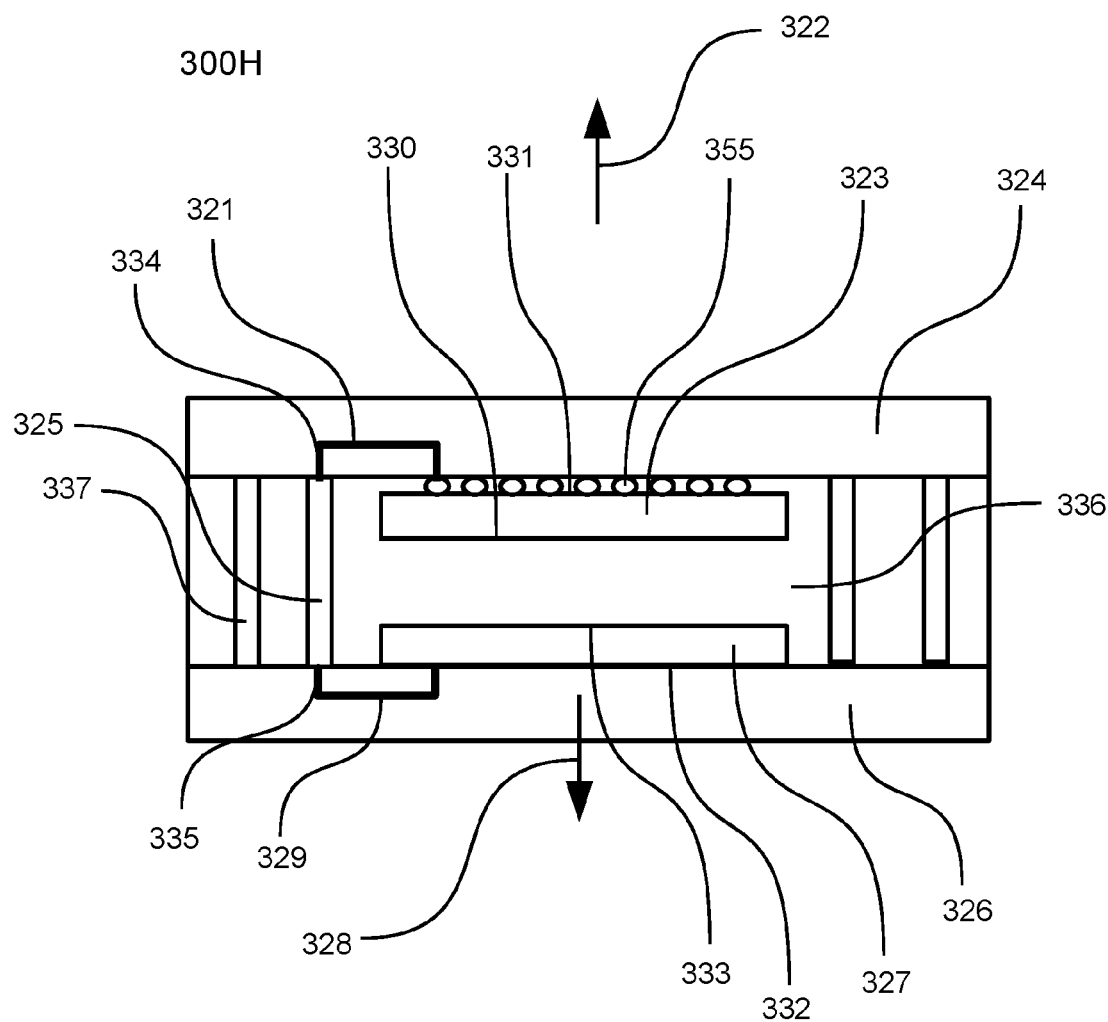
FIG. 3H shows another embodiment of the semiconductor package.
Figure 3I:
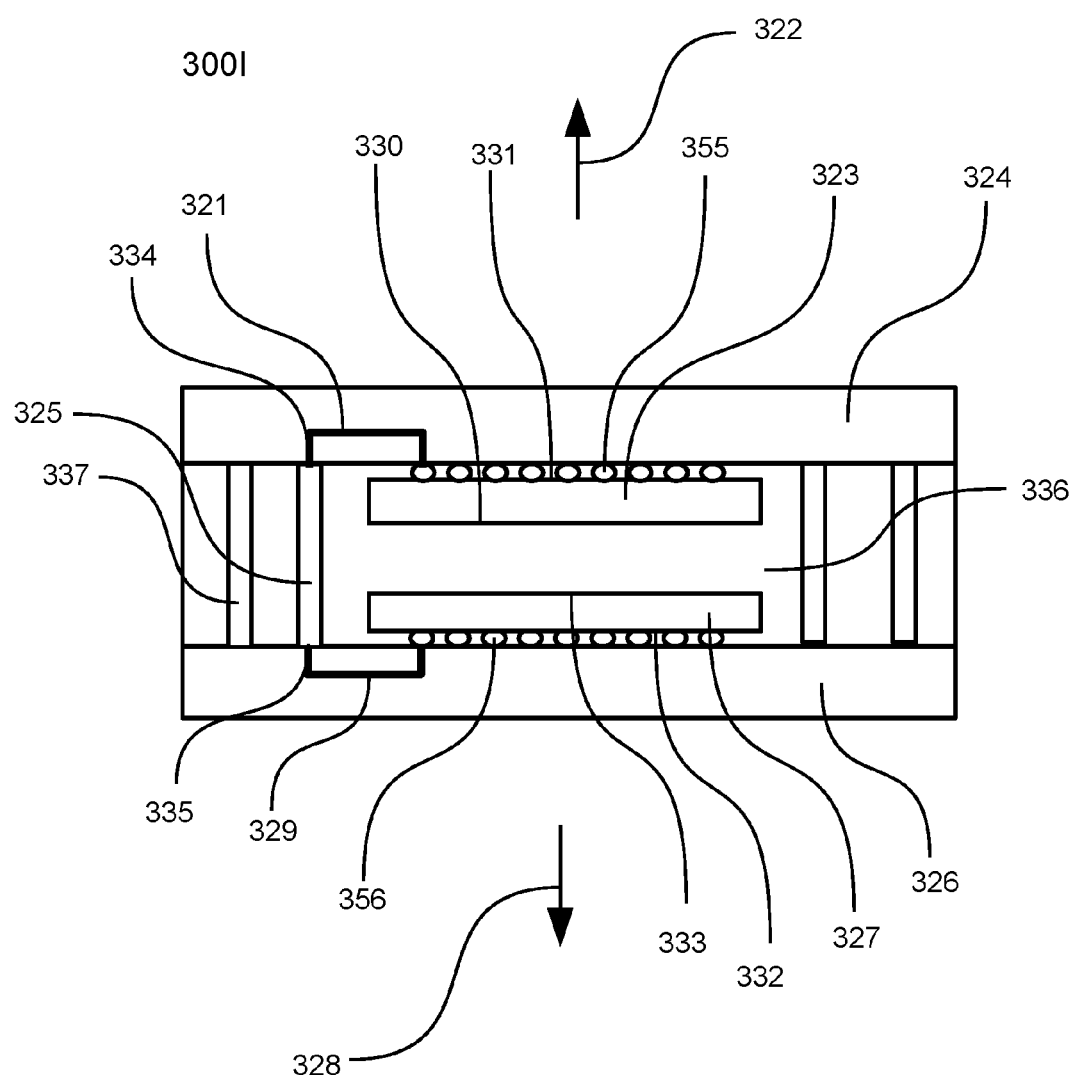
FIG. 3I shows another embodiment of the semiconductor package.

FIG. 3A shows an embodiment of the semiconductor package. FIG. 3B shows an embodiment of the semiconductor package. FIG. 3C shows an embodiment of the semiconductor package. FIG. 3D shows an embodiment of the semiconductor package. FIG. 3E shows an embodiment of the semiconductor package. FIG. 3F shows an active surface of a die. FIG. 3G shows an embodiment of the semiconductor package. FIG. 3H shows an embodiment of the semiconductor package. With reference to FIG. 3A, the semiconductor package 300A comprises a processor 302, a memory module 304, a redistribution layer 308, a redistribution layer 306, and metal vias 310. The redistribution layer 306 can be connected to a memory module 316 through connection elements 318.

The redistribution layer 308 can be connected to a printed circuit board 314. In some embodiments, the redistribution layer 308 can be connected to a substrate. The redistribution layer 306 can have multiple sublayers so that it can provide space for routings of metal traces. The redistribution layer 308 can have multiple sublayers so that it can provide space for routings of metal traces.

The processor 302 can access the memory module 304 through the metal traces in the redistribution layer 308, the metal vias 310, and the metal traces in the redistribution layer 306. The processor 302 can access the memory module 316 through the metal traces in the redistribution layer 308, the metal vias 310, the metal traces in the redistribution layer 306, and the connection elements 318. In some embodiments, the memory module 304 can be a Wide IO memory. In some embodiments, the memory module 316 can be an LPDDR memory module. A molding material 312 can be filled between the redistribution layer 306 and the redistribution layer 308.

In one embodiment, a semiconductor package 300B comprises a first die 323, a second die 327, a first redistribution structure 324, a second redistribution structure 326, and a metal via 325.

The first die 323 has a first active surface 331 and a first non-active surface 330. The first active surface 331 faces a first direction 322. The second die 327 has a second active surface 332 and a second non-active surface 333. The second active surface 332 faces a second direction 328. The first direction 322 is opposite to the second direction 328. The first redistribution structure 324 is connected to the first active surface 331 of the first die 323.

The first redistribution structure 324 comprises a first metal trace 321. The second redistribution structure 326 is connected to the active surface 332 of the second die 327. The second redistribution structure 326 comprises a second metal trace 329. The metal via 325 has a first end 334 and a second end 335. The first end 334 of the metal via 325 is connected to the first redistribution structure 324. The second end 335 of the metal via is connected to the second redistribution structure 326.

The first end 334 of the metal via 325 is connected to the first active surface 331 of the first die 323 through the first metal trace 321. The second end 335 of the metal via 325 is connected to the second active surface 332 of the second die 327 through the second metal trace 329. No solder bumps are located between the first redistribution structure 324 and the first die 323 and no solder bumps are located between the second redistribution structure 326 and the second die 327.

In one example, the semiconductor package further comprises a molding material 336 filled between the first non-active surface 330 of the first die 323 and the second non-active surface 333 of the second die 327.

In one example, the metal via 325 is a first metal via 325 and the semiconductor package 300B further comprises a second metal via 337. The second metal via 337 has a third end 338 and a fourth end 339. The third end 338 of the second metal via 337 is connected to the first redistribution structure 324. The fourth end 339 of the second metal via 337 is connected to the second redistribution structure 326. The second metal via 337 is on a same side of the first die 323 and the second dies 327 as the first metal via 325.

In one example, the first die 323 has a first side 340 and a second side 341, The first end 334 of the first metal via 325 is connected to the first redistribution structure 324 at a first position 342. The third end of the second metal via 337 is connected to the first redistribution structure 324 at a third position 344. The first distance between the first position 342 and the first side 340 of the first die 323 is shorter than a second distance between the third position 344 and the first side 340 of the first die 323.

In one example, the first die 323 has a central area 345, a side area 346, and a central location 347. The first metal trace 321 is connected to the first die 323 at a first location 345 on the side area 346.

In one example, the first redistribution structure 324 comprises a second metal trace 350. The second metal trace 350 is connected between the third end 338 of the second metal via 337 and a second location 349 on the side area 346. A third distance between the first location 349 of the side area 346 and the central location 347 of the first die 323 is greater than a fourth distance between the second location 348 of the side area 346 and the central location 347 of the first die 323.

In one example, the semiconductor package 300B further comprises a plurality of solder bumps 351 formed on the first redistribution structure 324. In one example, the semiconductor package 300B further comprises a plurality of solder bumps 352 formed on the second redistribution structure 326.

In one example, the semiconductor package 300B further comprises a plurality of metal vias 353, the metal vias 353 being connected to the first redistribution structure 324 at a plurality of connection positions 354, the connection positions 354 substantially surrounding the side area 346 of the first die 323.

In one embodiment, a semiconductor package 300H comprises a first die 323, a second die 327, a first redistribution structure 324, a second redistribution structure 326, and a metal via 325.

The first die 323 has a first active surface 331 and a first non-active surface 330. The first active surface 331 faces a first direction 332. The second die 327 has a second active surface 332 and a second non-active surface 333. The second active surface 332 faces a second direction 328. The first direction 322 is opposite to the second direction 328. The first redistribution structure 324 is connected to the first active surface 331 of the first die 323. The first redistribution structure 324 comprises a first metal trace 321.

The second redistribution structure 236 is connected to the active surface 332 of the second die 327. The second redistribution structure 326 comprises a second metal trace 329. The metal via 325 has a first end 334 and a second end 335. The first end 334 of the metal via 325 is connected to the first redistribution structure 324. The second end 335 of the metal via 325 is connected to the second redistribution structure 326. The first end 334 of the metal via 325 is connected to the first active surface 331 of the first die 324 through the first metal trace 321. The second end 335 of the metal via 325 is connected to the second active surface 332 of the second die 327 through the second metal trace 329.

A plurality of solder bumps 355 are located between the first redistribution structure 324 and the first die 323. No solder bumps are located between the second redistribution structure 326 and the second die 327.

In one embodiment, a semiconductor package 300I comprises a first die 323, a second die 327, a first redistribution structure 324, a second redistribution structure 326, and a metal via 325.

The first die 323 has a first active surface 331 and a first non-active surface 330. The first active surface 331 faces a first direction 322.
The second die 327 has a second active surface 332 and a second non-active surface 333. The second surface 332 faces a second direction 328. The first direction 322 is opposite to the second direction 328.

The first redistribution structure 324 is connected to the first active surface 331 of the first die 323. The first redistribution structure 324 comprises a first metal trace 321. The second redistribution structure 326 is connected to the active surface 332 of the second die 327. The second redistribution structure 326 comprises a second metal trace 329. The metal via 325 has a first end 334 and a second end 335. The first end 334 of the metal via 325 is connected to the first redistribution structure 324. The second end 335 of the metal via 325 is connected to the second redistribution structure 326. The first end 334 of the metal via 325 is connected to the first active surface 331 of the first die 323 through the first metal trace 321. The second end 335 of the metal via 325 is connected to the second active surface 332 of the second die 327 through the second metal trace 329.

A plurality of solder bumps 355 are located between the first redistribution structure 324 and the first die 323. A plurality of solder bumps 356 are located between the second redistribution structure 326 and the second die 327.

Figure 4:
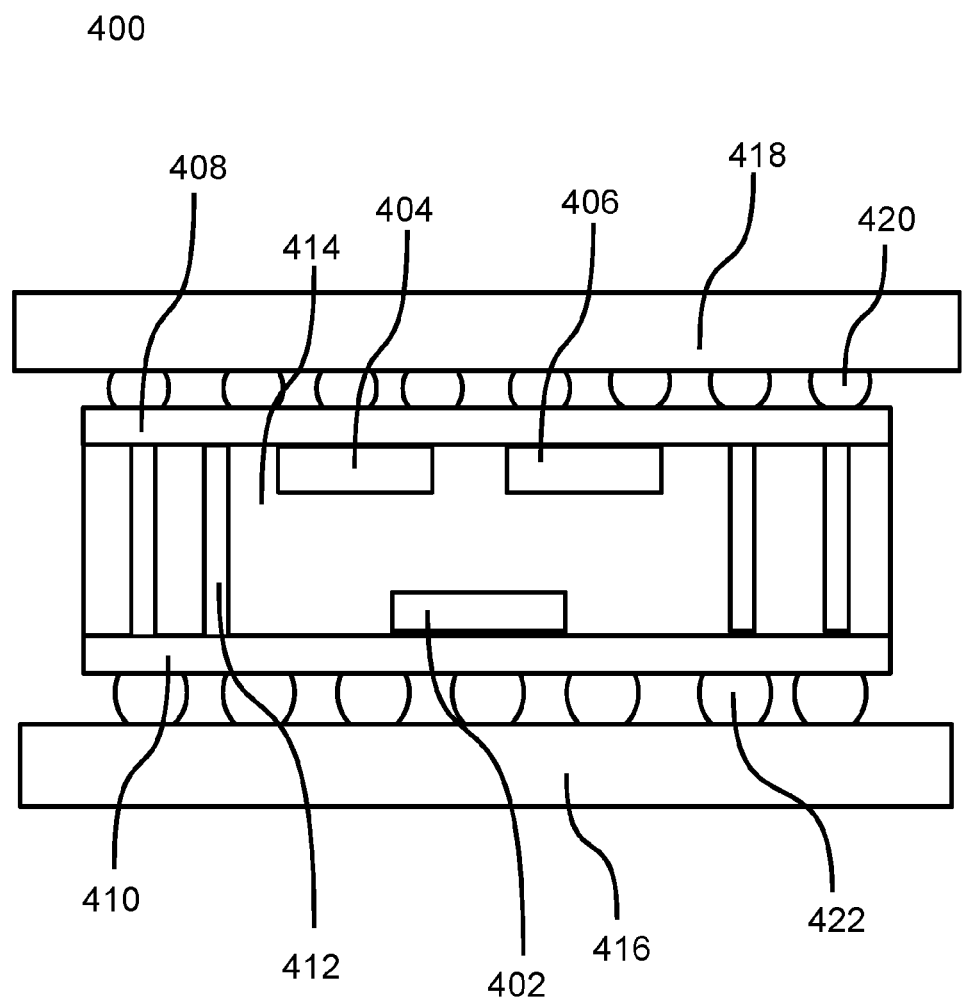
FIG. 4 shows another embodiment of the semiconductor package.

FIG. 4 shows an embodiment of the semiconductor package. The semiconductor package 400 comprises a processor 402, a memory module 404, a memory module 406, a redistribution layer 408, a redistribution layer 410, metal vias 412. The processor 410 is connected to the redistribution layer 410. The memory module 404 is connected to the redistribution layer 408.

The memory module 406 is connected to the redistribution layer 408. The memory module 404 and the memory module 406 can be located side by side. The metal vias are connected between the redistribution layer 408 and the redistribution layer 410. The memory module 404 and the memory module 406 can be the same type of memory. For example, the memory module 406 and the memory module 408 can both be Wide IO memories. The redistribution layer 408 can be further connected to a memory module 418 through connection elements 420.

The memory module 410 can be further connected to a printed circuit board 416 through connection elements 422. In some embodiments, the memory module 410 can be connected to a substrate. The memory module 418 can be an LPDDR memory. The processor 402 can access the memory module 404 and the memory module 406 through the redistribution layer 410, the metal vias 412, and the redistribution layer 408. The processor can also access the memory module 418 through the redistribution layer 410, the metal vias 412, the redistribution layer 408, and the connection elements 420.

Figure 5:
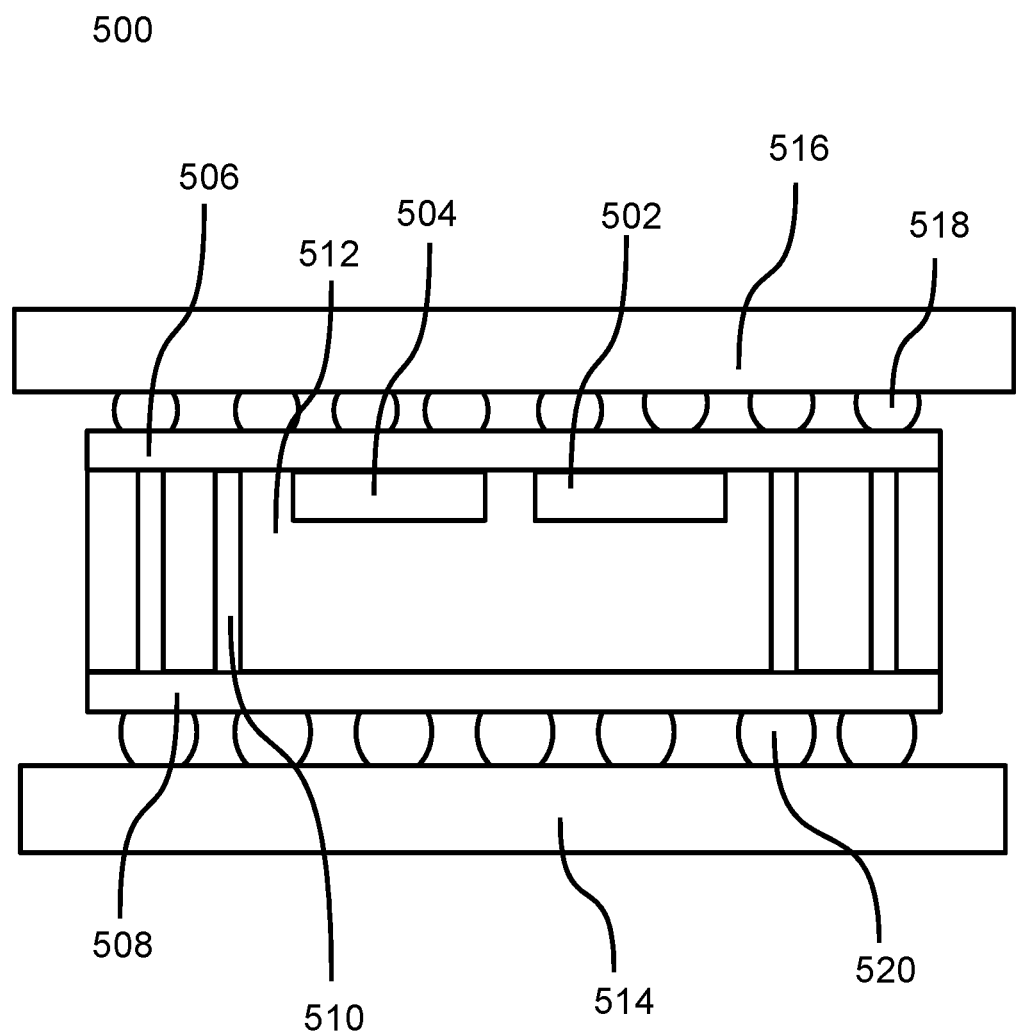
FIG. 5 shows another embodiment of the semiconductor package.

FIG. 5 shows an embodiment of the semiconductor package. The semiconductor package 500 comprises a processor 502, a memory module 504, a redistribution layer 506, a redistribution layer 508, and metal vias 510. The processor 502 is connected to the redistribution layer 506.

The memory module 504 is connected to the redistribution layer 506. In this embodiment, the processor 502 and the memory module 504 are disposed side by side. The communication between the processor 502 and the memory module can be made through metal traces in the redistribution layer 506. The redistribution layer 506 can be further connected to a memory module 516 through connection elements 518. In some embodiments, the memory module 504 is a Wide IO memory. In some embodiments, the memory module 518 is an LPDDR memory.

A molding material 512 can be filled between the redistribution layer 506 and the redistribution layer 508. The redistribution layer 508 can be further connected to a printed circuit board 514 through connection elements 520. In some embodiments, the redistribution layer 508 can be connected to a substrate. The processor 502 can access the memory module 504 through metal traces in the redistribution layer 506. The processor 502 can also access the memory module 516 through the metal traces in the redistribution layer 506 and the connection elements 518.

Figure 6:
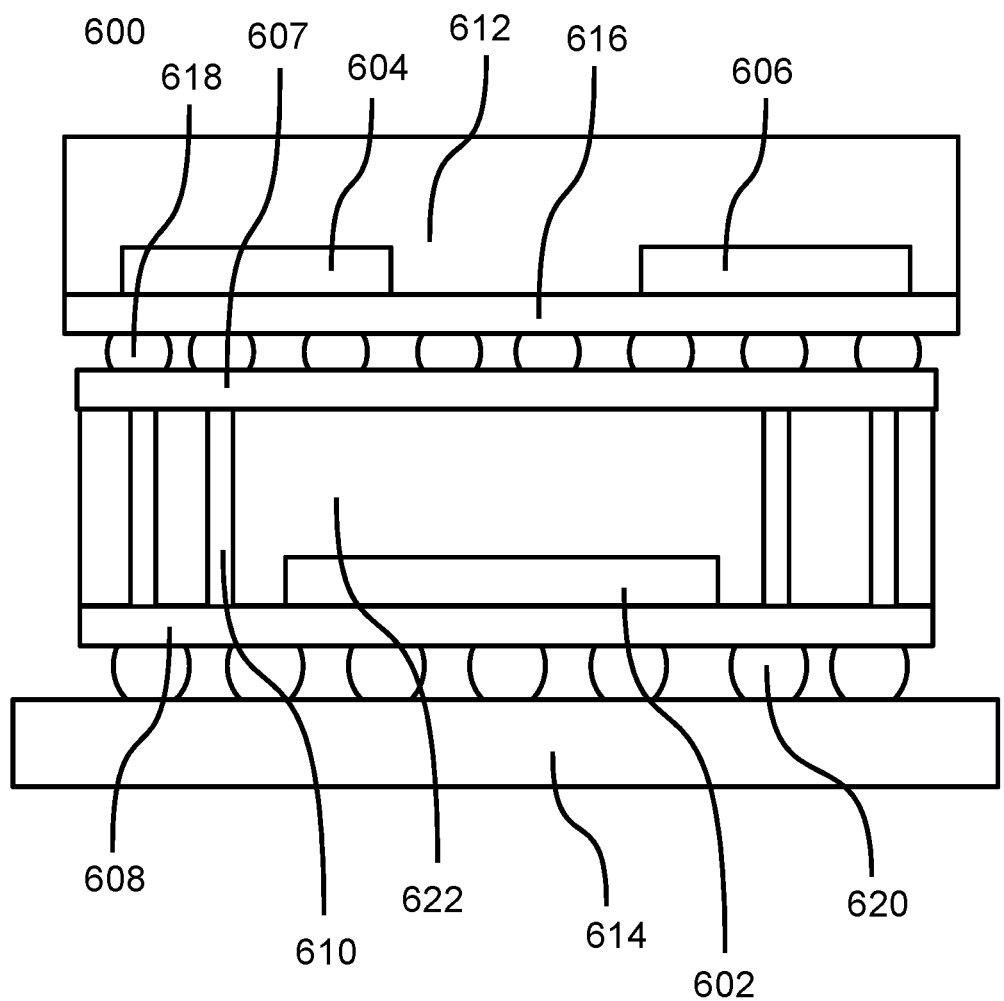
FIG. 6 shows another embodiment of the semiconductor package.

FIG. 6 shows an embodiment of the semiconductor package. The semiconductor package 600 comprises a processor 602, a memory module 602, a memory module 604, a redistribution layer 607, a redistribution layer 608, a redistribution layer 616, metal vias 610, connection elements 618, and connection elements 620.

The processor 602 is connected to the redistribution layer 608. The metal vias are connected between the redistribution layer 607 and the redistribution layer 608. The redistribution layer 607 is connected to the redistribution layer 616 through the connection elements 618. The redistribution layer 608 can be further connected to the printed circuit board 614 through the connection elements 620. In some embodiments, the the redistribution layer 608 can be connected to the printed circuit board 614. In some embodiments, the memory module 604 and the memory module 606 are Wide IO memories.

In some embodiments, the memory module 604 and the memory module 606 are LPDDR memories. In some embodiments, the memory module 604 is a Wide IO memory and the memory module 606 is an LPDDR memory. The processor 602 can access the memory module 602 and the memory module 604 through the redistribution layer 608, the metal vias 610, the redistribution layer 607, the connection elements 618, and the redistribution layer 616. A molding material 622 can be filled between the redistribution layer 607 and the redistribution layer 608. A molding material 612 can be used to encapsulate the memory module 604 and the memory module 606.

Figure 7:
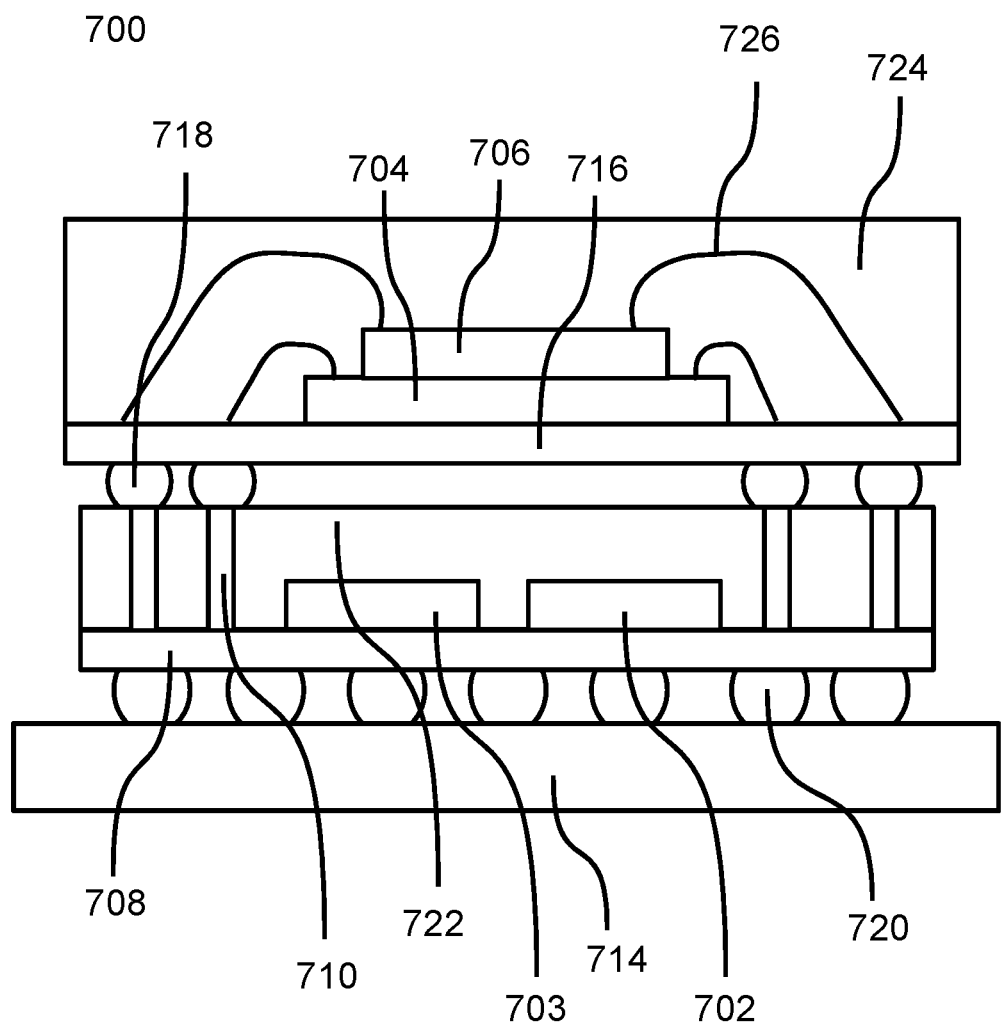
FIG. 7 shows another embodiment of the semiconductor package.

FIG. 7 shows an embodiment of the semiconductor package. The semiconductor package 700 comprises a memory module 702, a memory module 703, a memory module 704, a memory module 706, a redistribution layer 708, metal vias 710, and connection elements 718. The memory module 702 is connected to the redistribution layer 708. The memory module 703 is connected to the redistribution layer 708. The memory module 704 can be a die. The memory module 706 can be another die. The memory module 704 and the memory module 706 can be stacked on a substrate 716. The memory module 704 and the memory module 706 can communicate with the substrate 716 through bonding wires 726.

The substrate 716 is connected to the metal vias 710 through the connection elements 718. The redistribution layer 708 can be further connected to a printed circuit board 714. In some embodiments, the redistribution layer 708 can be connected to another substrate. In some embodiments, the redistribution layer 708 can be connected to another redistribution layer. In some embodiments, the memory module 702 and the memory module 703 are Wide IO memories. In some embodiments, the memory module 704 and the memory module 706 are LPDDR memories.

Figure 8A:
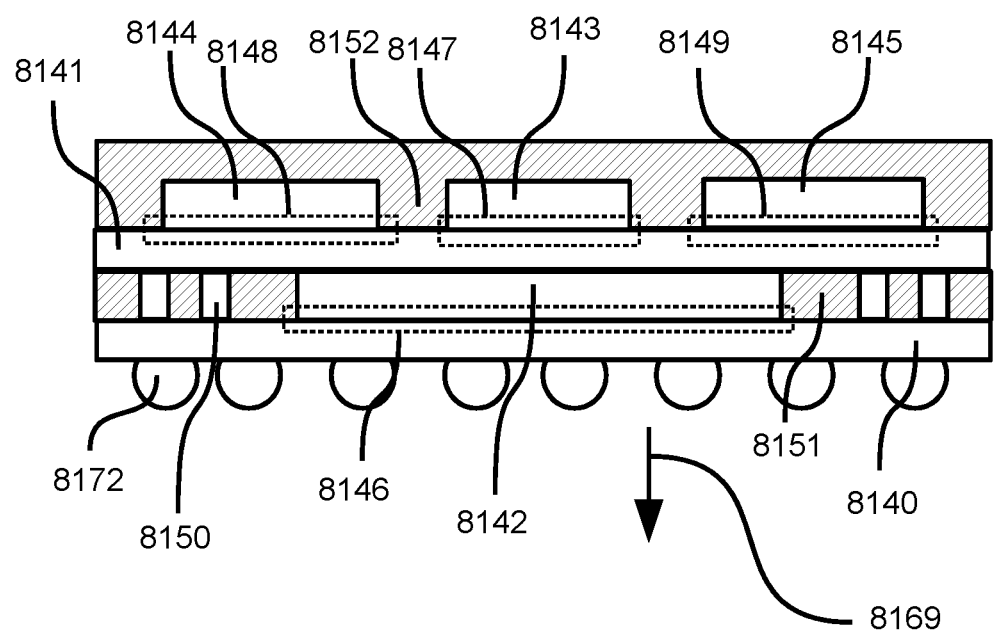
FIG. 8A shows another embodiment of the semiconductor package.
Figure 8B:
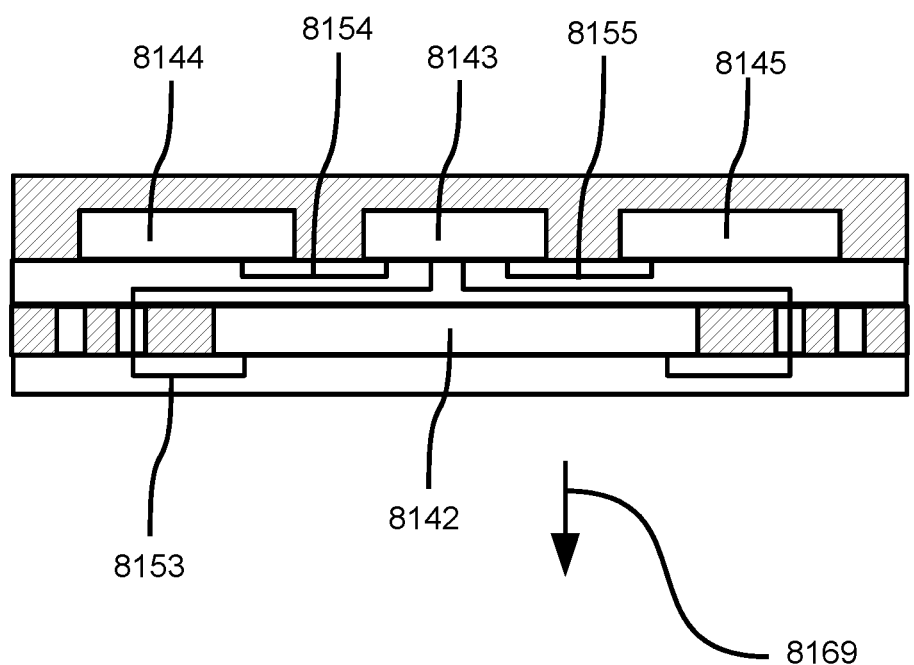
FIG. 8B shows another embodiment of the semiconductor package.

FIG. 8A shows an embodiment of the semiconductor package. FIG. 8B shows an embodiment of the semiconductor package. In one embodiment, a semiconductor package 800A comprises a first redistribution structure 8140, a second redistribution structure 8141, a plurality of metal vias 8150, a first connection structure 8146, a second connection structure 8147, a third connection structure 8148, a fourth connection structure 8149, a processor 8142, a memory interface die 8143, a first memory die 8144, and a second memory die 8145. The plurality of metal vias 8150 are connected between the first redistribution structure 8140 and the second redistribution structure 8141. A processor 8142 is connected to the first redistribution structure 8140 through the first connection structure 8146.

The memory interface die 8143 is connected to the second redistribution structure 8141 through the second connection structure 8147. The first memory die 8144 is connected to the second redistribution structure 8141 through the third connection structure 8148. The second memory die 8145 is connected to the second redistribution structure 8141 through the fourth connection structure 8149. A first data bus 8153 is formed between the processor 8142 and the memory interface die 8143. A second data bus 8154 is formed between the memory interface die 8143 and the first memory die 8144. A third data bus 8155 is formed between the memory interface die 8143 and the second memory die 8145.

In one example, a plurality of solder bumps 8173 are connected to the first redistribution structure. In one example, a molding material 8151 is filled between the first redistribution structure 8140 and the second redistribution structure 8141. In one example, a molding material 8152 is disposed between the memory interface die 8143 and the first memory die 8144. In one example, a molding material 8152 is disposed between the memory interface die 8143 and the second memory die 8145.

In one example, no data bus is formed between the first memory die 8144 and the processor 8142. In one example, no data bus is formed between the second memory die 8145 and the processor 8142. In one example, the first connection structure 8146 does not have a solder bump. In one example, the second connection structure 8147 does not have a solder bump.

In one example, the third connection structure 8148 does not have a solder bump. In one example, the fourth connection structure 8149 does not have a solder bump. In one example, the first data bus 8153 has a first bus width, the second data bus 8154 has a second bus width, the third data bus 8155 has a third data width, and the second bus width is different from the third bus width. In one example, a first active surface of the processor 8142, a second active surface of the first memory die 8144, and a third active surface of the second memory die 8145, face a same direction 8169.

Figure 8C:
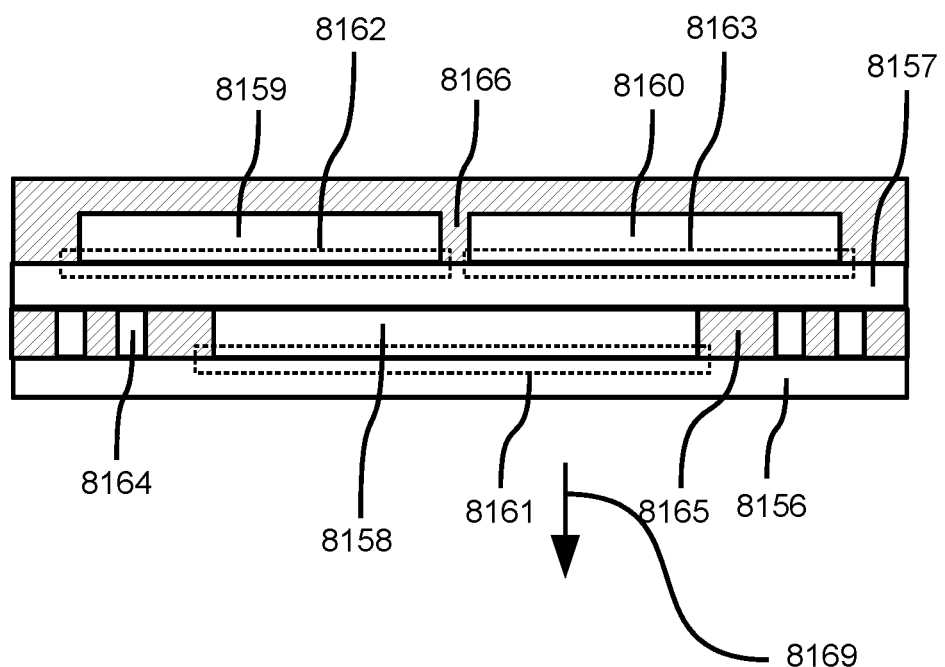
FIG. 8C shows another embodiment of the semiconductor package.
Figure 8D:
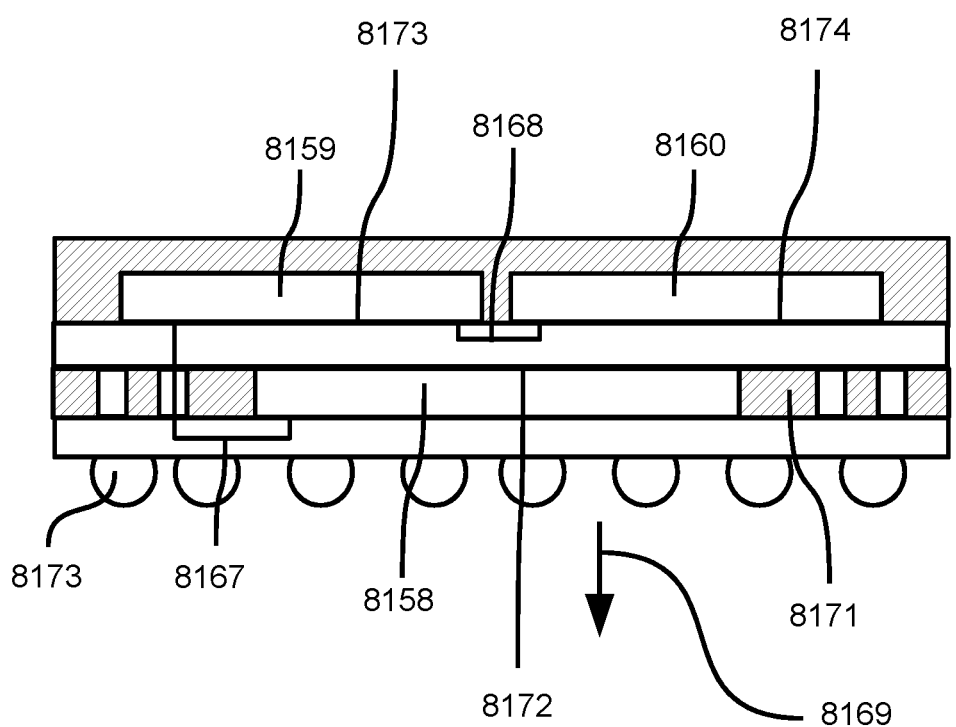
FIG. 8D shows another embodiment of the semiconductor package.
Figure 8E:
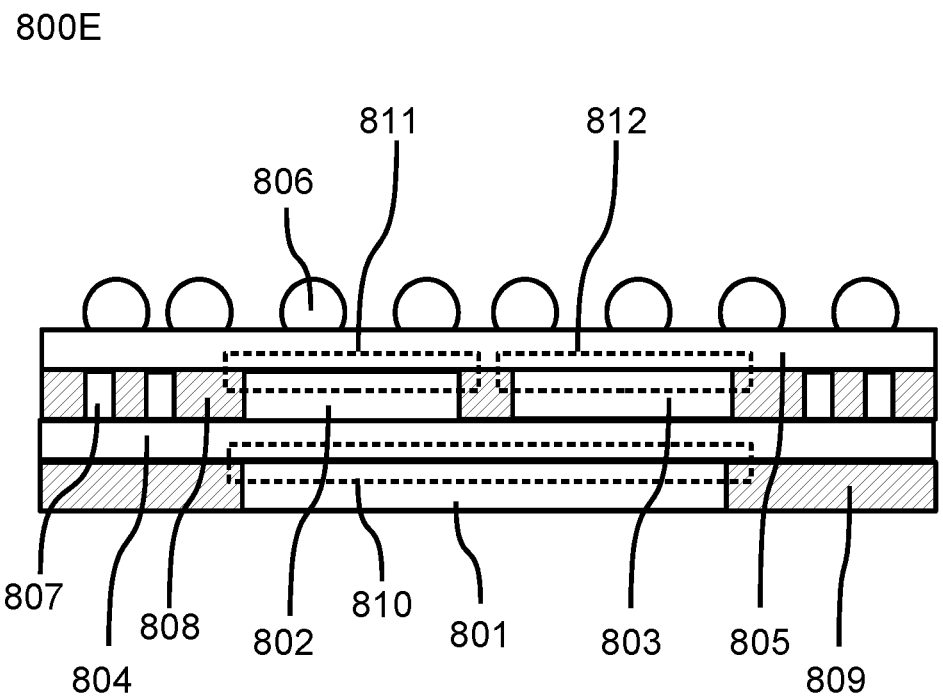
FIG. 8E shows another embodiment of the semiconductor package.

FIG. 8E shows an embodiment of the semiconductor package. The semiconductor package 800E comprises a processor 801, a memory module 802, a memory module 803, a redistribution layer 804, a redistribution layer 805, metal vias 807. The metal vias 807 are electrically connected to the redistribution layer 804 and the redistribution layer 805. The metal vias can help to transmit signals or power levels between the redistribution layer 804 and the redistribution layer 805.

An active side of the processor 801 is connected to the redistribution layer 804 through a connection structure 810. The connection structure 810 help to connect IO pads of the processor 801 to metal traces in the redistribution layer 804. In some embodiments, the connection structure 810 does not contain a solder material. An active side of the memory module 802 is connected to the redistribution layer 805 through a connection structure 811. The connection structure

811 help to connect IO pads of the memory module 802 to metal traces in the redistribution layer 805. In some embodiments, the connection structure 811 does not contain a solder material.

With reference to FIG. 8E, an active side of the memory module 803 is connected to the redistribution layer 805 through a connection structure 812. The connection structure 812 help to connect IO pads of the memory module 803 to metal traces in the redistribution layer 805. In some embodiments, the connection structure 812 does not contain a solder material. In some embodiments, a molding material 809 is disposed on a side of the redistribution layer 804. The molding material 809 surrounds four side walls of the processor 801. In some embodiments, the molding material 809 does not cover a non-active side of the processor 801.

In some embodiments, a molding material 808 is filled between the redistribution layer 804 and the redistribution layer 805. In some embodiments, the molding material 808 surrounds four side walls of the memory module 802 and four side walls of the memory module 803. In some embodiments, the molding material 808 does not cover a non-active side of the memory module 802. In some embodiments, the molding material 808 does not cover a non-active side of the memory module 803.

In some embodiments, no metal vias are embedded in the molding material 809. The processor 801 can access the memory module 802 through the redistribution layer 804, the metal vias 807, the redistribution layer 805, and the connection structure 811. The processor 801 can access the memory module 803 through the redistribution layer 804, the metal vias 807, the redistribution layer 805, and the connection structure 812.

With reference to FIG. 8E, in some embodiments, the non-active side of the memory module 802 is not electrically connected to the redistribution layer 805. In some embodiments, the non-active side of the memory module 803 is not electrically connected to the redistribution layer 805. In some embodiments, the non-active side of the processor 801 is not electrically connected to the redistribution layer 804. In some embodiments, a plurality of connection elements 806 are connected to the redistribution layer 805 so that the redistribution layer 805 can further connect to a printed circuit board through the connection elements 806.

Figure 8F:
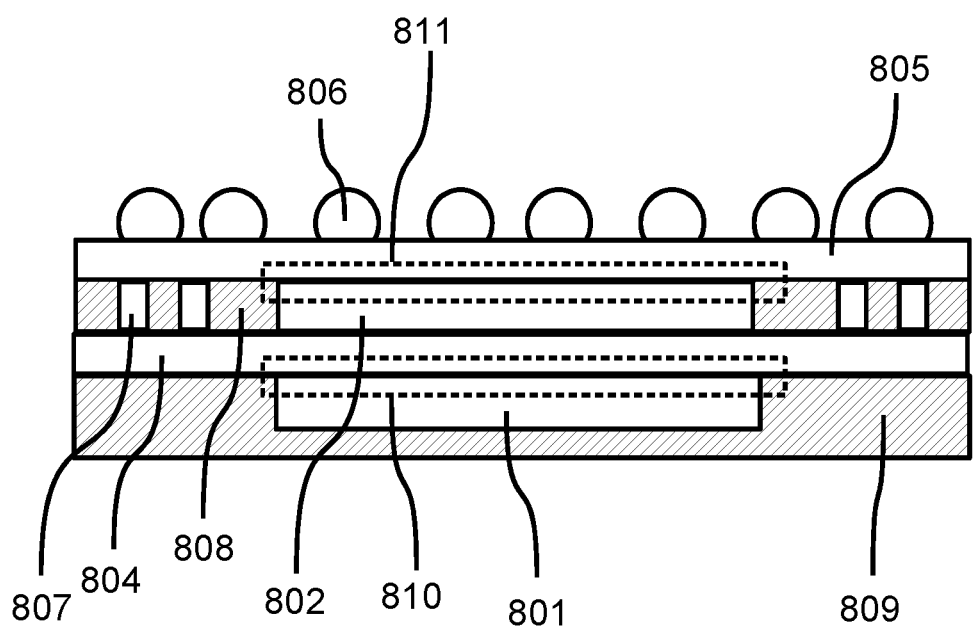
FIG. 8F shows another embodiment of the semiconductor package.
Figure 8G:
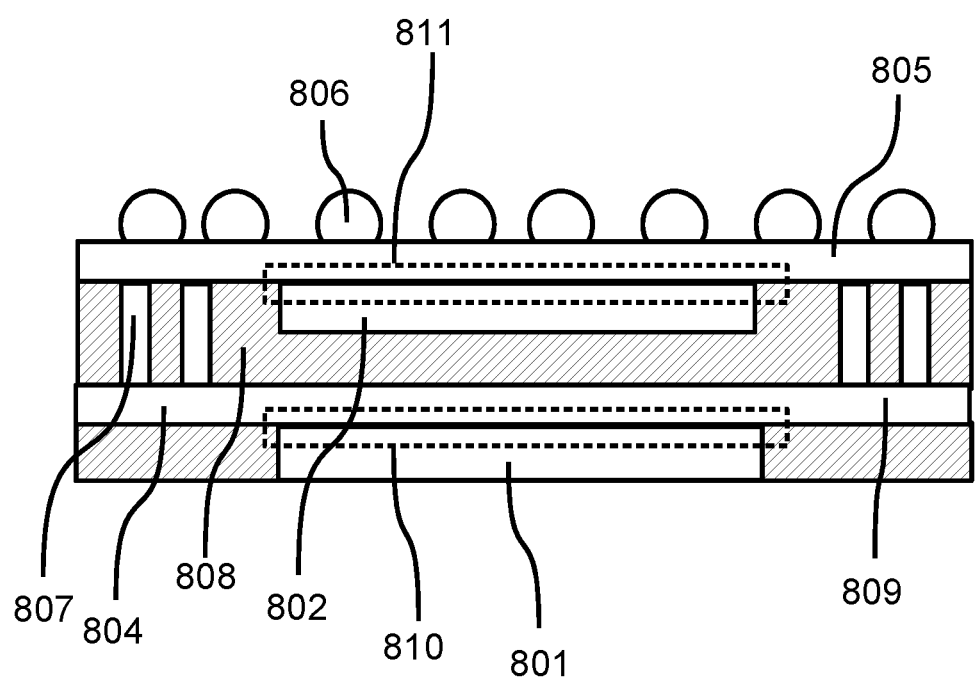
FIG. 8G shows another embodiment of the semiconductor package.
Figure 8H:
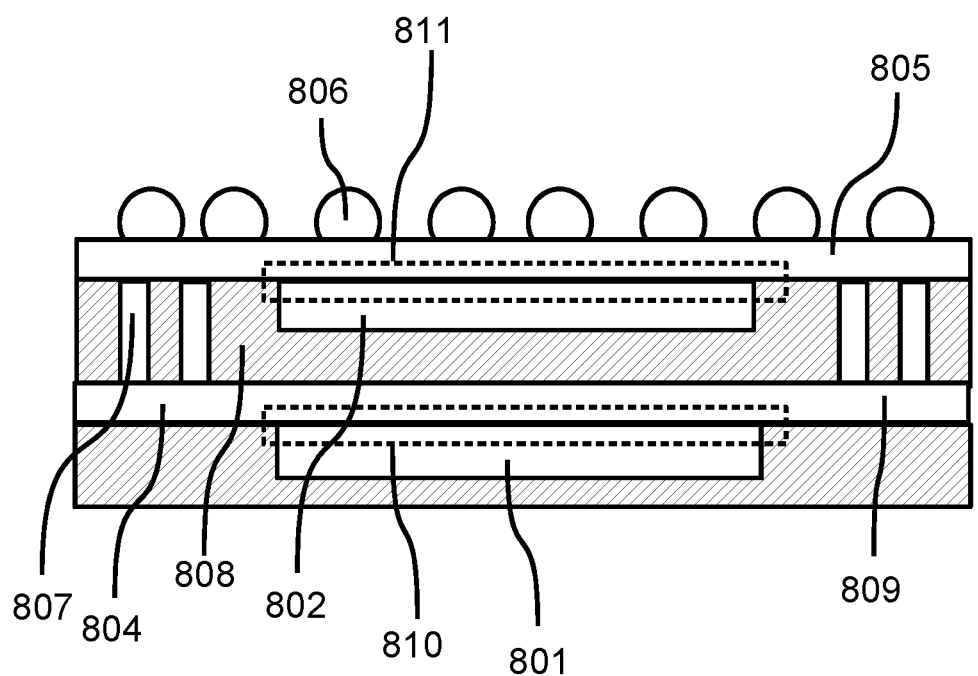
FIG. 8H shows another embodiment of the semiconductor package.

FIG. 8F shows an embodiment of the semiconductor package. FIG. 8G shows an embodiment of the semiconductor package. FIG. 8H shows an embodiment of the semiconductor package. With reference to FIG. 8F, the molding material 809 covers the non-active side of the processor 801 but the molding material 808 does not cover the non-active side of the memory module. In some embodiments, no metal vias are embedded in the molding material 809. In some embodiments, metal vias can be embedded in the molding material 809. With reference to FIG. 8G, the molding material 809 does not cover the non-active side of the processor 801 but the molding material 808 covers the non-active side of the memory module.

In some embodiments, no metal vias are embedded in the molding material 809. In some embodiments, metal vias can be embedded in the molding material 809. With reference to FIG. 8H, the molding material 809 covers the non-active side of the processor 801 and the molding material 808 covers the non-active side of the memory module. In some embodiments, no metal vias are embedded in the molding material 809. In some embodiments, metal vias can be embedded in the molding material 809.

Figure 8I:
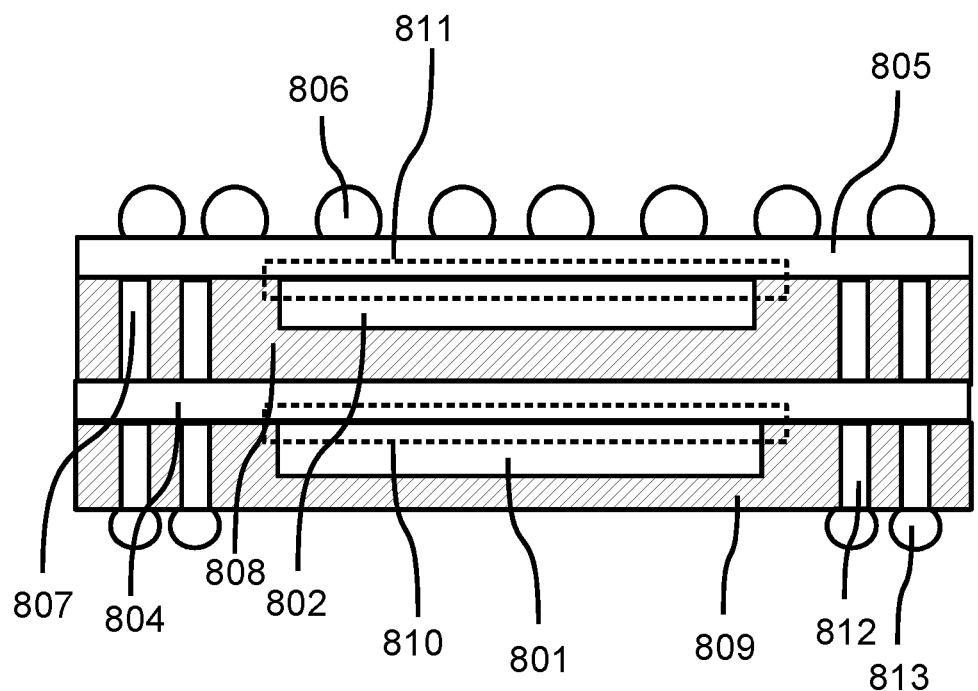
FIG. 8I shows another embodiment of the semiconductor package.

FIG. 8I shows an embodiment of the semiconductor package. A plurality of metal vias 812 are embedded in the molding material 809. The metal vias 812 are electrically connected to the redistribution layer 804. In some embodiments, a plurality of connection elements 813 are electrically connected to the metal vias 812. The connection elements 812 can be further connected to another redistribution layer, a substrate, or printed circuit board.

FIG. 8C shows an embodiment of the semiconductor package. FIG. 8D shows an embodiment of the semiconductor package. In one embodiment, a semiconductor package 800C comprises a first redistribution structure 8156, a second redistribution structure 8157, a plurality of metal vias 8164, a first connection structure 8161, a second connection structure 8162, a third connection structure 8163, a processor 8158, a first memory die 8159, and a second memory die 8160. The plurality of metal vias 8164 are connected between the first redistribution structure 8156 and the second redistribution structure 8157. The processor 8158 is connected to the first redistribution structure 8156 through the first connection structure 8161.

The first memory die 8159 is connected to the second redistribution structure 8157 through the second connection structure 8162. The second memory die 8160 is connected to the second redistribution structure 8157 through the third connection structure 8163. A first data bus 8167 is formed between the processor 8158 and the first memory die 8159. A second data bus 8168 is formed between the first memory die 8159 and the second memory die 8160.

In one example, a plurality of solder bumps 8173 are connected to the first redistribution structure 8156. In one example, a molding material 8171 is filled between the first redistribution structure 8156 and the second redistribution structure 8157. In one example, a molding material 8166 is disposed between the first memory die 8159 and the second memory die 8160. In one example, no data bus is formed between the second memory die 8160 and the processor 8153.

In one example, the first connection structure 8161 does not have a solder bump. In one example, the second connection structure 8162 does not have a solder bump. In one example, the third connection structure 8163 does not have a solder bump. In one example, the first data bus 8167 has a first bus width, the second data bus 8168 has a second bus width, and the first bus width is different from the second bus width. In one example, a first active surface 8172 of the processor 8158, a second active surface 8173 of the first memory die 8159, and a third active surface 8174 of the second memory die 8160, face a same direction 8169.

Figure 9A:
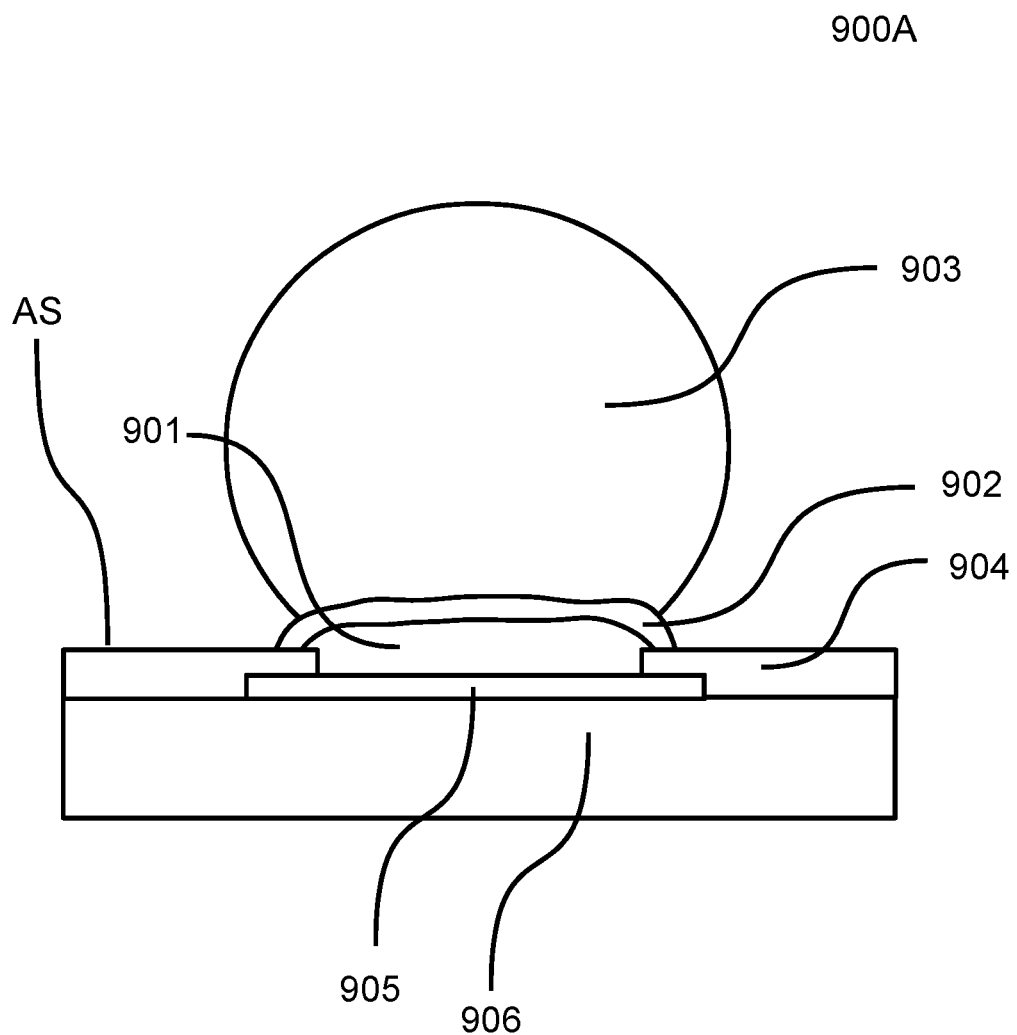
FIG. 9A shows an embodiment of a connection element.

FIG. 9A shows an embodiment of a connection element. The connection element 900A comprises a first metal layer 901, a second metal layer 902, a solder ball 903. The first metal layer 901 can comprise Ni (Nickel). The second metal layer 902 can comprise Au (Gold). The connection element 900A is located on an active surface AS of a chip 906. The active surface AS comprises a passivation layer 904, and a metal pad 905. The metal pad 905 can comprise Al (Aluminium). In one embodiment, the passivation layer can comprise silicon dioxide (SiO2). In one embodiment, the passivation layer can comprise silicon nitride (SiN).

Figure 9B:
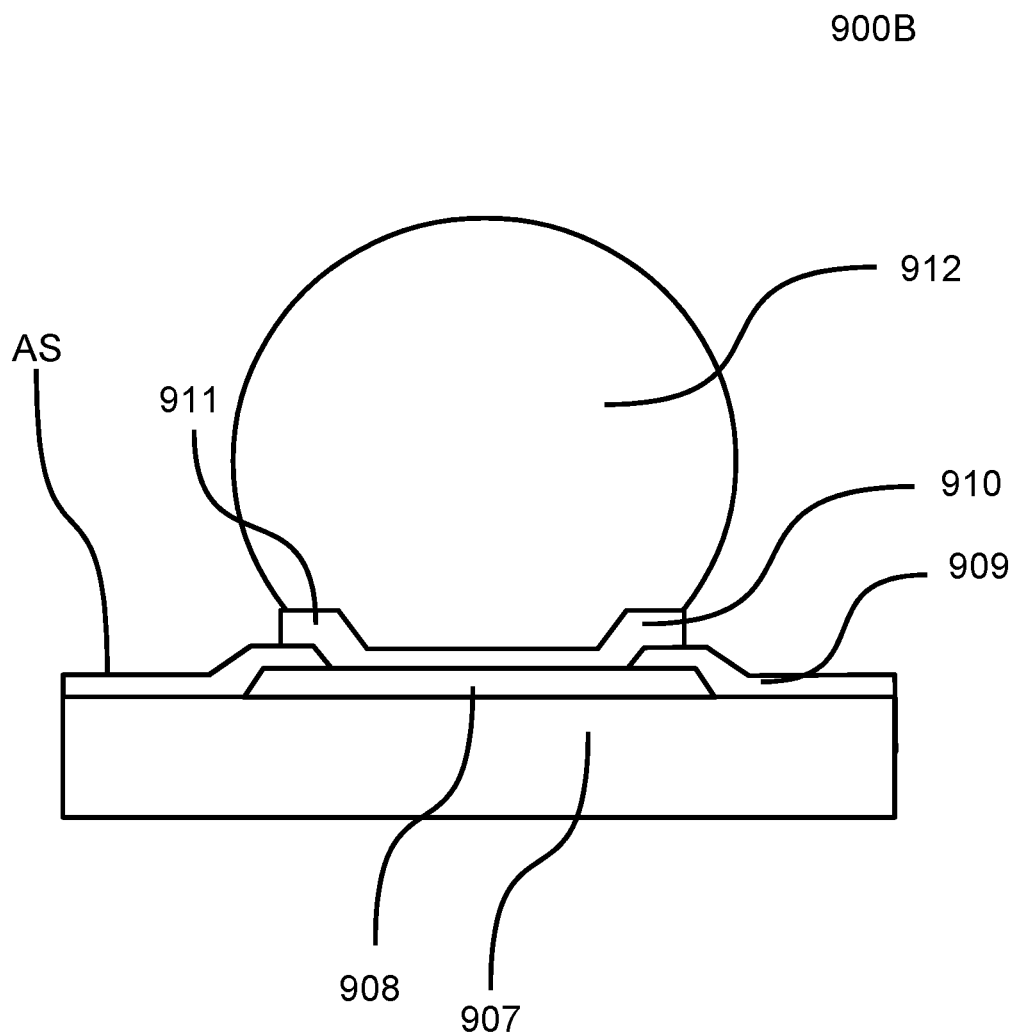
FIG. 9B shows another embodiment of a connection element.

FIG. 9B shows an embodiment of a connection element. The connection element 900B comprises a solder ball 912, and an under bump metallization layer 910 (UBM layer 910). The UBM layer 910 is connected to a metal pad 908. The connection element 900B is located on an active surface AS of a chip 907. The active surface AS of the chip 907 comprises a passivation layer 909 and a metal pad 908. The solder ball 912 can contain Sn, Ni, Au, Ag, Pb, Bi, and alloys thereof. The UBM layer 910 can comprise multiple layers of selectively plated Ni/Au, Ti/Cu, TiW/Cu, Ti/Cu/NiV/Cu, or their combination. The metal pad can contain Al or Cu.

Figure 9C:
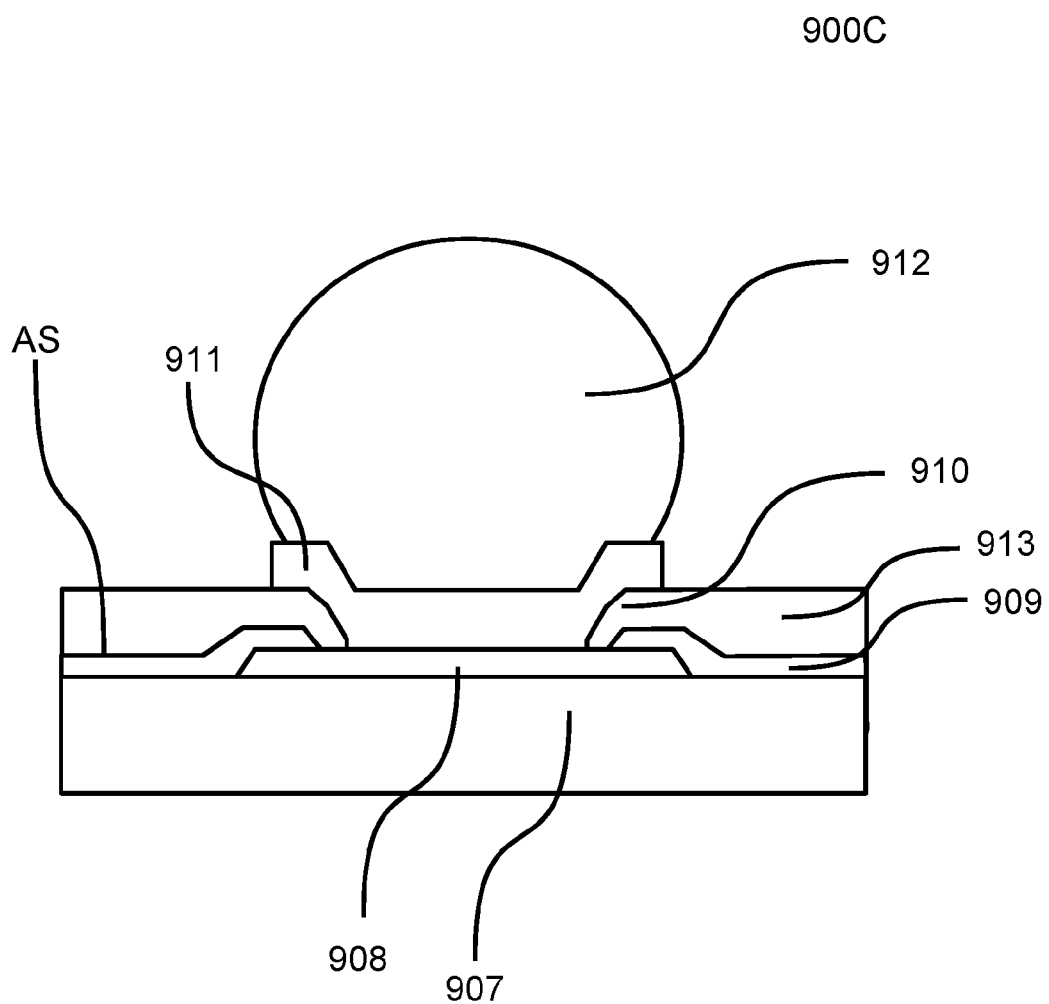
FIG. 9C shows another embodiment of a connection element.

FIG. 9C shows an embodiment of a connection element. The connection element 900C comprises a solder ball 912, and an under bump metallization layer 910 (UBM layer 910). The UBM layer 910 is connected to a metal pad 908. The connection element 900C is located on an active surface AS of a chip 907. The active surface AS of the chip 907 comprises a passivation layer 909, an insulating layer 913, and a metal pad 908. The solder ball 912 may comprise Sn, Ni, Au, Ag, Pb, Bi, or alloys thereof. The UBM layer 910 may comprise multiple layers of selectively plated Ni/Au, Ti/Cu, TiW/Cu, Ti/Cu/NiV/Cu, or their combination. The metal pad 908 may comprise Al or Cu. The insulating layer 913 may comprise polyimide, benzocyclobutene (BCB), polybenzoxazoles (PBO), or other material having similar insulating and structural properties.

Figure 9D:
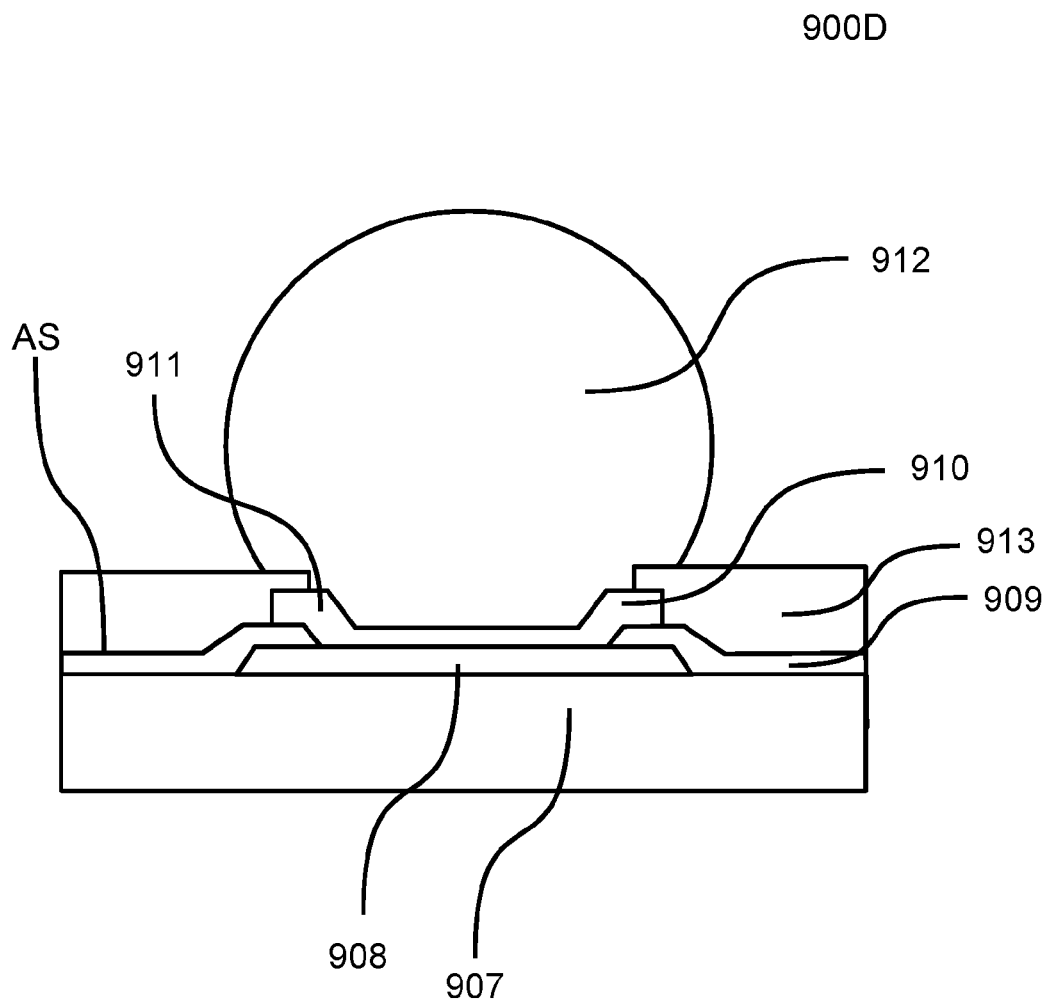
FIG. 9D shows another embodiment of a connection element.

FIG. 9D shows an embodiment of a connection element. The connection element 900D comprises a solder ball 912, and an under bump metallization layer 910 (UBM layer 910). The UBM layer 910 is connected to a metal pad 908. The connection element 900D is located on an active surface AS of a chip 907. The active surface AS of the chip 907 comprises a passivation layer 909, an insulating layer 913, and a metal pad 908. The solder ball 912 may comprise Sn, Ni, Au, Ag, Pb, Bi, or alloys thereof. The UBM layer 910 may comprise multiple layers of selectively plated Ni/Au, Ti/Cu, TiW/Cu, Ti/Cu/NiV/Cu, or their combination. The metal pad 908 may comprise Al or Cu. The insulating layer 913 may comprise polyimide, benzocyclobutene (BCB), polybenzoxazoles (PBO), or other material having similar insulating and structural properties.

Figure 9E:
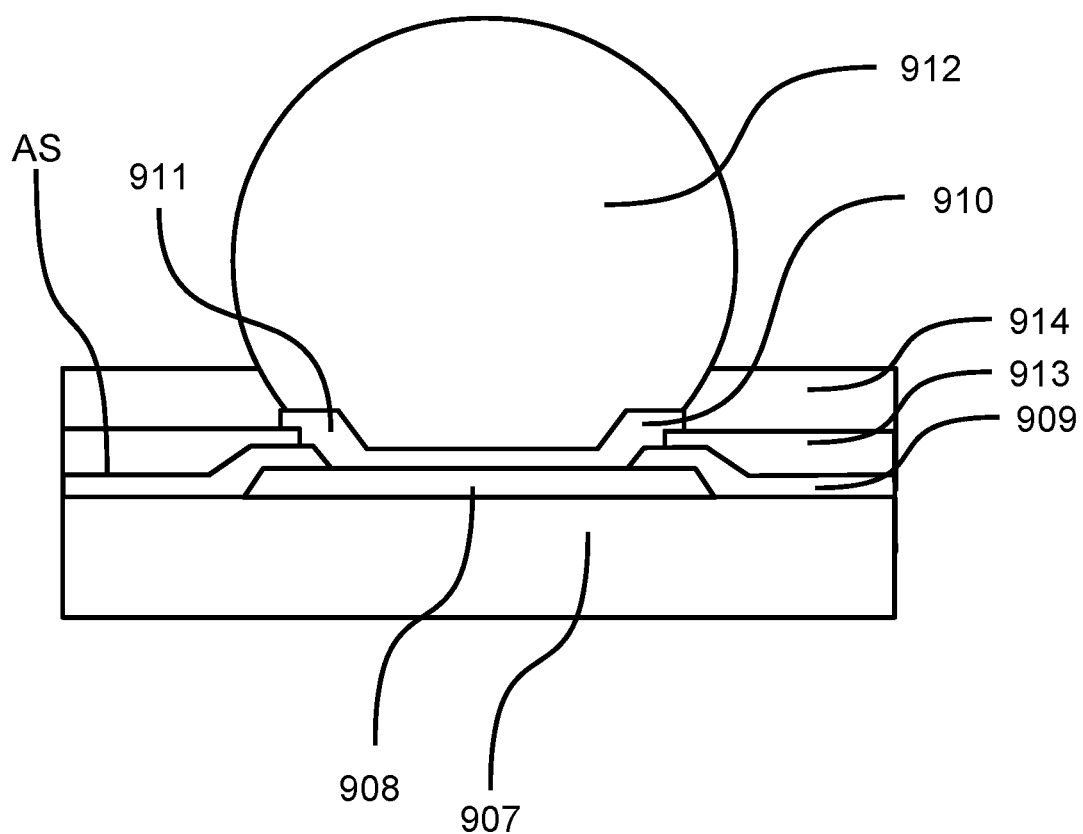
FIG. 9E shows another embodiment of a connection element.

FIG. 9E shows an embodiment of a connection element. The connection element 900E comprises a solder ball 912, and an under bump metallization layer 910 (UBM layer 910). The UBM layer 910 is connected to a metal pad 908. The connection element 900E is located on an active surface AS of a chip 907. The active surface AS of the chip 907 comprises a passivation layer 909, a first insulating layer 913, a second insulating layer 914, and the metal pad 908.

The solder ball 912 may comprise Sn, Ni, Au, Ag, Pb, Bi, or alloys thereof. The UBM layer 910 may comprise multiple layers of selectively plated Ni/Au, Ti/Cu, TiW/Cu, Ti/Cu/NiV/Cu, or their combination. The metal pad 908 may comprise Al or Cu. The insulating layer 913 may comprise polyimide, benzocyclobutene (BCB), polybenzoxazoles (PBO), or other material having similar insulating and structural properties. The insulating layer 914 may comprise polyimide, benzocyclobutene (BCB), polybenzoxazoles (PBO), or other material having similar insulating and structural properties.

Figure 9F:
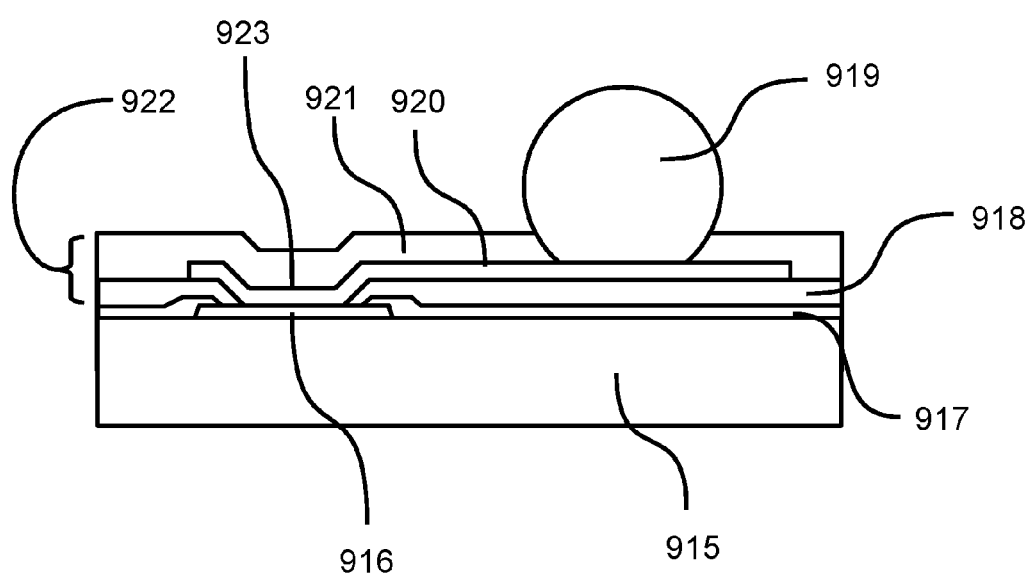
FIG. 9F shows another embodiment of a connection element.

FIG. 9F shows an embodiment of a connection element. The connection element 900F comprises a solder ball 919 and a redistribution structure 922. The connection element 900F is located on an active surface AS of a chip 915. The active surface AS of the chip 915 comprises a passivation layer 917 and a metal pad 916. The redistribution structure 922 comprises a first insulating layer 918, and a second insulating layer 921. A via 923 is formed on top of the metal pad 916. A metal trace 920 is connected to the via 923. The metal trace 920 also connects to the solder ball 919. In one embodiment, no USB is presented under the solder ball 919.

The solder ball 919 may comprise Sn, Ni, Au, Ag, Pb, Bi, or alloys thereof. The metal pad 916 may comprise Al or Cu. The first insulating layer 918 may comprise polyimide, benzocyclobutene (BCB), polybenzoxazoles (PBO), or other material having similar insulating and structural properties. The second insulating layer 921 may comprise polyimide, benzocyclobutene (BCB), polybenzoxazoles (PBO), or other material having similar insulating and structural properties.

Figure 9G:
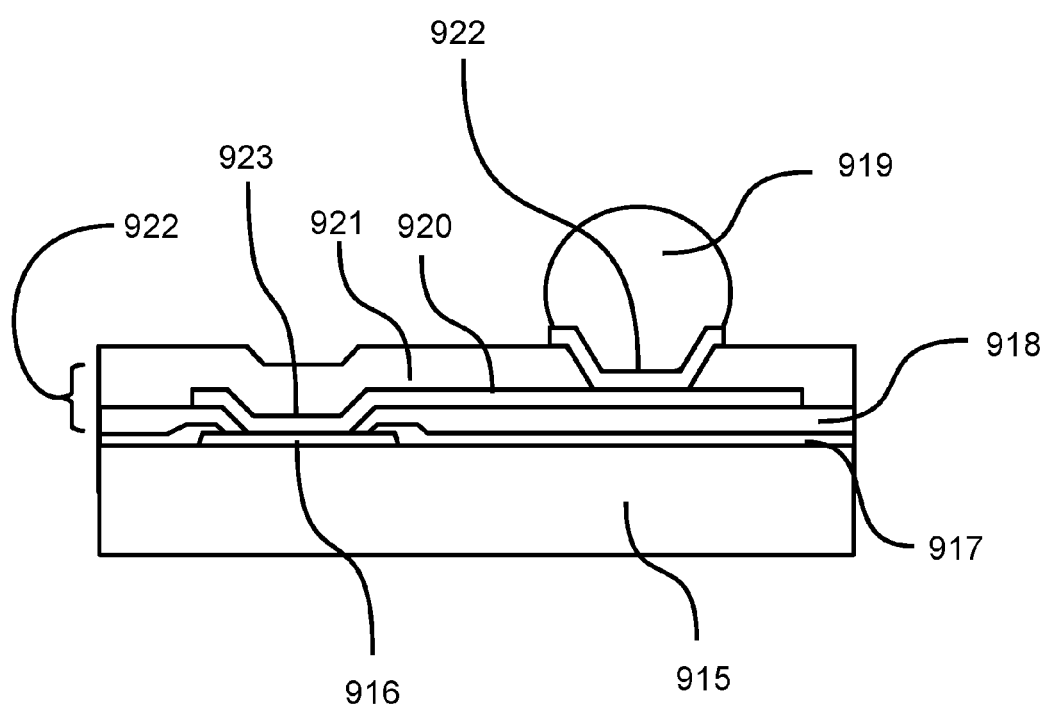
FIG. 9G shows another embodiment of a connection element.

FIG. 9G shows an embodiment of a connection element. The connection element 900G comprises a solder ball 919 and a redistribution structure 922. The connection element 900F is located on an active surface AS of a chip 915. The active surface AS of the chip 915 comprises a passivation layer 917 and a metal pad 916. The redistribution structure 922 comprises an UBM 922, a first insulating layer 918, and a second insulating layer 921. A via 923 is formed on top of the metal pad 916. A metal trace 920 is connected to the via 923. The metal trace 920 also connects to the solder ball 919. The USB 922 is presented under the solder ball 919.

The solder ball 919 may comprise Sn, Ni, Au, Ag, Pb, Bi, or alloys thereof. The metal pad 916 may comprise Al or Cu. The first insulating layer 918 may comprise polyimide, benzocyclobutene (BCB), polybenzoxazoles (PBO), or other material having similar insulating and structural properties. The second insulating layer 921 may comprise polyimide, benzocyclobutene (BCB), polybenzoxazoles (PBO), or other material having similar insulating and structural properties.

Figure 10A:
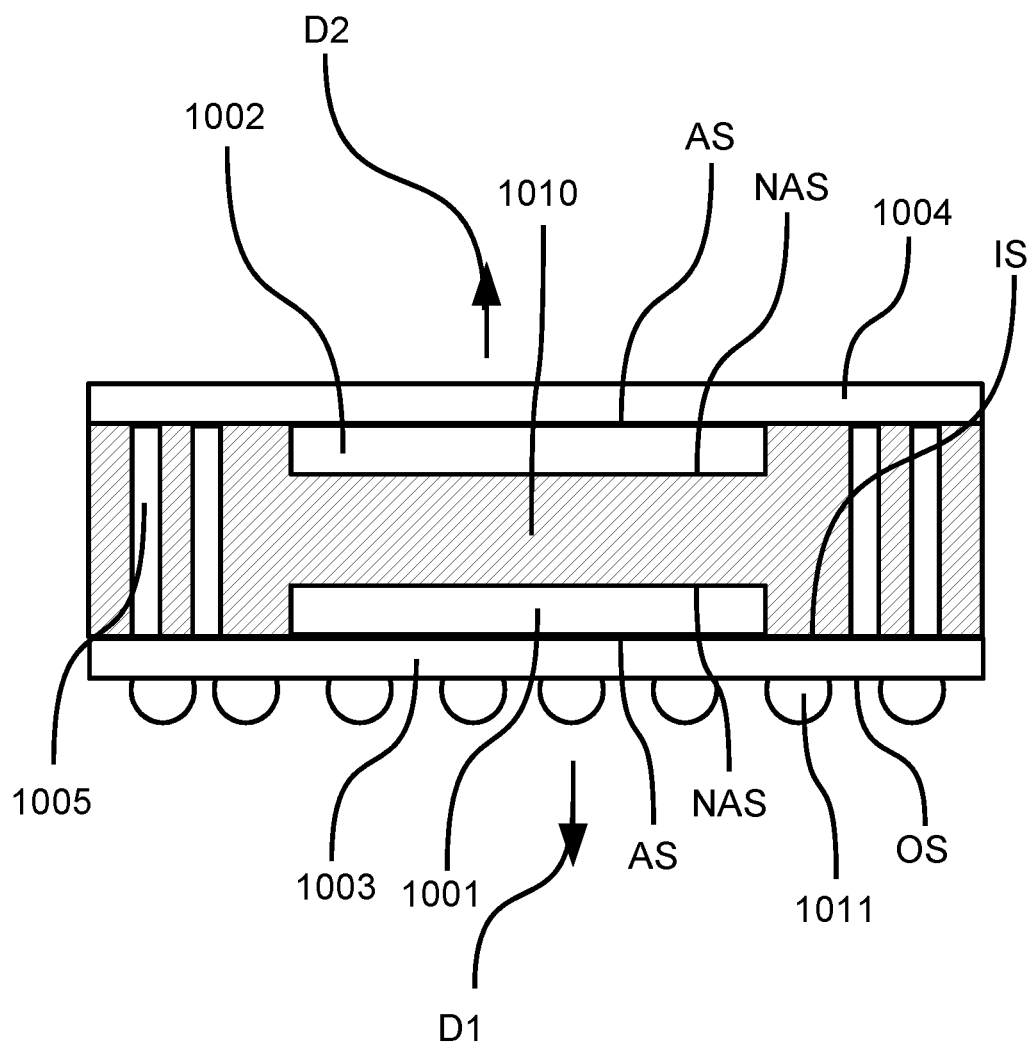
FIG. 10A shows an embodiment of a memory module.
Figure 10B:
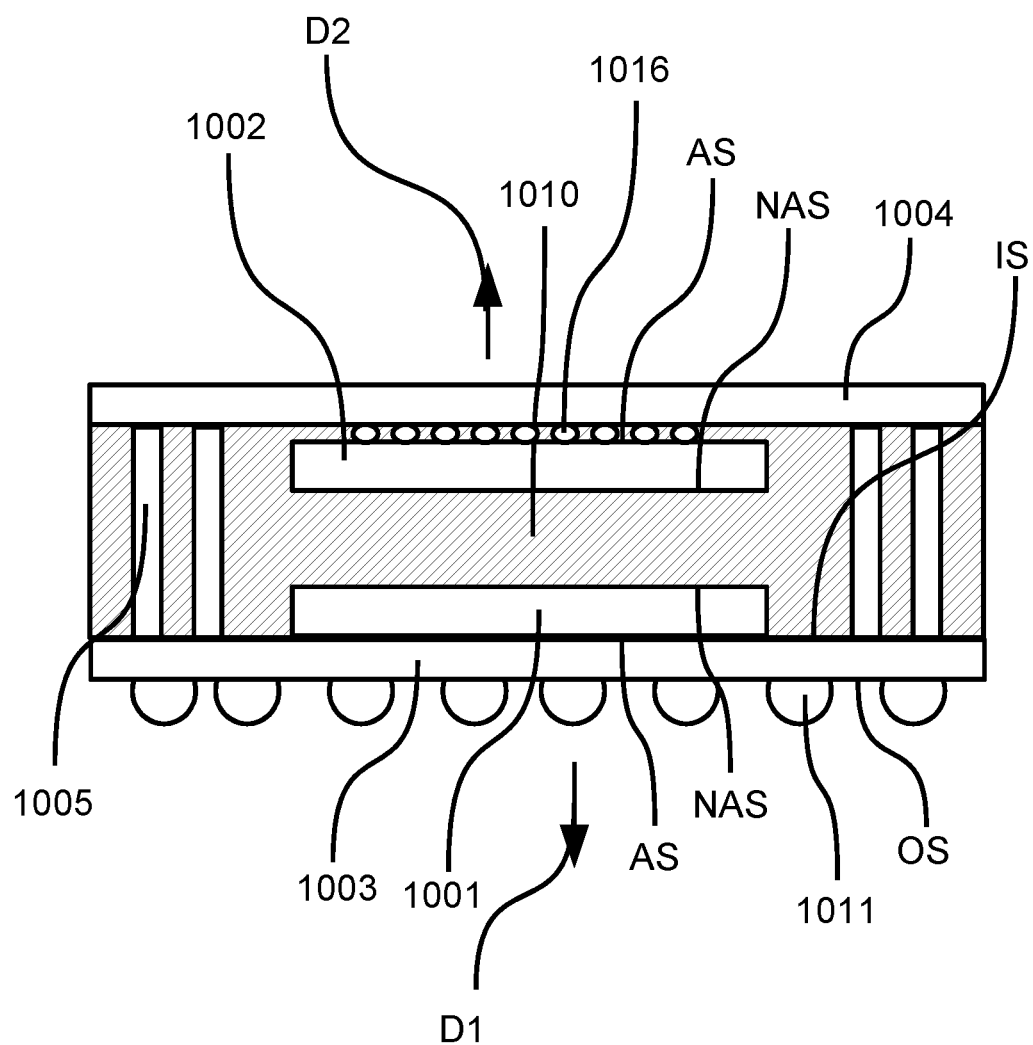
FIG. 10B shows another embodiment of a memory module.
Figure 10C:
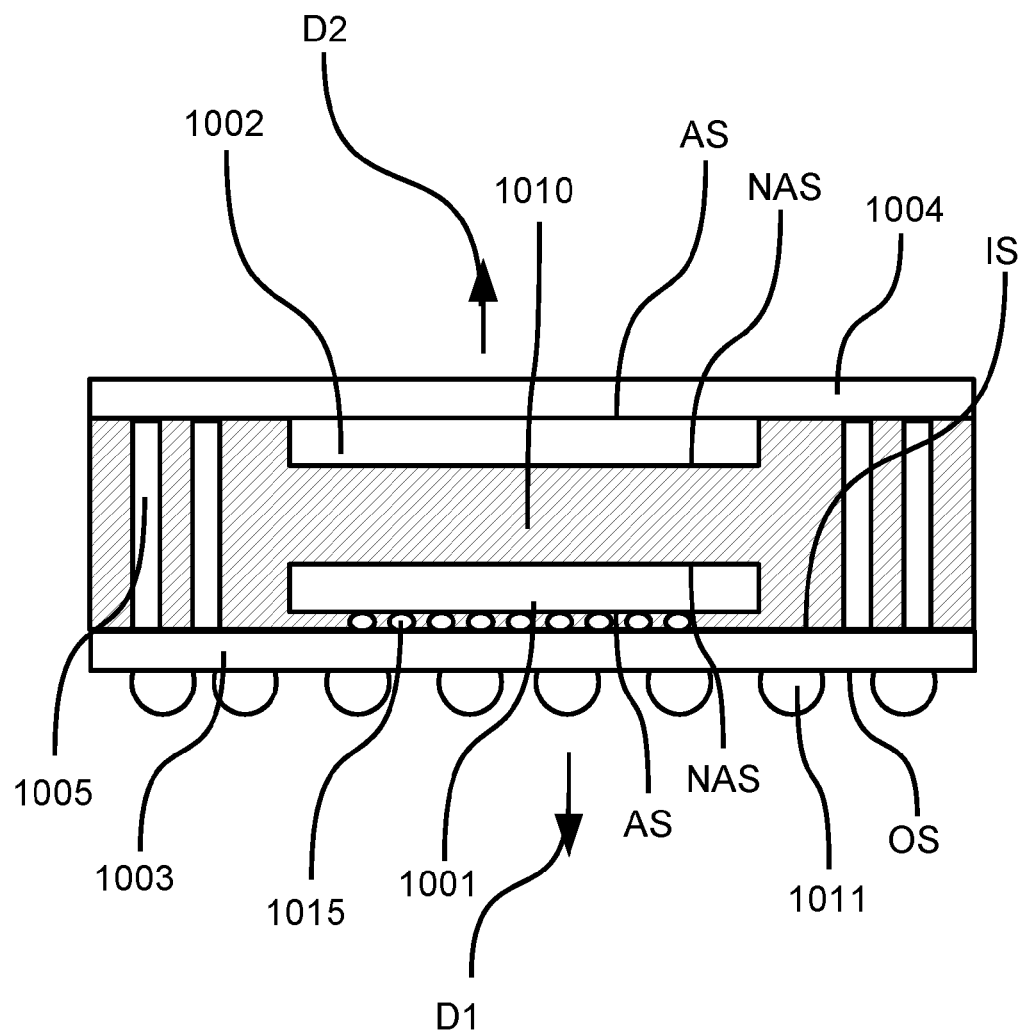
FIG. 10C shows another embodiment of a memory module.
Figure 10D:
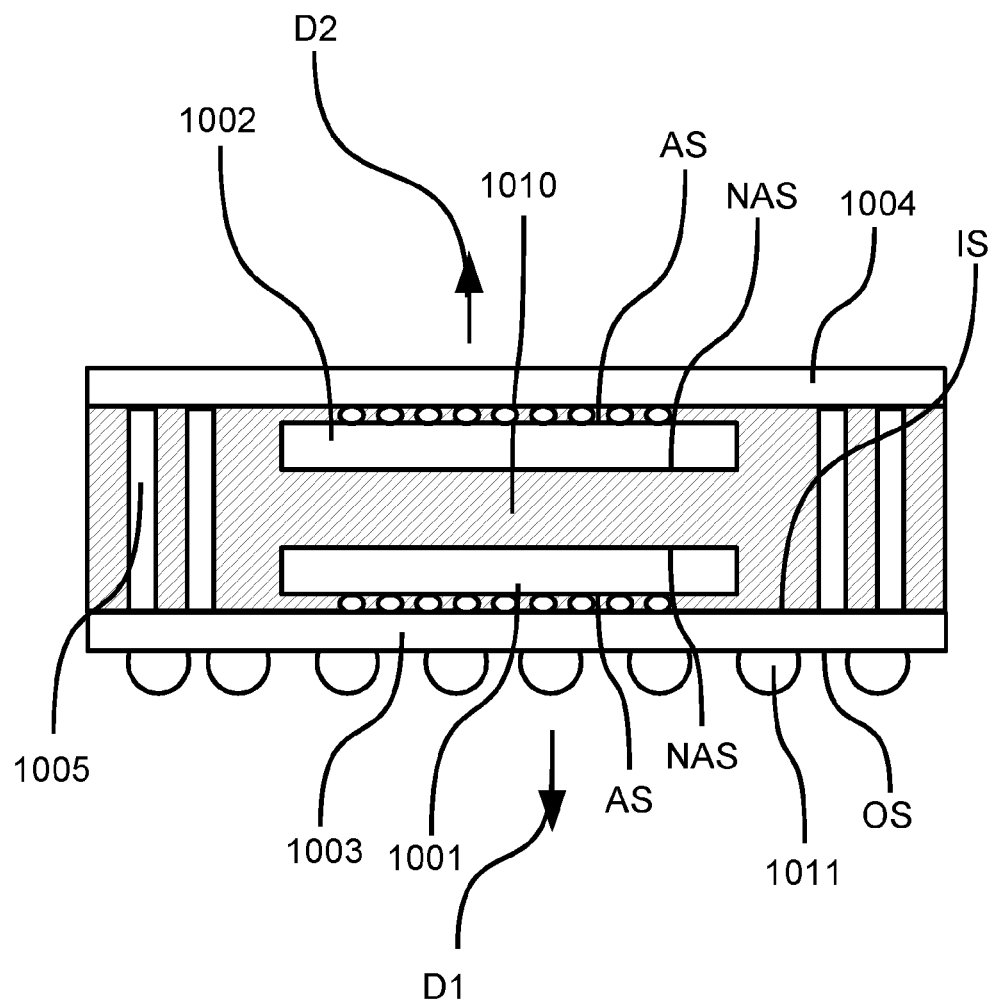
FIG. 10D shows another embodiment of a memory module.
Figure 10E:
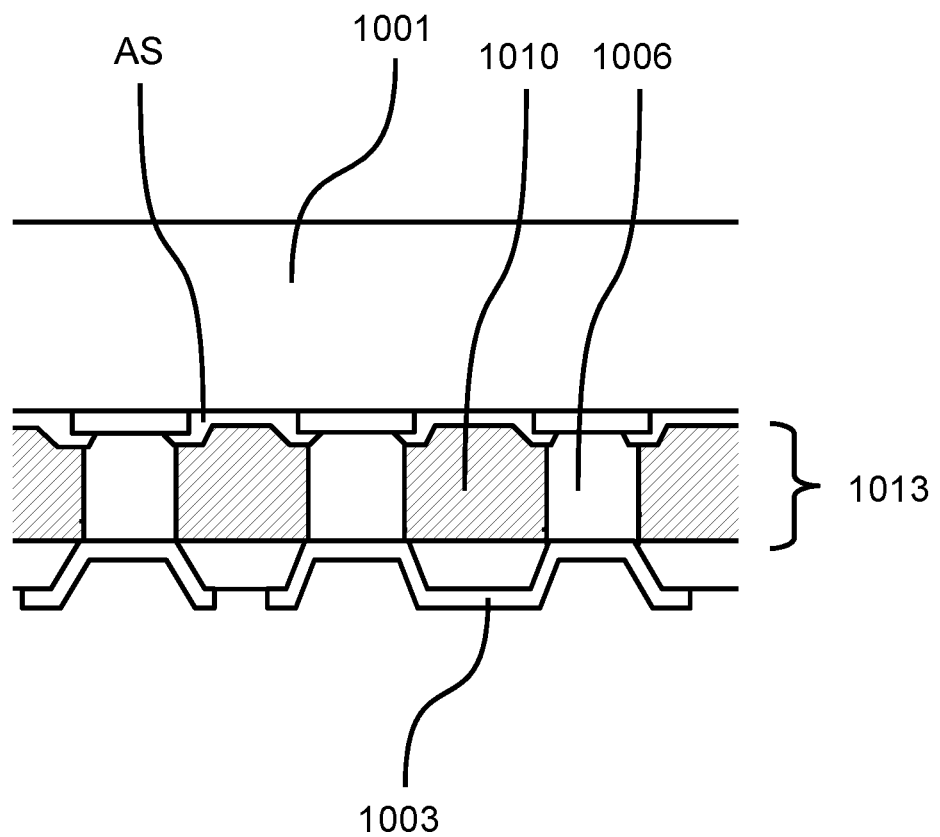
FIG. 10E shows another embodiment of a connection structure.
Figure 10F:
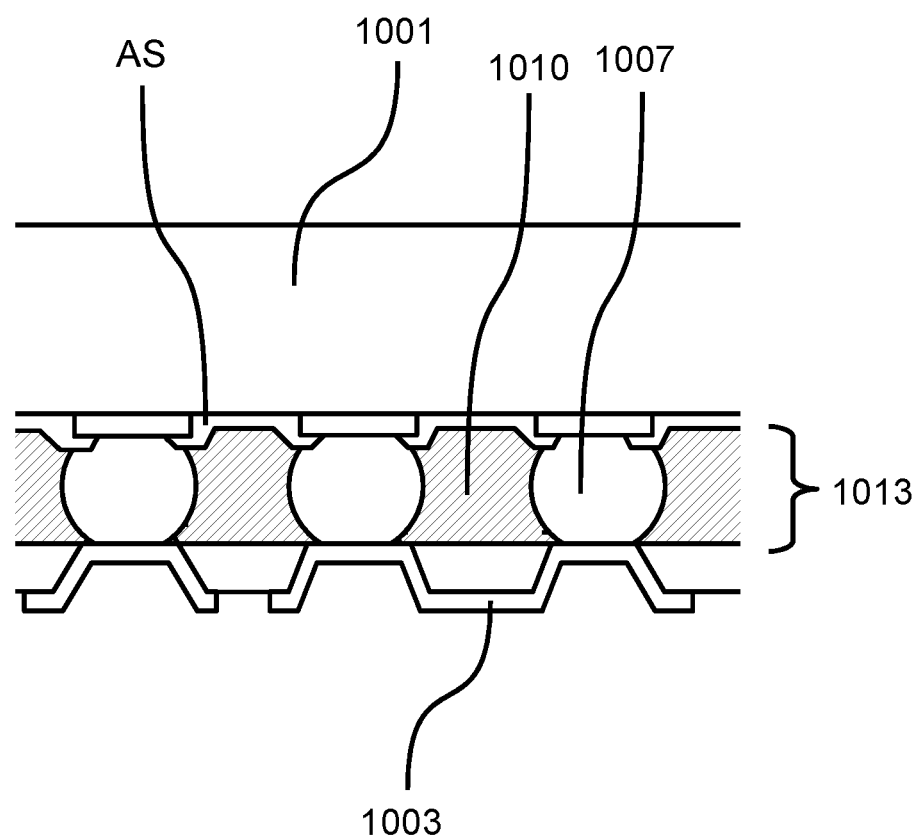
FIG. 10F shows another embodiment of a connection structure.
Figure 10G:
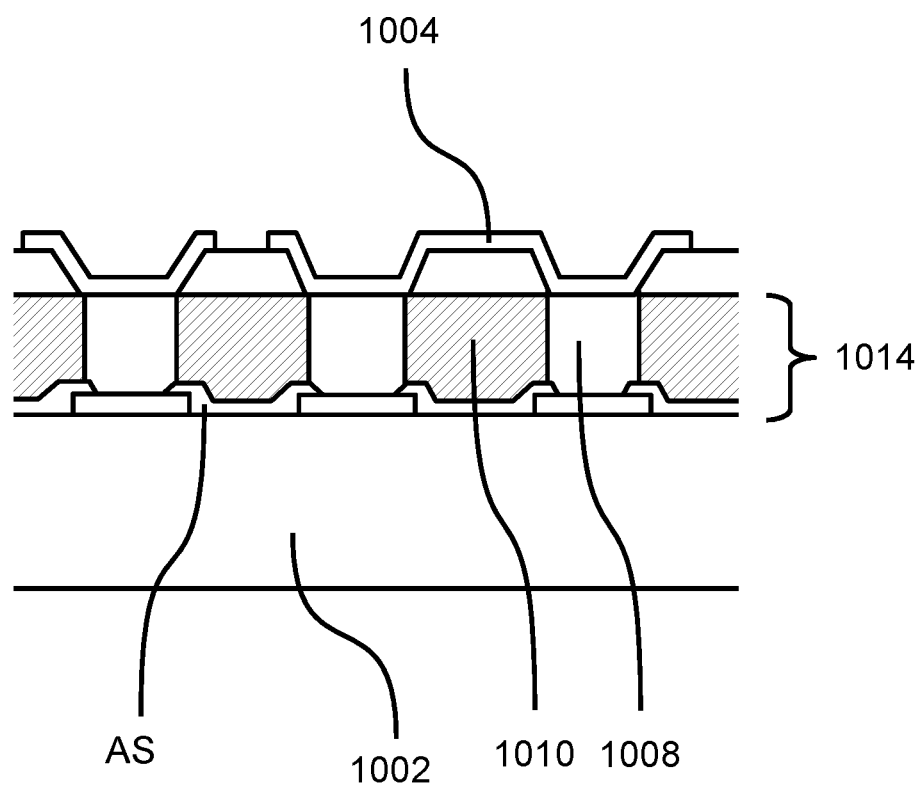
FIG. 10G shows another embodiment of a connection structure.
Figure 10H:
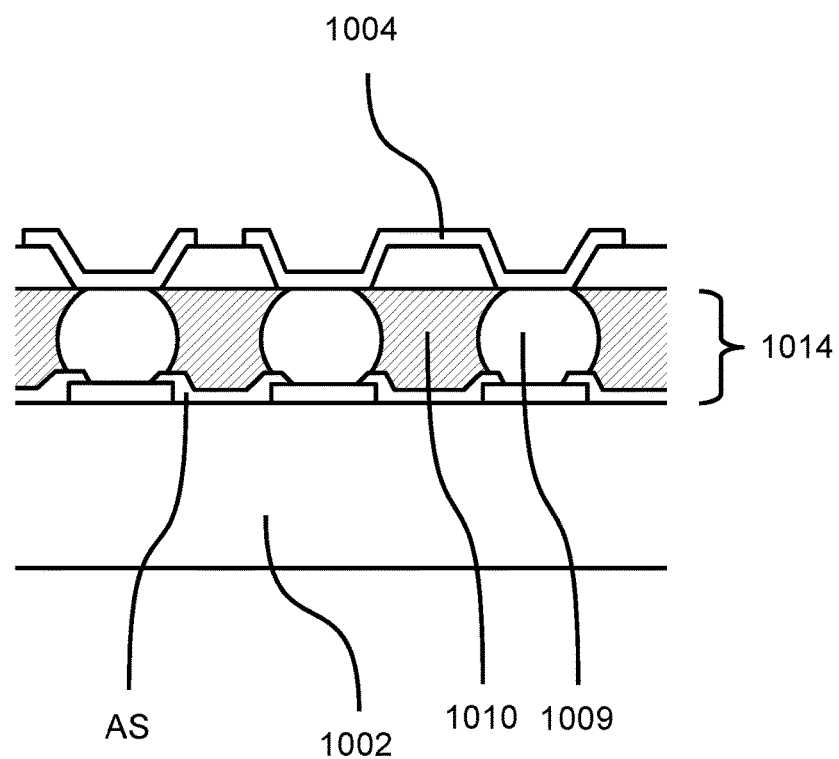
FIG. 10H shows another embodiment of a connection structure.
Figure 10I:
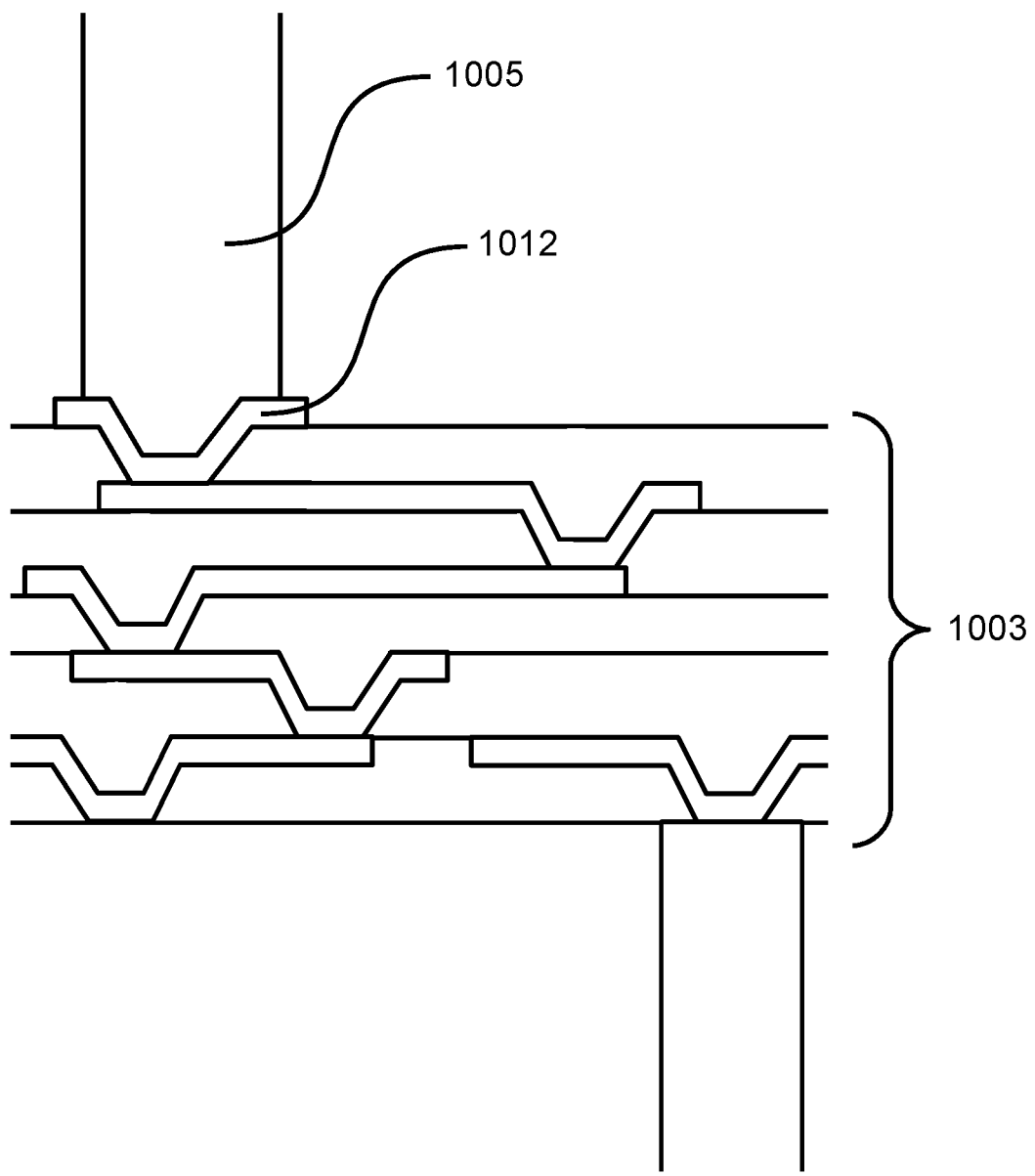
FIG. 10I shows another embodiment of a connection structure.

FIG. 10A shows an embodiment of a memory module. FIG. 10B shows an embodiment of a memory module. FIG. 10C shows an embodiment of a memory module. FIG. 10D shows an embodiment of a memory module. FIG. 10E shows an embodiment of a connection structure. FIG. 10F shows an embodiment of a connection structure. FIG. 10H shows an embodiment of a connection structure. FIG. 10I shows an embodiment of a connection structure.

Referring to FIG. 10A, a memory module 1000A is disclosed. The memory module 1000a comprises a DRAM die 1001, a DRAM die 1002, a redistribution structure 1003, a redistribution structure 1004, and a conductive via 1005. FIG. 10G shows an embodiment of a connection structure.

The DRAM die 1001 has an active surface AS and a non-active surface NAS. The DRAM die 1002 has an active surface AS and a non-active surface NAS. The active surface AS of the DRAM die 1001 is connected to the redistribution structure 1003. The active surface AS of the DRAM die is connected to the redistribution structure 1004. The conductive via 1005 is connected between the redistribution structure 1003 and the redistribution structure 1004. The active surface AS of the DRAM die 1001 faces a direction D1. The active surface AS of the DRAM die 1002 faces a direction D2. The direction D1 is opposite to the direction D2.

Referring to FIG. 10C, in one example, a plurality of solder bumps 1007 are located between the active surface AS of the DRAM die 1001 and the redistribution structure 1003. Referring to FIG. 10C, in one example, no solder bumps are located between the active surface AS of the DRAM die 1002 and the redistribution structure 1004.

Referring to FIG. 10H, in one example, a plurality of solder bumps 1009 are located between the active surface AS of the DRAM die 1002 and the redistribution structure 1004. In one example, no solder bumps are located between the active surface AS of the DRAM die 1001 and the redistribution structure 1003.

Referring to FIG. 10A, in one example, the memory module 1000A further comprises a molding material 1010 filled between the redistribution structure 1003 and the redistribution structure 1004. In one example, the memory module 1000a further comprises a plurality of solder bumps 1011 located on an outer surface OS of the redistribution layer 1003.

Referring to FIG. 10I, in one example, the memory module 1000A further comprises a plurality of conductive base structures 1012. The conductive base structure 1012 is located on an inner surface IS of the redistribution layer 1003. The conductive base structure 1012 is connected to the conductive via 1005.

With reference to FIG. 10A and FIG. 10E, an embodiment of the memory module 1000A is disclosed. The memory module 1000A comprises a DRAM die 1001, a DRAM die 1002, a connection structure 1013, a connection structure 1014, a redistribution structure 1003, a redistribution structure 1004, and a plurality of metal vias 1005. The DRAM die 1001 has an active surface AS and a non-active surface NAS. The DRAM die 1002 has an active surface AS and a non-active surface NAS. The connection structure 1013 comprises a group of metal pillars 1006.

With reference to FIG. 10G, in one embodiment, the connection structure 1014 comprises a group of metal pillars 1008. The active surface AS of the DRAM die 1001 is connected to the redistribution structure 1003 through the connection structure 1013. The active surface AS of the DRAM die 1002 is connected to the redistribution structure 1004 through the connection structure 1014. The conductive vias 1005 are connected between the redistribution structure 1003 and the redistribution structure 1004. The DRAM die 1001 has a first storage space. The DRAM die 1002 has a second storage space. In one embodiment, the first storage space is the same as the second storage space.

An embodiment of the memory module 1000A is disclosed. The memory module comprises a DRAM die 1001, a DRAM die 1002, a molding material 1010, a connection structure 1013, a connection structure 1014, a redistribution structure 1003, a redistribution structure 1004, and a plurality of conductive vias 1005. The DRAM die 1001 has an active surface AS and a non-active surface NAS. The DRAM die 1002 has an active surface AS and a non-active surface NAS. The connection structure 1013 comprises a first group of metal pillars 1006. The connection structure 1014 comprises a group of metal pillars 1014.

The active surface AS of the DRAM die 1001 is connected to the redistribution structure 1003 through the connection structure 1013. The molding material 1010 is filled between the active surface AS of the DRAM die 1001 and the redistribution structure 1003. The active surface AS of the DRAM die 1002 is connected to the redistribution structure 1004 through second connection structure 1014. The molding material 1010 is filled between the active surface AS of the DRAM die 1002 and the redistribution structure 1004. The conductive vias 1005 are connected between the redistribution structure 1003 and the redistribution structure 1004.

With reference to FIG. 10A, in one embodiment, a memory module 1000A comprises a first DRAM die 1001, a second DRAM die 1002, a first redistribution structure 1003, a second redistribution structure 1004, and a conductive via 1005. The first DRAM die 1001 has an active surface AS and a non-active surface NAS. The second DRAM die 1002 has an active surface AS and a non-active surface NAS. The active surface AS of the first DRAM die 1001 is connected to the first redistribution structure 1003. The active surface AS of the second DRAM die 1002 is connected to the second redistribution structure 1004. The conductive via 1005 is connected between the first redistribution structure 1003 and the second redistribution structure 1004. The active surface AS of the first DRAM die 1001 faces a first direction D1. The active surface AS of the second DRAM die 1002 faces a second direction D2. The first direction D1 is opposite to the second direction D2. In one example, no solder bumps are located between the active surface AS of the first DRAM die 1001 and the first redistribution structure 1003.

In one example, with reference to FIG. 10C, a plurality of solder bumps 1015 are located between the active surface AS of the first DRAM die 1001 and the first redistribution structure 1003. In one example, no solder bumps are located between the active surface AS of the second DRAM die 1002 and the second redistribution structure 1004.

With reference to FIG. 10B, in one example, a plurality of solder bumps 1016 are located between the active surface AS of the second DRAM die 1002 and the second redistribution structure 1004. In one example, the memory module 1000A further comprises a molding material 1010 filled between the first redistribution structure 1003 and the second redistribution structure 1004.

In one example, the memory module 1000A further comprises a plurality of solder bumps 1011 located on an outer surface OS of the first redistribution layer 1003. In one example, the memory module 1000A further comprises a plurality of conductive base structures 1012, the conductive base structures 1012 being located on an inner surface IS of the first redistribution layer, the conductive base structure 1012 is connected to the conductive via 1005.

With reference to FIG. 10A, in one embodiment, the memory module 1000A comprises a first DRAM die 1001, a second DRAM die 1002, a first connection structure 1013, a second connection structure 1014, a first redistribution structure 1003, and a second redistribution structure 1004. The first DRAM die 1001 has an active surface AS and a non-active surface NAS. The second DRAM die 1002 has an active surface AS and a non-active surface NAS. The first connection structure 1013 comprises a first group of metal pillars 1006. The second connection structure comprises a second group of metal pillars 1008. The active surface AS of the first DRAM die 1001 is connected to the first redistribution structure 1003 through the first connection structure 1013. The active surface of the second DRAM die 1002 is connected to the second redistribution structure 1004 through the second connection structure 1014. The conductive vias 1005 is connected between the first redistribution structure 1003 and the second redistribution structure 1004. The first DRAM die 1001 has a first storage space. The second DRAM die 1002 has a second storage space. The first storage space is the same as the second storage space.

With reference to FIG. 10A, in one embodiment, the memory module 1000A comprises a first DRAM die 1001, a second DRAM die 1002, a molding material 1010, a first connection structure 1013, a second connection structure 1014, a first redistribution structure 1003, a second redistribution structure 1004, and a plurality of conductive vias 1005. The first DRAM die 1001 has an active surface AS and a non-active surface NAS. The second DRAM die 1002 has an active surface AS and a non-active surface NAS. The first connection structure 1013 comprises a first group of metal pillars 1006. The second connection structure 1014 comprises a second group of metal pillars 1008. The active surface AS of the first DRAM die 1001 is connected to the first redistribution structure 1003 through the first connection structure 1013. The molding material 1010 is filled between the active surface AS of the first DRAM die 1001 and the first redistribution structure 1003.

The active surface AS of the second DRAM die 1002 is connected to the second redistribution structure 1004 through the second connection structure 1014. The molding material 1010 is filled between the active surface AS of the second DRAM die 1002 and the second redistribution structure 1004. The conductive vias 1005 are connected between the first redistribution structure 1003 and the second redistribution structure 1004.

Figure 11A:
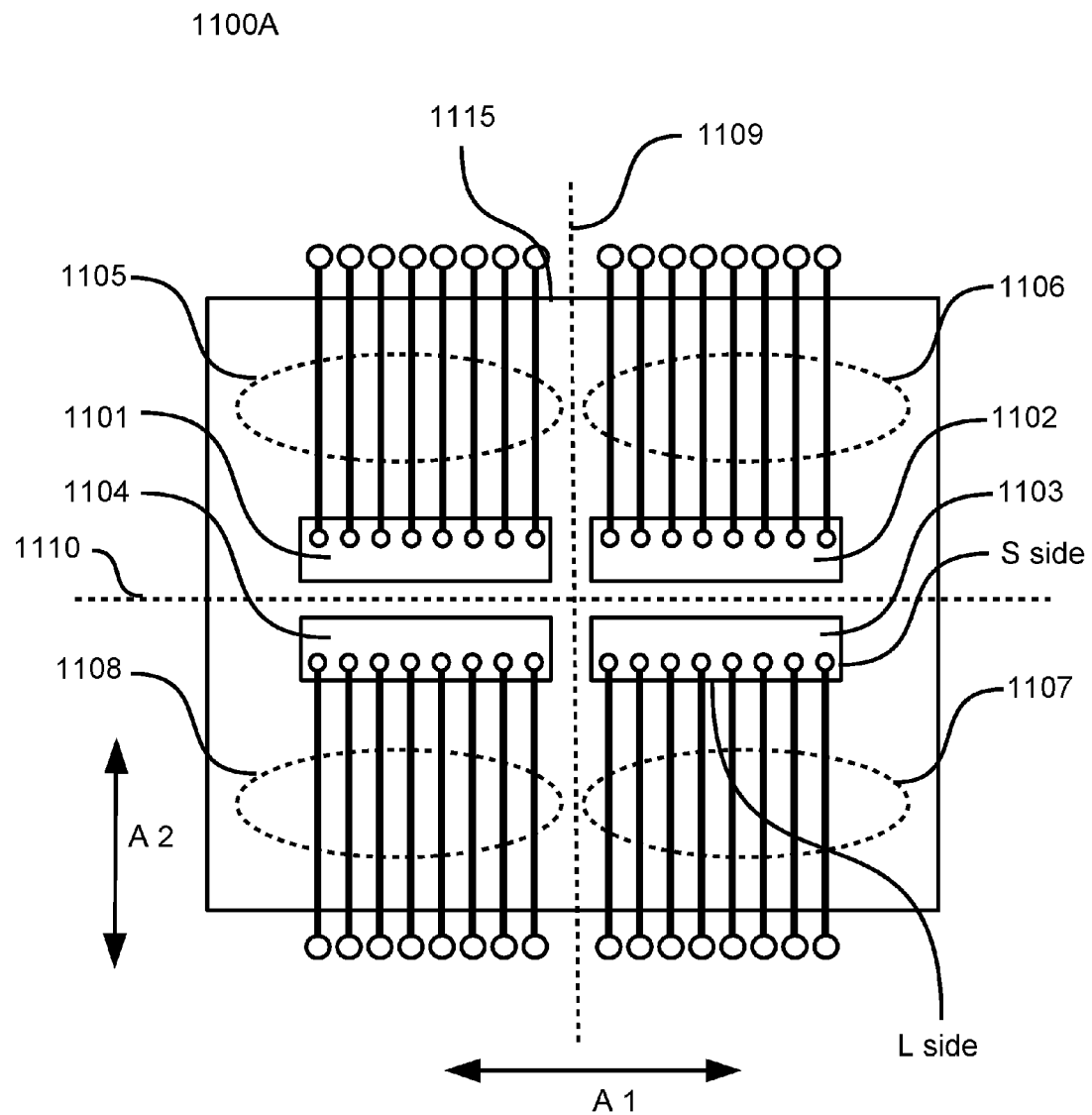
FIG. 11A shows an exemplary bottom view of a memory chip connected to a redistribution structure.
Figure 11B:
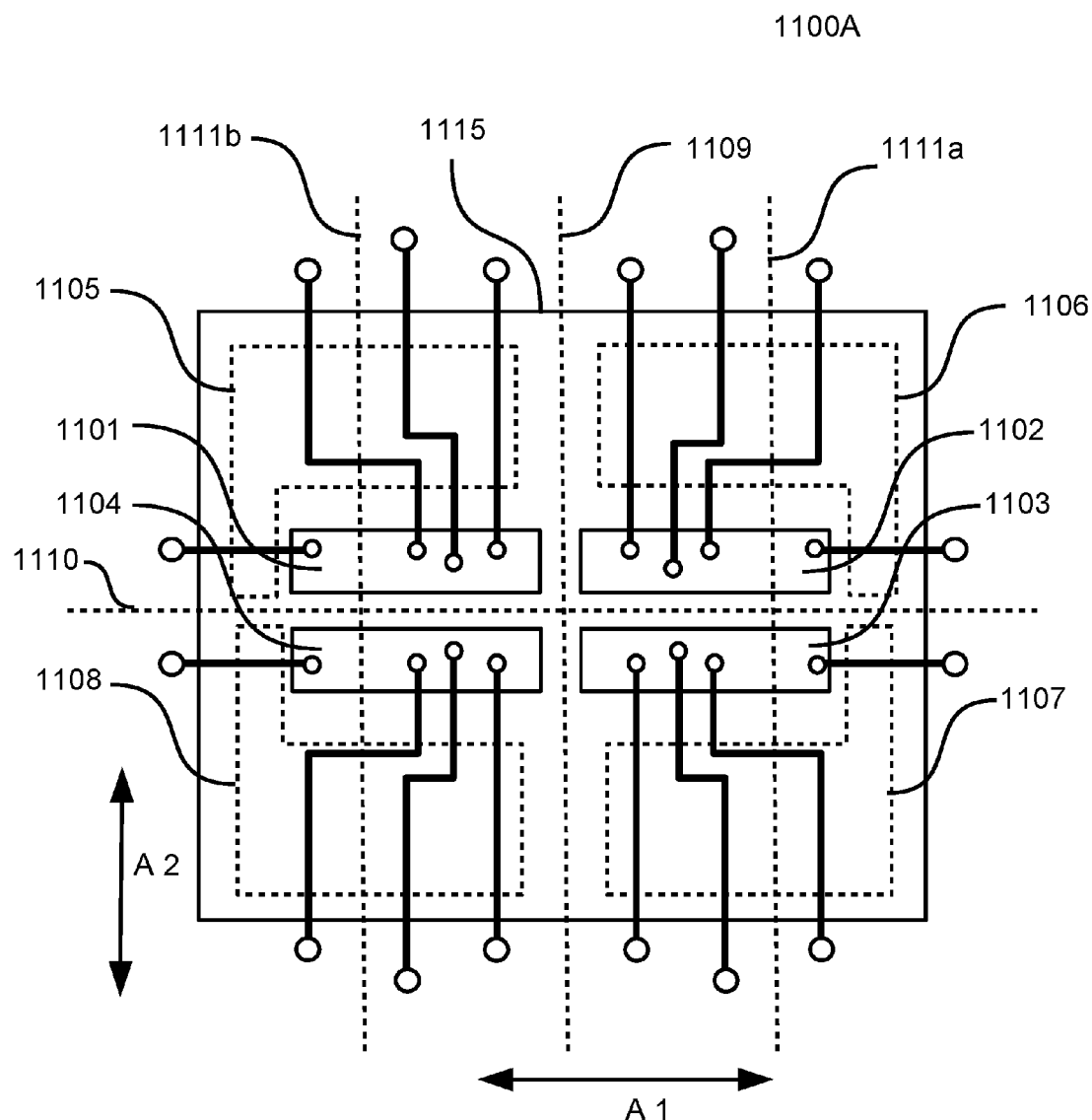
FIG. 11B shows another exemplary bottom view of a memory chip connected to a redistribution structure.
Figure 11C:
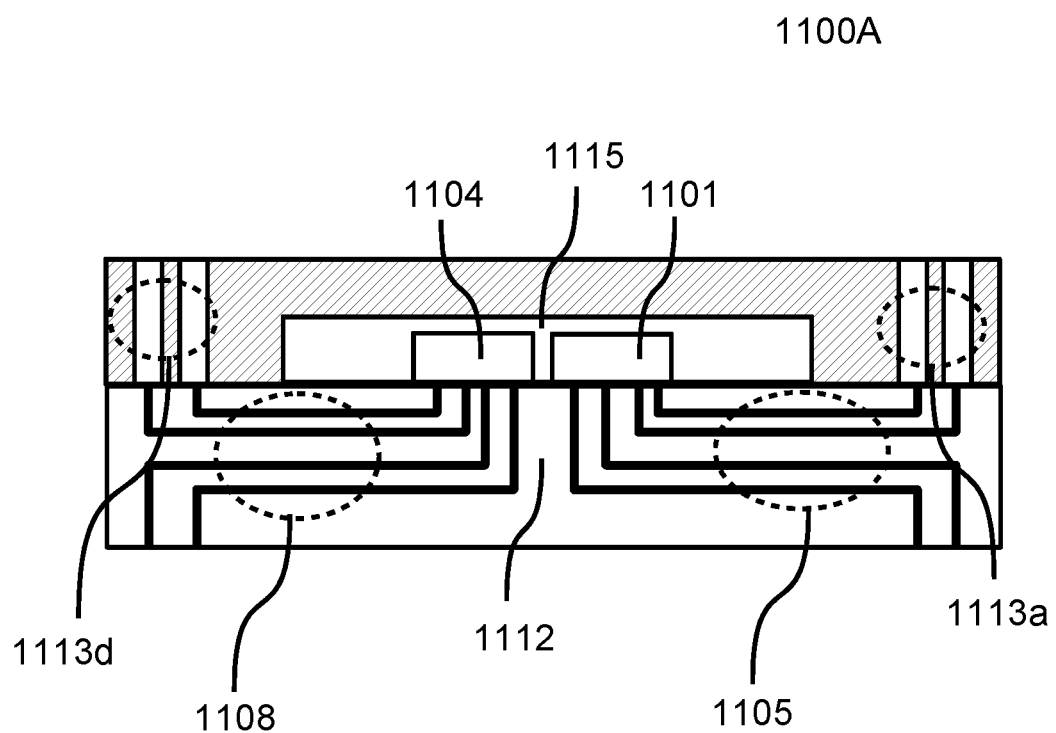
FIG. 11C shows a cross sectional view along a cutting line 1111a shown in FIG. 11B.
Figure 11D:
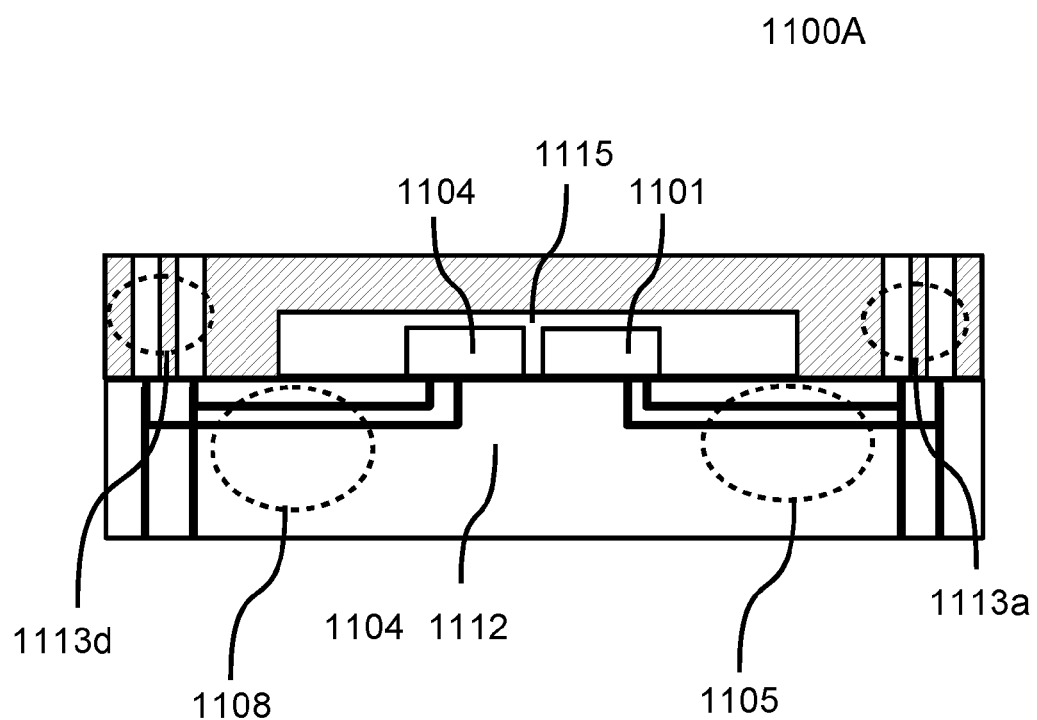
FIG. 11D shows a cross sectional view along a cutting line 1111b shown in FIG. 11B.
Figure 11E:
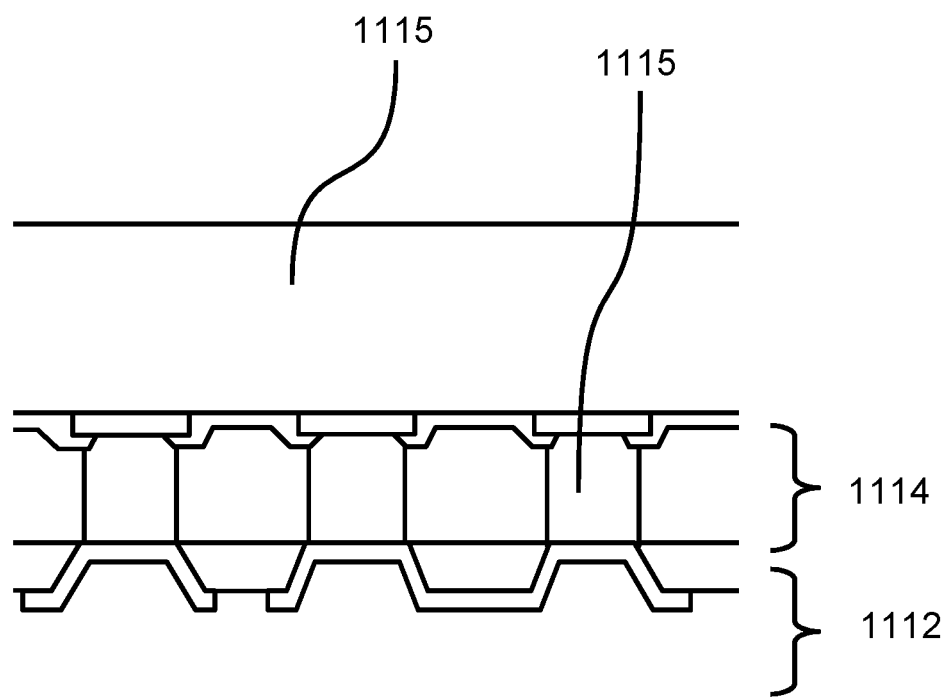
FIG. 11E shows a connection structure.
Figure 11F:
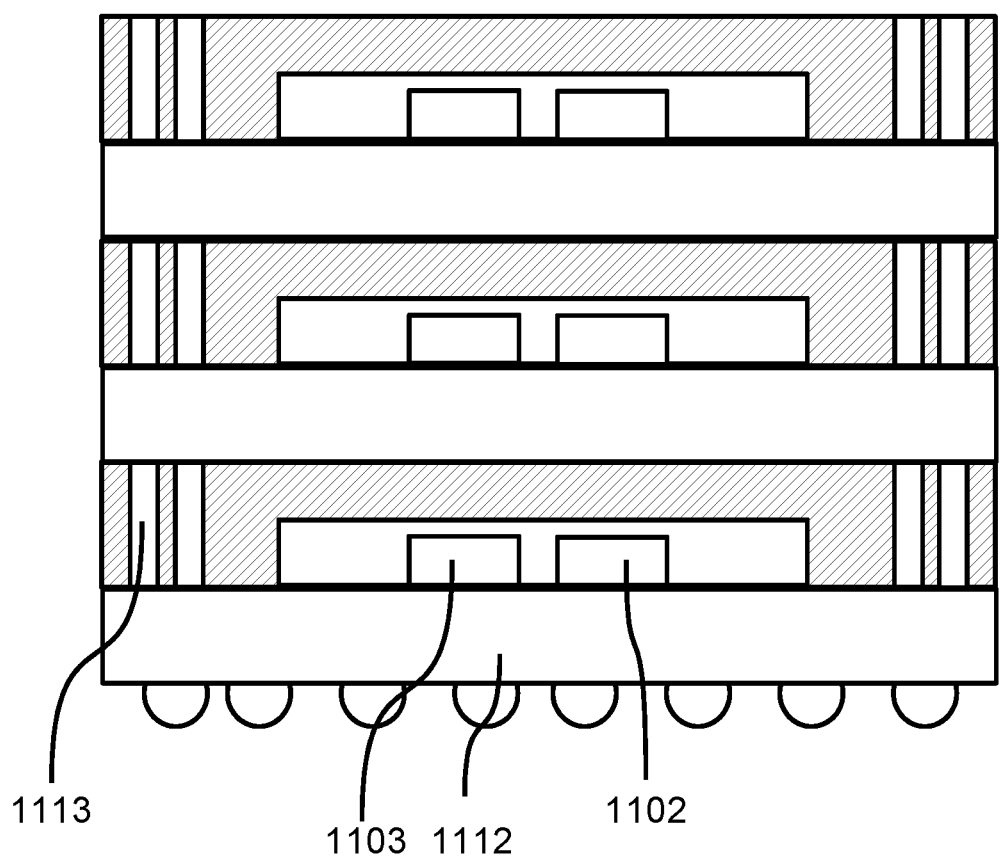
FIG. 11F shows an embodiment of a semiconductor package.
Figure 11G:
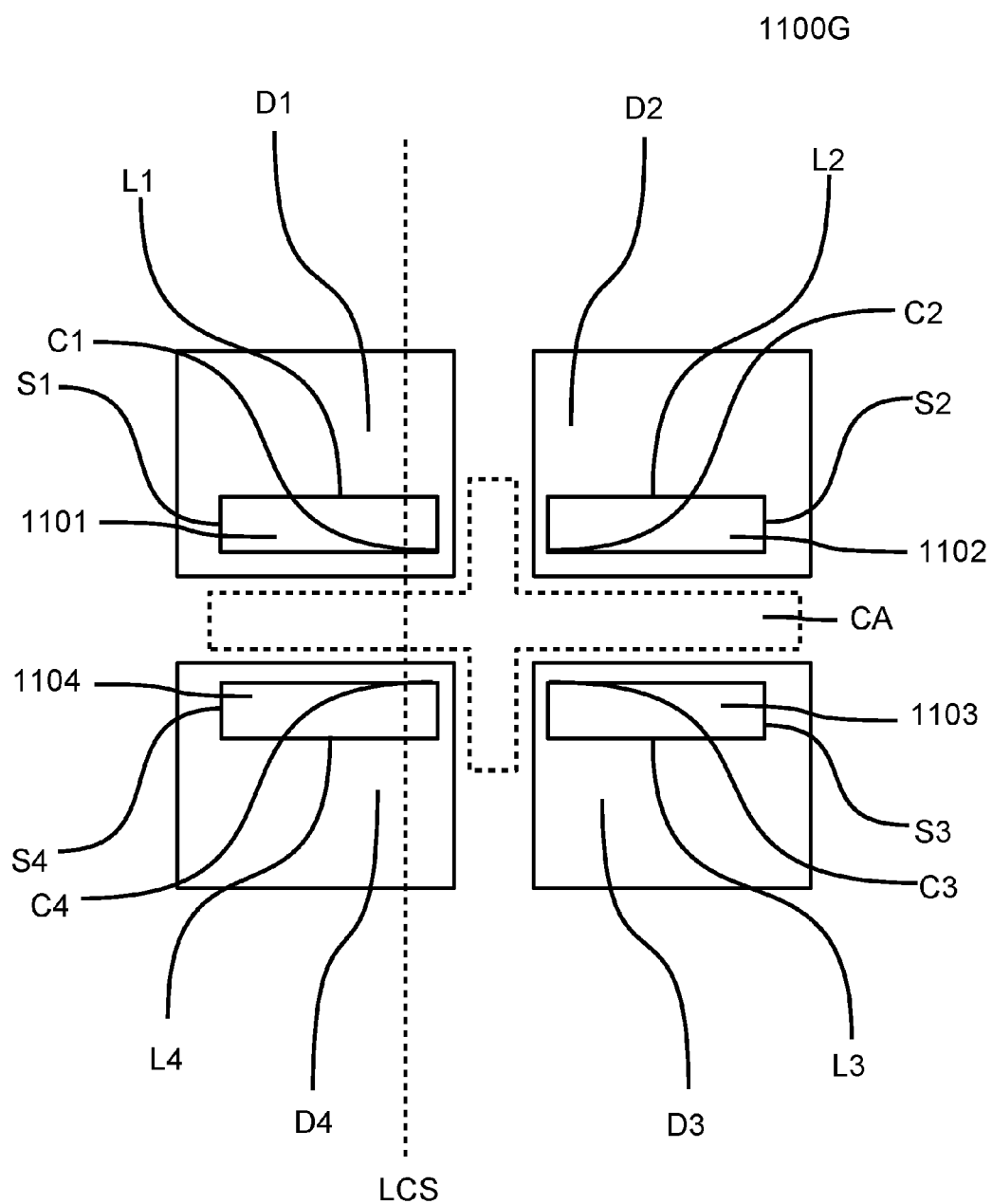
FIG. 11G shows a top view of an embodiment of a memory module.
Figure 11H:
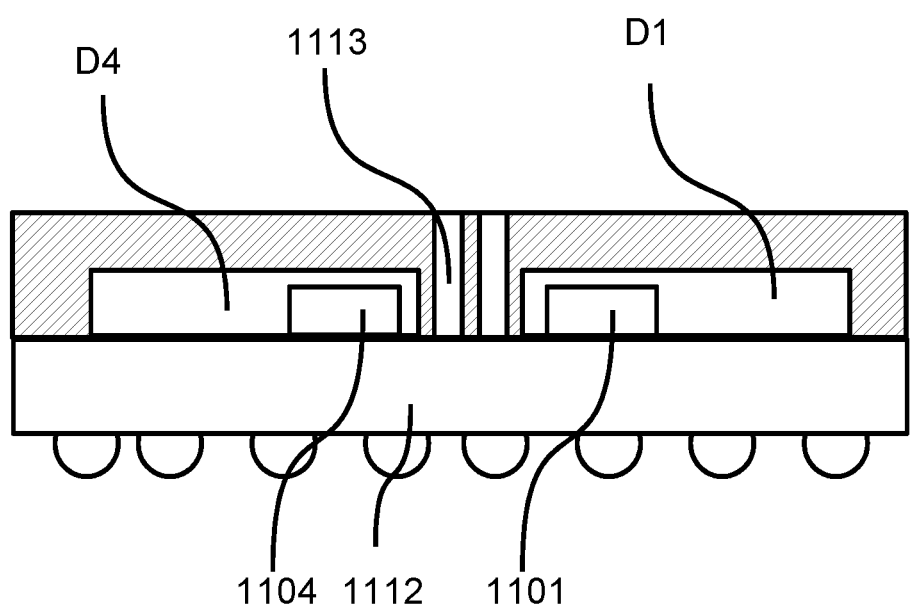
FIG. 11H shows a cross sectional view of the memory module of FIG. 11G.
Figure 11I:
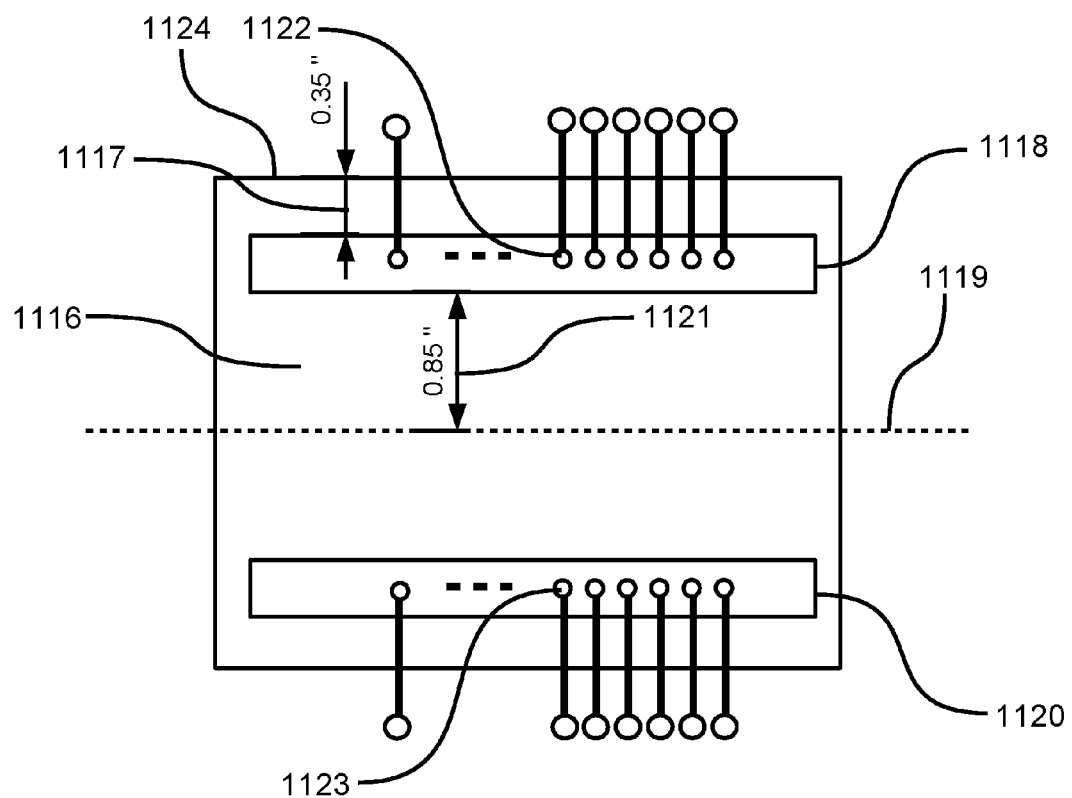
FIG. 11I shows an active surface view of a die.

FIG. 11A shows an exemplary bottom view of a memory chip connected to a redistribution structure. FIG. 11B shows an exemplary bottom view of a memory chip connected to a redistribution structure. FIG. 11C shows a cross sectional view along a cutting line 1111a shown in FIG. 11B. FIG. 11D shows a cross sectional view along a cutting line 1111b shown in FIG. 11B. FIG. 11E shows a connection structure. FIG. 11F shows an embodiment of a semiconductor package. FIG. 11G shows a top view of an embodiment of a memory module. FIG. 11H shows a cross sectional view of the memory module of FIG. 11G. FIG. 11I shows an active surface view of a die.

Referring to FIG. 11A, FIG. 11B, FIG. 11C, FIG. 11D, and FIG. 11E, in one embodiment, a memory module 1100A is disclosed. The memory module 1100A comprises a memory chip 1115, a connection structure 1114, a redistribution structure 1112, a first group of conductive vias 1113a, a second group of conductive vias 1113b, a third group of conductive vias 1113c, and a fourth group of conductive vias 1113d. The memory chip 1115 comprises a first quadrant 1101, a second quadrant 1102, a third quadrant 1103, and a fourth quadrant 1104.

Each quadrant has a channel. The redistribution structure 1112 is connected to the memory chip 1115 through the connection structure 1114. The redistribution structure 1112 comprises a first group of metal traces 1105, a second group of metal traces 1106, a third group of metal traces 1107 and a fourth group of metal traces 1108. The first group of conductive vias 1103a are electrically connected to the first quadrant 1101 through the first group of metal traces 1105.

The second group of conductive vias 1113b are electrically connected to the second quadrant 1102 through the second group of metal traces 1106. The third group of conductive vias 1113c are electrically connected to the third quadrant 1103 through the third group of metal traces 1107. The fourth group of conductive vias 1113d are electrically connected to the fourth quadrant 1104 through the fourth group of metal traces 1108. The first group of metal traces 1105 is substantially symmetric to the second group of metal traces 1106 with respect to a first plane 1109. The third group of metal traces 1107 are substantially symmetric to the fourth group of metal traces 1108 with respect to the first plane 1109.

Referring to FIG. 11A, FIG. 11B, FIG. 11C, FIG. 11D, and FIG. 11E, in one embodiment, a memory module 1100A is disclosed. The memory module 1100A comprises a memory chip 1115, a connection structure 1114, and a redistribution structure 1112. The memory chip 1100ac comprises a first quadrant 1101, a second quadrant 1102, a third quadrant 1103, and a fourth quadrant 1104. Each quadrant has a channel. Each quadrant has an L side and an S side. A length of the L side is greater than a length of the S side in a quadrant. In each quadrant, the L side is along a first axis A1, and the S side is along a second axis A2. The redistribution structure 1112 is connected to the memory chip 1115 through the connection structure 1114.

The redistribution structure 1112 comprises a first group of metal traces 1105, a second group of metal traces 1106, a third group of metal traces 1107, and a fourth group of metal traces 1108. A majority of the first group of metal traces 1105 are routed substantially in parallel with the second axis A2. A majority of the second group of metal traces 1106 are routed substantially in parallel with the second axis A2. A majority of the third group of metal traces 1108 are routed substantially in parallel with the second axis A2. A majority of the fourth group of metal traces 1108 are routed substantially in parallel with the second axis A2.

Referring to FIG. 11A, FIG. 11B, FIG. 11C, FIG. 11D, FIG. 11E, Fig. G, and Fig. H, in one embodiment, a memory module 1100G is disclosed. The memory module 1100G comprises a first memory die D1, a second memory die D2 a third memory die D3, a fourth memory die D4, a connection structure 1114, a redistribution structure 1112, and a plurality of conductive vias 1113. The first memory die D1 comprises a first quadrant 1101. The first memory die D1 having a first inner corner C1.

The first inner corner C1 is formed by an a first L side L1 and a first S side S1. The second memory die D2 comprises a second quadrant 1102. The second memory die D2 has a second inner corner C2. The second inner corner C2 is formed by a second L side L2 and a second S side S2. The third memory die D3 comprises a third quadrant 1103. The third memory die D3 has a third inner corner C3. The third inner corner C3 is formed by a third L side L3 and a third S side S3. The fourth memory die D4 comprises a fourth quadrant 1104.

The fourth memory die D4 has a fourth inner corner C4. The fourth inner corner C4 is formed by a fourth L side L4 and a fourth S side S4. The redistribution structure 1112 is connected to the first memory die D1, the second memory die D2, the third memory die D3, and the fourth memory die D4 through the connection structure 1014. The conductive vias 1113 are connected to the redistribution structure 1112 at a central area CA. The central area CA is substantially surrounded by the first L side L1, the first S side S1, the second L side L2, the second S side S2, the third L side L3, the third S side S3, the fourth L side L4, and the fourth S side S4.

With reference to FIG. 11A, FIG. 11B, FIG. 11C, and FIG. 11D, in one embodiment, the memory module 1100A comprises a memory chip 1115, a connection structure 1114, a redistribution structure 1112, a first group of conductive vias 1113a, a second group of conductive vias 1113b, a third group of conductive vias 1113c, and a fourth group of conductive vias 1113d.

The memory chip 1115 comprises a first quadrant 1101, a second quadrant 1102, a third quadrant 1103, and a fourth quadrant 1104. Each quadrant comprises a channel. The redistribution structure 1112 is connected to the memory chip 1115 through the connection structure 1114. The redistribution structure 1112 comprises a first group of metal traces 1105, a second group of metal traces 1106, a third group of metal traces 1107 and a fourth group of metal traces 1108. The first group of conductive vias 1113a is electrically connected to the first quadrant 1101 through the first group of metal traces 1105.

The second group of conductive vias 1113b are electrically connected to the second quadrant 1102 through the second group of metal traces 1106. The third group of conductive vias 1113c are electrically connected to the third quadrant 1103 through the third group of metal traces 1107. The fourth group of conductive vias 1113d are electrically connected to the fourth quadrant 1104 through the fourth group of metal traces 1108. The first group of metal traces 1105 is substantially symmetric to the second group of metal traces 1106 with respect to a first plane 1109. The third group of metal traces 1107 is substantially symmetric to the fourth group of metal traces 1108 with respect to the first plane 109.

With reference to FIG. 11A, FIG. 11B, FIG. 11C, and FIG. 11D, in one embodiment, the memory module 1100A comprises a memory chip 1115, a connection structure 1114, and a redistribution structure 1112. The memory chip 1115 comprises a first quadrant 1101, a second quadrant 1102, a third quadrant 1103, and a fourth quadrant 1104. Each quadrant comprises a channel. Each quadrant has an L side and an S side. A length of the L side is greater than a length of the S side. The L side is in parallel with a first axis A1. The S side is in parallel with a second axis A2. The redistribution structure 1112 is connected to the memory chip 1115 through the connection structure 1114.

The redistribution structure 1112 comprises a first group of metal traces 1105, a second group of metal traces 1106, a third group of metal traces 1107, and a fourth group of metal traces 1108. A majority of the first group of metal traces 1105 are routed substantially in parallel with the second axis A2. A majority of the second group of metal traces 1106 are routed substantially in parallel with the second axis A2. A majority of the third group of metal traces 1107 are routed substantially in parallel with the second axis A2. A majority of the fourth group of metal traces 1108 are routed substantially in parallel with the second axis A2.

With reference to FIG. 11G and FIG. 11H, in one embodiment, a memory module 1100G comprises a first memory die D1, a second memory die D2, a third memory die D3, a fourth memory die D4, a connection structure 1114, a redistribution structure 1112, and a plurality of conductive vias 1113. The first memory die D1 comprises a first quadrant 1101. The first memory die D1 has a first inner corner C1.

The first inner corner C1 is formed by an a first L side L1 and a first S side S1. The second memory die D2 comprises a second quadrant 1102. The second memory die has a second inner corner C2. The second inner corner is formed by a second L side L2 and a second S side S2. The third memory die D3 comprises a third quadrant 1103. The third memory die D3 has a third inner corner C3. The third inner corner C3 is formed by a third L side L3 and a third S side S3. The fourth memory die D4 comprises a fourth quadrant 1104.

The fourth memory die D4 has a fourth inner corner C4. The fourth inner corner C4 is formed by a fourth L side L4 and a fourth S side S4. The redistribution structure 1112 is connected to the first memory die D1, the second memory die D2, the third memory die D3, and the fourth memory die D4 through the connection structure 1114. The plurality of conductive vias 1113 connect to the redistribution structure 1112 at a central area CA. The central area CA is substantially surrounded by the first L side L1, the first S side S1, the second L side L2, the second S side S2, the third L side L3, the third S side S3, the fourth L side L4, and the fourth S side S4.

With reference to FIG. 11I, a die 1116 has a first I/O zone 1118, a second I/O zone 1120. A plurality of first I/O ends 1122 are located on the first I/O zone 1118. A plurality of second I/O ends 1123 are located on the second I/O zone 1120. The die 1116 has a central line 1119. A first distance 1121 is defined as a distance between the first I/O zone 1118 and the central line 1119. A second distance 1117 is defined as a distance between the first I/O zone 1118 and an I/O side 1124 of the die 1116. In one example, the second distance 1117 is smaller than the first distance 1121.

Figure 12A:
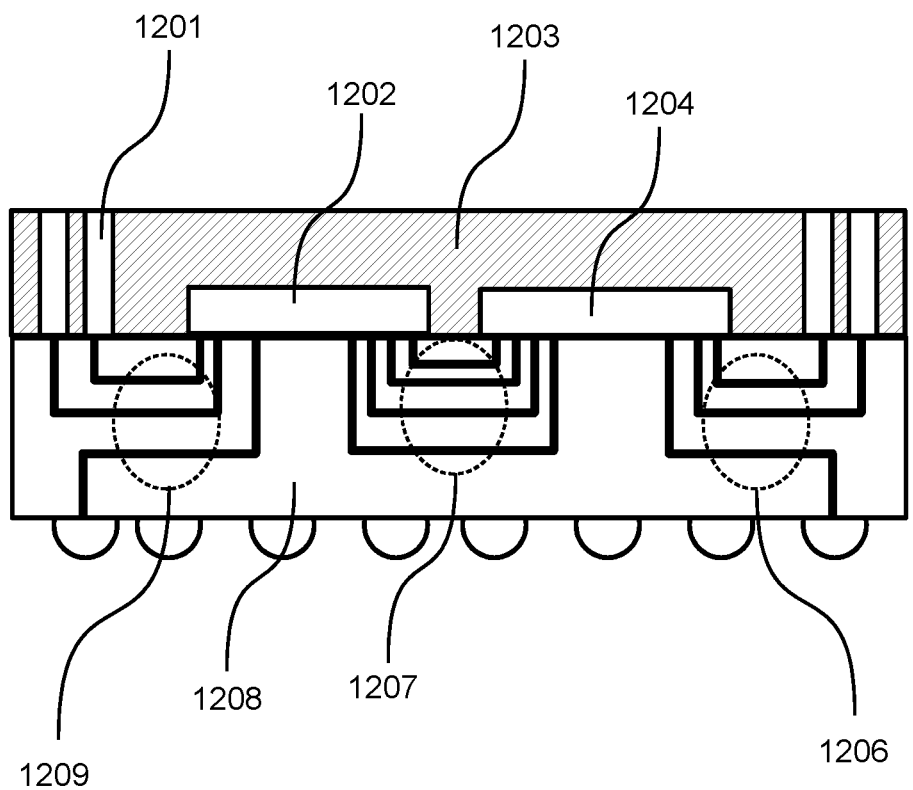
FIG. 12A shows a cross sectional view of an embodiment of a semiconductor package.
Figure 12B:
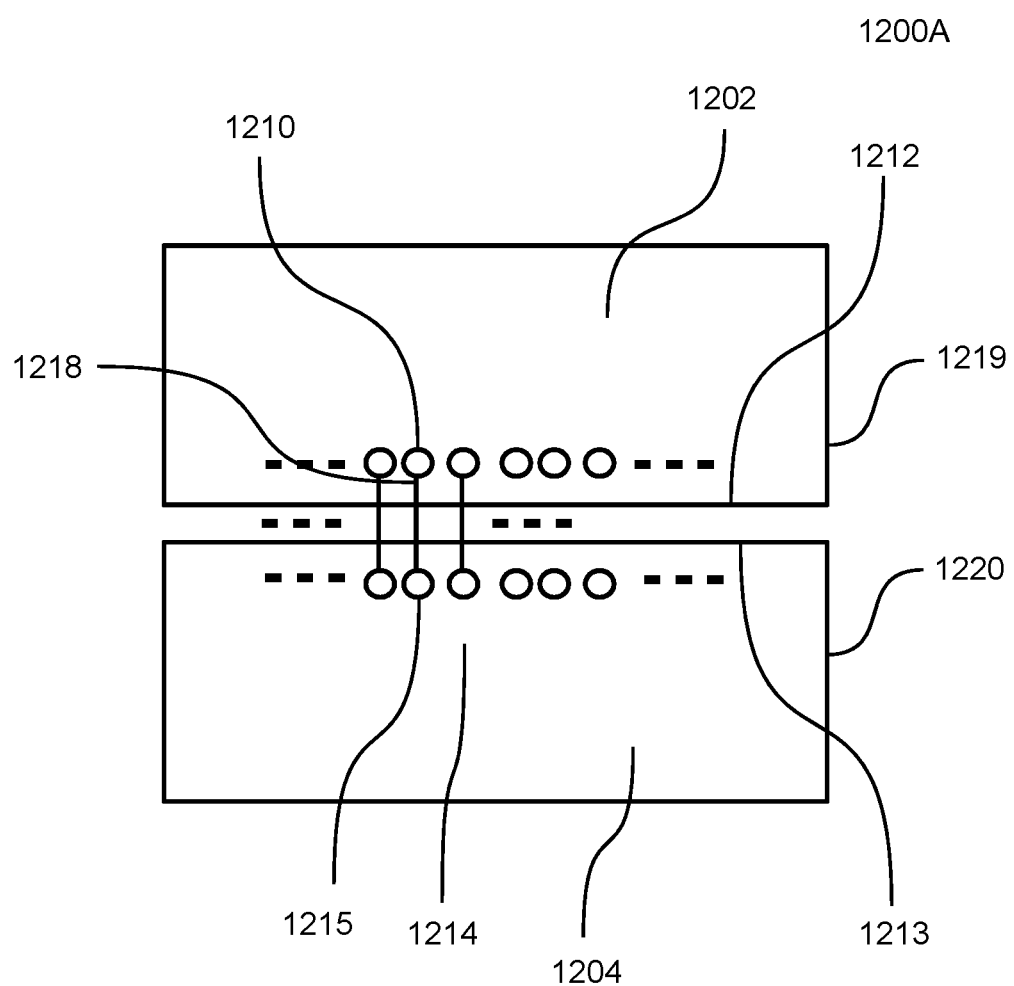
FIG. 12B shows an active surface view of a first die and a second die in FIG. 12A.

FIG. 12A shows a cross sectional view of an embodiment of a semiconductor package. FIG. 12B shows an active surface view of a first die and a second die in FIG. 12A.

With reference to FIG. 12A, in one embodiment, a semiconductor package 1200A comprises a first die 1202, a second die 1204, a redistribution structure 1208, a first group of traces 1209, a second group of traces 1206, and a group of inter die connection traces 1207. The first die 1202 is electrically connected to the redistribution structure 1208. The second die 1204 is electrically connected to the redistribution structure 1208. The first group of traces 1209 is embedded in the redistribution structure 1208. Each of the first group of traces 1209 is connected to the first die and not connected to the second die 1204. The second group of traces 1206 is embedded in the redistribution structure 1208.

Each of the second group of traces 1206 is connected to the second die 1204 and not connected to the first die 1202. The group of inter die connection traces 1207 are embedded in the redistribution structure 1208. The first die 1202 and the second die 1204 are electrically connected by the group of inter die connection traces 1207. A number of the inter die connection traces 1207 is greater than a number of traces in the first group 1209. A number of the inter die connection traces 1207 is greater than a number of the traces in the second group 1206.

With reference to FIG. 12A, in one embodiment, a semiconductor package 1200A comprises a first die 1202, a second die 1204, a redistribution structure 1208, a group of inter die traces 1207, The first die 1202 has a first side 1212 and a second side 1219. The first side 1212 is longer than the second side 1219. The first die 1212 comprises a plurality of first I/O connections 1210. The plurality of first I/O connections 1210 are located substantially along the first side 1212. The second die 1204 has a third side 1213 and a fourth side 1220. The third side 1213 is longer than the fourth side 1220.

The second die comprises a plurality of second I/O connections 1215. The plurality of second I/O connections are located substantially along the third side 1213. The inter die traces 1207 are embedded in the redistribution structure 1208. Each of the inter die traces 1207 is electrically connected to the first die 1202 and is electrically connected to the second die 1204. No solder bump is located between at least one of the inter die traces 1207 and the first die 1202. No solder bump is located between at least one of the inter die traces 1207 and the second die 1204.

Figure 13A:
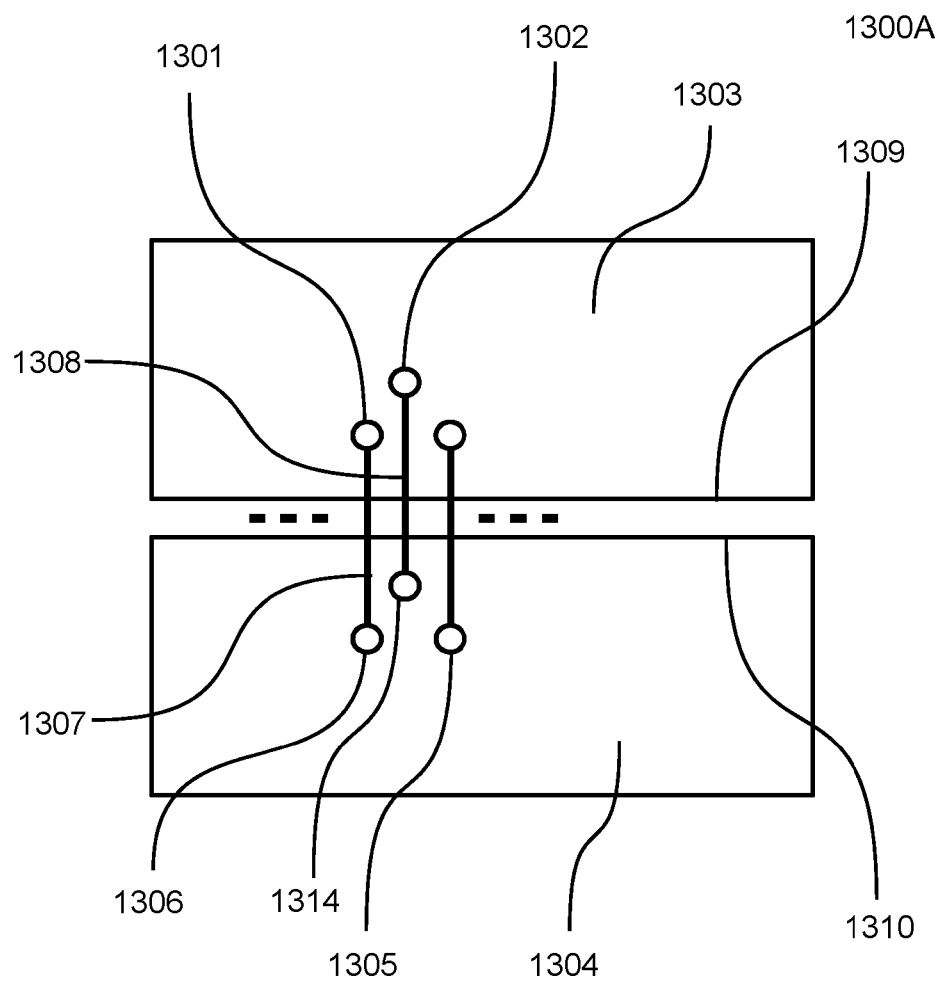
FIG. 13A shows an active surface view of a first die and a second die.
Figure 13B:
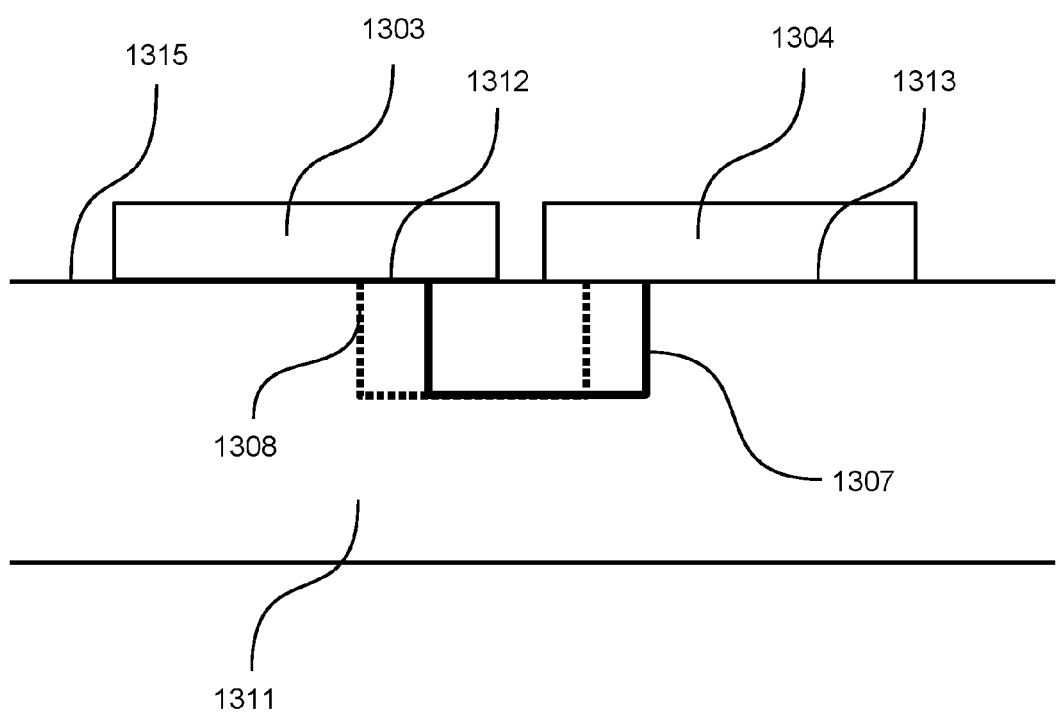
FIG. 13B shows a cross sectional view of a semiconductor package.

FIG. 13A shows an active surface view of a first die and a second die. FIG. 13B shows a cross sectional view of a semiconductor package.

In one embodiment, a semiconductor device 1300A comprises a first die 1303, a second die 1304, a redistribution structure 1311, a first trace 1307 for transmitting a first signal, and a second trace 1308 for transmitting a second signal. The first die 1303 has a first active side 1312. The first die 1303 comprises a first I/O connection 1301 and a second I/O connection 1302 on the first active side. The first I/O connection 1301 is closer to a side edge 1309 of the first die 1301 than the second I/O connection 1302.

The second die 1304 has a second active side 1313. The second die 1304 comprises a third I/O connection 1314 and a fourth I/O connection 1306 on the second active side 1313. The third I/O connection 1314 is closer to a side edge 1310 of the second die 1304 than the fourth I/O connection 1306. The redistribution structure 1311 has a connection surface 1315. The connection surface 1315 is connected to the first active side 1312 of the first die 1303 and the second active side 1313 of the second die 1304.

The first trace 1307 connects the first I/O connection 1301 to the fourth I/O connection 1306. The first trace 1307 has a first trace length. The second trace 1308 connects the second I/O connection 1302 to the third connection 1314. The second trace has a second trace length. The first signal and the second signal are synchronous to a clock signal. The first signal does not allow a phase delay over one clock period with respect to the second signal. In one example, the first trace length and the second trace length are substantially the same.

In one embodiment, a semiconductor package 1300A comprises a first die 1303, a second die 1304, a redistribution structure 1311, a first trace 1307, and a second trace 1308. The first die 1303 has a first active side 1302. The first die 1303 comprises a first I/O connection 1301 and a second I/O connection 1302 on the first active side 1302. The first I/O connection 1301 is closer to a side edge 1309 of the first die than the second I/O connection 1302. The second die 1304 has a second active side 1313. The second die comprises a third I/O connection 1314 and a fourth I/O connection 1306 on the second active side 1313. The third I/O connection 1314 is closer to a side edge 1310 of the second die 1304 than the fourth I/O connection 1306. The redistribution structure 1311 has a connection surface 1315.

The connection surface 1315 is connected to the first active side 1312 of the first die 1303 and the second active side 1313 of the second die 1304. The first trace 1307 transmits a first signal. The first trace 1307 connects the first I/O connection 1301 to the third I/O connection 1314. The first trace 1307 has a first trace length. The second trace 1308 for transmits a second signal. The second trace 1308 connects the second I/O connection 1302 to the fourth connection 1314. The second trace has a second trace length. The first trace length and the second trace length are substantially the same.

Figure 14A:
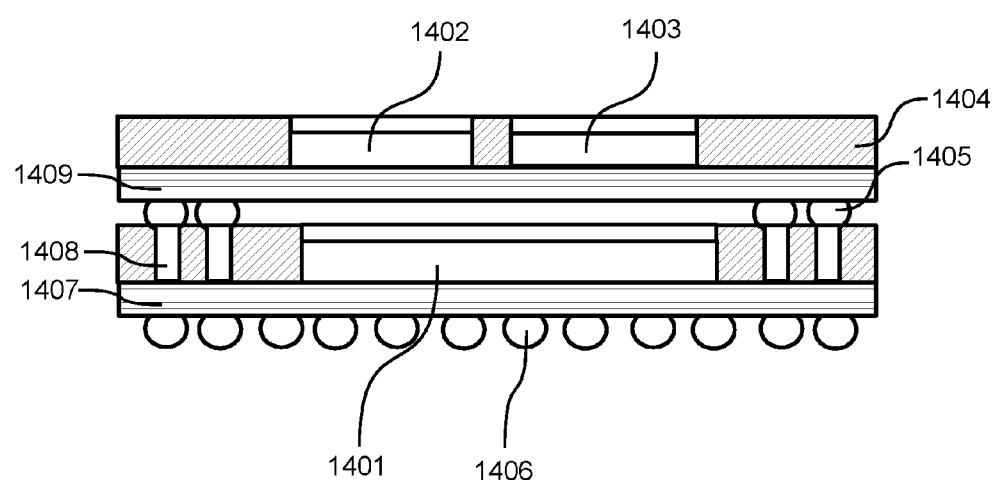
FIG. 14A shows an embodiment of a semiconductor device.
Figure 14B:
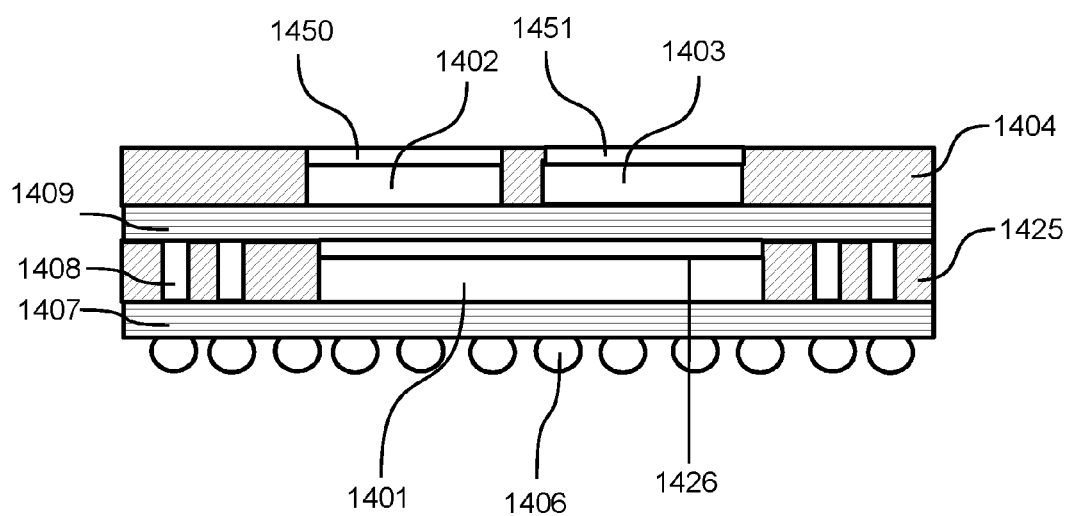
FIG. 14B shows another embodiment of a semiconductor device.
Figure 14C:
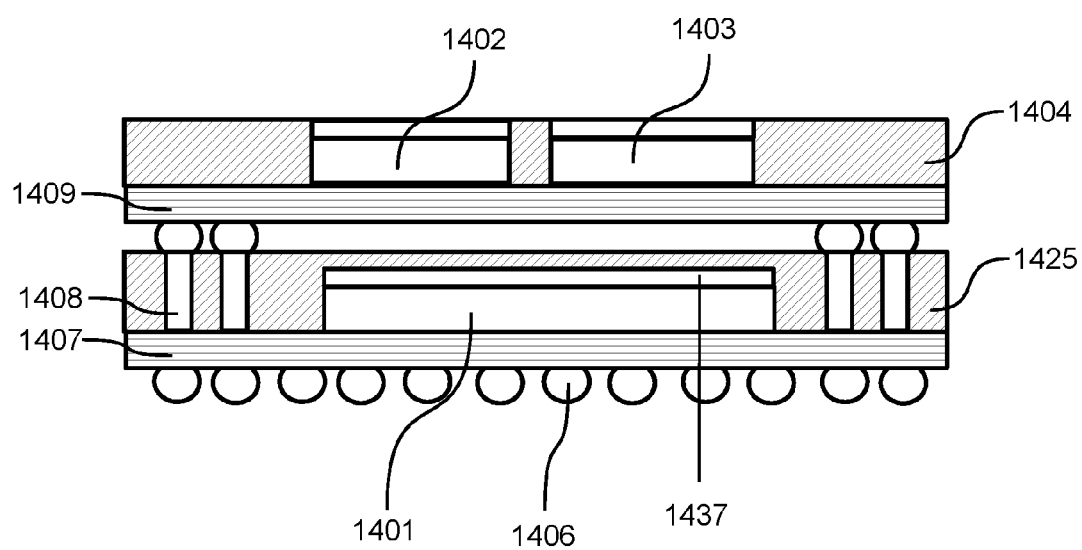
FIG. 14C shows another embodiment of a semiconductor device.
Figure 14D:
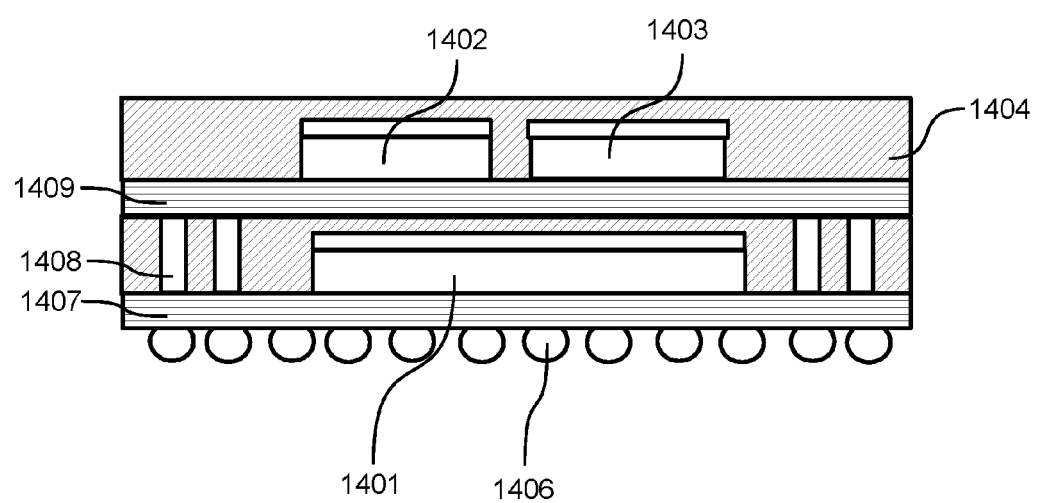
FIG. 14D shows another embodiment of a semiconductor device.
Figure 14E:
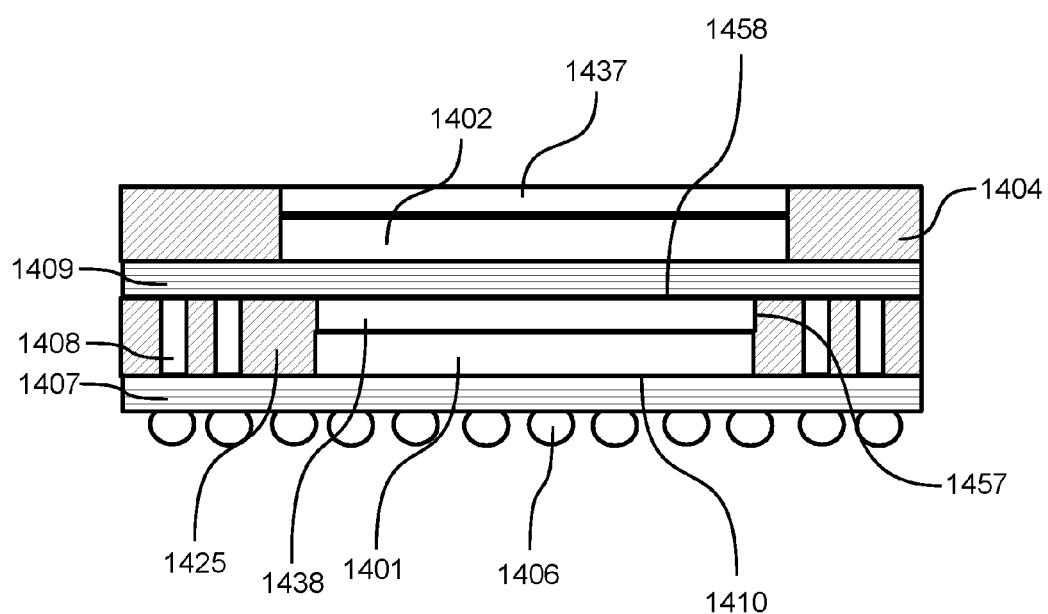
FIG. 14E shows another embodiment of a semiconductor device.
Figure 14F:
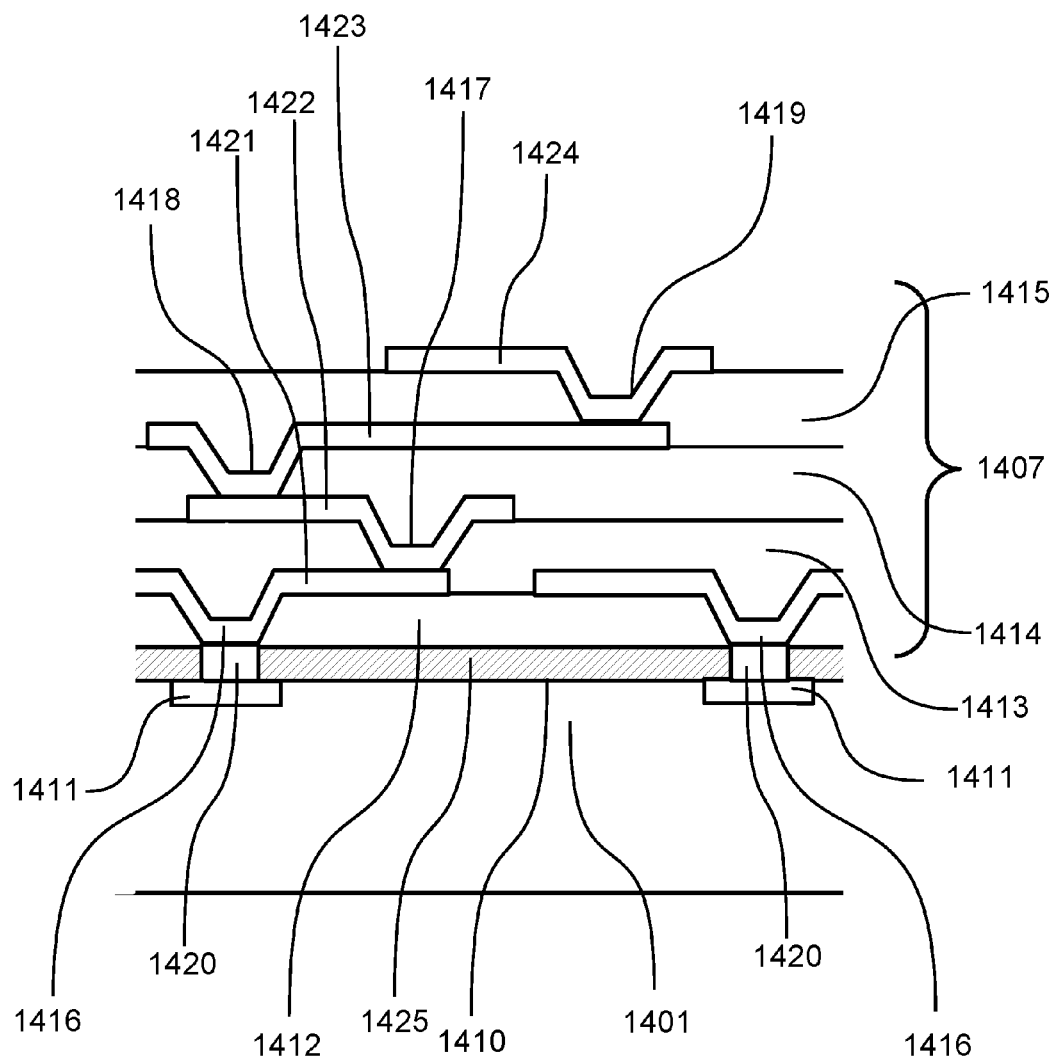
FIG. 14F shows a cross sectional view of a redistribution structure and a die.

FIG. 14A shows an embodiment of a semiconductor device. FIG. 14B shows an embodiment of a semiconductor device. FIG. 14C shows an embodiment of a semiconductor device. FIG. 14D shows an embodiment of a semiconductor device. FIG. 14E shows an embodiment of a semiconductor device. FIG. 14F shows a cross sectional view of a redistribution structure and a die.

Figure 14G:
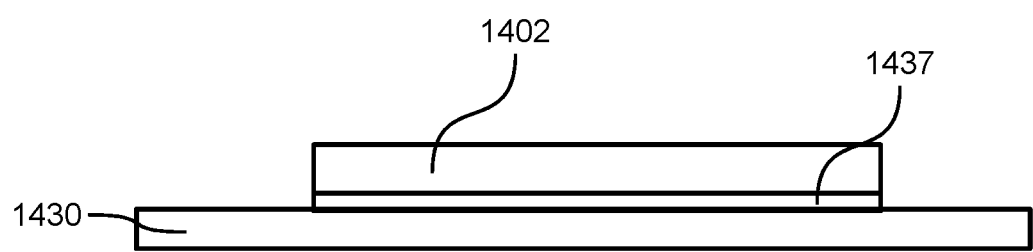
FIG. 14G shows one step of a method for making a semiconductor device.
Figure 14H:
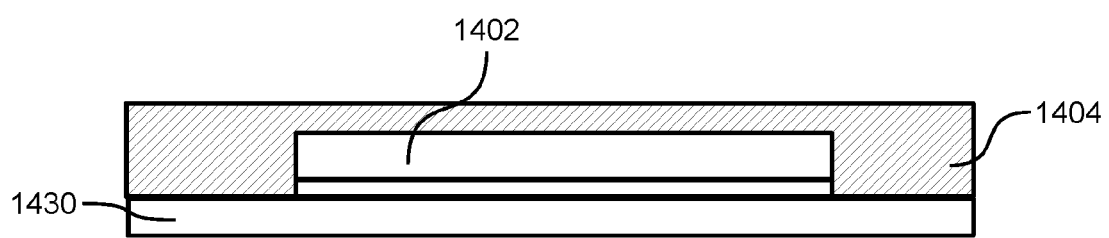
FIG. 14H shows next step of a method for making a semiconductor device.
Figure 14I:
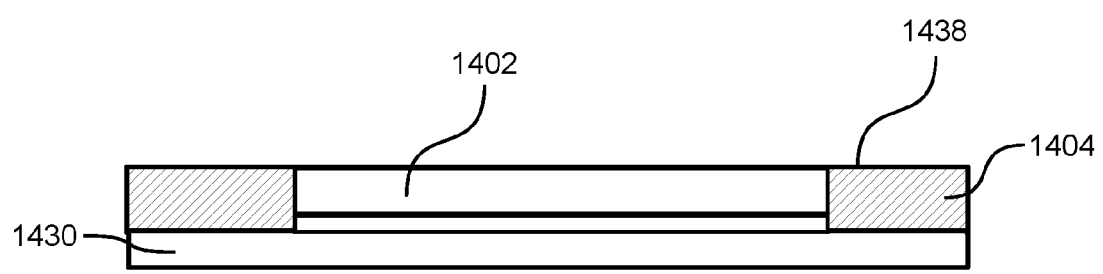
FIG. 14I shows next step of a method for making a semiconductor device.
Figure 14J:
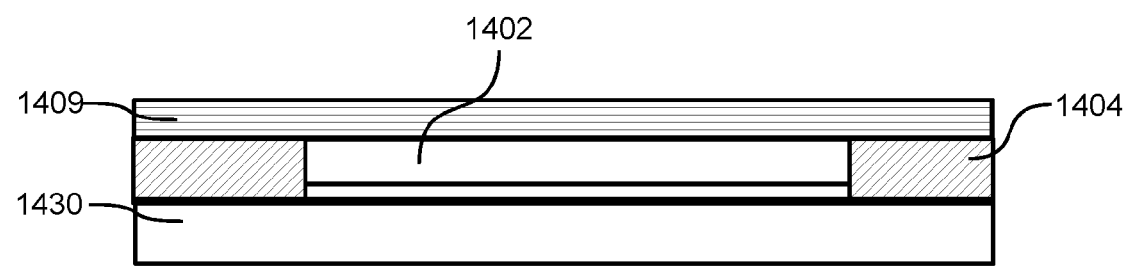
FIG. 14J shows next step of a method for making a semiconductor device.
Figure 14K:
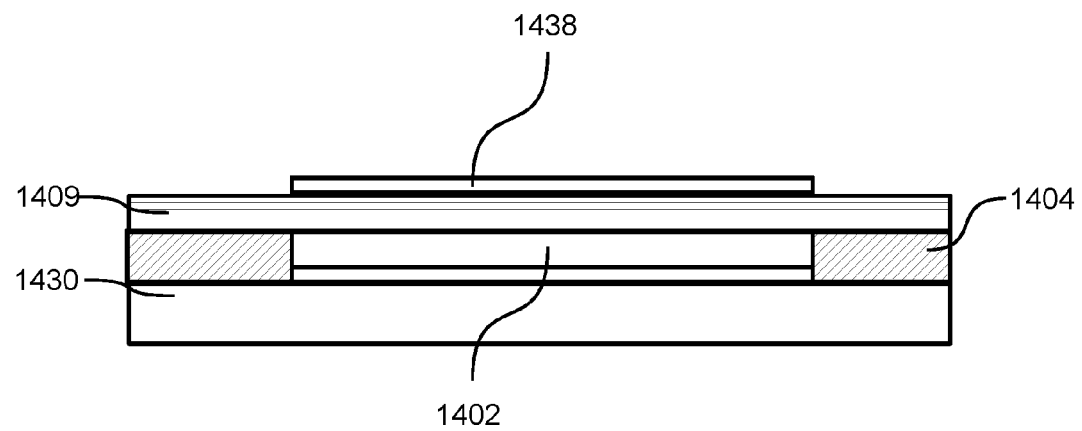
FIG. 14K shows next step of a method for making a semiconductor device.
Figure 14L:
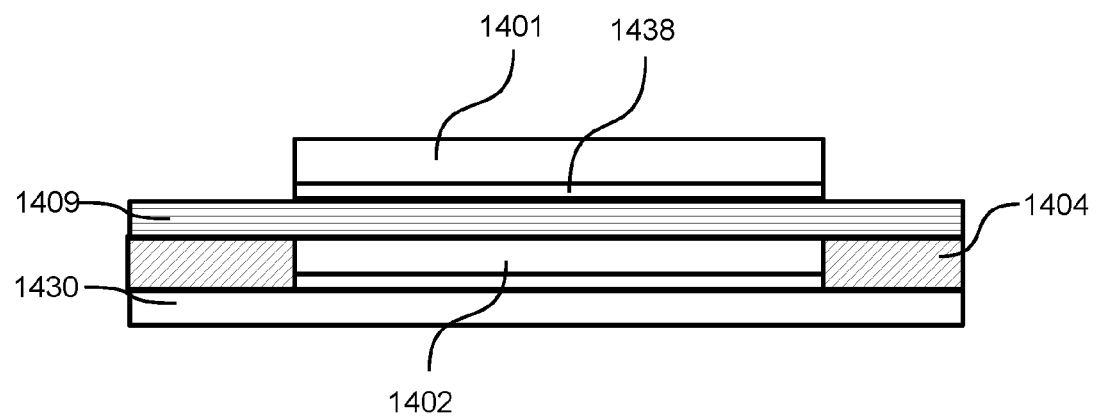
FIG. 14L shows next step of a method for making a semiconductor device.

FIG. 14G shows one step of a method for making a semiconductor device. FIG. 14H shows one step of a method for making a semiconductor device. FIG. 14I shows one step of a method for making a semiconductor device. FIG. 14J shows one step of a method for making a semiconductor device. FIG. 14K shows one step of a method for making a semiconductor device. FIG. 14L shows one step of a method for making a semiconductor device.

Figure 14M:
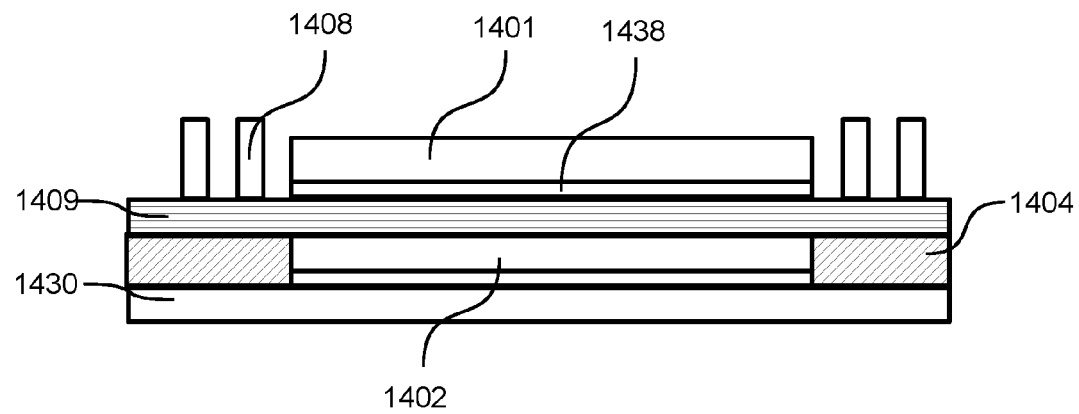
FIG. 14M shows next step of a method for making a semiconductor device.
Figure 14N:
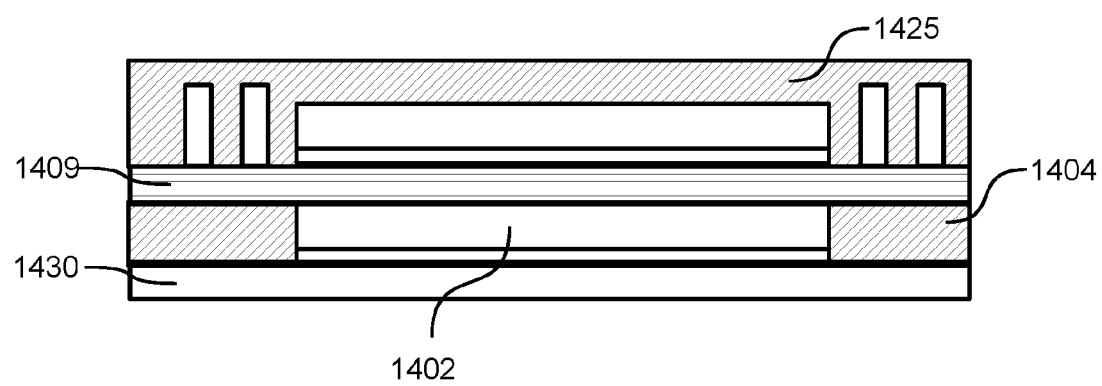
FIG. 14N shows next step of a method for making a semiconductor device.
Figure 14O:
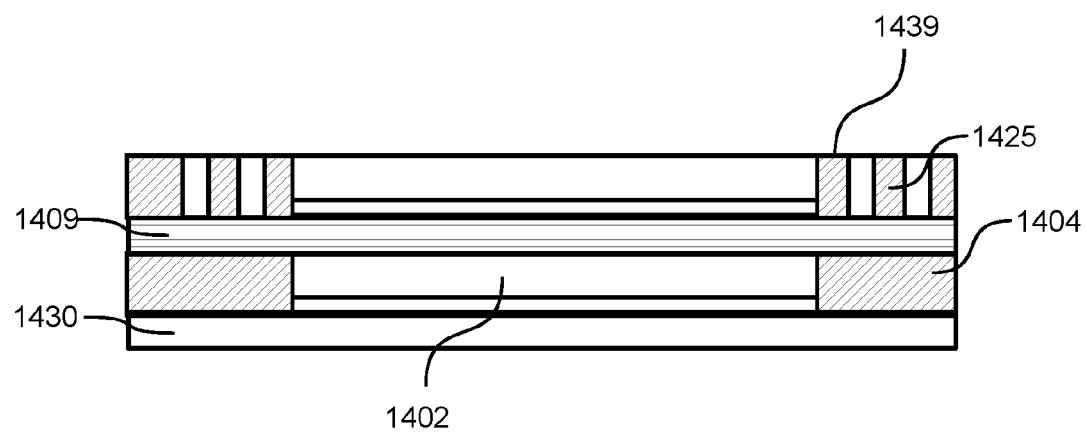
FIG. 14O shows next step of a method for making a semiconductor device.
Figure 14P:
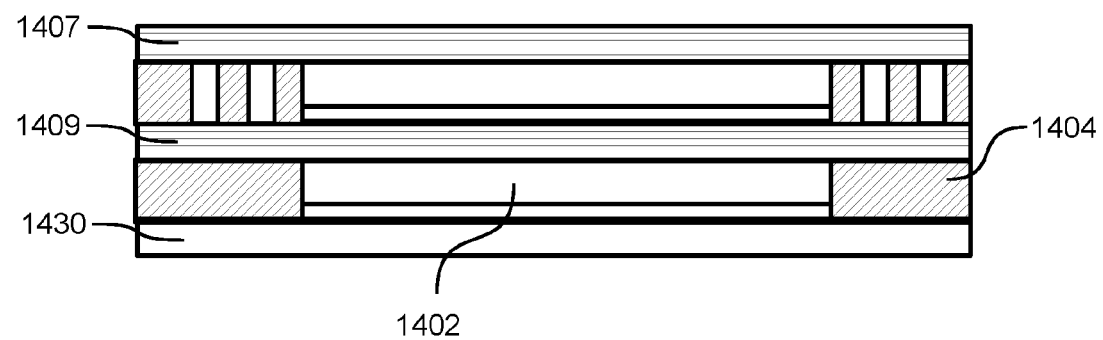
FIG. 14P shows next step of a method for making a semiconductor device.
Figure 14Q:
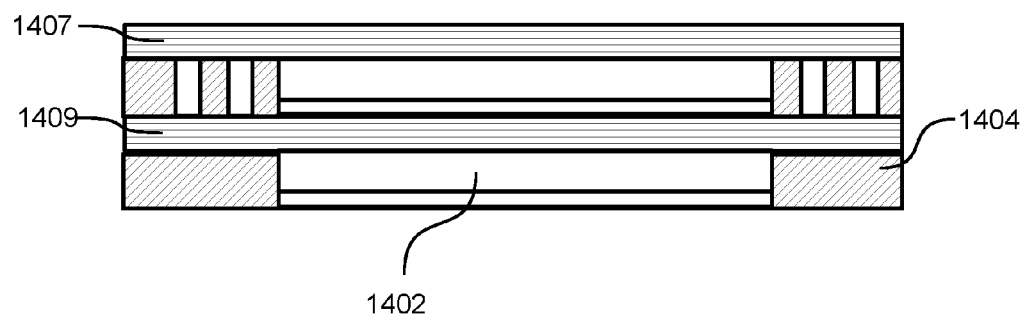
FIG. 14Q shows next step of a method for making a semiconductor device.
Figure 14R:
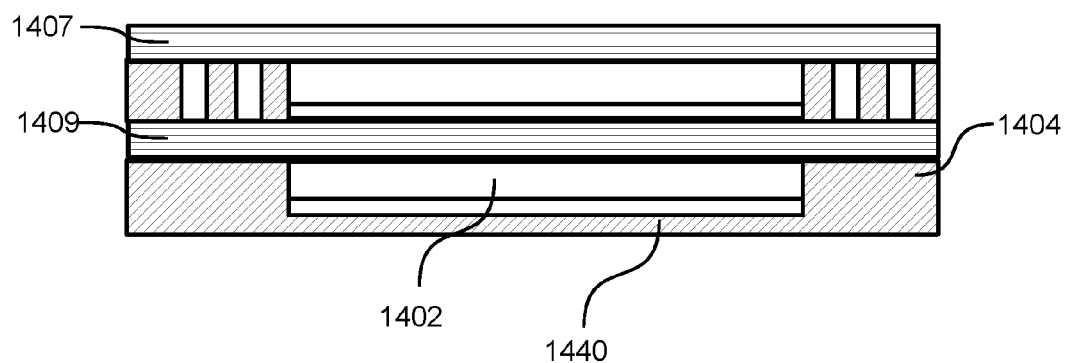
FIG. 14R shows next step of a method for making a semiconductor device.
Figure 14S:
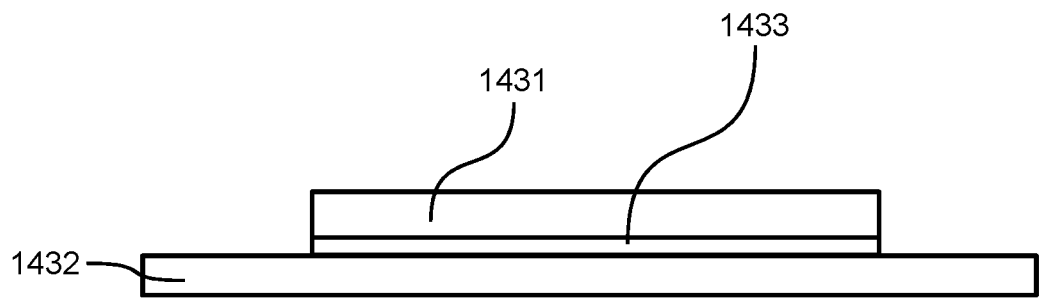
FIG. 14S shows next step of a method for making a semiconductor device.

FIG. 14M shows one step of a method for making a semiconductor device. FIG. 14N shows one step of a method for making a semiconductor device. FIG. 14O shows one step of a method for making a semiconductor device. FIG. 14P shows one step of a method for making a semiconductor device. FIG. 14Q shows one step of a method for making a semiconductor device. FIG. 14R shows one step of a method for making a semiconductor device. FIG. 14S shows one step of a method for making a semiconductor device.

Figure 14T:
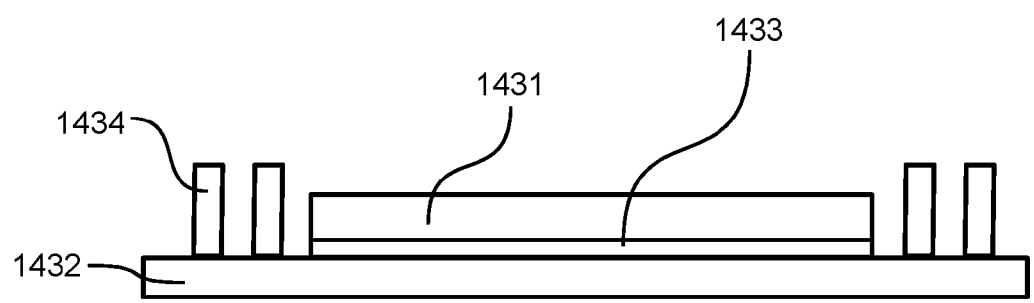
FIG. 14T shows next step of a method for making a semiconductor device.
Figure 14U:
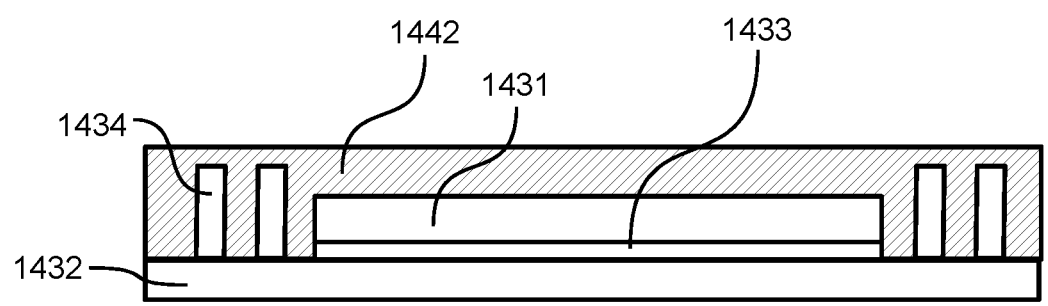
FIG. 14U shows next step of a method for making a semiconductor device.
Figure 14V:
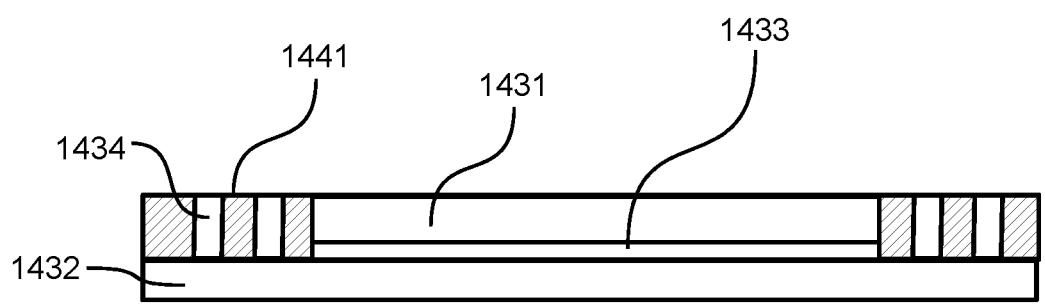
FIG. 14V shows next step of a method for making a semiconductor device.
Figure 14W:
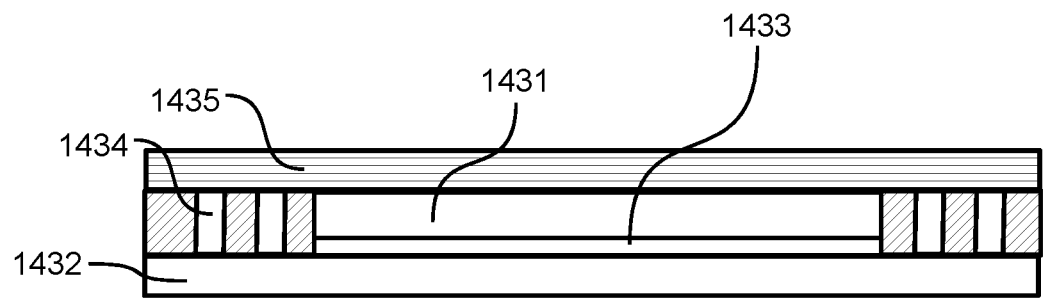
FIG. 14W shows next step of a method for making a semiconductor device.
Figure 14X:
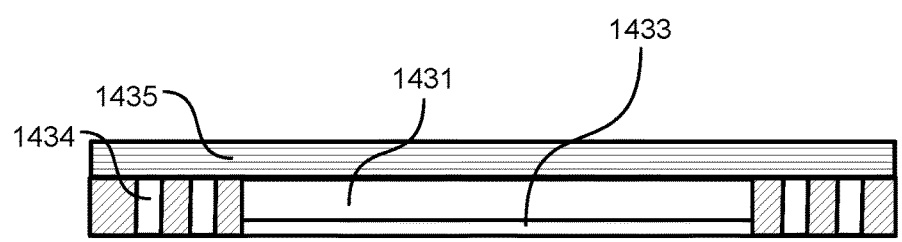
FIG. 14X shows next step of a method for making a semiconductor device.
Figure 14Y:
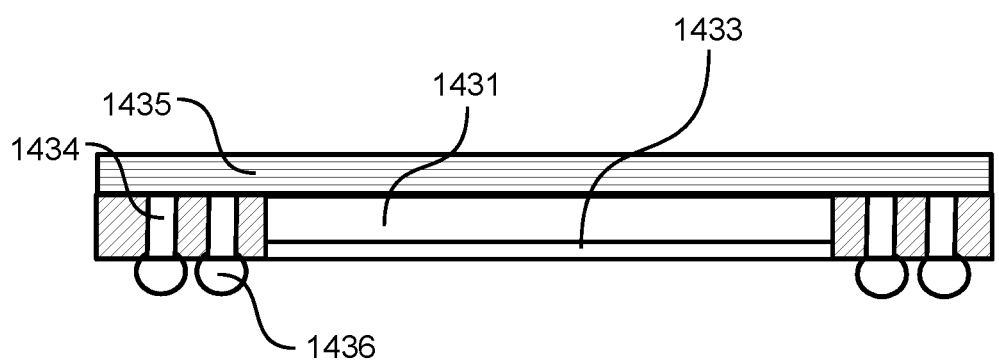
FIG. 14Y shows next step of a method for making a semiconductor device.

FIG. 14T shows one step of a method for making a semiconductor device. FIG. 14U shows one step of a method for making a semiconductor device. FIG. 14V shows one step of a method for making a semiconductor device. FIG. 14W shows one step of a method for making a semiconductor device. FIG. 14X shows one step of a method for making a semiconductor device. FIG. 14Y shows one step of a method for making a semiconductor device.

A trace thickness ratio (A/B) is defined as a ratio between a first trace thickness A and a second trace thickness B. For example, a trace thickness ratio (A/B) is the result of the first trace thickness A divided by the second trace thickness B. In other words, the first trace thickness A is a numerator and the second trace thickness B is a denominator. In another example, there is a third trace thickness C. A trace thickness ratio (C/A) is the result of the third trace thickness C divided by the first trace thickness A. In other words, the third trace thickness C is a numerator and the first trace thickness A is a denominator.

In one embodiment, with reference to FIG. 14A to FIG. 14F, a semiconductor device 1400E comprises a die 1401, a redistribution structure 1407, and a plurality of metal posts 1420. The die 1401 has an active surface 1410. The die 1401 comprises a plurality of metal pads 1411 on the active surface 1410.

The redistribution structure 1407 comprises a first sublayer 1412, a second sublayer 1413, and a third sublayer 1414. The second sublayer 1413 is located between the first sublayer 1412 and the third sublayer 1414. The first sublayer 1412 comprises a plurality of first vias 1416 and a plurality of first metal traces 1421. The first vias 1416 are cup-shaped. The first metal traces 1421 have a first trace thickness A. The second sublayer 1413 comprises a plurality of second vias 1417 and a plurality of second metal traces 1422. The second vias 1417 are cup-shaped. The second metal traces 1422 have a second trace thickness B. The third sublayer 1414 comprises a plurality of third vias 1418 and a plurality of third metal traces 1423. The third vias 1418 are cup-shaped. The third metal traces 1423 have a third trace thickness C.

The first vias 1416 are in contact with the metal posts 1420. The metal pads 1411 are in contact with the metal posts 1420. The first trace thickness A is smaller than the third trace thickness C. The first metal traces 1421, the second metal traces 1422, and the third metal traces 1423 are made of aluminium, copper, tungsten, and/or alloys thereof. The first sublayer 1412, the second sublayer 1413, and the third sublayer 1414 can comprise WPR, epoxy, polyimide (PI), benzocyclobutene (BCB), or polybenzoxazole (PBO).

In one example, the first metal traces 1421 are made of copper. In one example, the second metal traces 1422 are made of copper. In one example, the third metal traces 1423 are made of copper. In one example, the semiconductor device 1400E comprises a plurality of metal pillars 1408. The metal pillars 1408 are beside the die 1401. The metal pillars 1408 are connected to the the redistribution structure 1407.

In one example, the redistribution structure 1407 is a first redistribution structure. The semiconductor device 1400E comprises a second redistribution structure 1409, and a second die 1402. The second die 1402 is a memory die. The second die 1402 is connected to the second redistribution structure 1409. In one example, a height of the metal posts is between 1 micrometer and 10 micrometer. In one example, a height of the metal posts is between 1 micrometer and 5 micrometer. In one example, a molding material 1425 is filled between the the first sublayer 1402 and the active surface 1410 of the die 1401.

In one example, a molding material 1425 is filled between the die 1401 and the metal pillars 1408. In one example, the first sublayer 1412 comprises polyimide. In one example, the first sublayer 1412 comprises polybenzoxazole (PBO). In one example, the second sublayer 1413 comprises polyimide. In one example, the second sublayer 1413 comprises polybenzoxazole (PBO).

In one example, the third sublayer 1414 comprises polyimide. In one example, the third sublayer 1414 comprises polybenzoxazole (PBO). In one example, the semiconductor device 1400A comprises a plurality of solder bumps 1405. The solder bumps 1405 are connected between the first redistribution structure 1407 and the second redistribution structure 1409. In one example, the die 1401 is a first die

1401, the semiconductor device 1400A comprises a second die 1402 and a third die 1403.

In one example, the semiconductor device 1400A comprises a molding material 1404. The molding material 1404 is filled to surround the second die 1402 and the third die 1403. In one example, an adhesive layer 1450 is in contact with a back side of the second die 1402. In one example, an adhesive layer 1451 is in contact with a back side of the third die 1403.

In one example, the molding material 1404 does not cover the adhesive layer 1450 and the adhesive layer 1451. In one example, an adhesive layer 1437 is in contact with a back side of the first die 1401. In one example, the molding material 1425 does not cover the adhesive layer 1437. In one example, the molding material 1425 is in direct contact with the second redistribution structure 1409. In one example, the molding material 1425 covers the adhesive layer 1437. In one example, the molding material 1404 covers the second die 1402 and the third die 1403.

In one example, the molding material 1425 is in contact with at least one lateral side 1457 of the adhesive layer 1438. In one example, the molding material 1425 does not cover a top side 1458 of the adhesive layer 1438.

One objective of the semiconductor device 1400E is to provide a higher reliability. Another objective of the semiconductor device 1400E is to provide finer interconnection pitches than traditional BGA packages. Still another objective of the semiconductor device 1400E is to provide a cost effective package type.

In one embodiment, a semiconductor device 1400E comprises a die 1401, a redistribution structure 1407, and a plurality of metal posts 1420. The die 1401 has an active surface 1410. The die 1401 comprises a plurality of metal pads 1411 on the active surface 1410.

The redistribution structure 1407 comprises a first sublayer 1412, a second sublayer 1413, a third sublayer 1414, and a fourth sublayer 1415. The second sublayer 1413 is located between the first sublayer 1412 and the third sublayer 1414. The third sublayer 1414 is located between the second sublayer 1413 and the fourth sublayer 1415. The first sublayer 1412 comprises a plurality of first vias 1416 and a plurality of first metal traces 1421. The first vias 1416 are cup-shaped. The first metal traces have a first trace thickness 1421. The second sublayer 1413 comprising a plurality of second vias 1417 and a plurality of second metal traces 1422.

The second vias 1417 are cup-shaped. The second metal traces 1422 have a second trace thickness B. The third sublayer 1414 comprises a plurality of third vias 1418 and a plurality of third metal traces 1423. The third vias 1418 are cup-shaped. The third metal traces 1423 have a third trace thickness C. The fourth sublayer 1415 comprises a plurality of fourth vias 1419 and a plurality of fourth metal traces 1424. The fourth metal vias 1424 are cup-shaped. The fourth metal traces 1424 have a fourth trace thickness D. The first vias 1416 are in contact with the metal posts 1420. The metal pads 1411 are in contact with the metal posts 1420. The first trace thickness A is smaller than the fourth trace thickness D.

In one example, each of the first vias 1416 have a first width ratio. Each of the second vias 1417 have a second width ratio. Each of the third vias 1418 have a third width ratio. Each of the fourth vias 1419 have a fourth ratio. The definition of a width ratio is defined later in this specification. In some cases, two different first vias 1416 can have two different first width ratios. In most cases, the plurality of first vias 1416 have the same first width ratio. In some cases, two different second vias 1417 can have two different second width ratios. In most cases, the plurality of second vias 1417 have the same second width ratio. In some cases, two different third vias 1418 can have two different third width ratios. In most cases, the plurality of third vias 1418 have the same third width ratio. In some cases, two different fourth vias 1419 can have two different fourth width ratios. In most cases, the plurality of fourth vias 1419 have the same fourth width ratio.

In one embodiment, a semiconductor device 1400E comprises a die 1401, a redistribution structure 1407, and a plurality of metal posts 1420. The die 1401 has an active surface 1410. The die 1401 comprises a plurality of metal pads 1411 on the active surface 1410.

a redistribution structure 1407, the redistribution structure 1407 comprising a first sublayer 1412, a second sublayer 1413, and a third sublayer 1414. The second sublayer 1413 is located between the first sublayer 1412 and the third sublayer 1414. The first sublayer 1412 comprises a plurality of first vias 1416 and a plurality of first metal traces 1421. The first metal traces 1421 have a first trace thickness A. The second sublayer 1413 comprises a plurality of second vias 1417 and a plurality of second metal traces 1422. The second metal traces 1422 have a second trace thickness B. The third sublayer 1414 comprises a plurality of third vias 1418 and a plurality of third metal traces 1423. The third metal traces 1423 have a third trace thickness C.

The first vias 1416 are in contact with the metal posts 1420. The metal pads 1411 are in contact with the metal posts 1420. A trace thickness ratio (C/A) between the third trace thickness C and the first trace thickness A is between 1 and 10. A trace thickness ratio (C/A) between the third trace thickness C and the first trace thickness A is between 1 and 5. In one example, a trace thickness ratio (C/A) between the third trace thickness C and the first trace thickness A is between 1 and 3.

In one embodiment, a semiconductor device 1400E comprises a die 1401, a redistribution structure 1407, and a plurality of metal posts 1420. The die 1401 has an active surface 1410. The die 1401 comprises a plurality of metal pads 1411 on the active surface 1410.

The redistribution structure 1407 comprises a first sublayer 1412, a second sublayer 1413, a third sublayer 1414, and a fourth sublayer 1415. The second sublayer 1413 is located between the first sublayer 1412 and the third sublayer 1414. The third sublayer 1414 is located between the second sublayer 1413 and the fourth sublayer 1415. The first sublayer 1412 comprises a plurality of first vias 1416 and a plurality of first metal traces 1421. The first metal traces 1421 have a first trace thickness A.

The second sublayer 1413 comprises a plurality of second vias 1417 and a plurality of second metal traces 1422. The second metal traces 1422 have a second trace thickness B. The third sublayer 1414 comprises a plurality of third vias 1418 and a plurality of third metal traces 1423. The third metal traces 1423 have a third trace thickness C. The fourth sublayer 1415 comprises a plurality of fourth vias 1419 and a plurality of fourth metal traces 1424. The fourth metal traces 1424 have a fourth trace thickness D.

The first vias 1416 are in contact with the metal posts 1420. The metal pads 1411 are in contact with the metal posts 1420. A trace thickness ratio (D/B) between the fourth trace thickness D and the second trace thickness B is between 1 and 10. In one example, a trace thickness ratio (D/B) between the fourth trace thickness D and the second trace thickness B is between 1 and 5. In one example, a trace thickness ratio (D/B) between the fourth trace thickness D and the second trace thickness B is between 1 and 3.

In one embodiment, with reference to FIG. 14G to FIG. 14R, a method for manufacturing a semiconductor device 1400R is disclosed. First, a carrier 1430 is provided. Then, a second adhesive layer 1437 is placed on the carrier 1430. Then, a second die 1402 is placed on the adhesive layer 1437. The second die 1402 is encapsulated by a second molding material 1404. Then, the second molding material 1404 is ground to planarize a second surface 1438 of the second molding material 1404. Then, a second redistribution structure 1409 is formed on the second die 1402 so that the second die 1402 is electrically connected to the second redistribution structure 1409.

Then, a first adhesive layer 1438 is placed on the second redistribution structure 1409. Then, a first die 1401 is placed on the first adhesive layer 1438. Then, a plurality of metal pillars 1408 are formed on the second redistribution structure 1409. The first die 1401 is encapsulated by a first molding material 1425. Then, a first molding material 1425 is ground to planarize a first surface 1439 of the first molding material 1425. Then, a first redistribution structure 1407 is formed on the first die 1401 so that the first die 1401 is electrically connected to the first redistribution structure 1407. Then, the carrier 1430 is removed. In one example, a third molding material 1440 is filled to cover the second die 1402. In one example, the metal pillars 1408 are formed by plating.

In one example, the first metal traces are formed by metal depositing. The second metal traces are formed by metal depositing. The third metal traces are formed by metal depositing. The first sublayer 1412, the second sublayer 1413, and the third sublayer 1414 can formed by spin coating, spray coating, PVD, CVD, or printing.

In one embodiment, with reference to FIG. 14S to FIG. 14Y, a method for manufacturing a semiconductor device 1400Y is disclosed. First, a carrier 1432 is provided. Then, an adhesive layer 1433 is placed on the carrier 1432. Then, a die 1431 is placed on the adhesive layer 1433. Then, a plurality of metal pillars 1434 are formed on the carrier 1432. Then, the first die 1431 is encapsulated by a molding material 1435. grinding the molding material 1442 to planarize a first surface 1441 of the molding material 1442. Then, a redistribution structure 1435 is formed on the die 1431 so that the die 1431 is electrically connected to the redistribution structure 1435. Then, the carrier 1432 is removed. Then, a plurality of solder bumps 1436 are placed on the redistribution structure 1435.

Figure 15A:
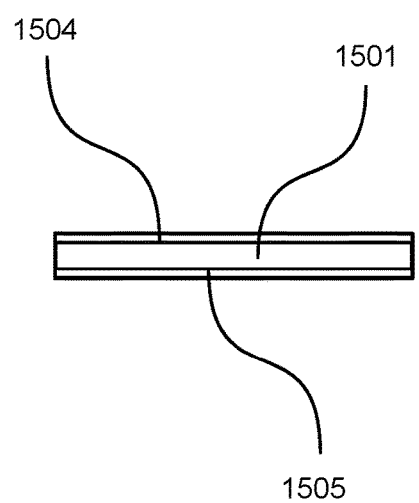
FIG. 15A shows next step of a method for making a semiconductor package.
Figure 15B:
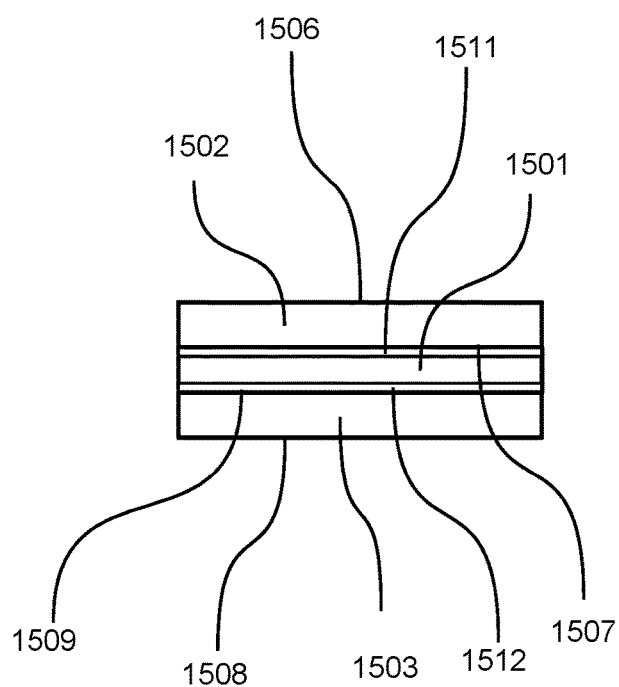
FIG. 15B shows next step of a method for making a semiconductor package.
Figure 15C:
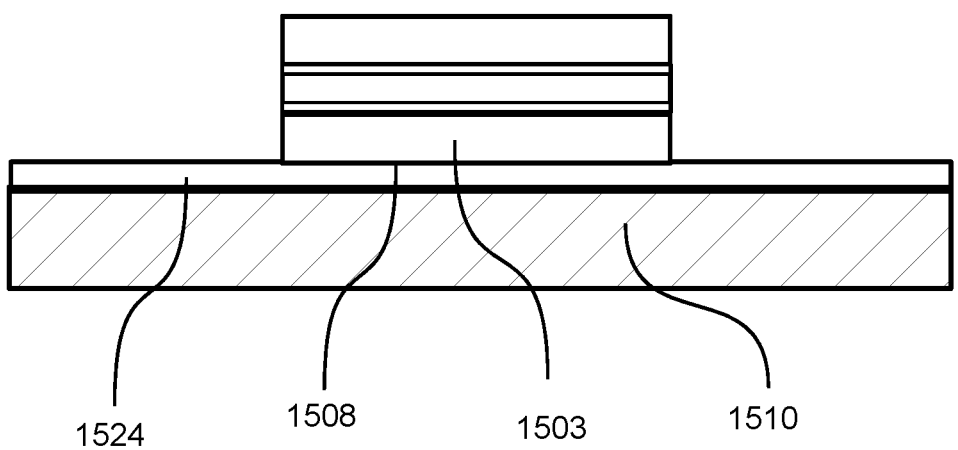
FIG. 15C shows next step of a method for making a semiconductor package.
Figure 15D:
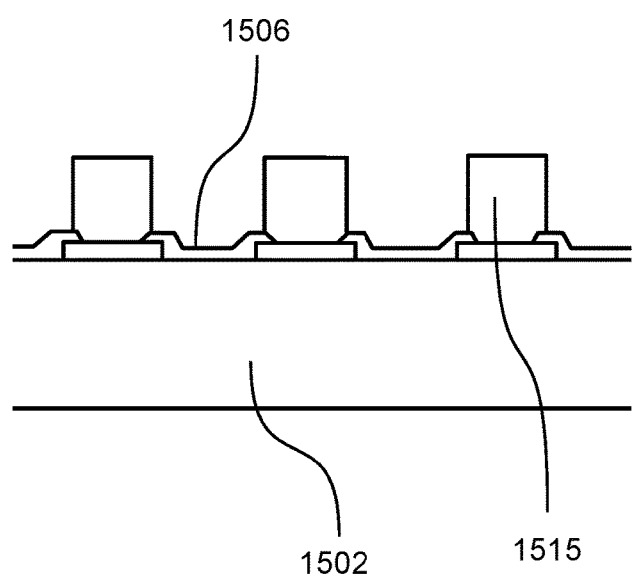
FIG. 15D shows next step of a method for making a semiconductor package.
Figure 15E:
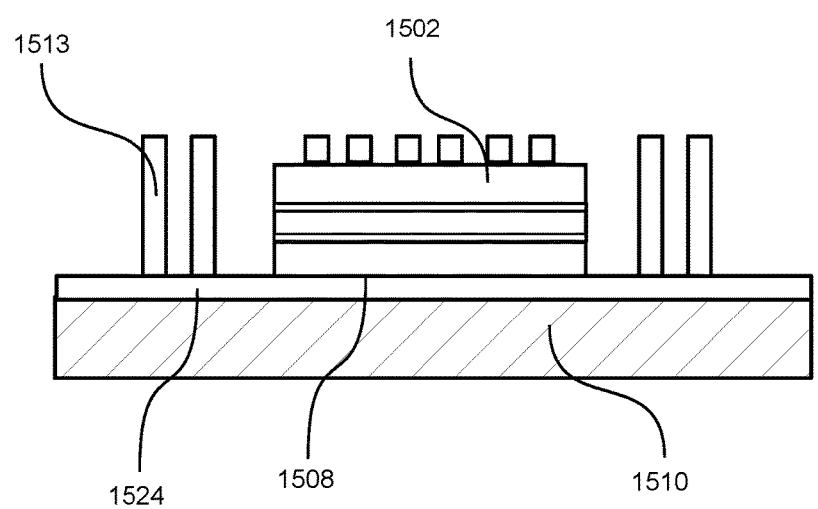
FIG. 15E shows next step of a method for making a semiconductor package.
Figure 15F:
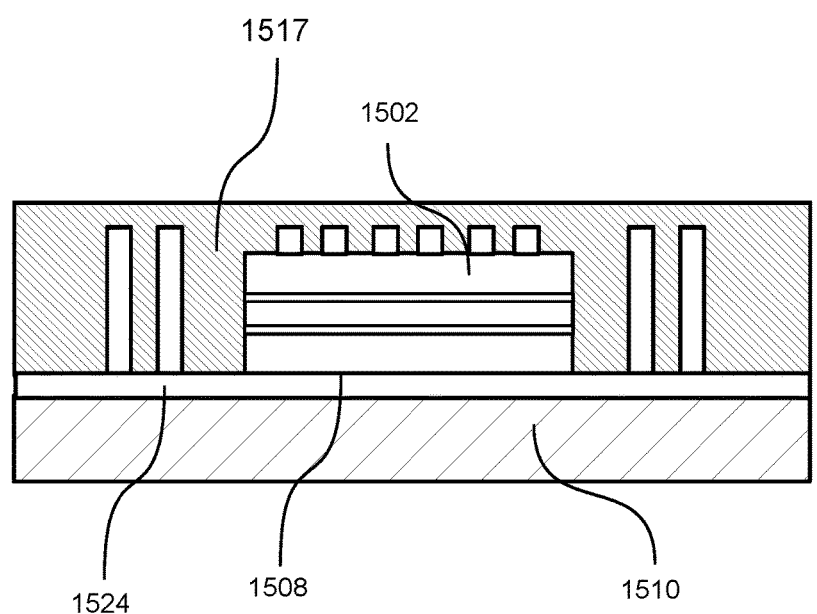
FIG. 15F shows next step of a method for making a semiconductor package.
Figure 15G:
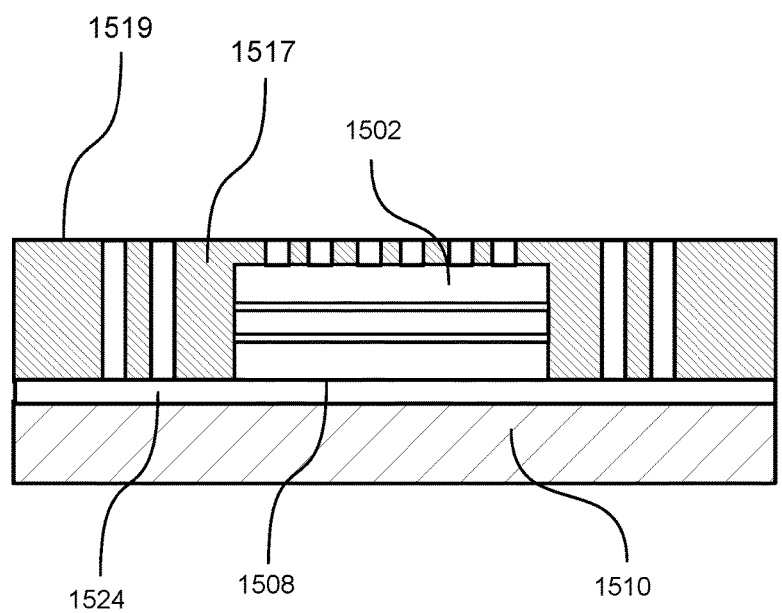
FIG. 15G shows next step of a method for making a semiconductor package.

FIG. 15A shows one step of a method for making a semiconductor package. FIG. 15B shows one step of a method for making a semiconductor package. FIG. 15D shows one step of a method for making a semiconductor package. FIG. 15E shows one step of a method for making a semiconductor package. FIG. 15F shows one step of a method for making a semiconductor package. FIG. 15G shows one step of a method for making a semiconductor package.

In one embodiment, a method for making a semiconductor package is disclosed. First, a supporter 1501 is provided. The supporter 1501 has a first side 1504 and a second side 1505. The supporter 1501 is placed between a first die 1502 and a second die 1503.

Figure 15H:
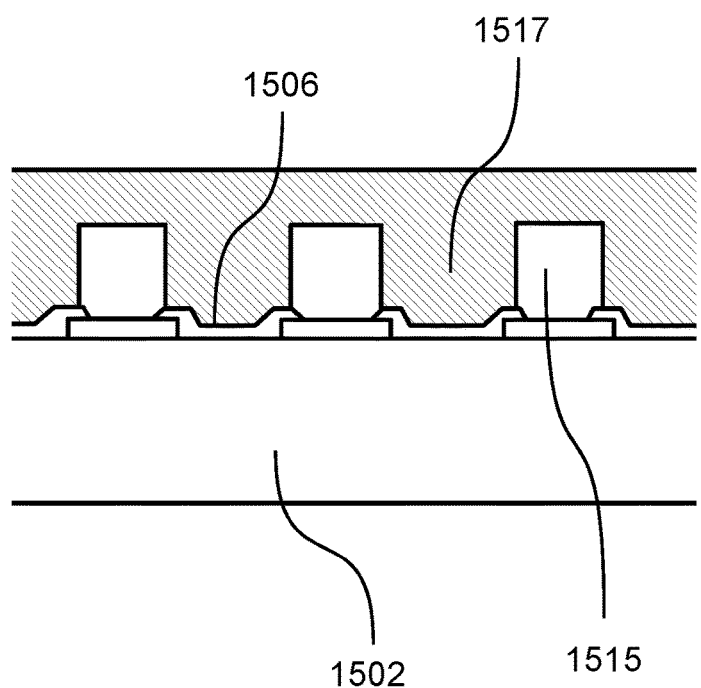
FIG. 15H shows next step of a method for making a semiconductor package.
Figure 15I:
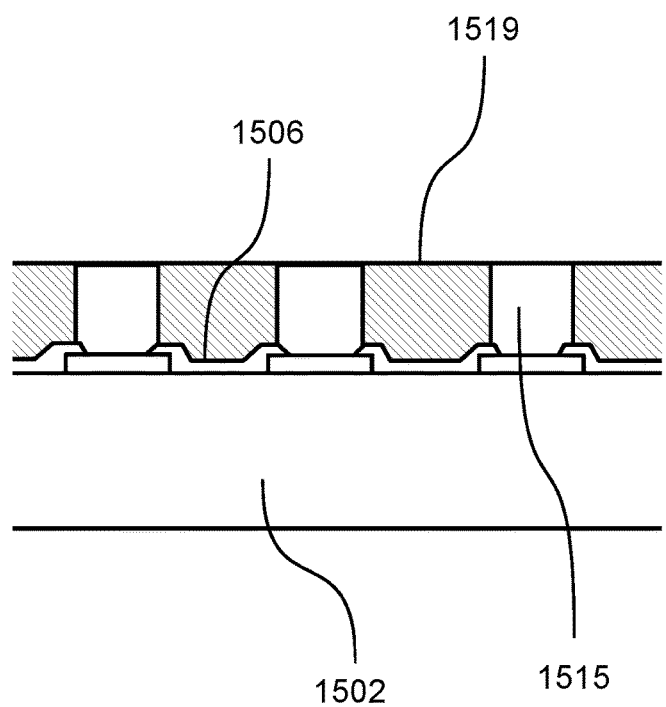
FIG. 15I shows next step of a method for making a semiconductor package.
Figure 15J:
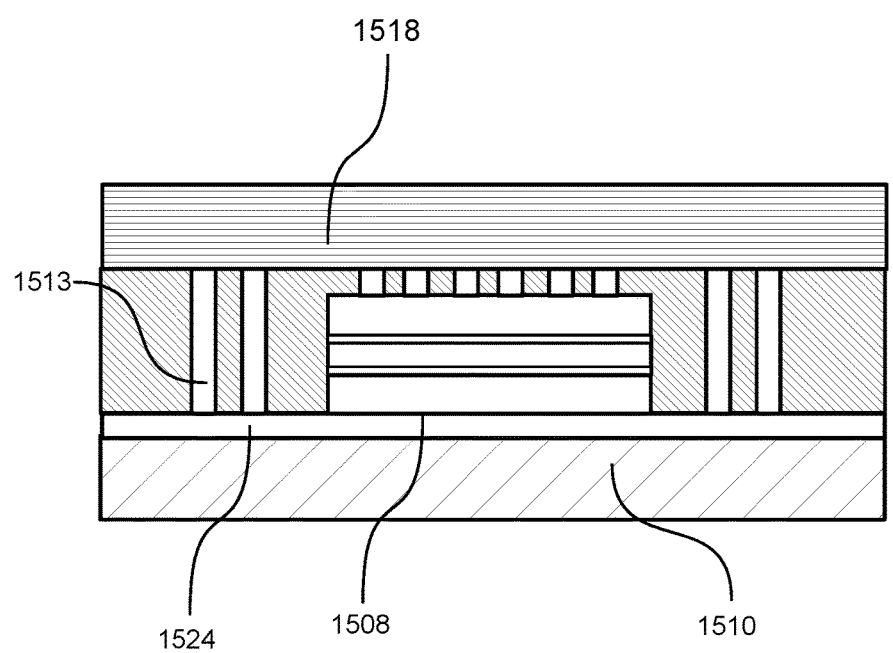
FIG. 15J shows next step of a method for making a semiconductor package.
Figure 15K:
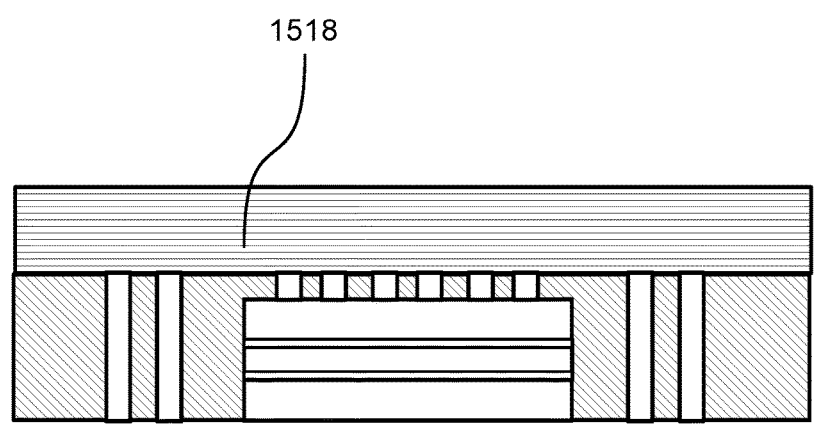
FIG. 15K shows next step of a method for making a semiconductor package.
Figure 15L:
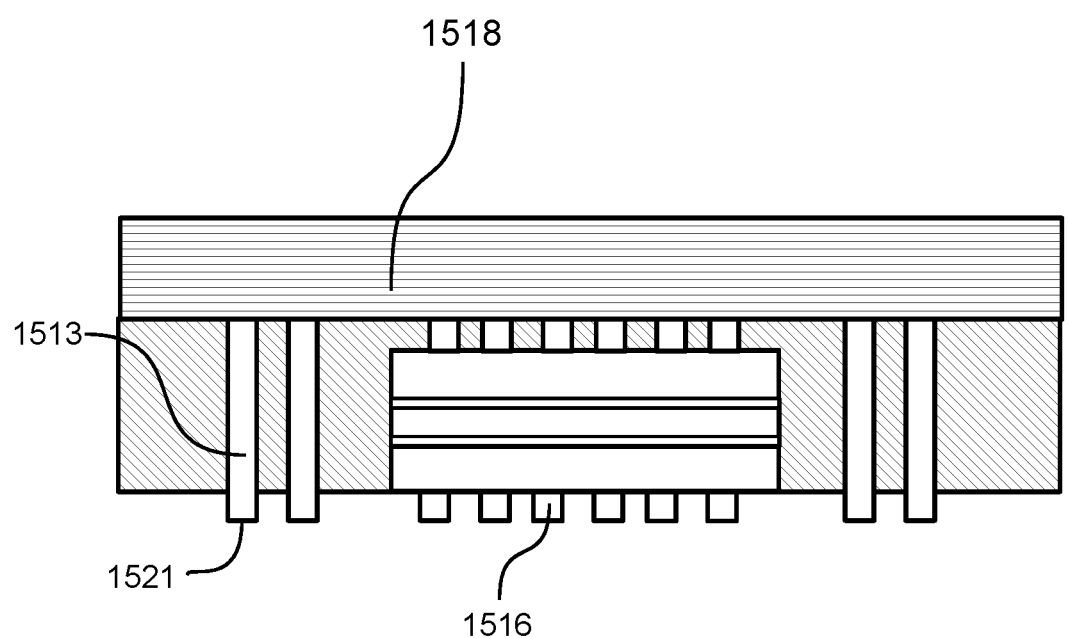
FIG. 15L shows next step of a method for making a semiconductor package.
Figure 15M:
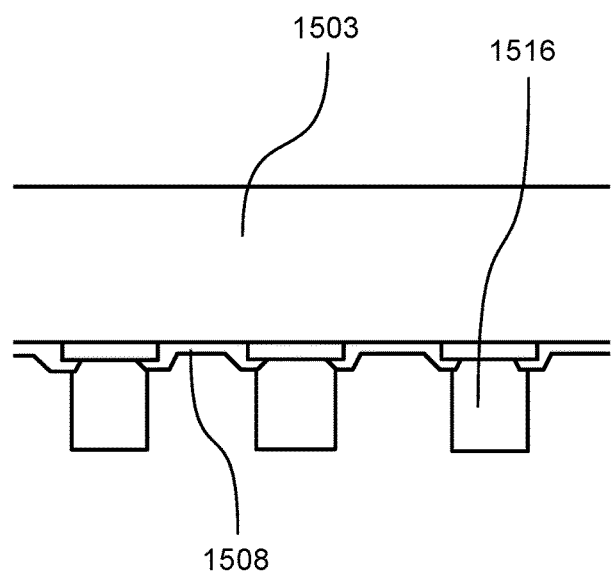
FIG. 15M shows next step of a method for making a semiconductor package.
Figure 15N:
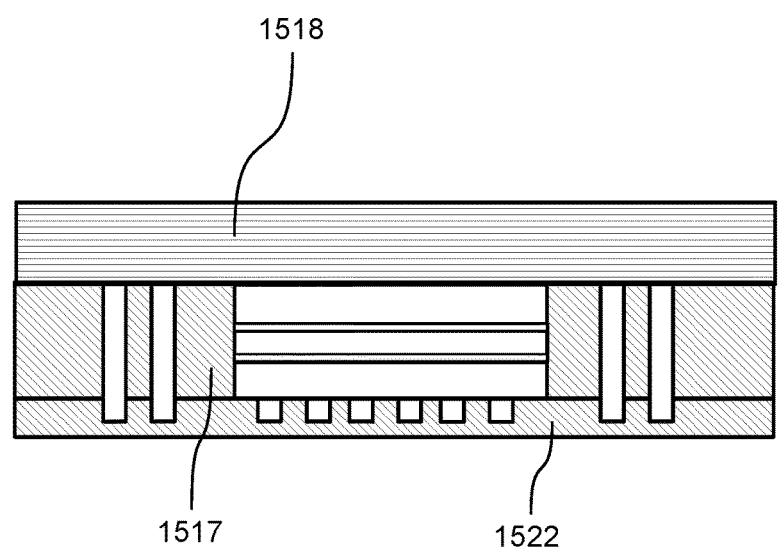
FIG. 15N shows next step of a method for making a semiconductor package.
Figure 15O:
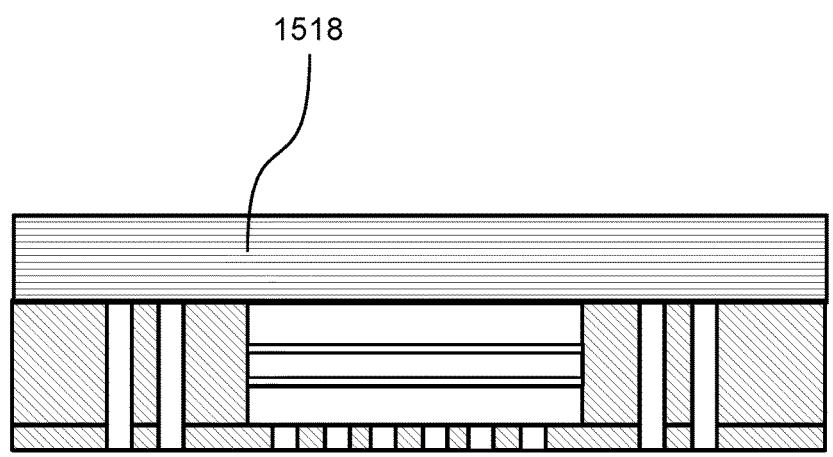
FIG. 15O shows next step of a method for making a semiconductor package.
Figure 15P:
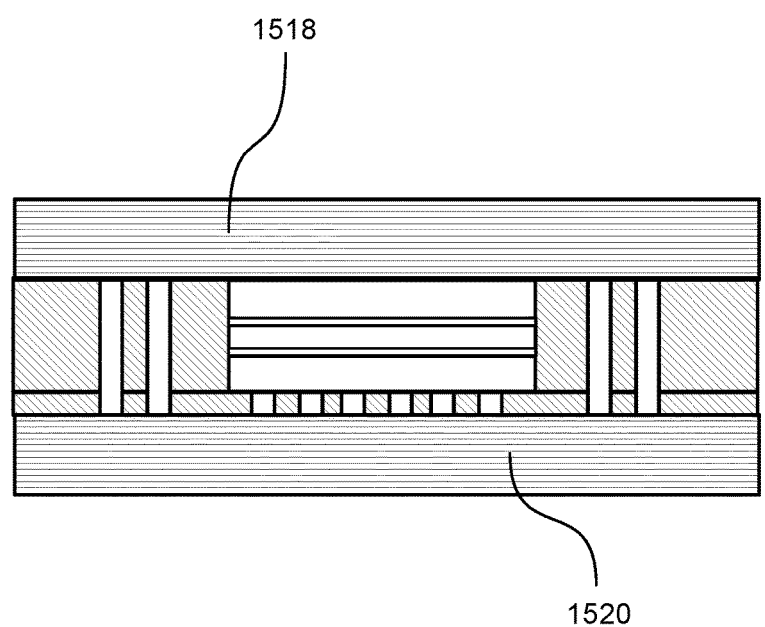
FIG. 15P shows next step of a method for making a semiconductor package.

FIG. 15H shows one step of a method for making a semiconductor package. FIG. 15I shows one step of a method for making a semiconductor package. FIG. 15J shows one step of a method for making a semiconductor package. FIG. 15K shows one step of a method for making a semiconductor package. FIG. 15L shows one step of a method for making a semiconductor package. FIG. 15M shows one step of a method for making a semiconductor package. FIG. 15N shows one step of a method for making a semiconductor package. FIG. 15O shows one step of a method for making a semiconductor package. FIG. 15P shows one step of a method for making a semiconductor package.

The first die 1502 has a first active surface 1506 and a first back surface 1507. The second die 1503 has a second active surface 1508 and a second back surface 1509. The first side 1502 of the supporter 1501 is in contact with the first back surface 1507 of the first die 1502. The second side 1505 of the supporter 1501 is in contact with the second back surface 1509 of the second die 1503. Then, a carrier 1510 is provided. Then, the second die 1503 is putted on the carrier 1510. The second active surface 1508 of the second die 1503 is in contact with the carrier 1510.

In one example, a first adhesive 1511 is applied between the first side 1504 of the support 1501 and the first back surface 1507 of the first die 1502. In one example, a second adhesive 1512 is applied between the second side 1503 of the support 1501 and the second back surface 1509 of the second die 1503. In one example, the method further comprises: forming a plurality of first metal posts 1515 on the first active surface 1506 of the first die 1502 before putting the first die on the carrier 1510. In one example, a plurality of metal vias 1513 are formed on the carrier 1510.

In one example, a first molding material 1517 is disposed so that the first molding material 1517 covers the first active surface 1506 of the first die 1502. In one example, the first molding material 1517 is ground to planarize the first molding material 1517. In one example, a first redistribution structure 1519 is formed on a first surface 1518 of the molding material 1517. In one example, the carrier 1510 is removed from the second die 1503.

In one example, protrusions 1521 are formed on the metal vias 1513. In one example, a plurality of second metal posts 1516 are formed on the second active surface 1508 of the second die 1503. In one example, a second molding material 1522 is disposed on the first molding material 1517. In one example, the second molding material 1522 is ground to planarize the molding material 1522. In one example, a second redistribution structure 1520 is formed so that the second redistribution structure 1520 is connected to the protrusions 1521 on the metal vias 1513 and the second metal posts 1516 on the second active surface 1508 of the second die 1503.

In one example, the carrier 1510 comprises an adhesive layer 1524. The adhesive layer 1524 is in contact with the second active surface 1508 of the second die 1503. In one example, the supporter 1501 comprises metal. In one example, the supporter 1501 comprise an organic material.

Figure 16A:
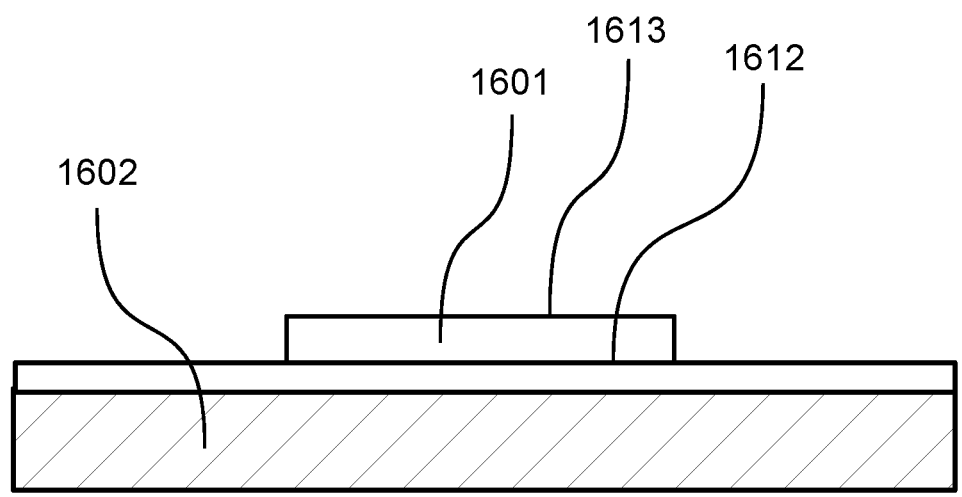
FIG. 16A shows next step of a method for making a semiconductor package.
Figure 16B:
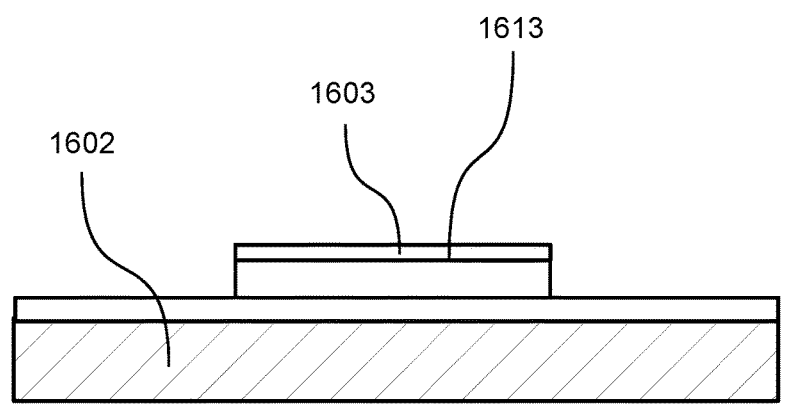
FIG. 16B shows next step of a method for making a semiconductor package.
Figure 16C:
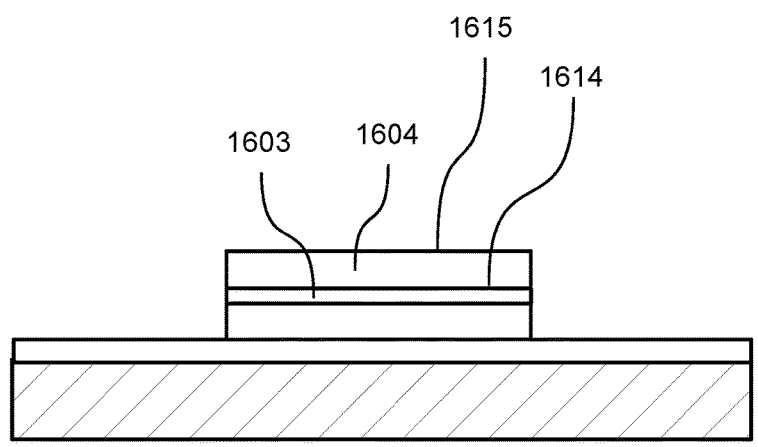
FIG. 16C shows next step of a method for making a semiconductor package.
Figure 16D:
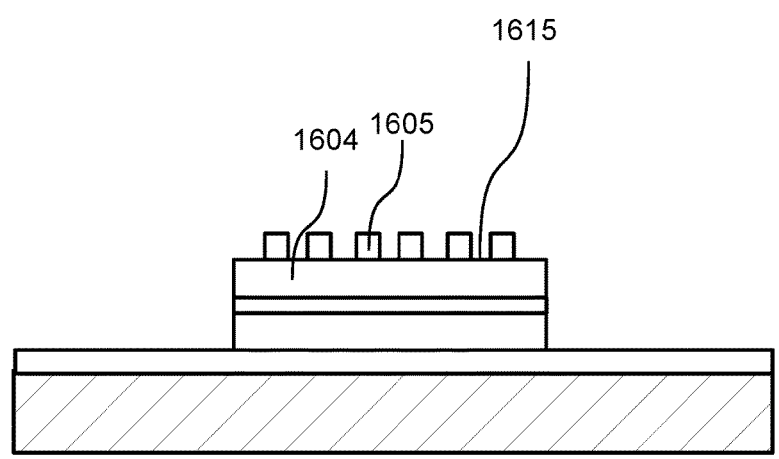
FIG. 16D shows next step of a method for making a semiconductor package.
Figure 16E:
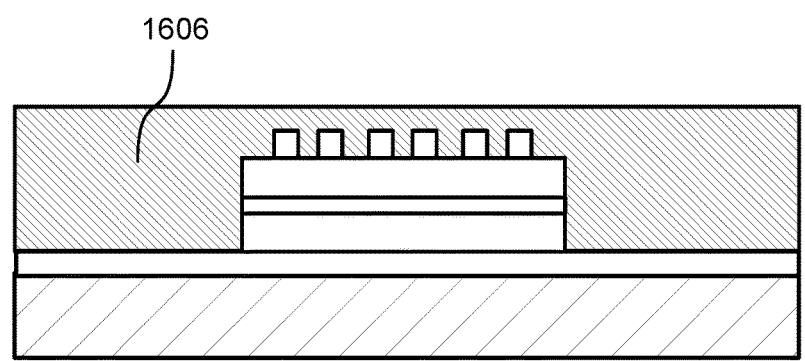
FIG. 16E shows next step of a method for making a semiconductor package.
Figure 16F:
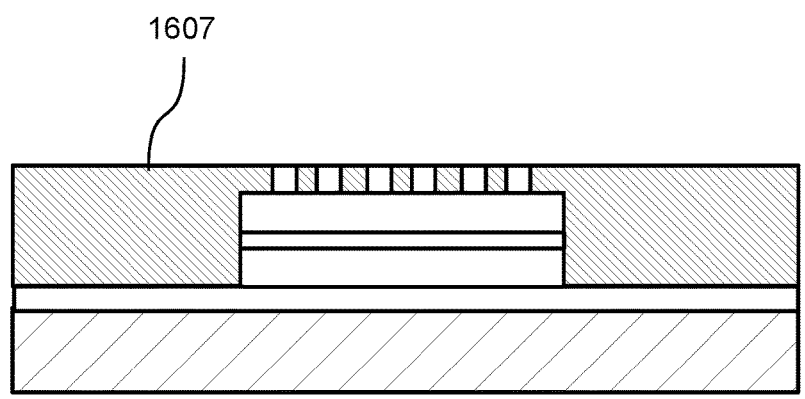
FIG. 16F shows next step of a method for making a semiconductor package.

FIG. 16A shows one step of a method for making a semiconductor package. FIG. 16B shows one step of a method for making a semiconductor package. FIG. 16C shows one step of a method for making a semiconductor package. FIG. 16D shows one step of a method for making a semiconductor package. FIG. 16E shows one step of a method for making a semiconductor package. FIG. 16F shows one step of a method for making a semiconductor package.

Figure 16G:
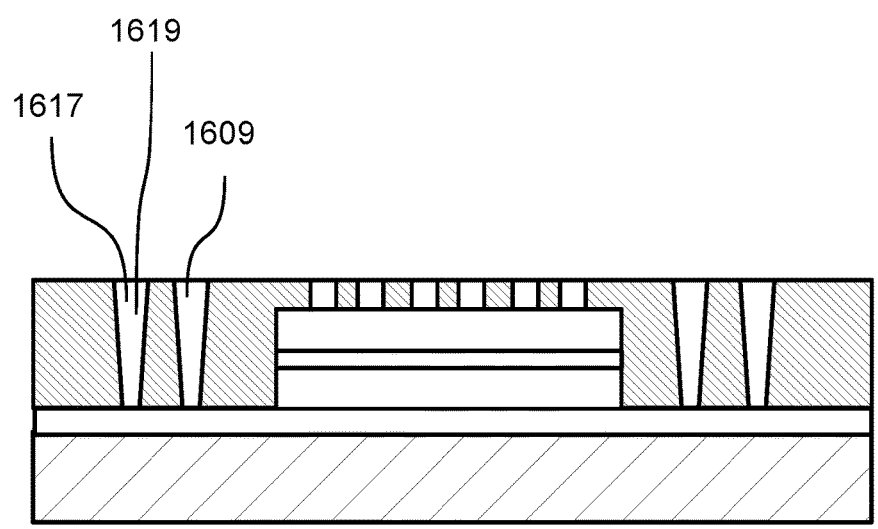
FIG. 16G shows next step of a method for making a semiconductor package.
Figure 16H:
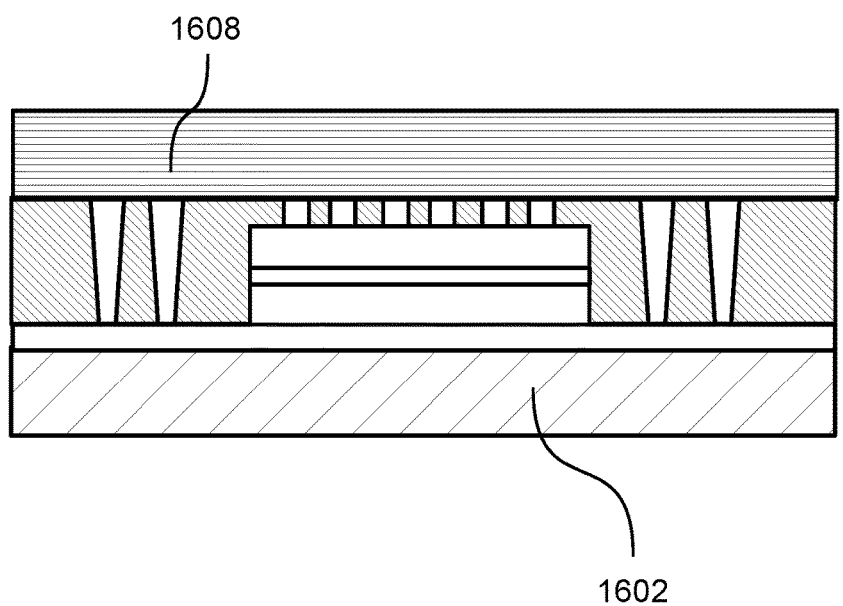
FIG. 16H shows next step of a method for making a semiconductor package.
Figure 16I:
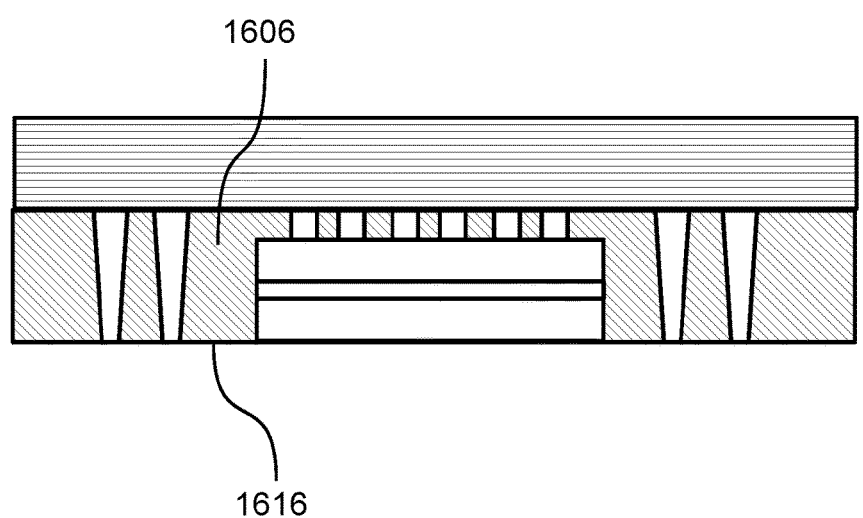
FIG. 16I shows next step of a method for making a semiconductor package.
Figure 16J:
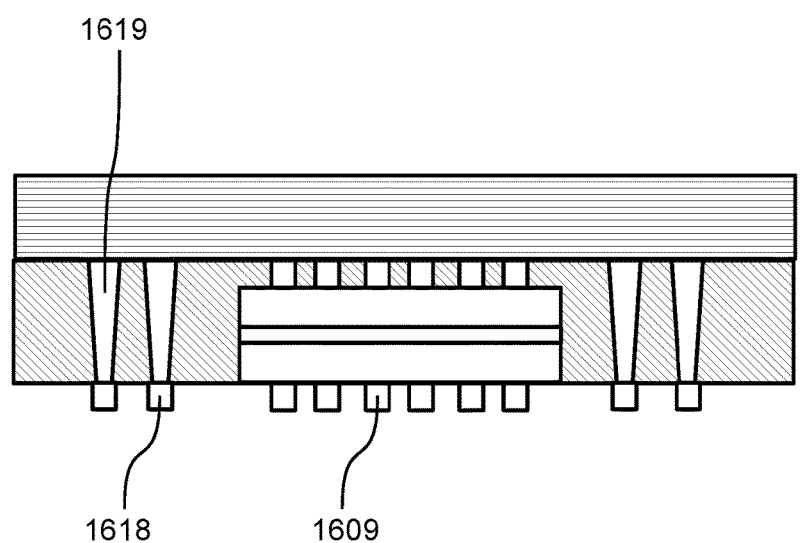
FIG. 16J shows next step of a method for making a semiconductor package.
Figure 16K:
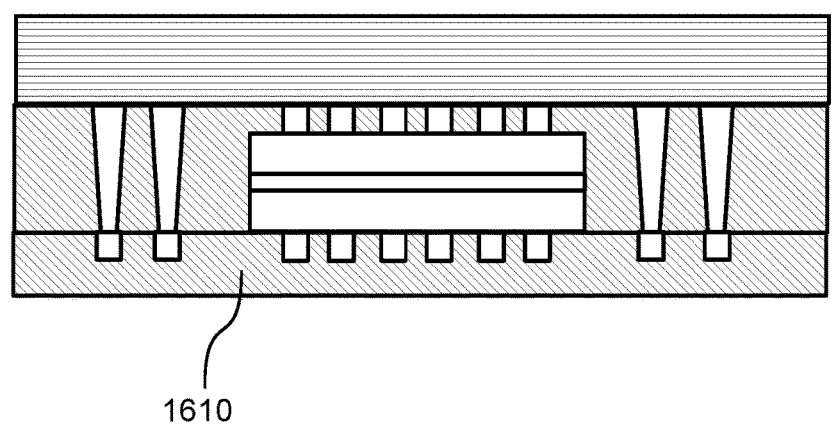
FIG. 16K shows next step of a method for making a semiconductor package.
Figure 16L:
FIG. 16L shows next step of a method for making a semiconductor package.
Figure 16M:
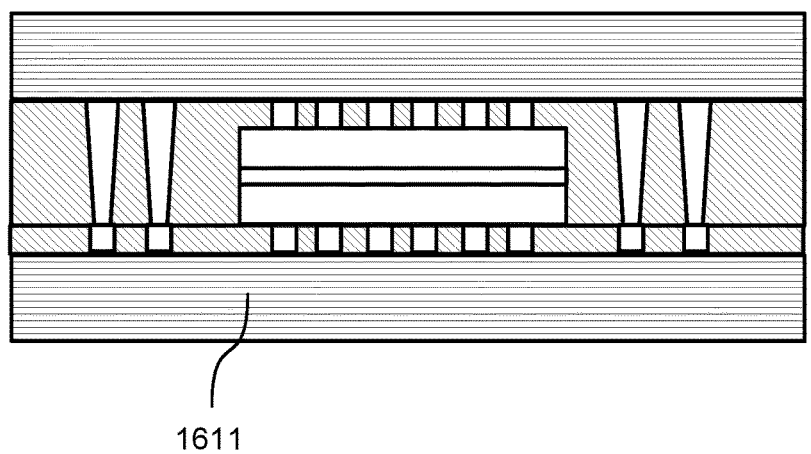
FIG. 16M shows next step of a method for making a semiconductor package.

FIG. 16G shows one step of a method for making a semiconductor package. FIG. 16H shows one step of a method for making a semiconductor package. FIG. 16I shows one step of a method for making a semiconductor package. FIG. 16J shows one step of a method for making a semiconductor package. FIG. 16K shows one step of a method for making a semiconductor package. FIG. 16L shows one step of a method for making a semiconductor package. FIG. 16M shows one step of a method for making a semiconductor package.

In one embodiment, a method for making a semiconductor package 1600M is disclosed. First, a carrier 1602 is provided. Then, a first die 1601 is placed on the carrier 1602. The first die 1601 has a first active surface 1612 and a first back surface 1613. The first active surface 1612 of the first die 1601 is in contact with the carrier 1602. Then, an adhesive 1603 is applied on the first back surface 1613 of the first die 1601.

Then, a second die 1604 is placed on the adhesive 1603. The second die 1604 has a second active surface 1615 and a second back surface 1614. The second back surface 1614 is in contact with the adhesive 1603. Then, a molding material 1606 is applied to encapsulate the first die 1601 and the second die 1604. Then, the molding material 1606 is ground to planarize a surface 1607 of the molding material 1606. Then, a redistribution structure 1608 is formed on the surface 1607 of the molding material 1606.

In one example, a set of holes 1609 are formed through the molding material 1606. In one example, a conductive material 1617 is filled into the holes 1609 to form conductive vias 1619. In one example, the surface 1607 is a first surface 1607 of the molding material 1606. The carrier 1602 is removed so that a second surface 1616 of the molding material 1606 is exposed. In one example, the molding material 1606 is a first molding material 1606, and a second molding material 1610 is applied on the first molding material 1606.

In one example, the redistribution structure 1608 is a first redistribution structure 1608. A second redistribution structure 1611 is formed on the second molding material 1610. In one example, the second molding material 1610 is ground to planarize the second molding material 1610. In one example, a plurality of first metal posts 1609 are formed on the first active surface 1612 of the first die 1601. In one example, protrusions 1618 are formed on the conductive vias 1619. In one example, a plurality of second metal posts 1605 are formed on the second active surface 1615 of the second die 1604.

Figure 17A:
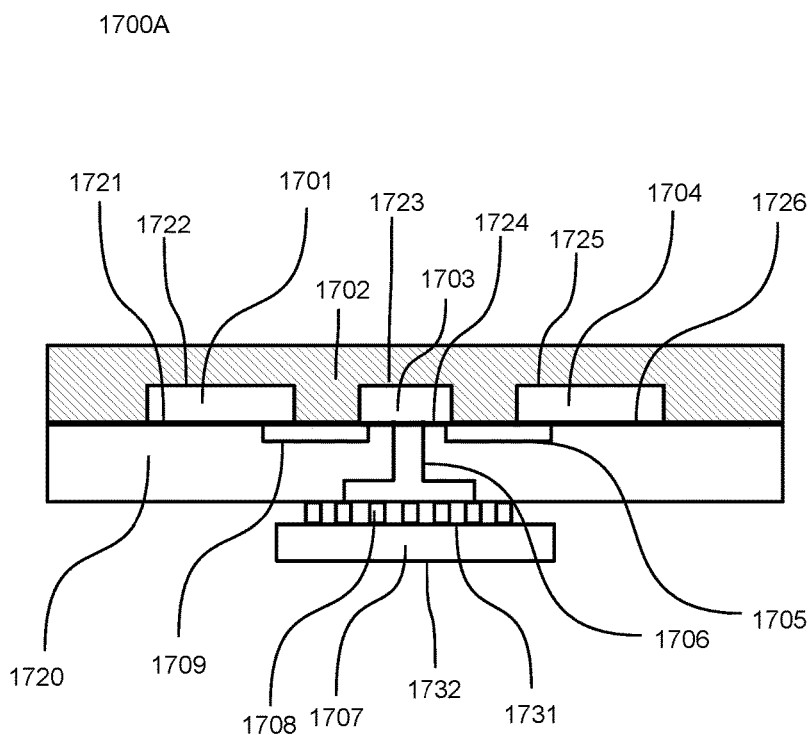
FIG. 17A shows an embodiment of a semiconductor device.
Figure 17B:
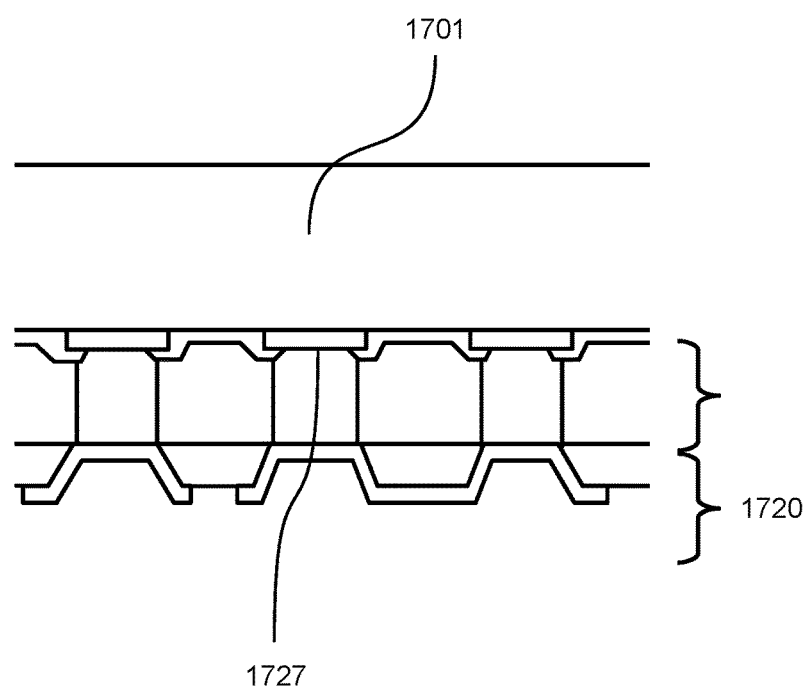
FIG. 17B shows another embodiment of a connection structure.
Figure 17C:
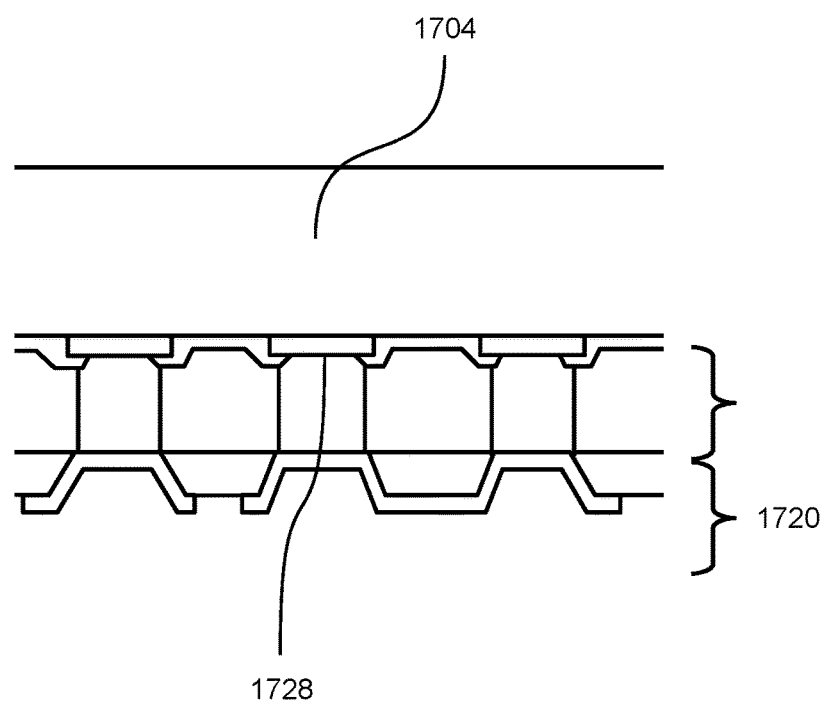
FIG. 17C shows another embodiment of a connection structure.
Figure 17D:
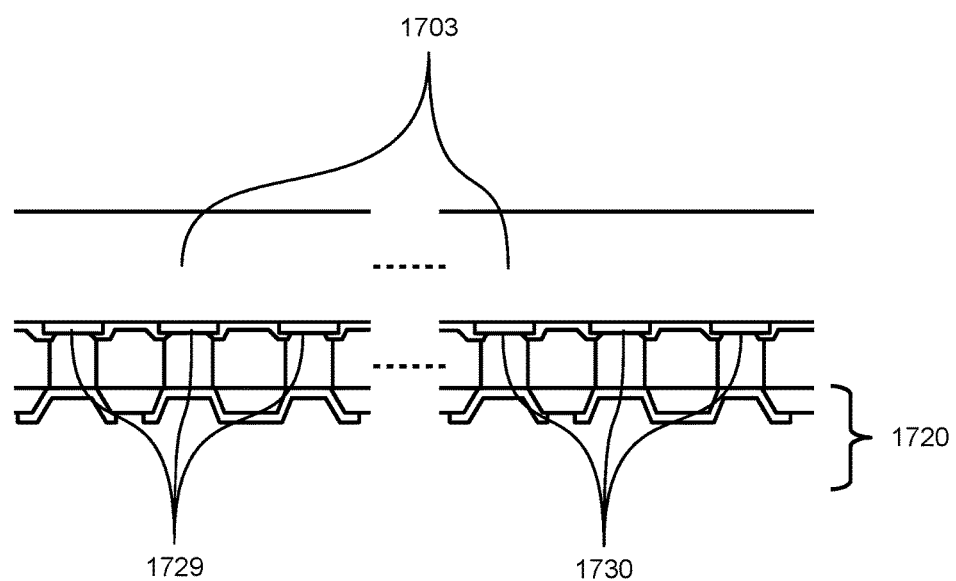
FIG. 17D shows another embodiment of a connection structure.
Figure 17E:
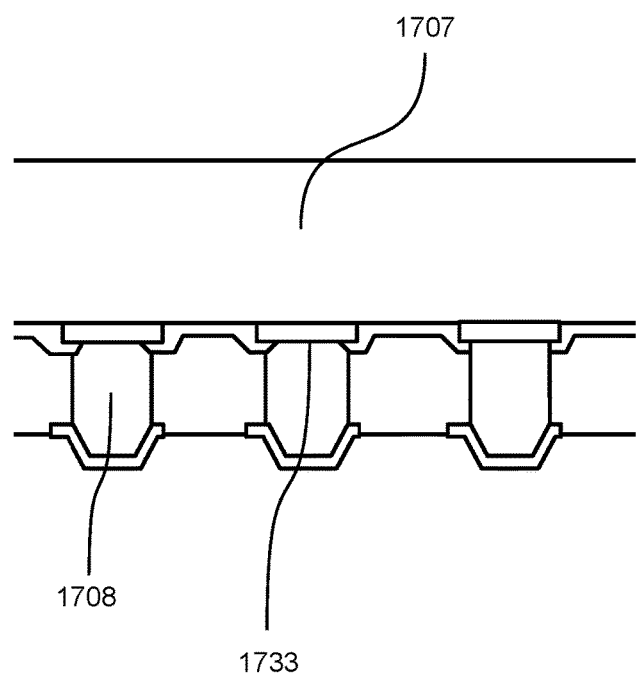
FIG. 17E shows another embodiment of a connection structure.
Figure 17F:
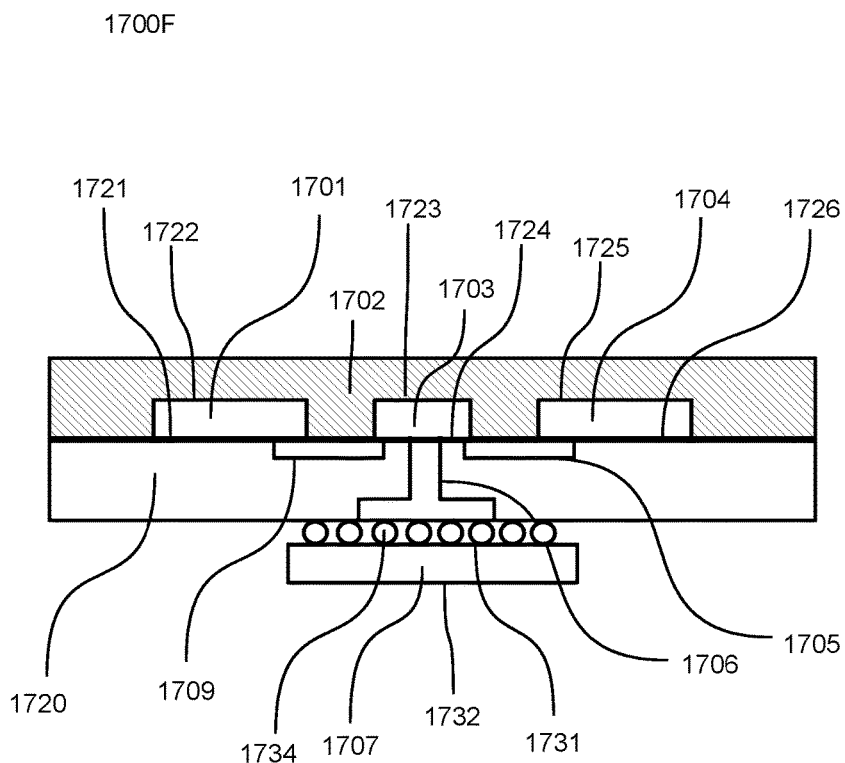
FIG. 17F shows another embodiment of a semiconductor device.
Figure 17G:
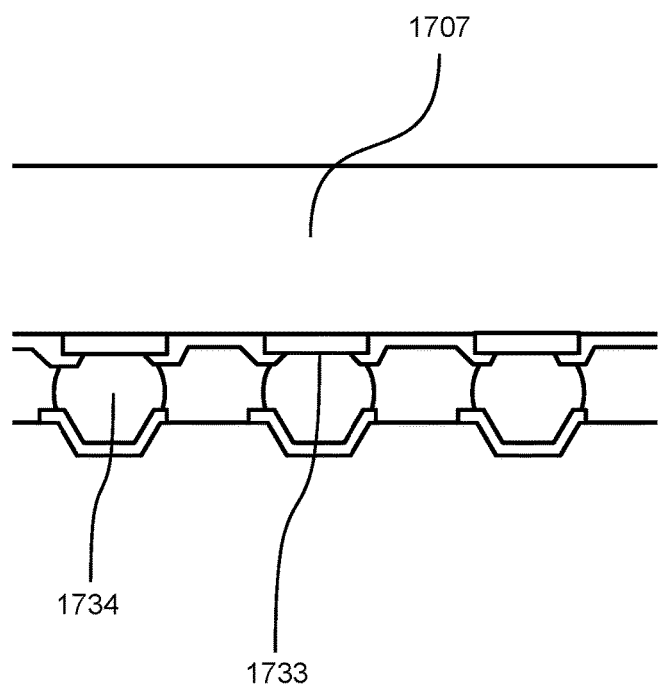
FIG. 17G shows another embodiment of a connection structure.

FIG. 17A shows an embodiment of a semiconductor device. FIG. 17B shows an embodiment of a connection structure. FIG. 17C shows an embodiment of a connection structure. FIG. 17D shows an embodiment of a connection structure. FIG. 17E shows an embodiment of a connection structure. FIG. 17F shows an embodiment of a semiconductor device. FIG. 17G shows an embodiment of a connection structure.

In one embodiment, A semiconductor device 1700A comprises a first memory die 1701, a second memory die 1704, an interface die 1703, a first redistribution structure 1720, a molding material 1702, a processor die 1707, and a set of conductive pillars 1708. The first memory die 1701 has a first active surface 1721 and a first back surface 1722. The first memory die 1701 comprises a first set of data bus connection ends 1727 on the first active surface 1721. The second memory die 1704 has a second active surface 1726 and a second back surface 1725. The second memory die 1704 comprises a second set of data bus connection ends 1728 on the second active surface 1726.

The interface die 1703 has an interface die active surface 1724 and an interface die back surface 1723. The interface die 1703 has a set of interface die first data connection ends 1729 on the interface die active surface 1724. The interface die 1703 has a set of interface die data second data connection ends 1730 on the interface die active surface 1724. The first active surface 1721 of the first memory die 1701 is in contact with the first redistribution structure 1720. The second active surface 1726 of the second memory die 1704 is in contact with the first redistribution structure 1720.

The first redistribution structure 1720 comprises a first set of memory data traces 1709, a second set of memory data traces 1705, and a set of processor data traces 1706. The first set of memory data traces 1709 is connected between the first set of data bus connection ends 1727 and the set of interface die first data connection ends 1729. The second set of traces 1705 are connected between the second set of data bus connection ends 1728 and the set of interface die second data connection ends 1730. The molding material 1702 is filled between the first memory die 1701 and the interface die 1703 and between the second memory die 1704 and the interface die 1703.

The processor die 1707 has a processor die active surface 1731 and a processor die back surface 1732. The processor die 1707 comprises a set of processor data bus connection ends 1733 on the processor die active surface 1731. The processor die 1707 is connected to the first redistribution structure 1720 through the set of conductive pillars 1708. The set of processor data bus connection ends 1733 is electrically connected to the set of processor data traces 1706.

In one embodiment, a semiconductor device 1700F comprises a first memory die 1701, a second memory die 1704, an interface die 1703, a first redistribution structure 1720, a molding material 1702, a processor die 1707, and a set of conductive bumps 1734. The first memory die 1701 has a first active surface 1721 and a first back surface 1722. The first memory die 1701 comprises a first set of data bus connection ends 1727 on the first active surface 1721.

The second memory die 1704 has a second active surface 1726 and a second back surface 1725. The second memory die 1704 comprises a second set of data bus connection ends 1728 on the second active surface 1706. The interface die 1703 has an interface die active surface 1724 and an interface die back surface 1723. The interface die 1703 has a set of interface die first data connection ends 1729 on the interface die active surface 1724. The interface die 1703 has a set of interface die data second data connection ends 1730 on the interface die active surface 1724. The first active surface 1721 of the first memory die 1701 is in contact with the first redistribution structure 1720.

The second active surface 1726 of the second memory die 1704 is in contact with the first redistribution structure 1720. The first redistribution structure 1720 comprises a first set of memory data traces 1709, a second set of memory data traces 1705, and a set of processor data traces 1706. The first set of memory data traces 1709 is connected between the first set of data bus connection ends 1727 and the set of interface die first data connection ends 1729. The second set of memory data traces 1705 is connected between the second set of data bus connection ends 1728 and the set of interface die second data connection ends 1730.

A molding material 1702 is filled between the first memory die 1701 and the interface die 1703 and between the second memory die 1704 and the interface die 1703. The processor die 1707 has a processor die active surface 1724 and a processor die back surface 1723. The processor die 1707 comprises a set of processor data bus connection ends 1733 on the processor die active surface 1724. The processor die 1707 is connected to the first redistribution structure 1720 through the set of conductive bumps 1734. The set of processor data bus connection ends 1733 is electrically connected to the set of processor data traces 1706.

In one embodiment, a semiconductor device 1800K comprises a first die 1865, a second die 1867, and a redistribution structure 1875. The first die 1865 has an L1 side 1871 and an S1 side 1868. The L1 side 1871 is longer than the S1 side 1868. The L1 side 1871 is perpendicular to the S1 side 1868. The first die 1865 comprises L1 connection ends 1872 and S1 connection ends 1873.

The L1 connection ends 1872 are disposed on an active surface 1874 of the first die 1865. The L1 connection ends 1872 are substantially disposed along the L1 side 1871. The S1 connection ends 1873 are disposed on the active surface 1874 of the first die 1865. The S1 connection ends 1873 are substantially disposed along the S1 side 1868. The second die 1867 has an L2 side 1870 and an S2 side 1869. The L2 side 1870 is longer than than the S2 side. The L2 side is perpendicular to the S2 side 1869. The second die 1867 comprises a first group 1876 of L2 connection ends 1879, a second group 1877 of L2 connection ends 1879, and S2 connection ends 1878.

The L2 connection ends 1879 are substantially disposed along the L2 side 1870. The redistribution structure 1875 has a first group of traces 1845 and a second group of traces 1846. The first group of traces 1845 is connected between the S1 connection ends 1873 and the first group of 1841 L2 connection ends 1879. The second group of traces 1846 is connected between the L1 connection ends 1872 and the second group 1877 of L2 connection ends 1879. The S1 side 1868 is parallel to the S2 side 1869.

In one embodiment, a semiconductor device 1800L comprises a first die 1850, a second die 1848, and a redistribution structure 1859. The first die 1850 has an L1 side 1856 and an S1 side 1854. The L1 side 1856 is perpendicular to the S1 side 1854.

The first die 1850 has a first active surface 1857. The first die 1850 comprises an L1 connection area 1852 on the first active surface 1857. The L1 connection area 1852 is substantially along the L1 side 1856. The first die 1850 comprises an S1 connection area 1853 on the first active surface 1857. The S1 connection area 1853 is substantially along the S1 side 1854. The second die 1848 has an L2 side 1855 and an S2 side 1861. The second die 1848 has a second active surface 1858. The second die 1848 comprises an L2 connection area 1851 on the second active surface 1858. The L2 connection area 1851 is substantially along the L2 side.

The L1 side is parallel to the L2 side. The redistribution structure 1859 has a first group of traces 1847 and a second group of traces 1849. The first group of traces 1847 is connected between the S1 connection area 1853 and the L2 connection area 1851. The second group of traces 1849 is connected between the L1 connection area 1852 and the L2 connection area 1851. An average length of the second group of traces is shorter than that of the first group of traces.

Figure 18A:
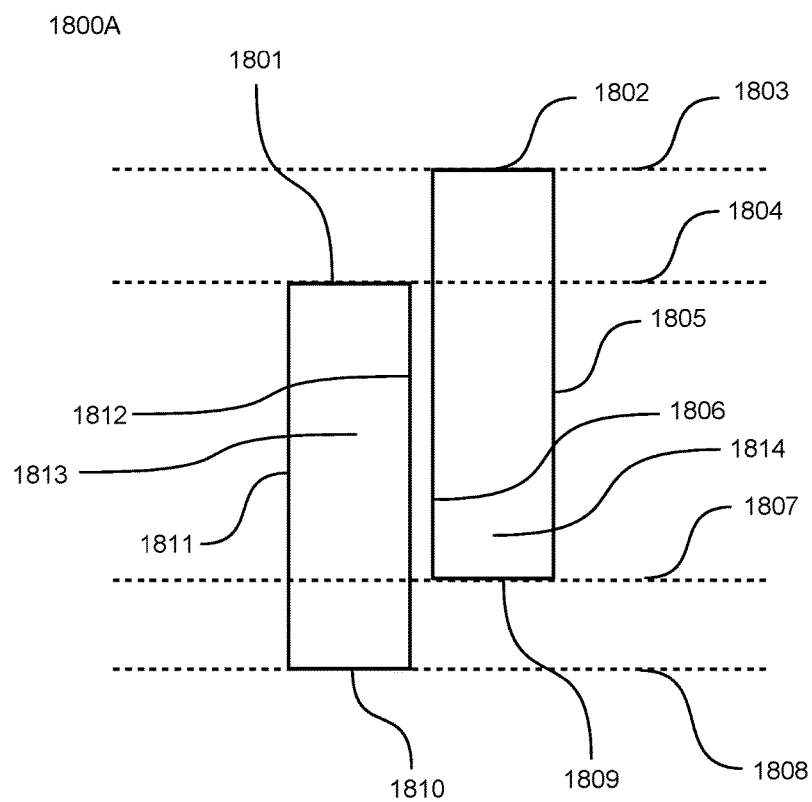
FIG. 18A shows a back surface view of two dies placed on a redistribution structure.
Figure 18B:
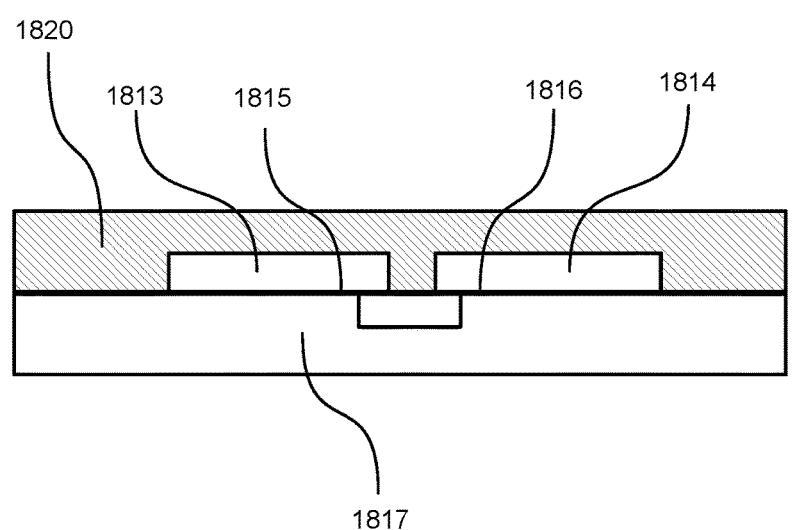
FIG. 18B shows a cross sectional view of two dies placed on a redistribution structure.
Figure 18C:
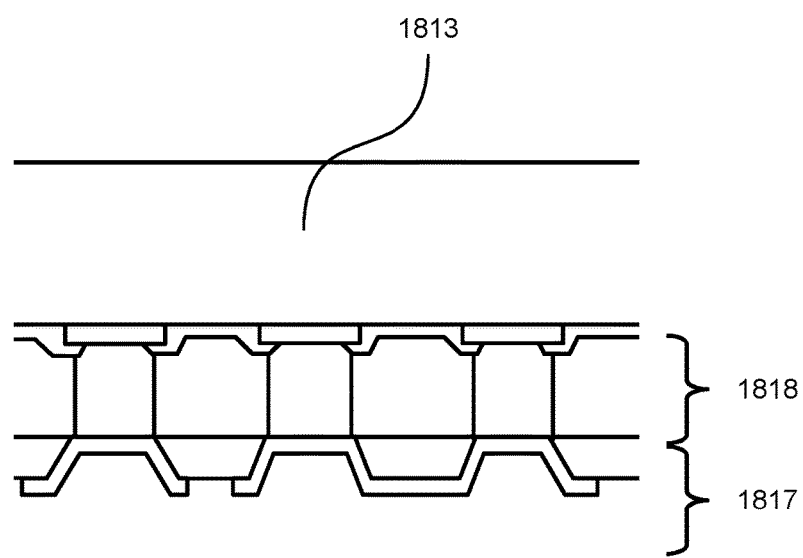
FIG. 18C shows an embodiment of a connection structure.
Figure 18D:
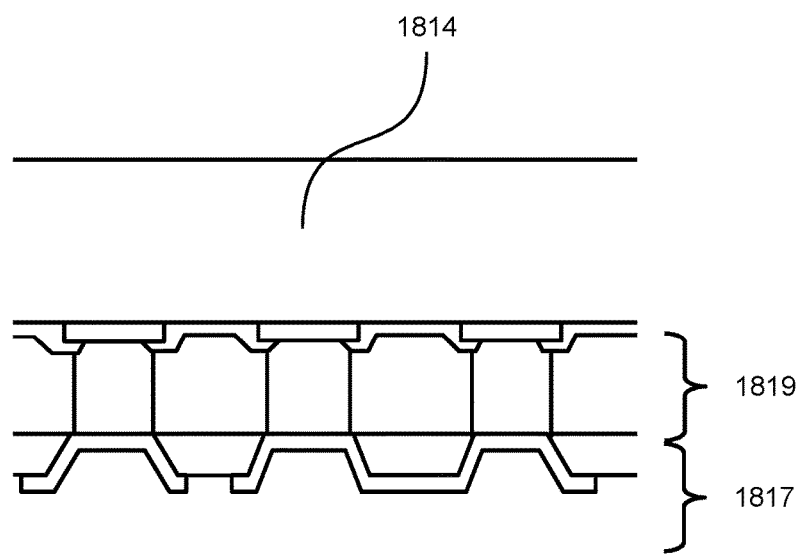
FIG. 18D shows another embodiment of a connection structure.
Figure 18E:
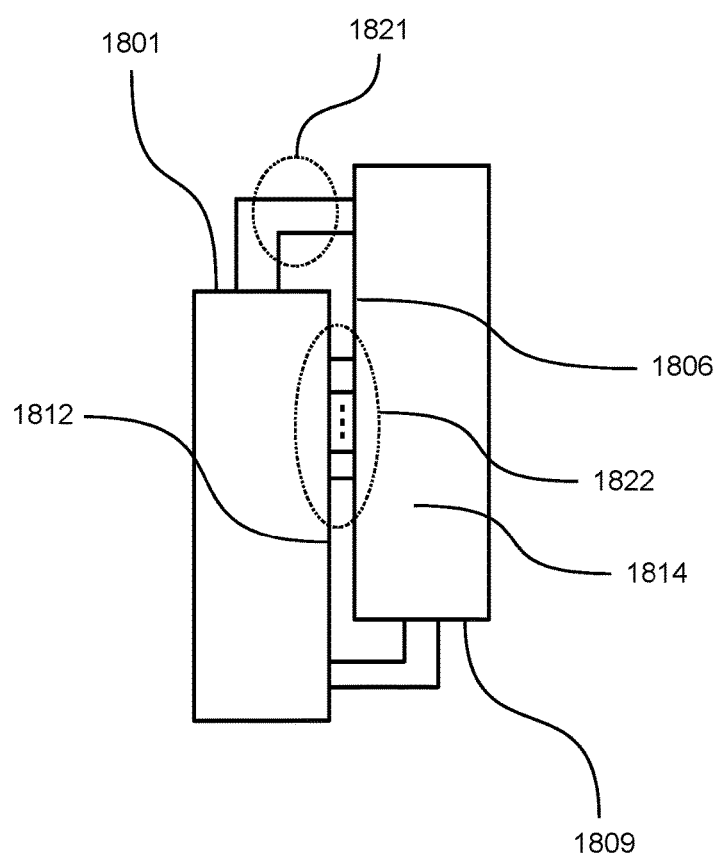
FIG. 18E shows a back surface view of two dies placed on a redistribution structure.
Figure 18F:
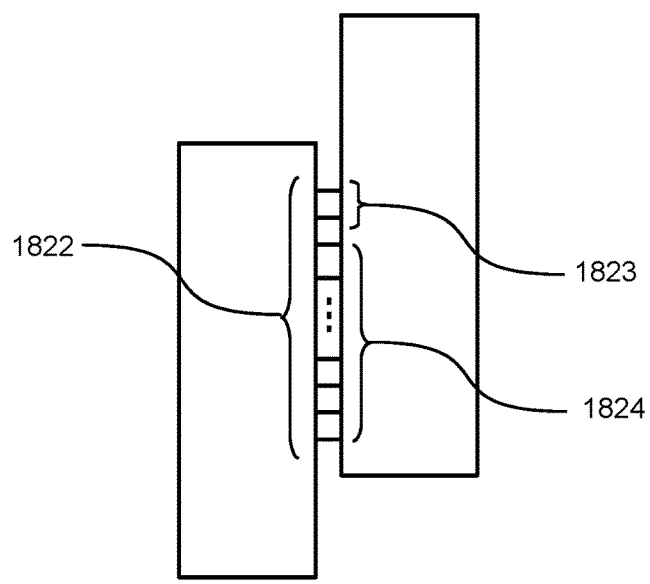
FIG. 18F shows another back surface view of two dies placed on a redistribution structure.
Figure 18G:
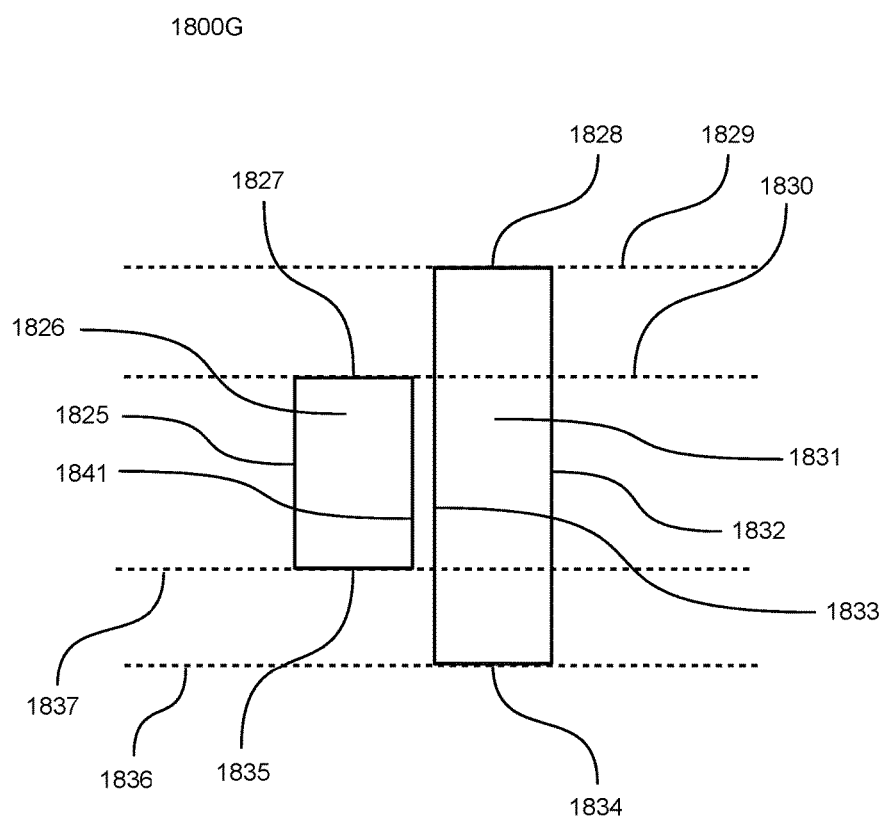
FIG. 18G shows another back surface view of two dies placed on a redistribution structure.

FIG. 18A shows a back surface view of two dies placed on a redistribution structure. FIG. 18B shows a cross sectional view of two dies placed on a redistribution structure. FIG. 18C shows an embodiment of a connection structure. FIG. 18D shows an embodiment of a connection structure. FIG. 18E shows a back surface view of two dies placed on a redistribution structure. FIG. 18F shows a back surface view of two dies placed on a redistribution structure. FIG. 18G shows a back surface view of two dies placed on a redistribution structure.

Figure 18H:
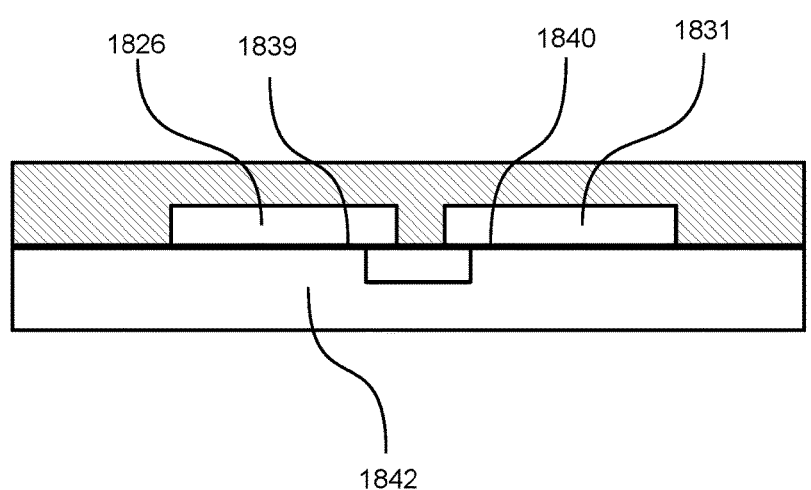
FIG. 18H shows a cross sectional view of two dies placed on a redistribution structure.
Figure 18I:
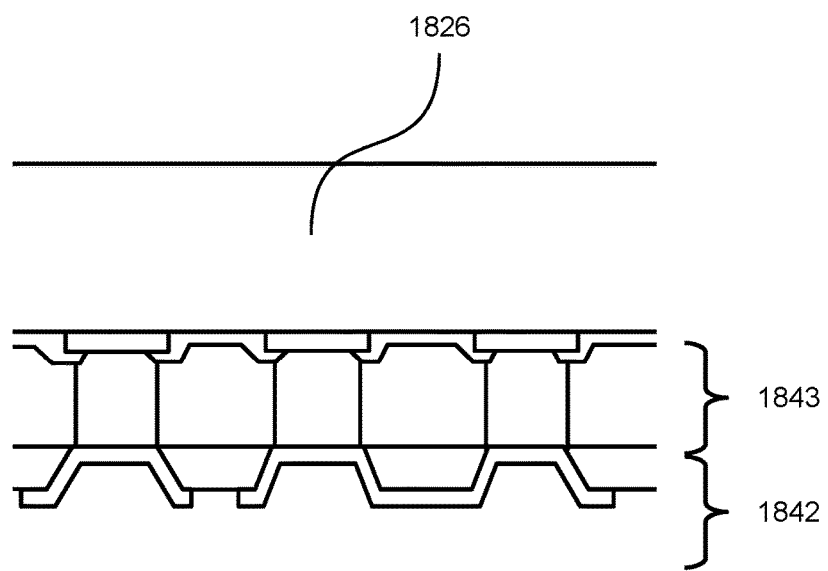
FIG. 18I shows an embodiment of a connection structure.
Figure 18J:
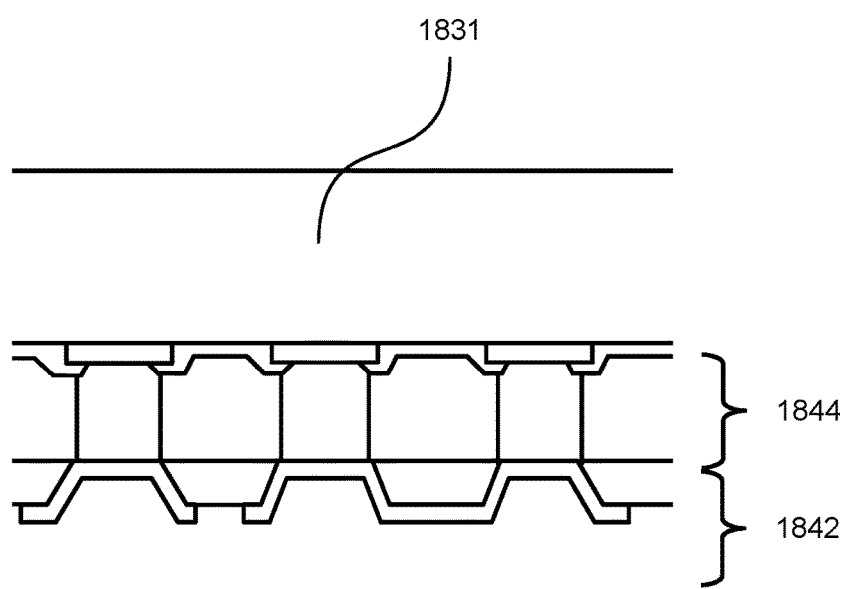
FIG. 18J shows another embodiment of a connection structure.
Figure 18K:
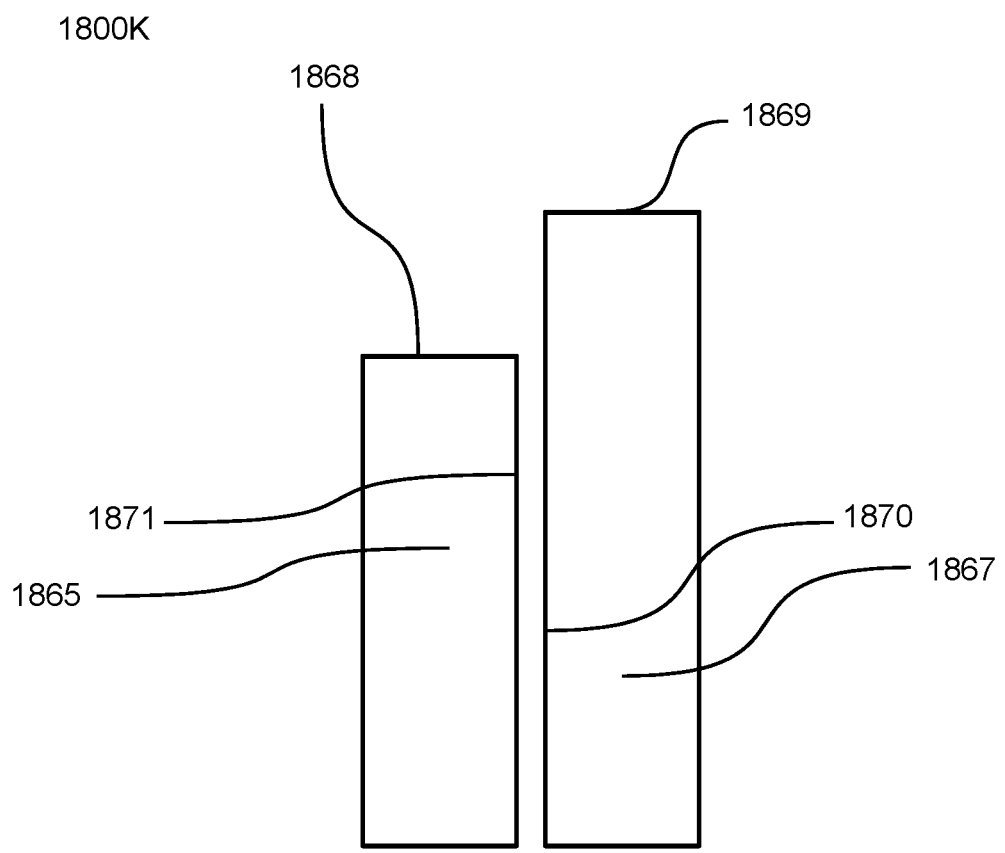
FIG. 18K shows a back surface view of two dies placed on a redistribution structure.
Figure 18L:
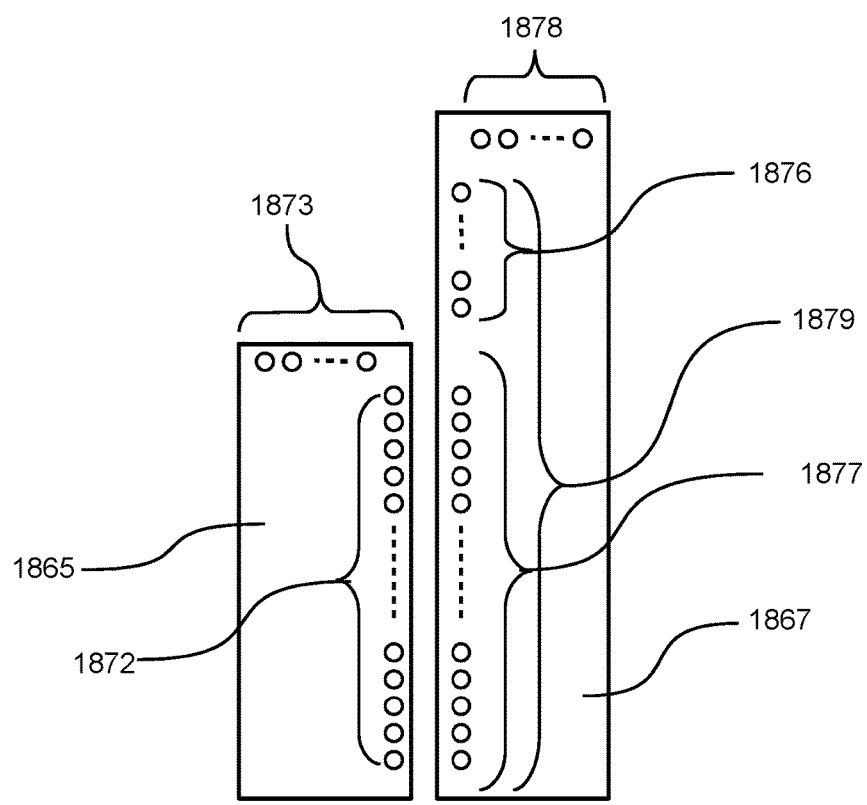
FIG. 18L shows another back surface view of two dies placed on a redistribution structure.
Figure 18M:
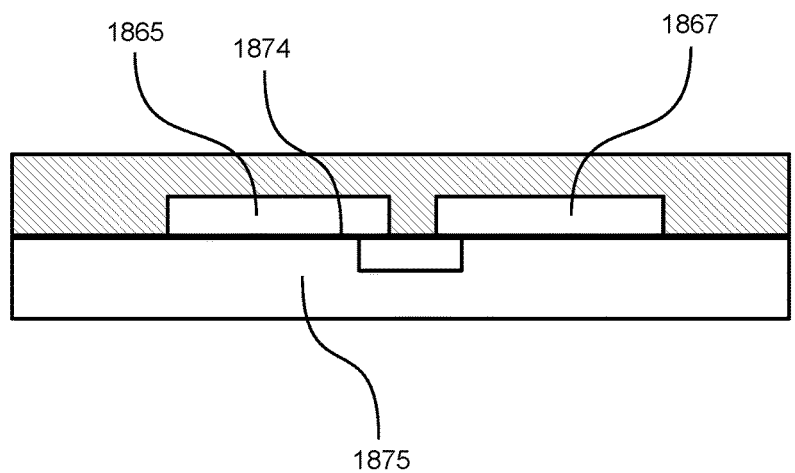
FIG. 18M shows a cross sectional view of two dies placed on a redistribution structure.
Figure 18N:
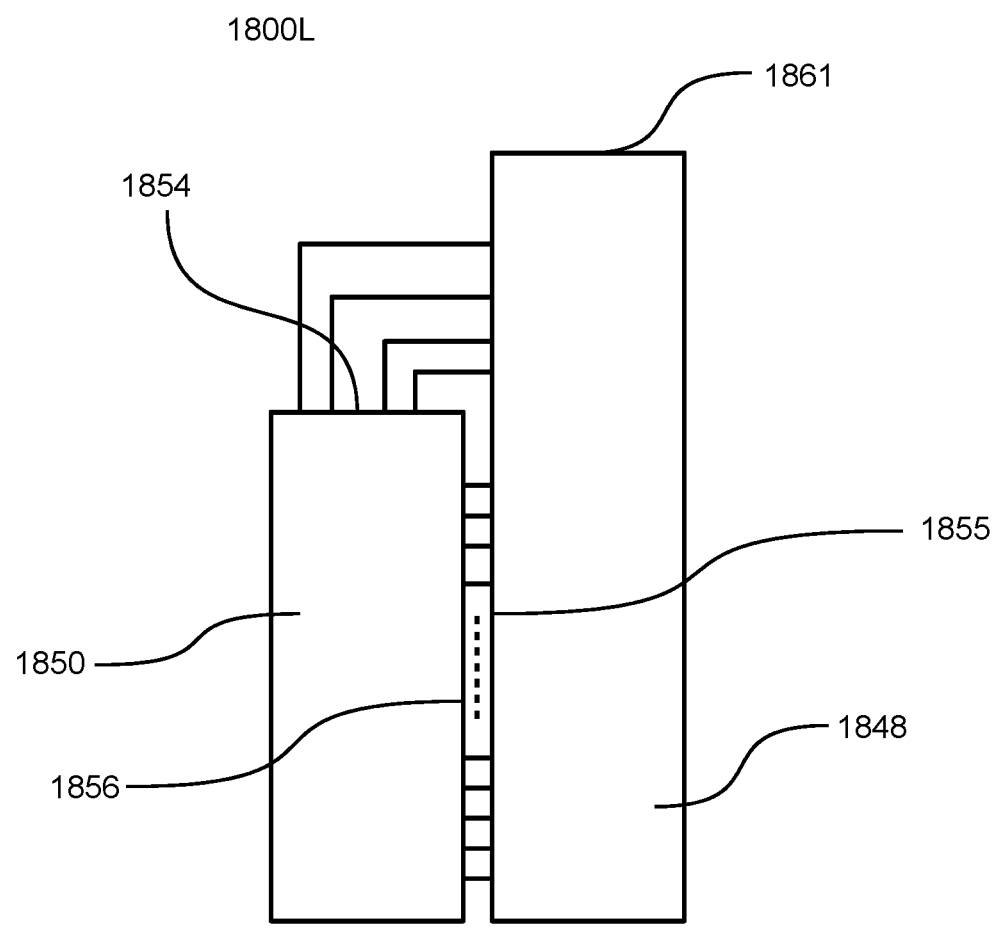
FIG. 18N shows a back surface view of two dies placed on a redistribution structure.
Figure 18O:
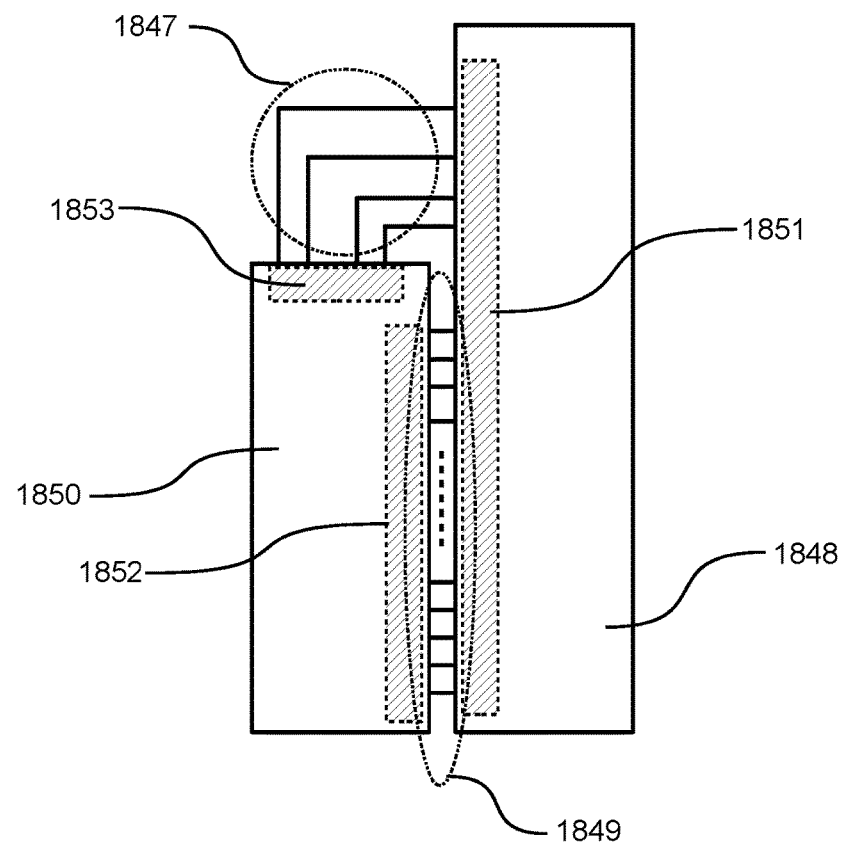
FIG. 18O shows another back surface view of two dies placed on a redistribution structure.
Figure 18P:
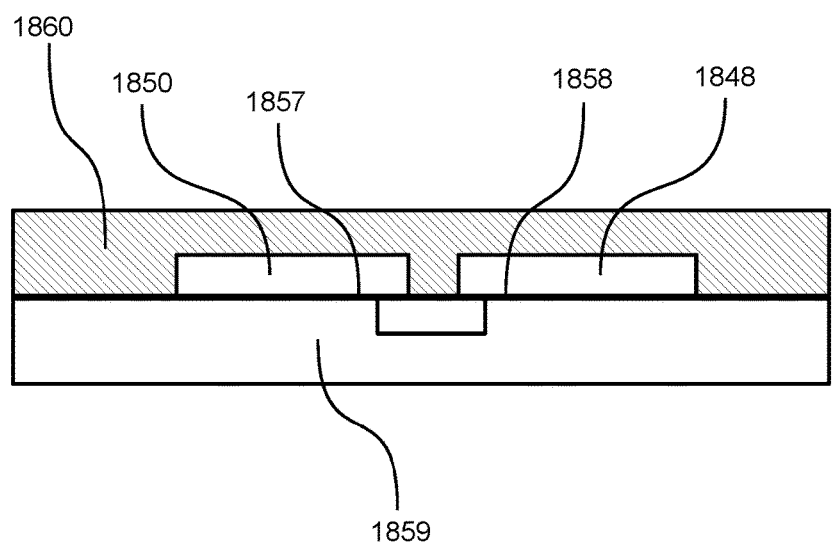
FIG. 18P shows a cross sectional view of two dies placed on a redistribution structure.

FIG. 18H shows a cross sectional view of two dies placed on a redistribution structure. FIG. 18I shows an embodiment of a connection structure. FIG. 18J shows an embodiment of a connection structure. FIG. 18K shows a back surface view of two dies placed on a redistribution structure. FIG. 18L shows a back surface view of two dies placed on a redistribution structure. FIG. 18M shows a cross sectional view of two dies placed on a redistribution structure. FIG. 18N shows a back surface view of two dies placed on a redistribution structure. FIG. 18O shows a back surface view of two dies placed on a redistribution structure. FIG. 18P shows a cross sectional view of two dies placed on a redistribution structure.

With reference to FIG. 18A, in one embodiment, a semiconductor device 1800A comprises a first die 1813, a second die 1814, a redistribution structure 1817, a first connection structure 1818, and a second connection structure 1819.

The first die 1813 has a first active surface 1815. The first die has an A1 side 1801, an A2 side 1812, an A3 side 1810, and an A4 side 1811. The A1 side 1801 is parallel to the A3 side 1810. The A2 side 1812 is parallel to the A4 side 1811. The A2 side 1812 is longer than the A1 side 1801. The A1 side 1801 is along an A1 axis 1804. The A3 side 1810 is along an A3 axis 1808. The second die 1814 has a second active surface 1816. The second die 1814 has a B1 side 1802, a B2 side 1805, a B3 side 1809, and a B4 side 1806. The B1 side 1802 is parallel to the B3 side 1809. The B2 side 1805 is parallel to the B4 side 1806. The B2 side 1805 is longer than the B1 side 1802.

The B1 side 1802 is along a B1 axis 1803. The B3 side 1809 is along a B3 axis 1807. The first active surface 1815 is connected to the redistribution structure 1817 through the first connection structure 1818. The second active surface 1816 is connected to the redistribution structure 1817 through the second connection structure 1819. The A1 axis 1804 intersects the second die 1814. The A3 axis 1808 does not intersect the second die 1814, the B1 axis 1803 does not intersect the first die 1813, and the B3 axis 1807 intersects the first die 1813.

In one example, the semiconductor device further comprises a molding material 1820. The molding material 1720 is filled between the first die 1813 and the second die 1814. In one example, the first die 1813 is a logic die and the second die 1814 is a memory die. In one example, the first die 1813 is a memory die and the second die 1814 is a logic die. In one example, the semiconductor device 1800A further comprises a first group of traces 1821 and a second group of traces 1822. Each trace of the first group of traces is connected between the A1 side 1801 and the B4 side 1806 and each trace of the second group of traces is connected between the A2 side 1812 and the B4 side 1806.

In one example, a subgroup 1824 of the second group of traces 1822 are assigned as a data bus for transmitting data from the memory die 1814. In one example, at least two traces 1823 of the second group of traces 1822 are assigned as a pair of complementary data strobe signals.

With reference to FIG. 18B and FIG. 18G, in one embodiment, a semiconductor device 1800G comprises a first die 1826, a second die 1831, a redistribution structure 1842, a first connection structure 1843, and a second connection structure 1844. The first die 1826 has a first active surface 1839. The first die 1826 has an A1 side 1827, an A2 side 1841, an A3 side 1835, and an A4 side 182. The A1 side 1827 is parallel to the A3 side 1835. The A2 side 1841 is parallel to the A4 side 1825. The A2 side 1841 is longer than the A1 side 1827. The A1 side 1827 is along an A1 axis 1830. The A3 side 1835 is along an A3 axis 1837.

The second die 1831 has a second active surface 1840. The second die has a B1 side 1828, a B2 side 1832, a B3 side 1834, and a B4 side 1833. The B1 side 1828 is parallel to the B3 side 1834. The B2 side 1832 is parallel to the B4 side 1833. The B2 side 1832 is longer than the B1 side 1828. The B1 side 1828 is along a B1 axis 1829. The B3 side 1834 being along a B3 axis 1836. The first active surface 1839 is connected to the redistribution structure 1842 through the first connection structure 1843. The second active surface 1840 is connected to the redistribution structure 1842 through the second connection structure 1844.

The A1 axis 1830 intersects the second die 1831. The A3 axis 1837 intersects the second die 1831. The B1 axis 1829 does not intersect the first die 1826. The B3 axis 1836 does not intersect the first die 1826.

Figure 19A:
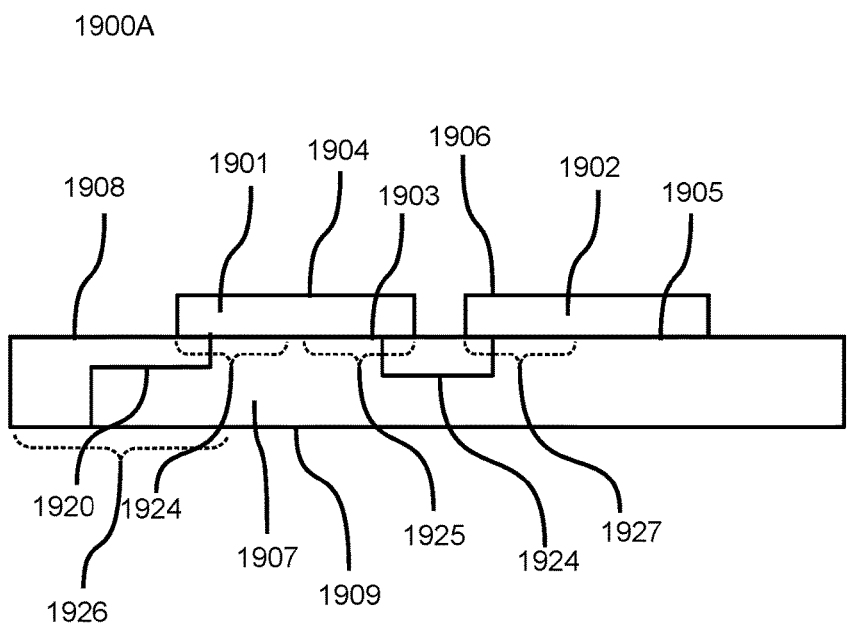
FIG. 19A shows another cross sectional view of two dies placed on a redistribution structure.
Figure 19B:
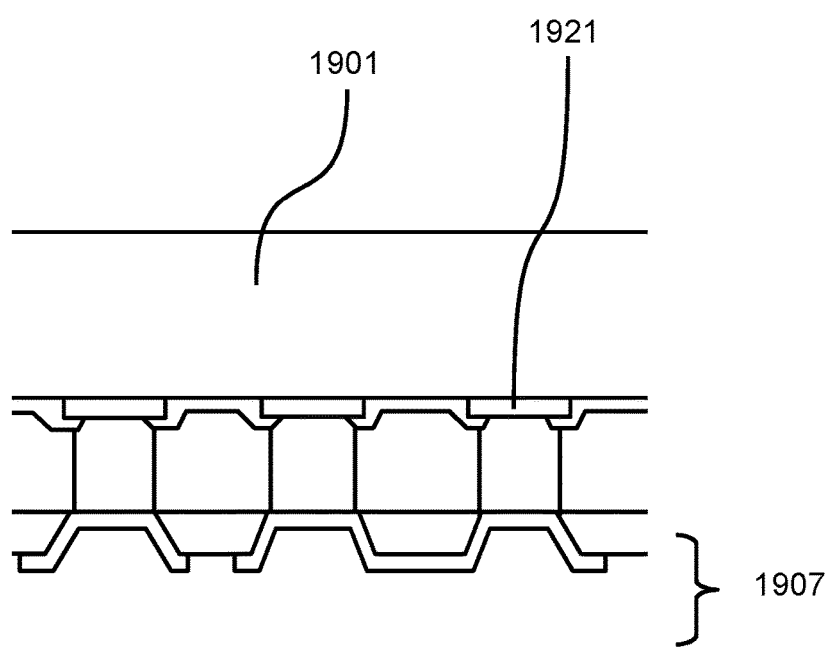
FIG. 19B shows an embodiment of a connection structure.
Figure 19C:
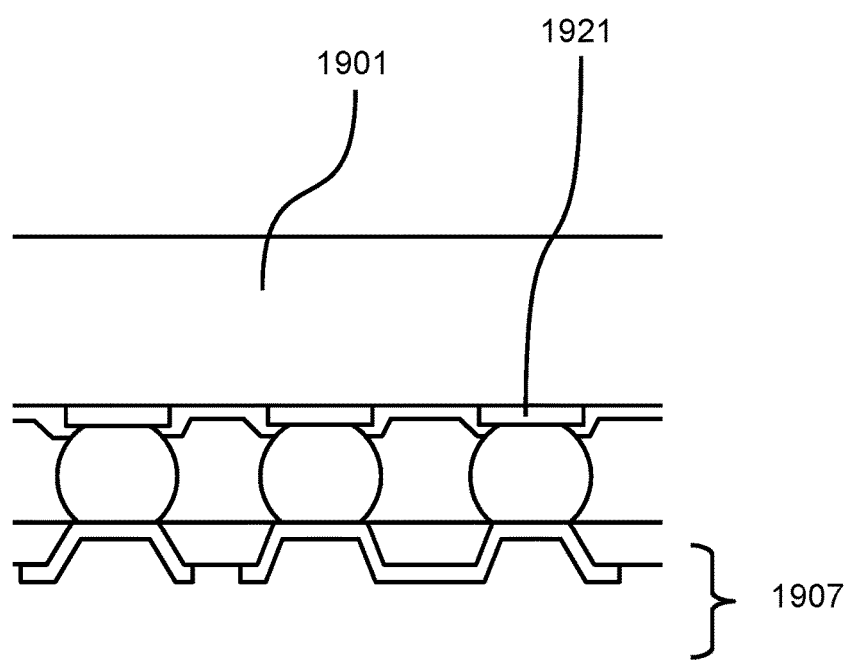
FIG. 19C shows another embodiment of a connection structure.
Figure 19D:
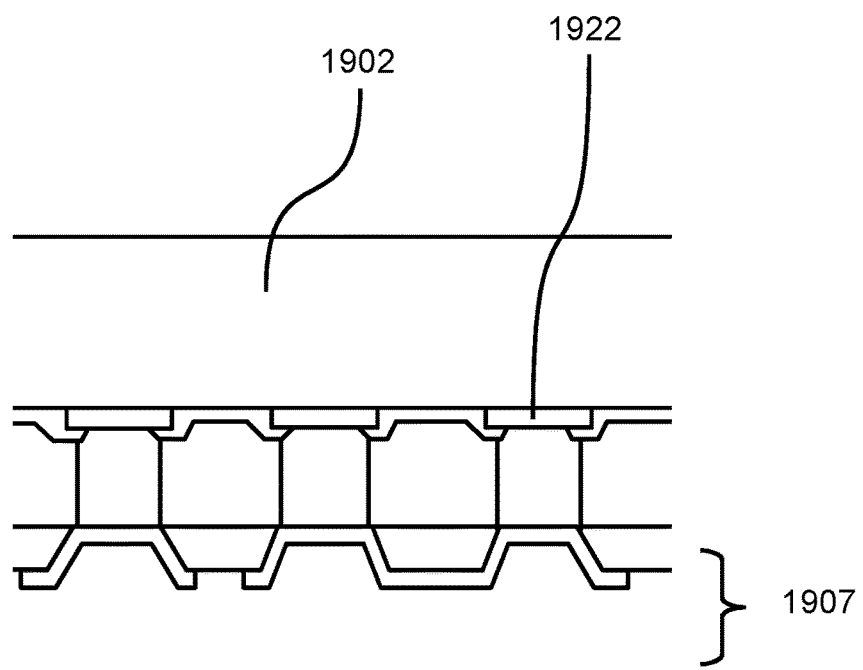
FIG. 19D shows an embodiment of a connection structure.
Figure 19E:
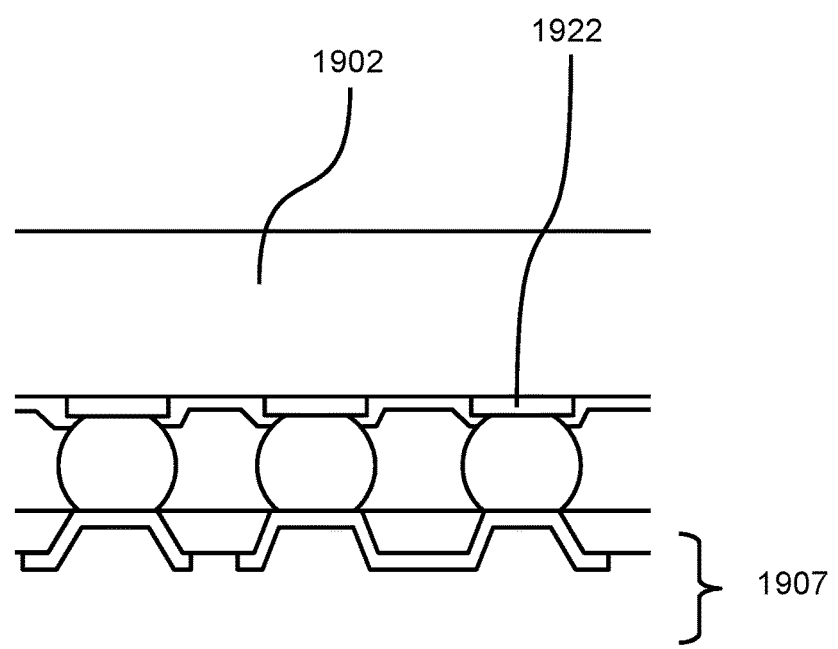
FIG. 19E shows another embodiment of a connection structure.
Figure 19F:
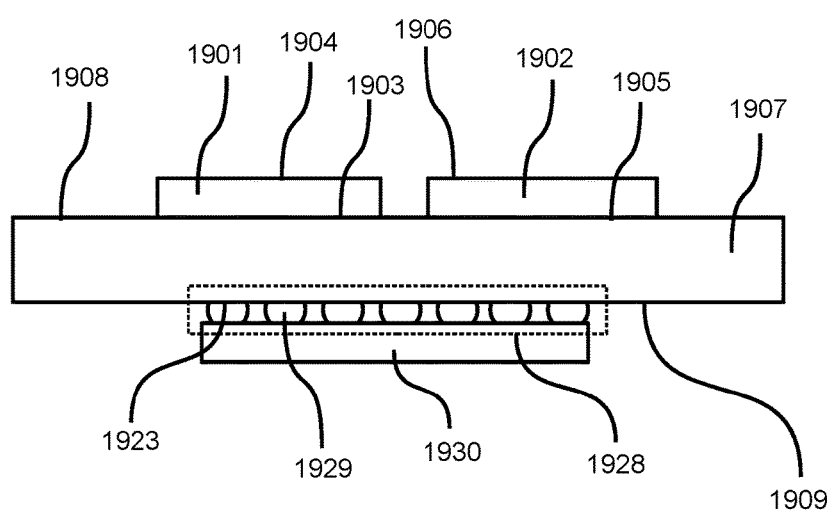
FIG. 19F shows a cross sectional view of a semiconductor device.
Figure 19G:
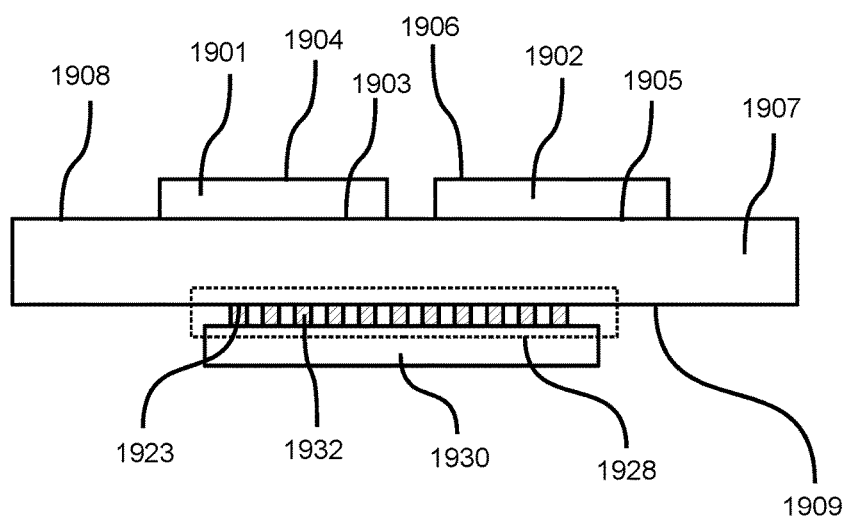
FIG. 19G shows another cross sectional view of a semiconductor device.
Figure 19H:
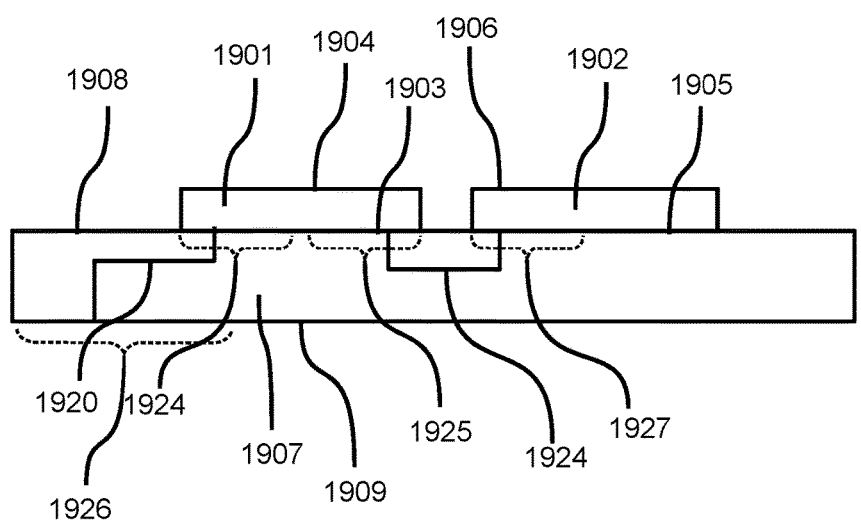
FIG. 19H shows a cross sectional view of two dies placed on a redistribution structure.
Figure 19I:
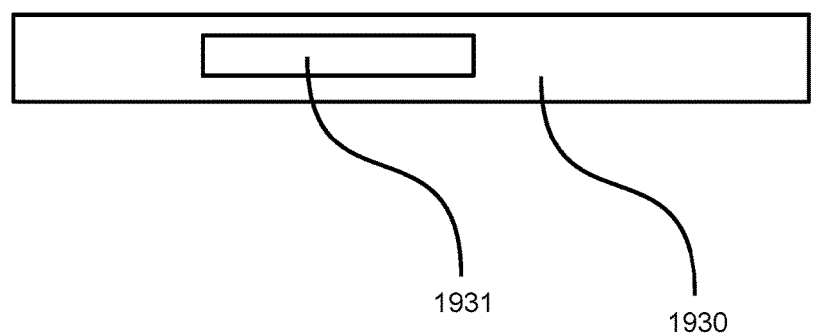
FIG. 19I shows an embodiment of a processor comprising a memory controller.

FIG. 19A shows a cross sectional view of two dies placed on a redistribution structure. FIG. 19B shows an embodiment of a connection structure. FIG. 19C shows an embodiment of a connection structure. FIG. 19D shows an embodiment of a connection structure. FIG. 19E shows an embodiment of a connection structure. FIG. 19F shows a cross sectional view of a semiconductor device. FIG. 19G shows a cross sectional view of a semiconductor device. FIG. 19H shows a cross sectional view of two dies placed on a redistribution structure. FIG. 19I shows an embodiment of a processor comprising a memory controller.

Figure 19J:
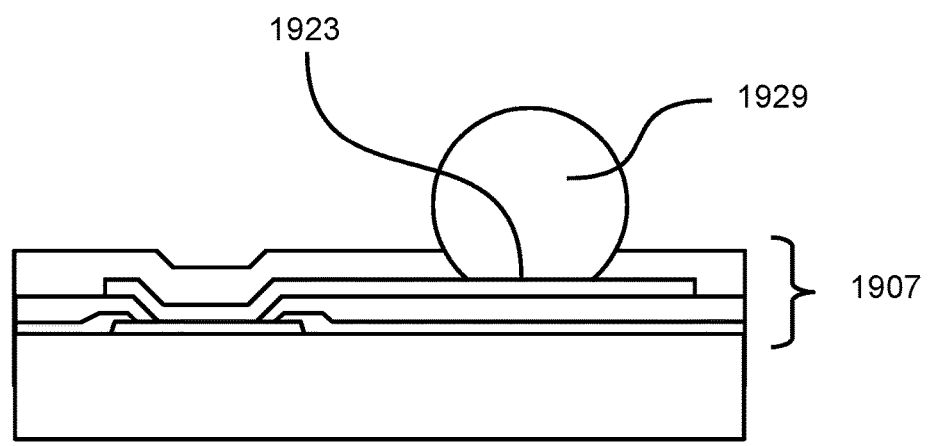
FIG. 19J shows another embodiment of a connection structure.
Figure 19K:
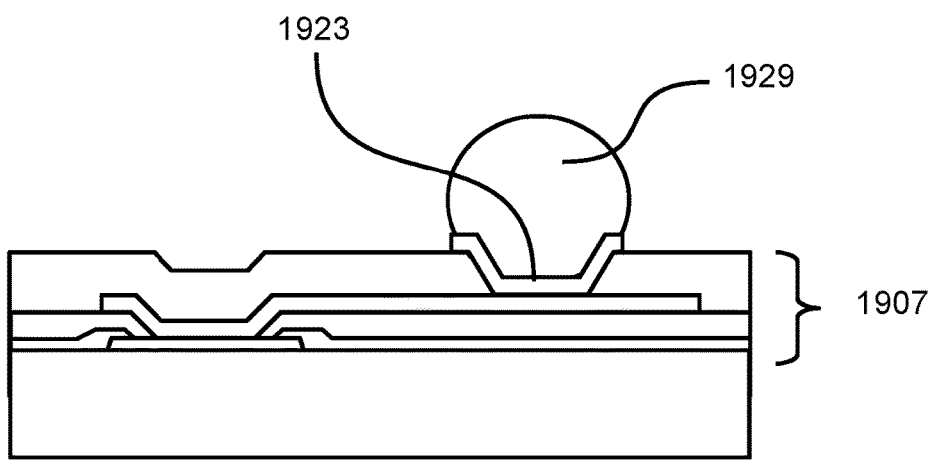
FIG. 19K shows another embodiment of a connection structure.
Figure 19L:
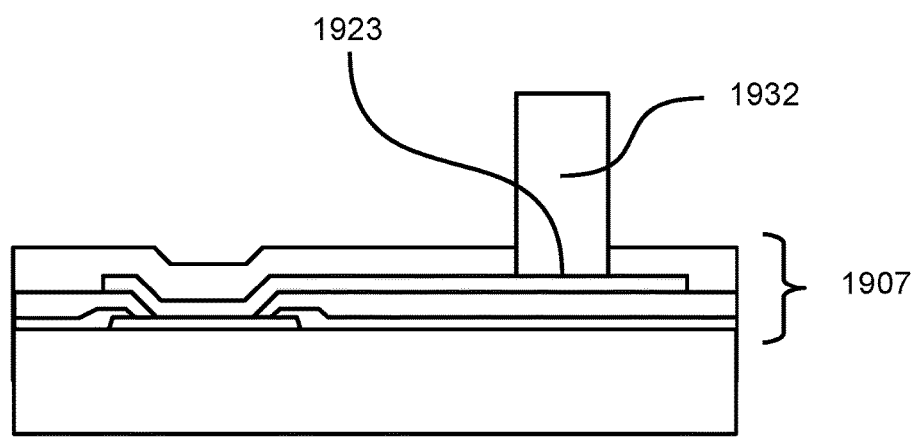
FIG. 19L shows another embodiment of a connection structure.
Figure 19M:
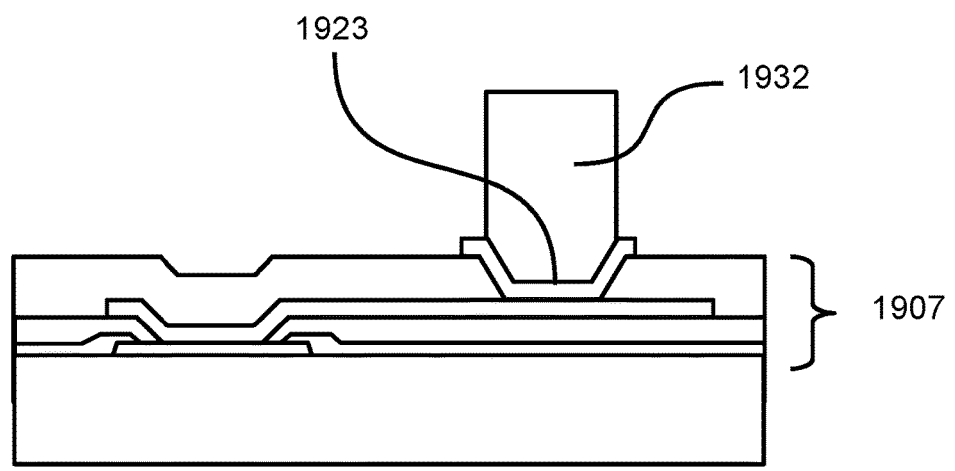
FIG. 19M shows another embodiment of a connection structure.

FIG. 19J shows an embodiment of a connection structure. FIG. 19K shows an embodiment of a connection structure. FIG. 19L shows an embodiment of a connection structure. FIG. 19M shows an embodiment of a connection structure.

In one embodiment, a semiconductor device 1900A comprises a DRAM die 1901, a flash memory die 1902, and a redistribution structure 1907. The DRAM die 1901 has a first active surface 1903 and a first back surface 1904. The DRAM die 1901 comprises a group of first connection ends 1921 located on the first active surface 1903. The flash memory die 1902 has a second active surface 1905 and a second back surface 1906. The flash memory die 1902 comprises a group of second connection ends 1922 located on the second active surface 1905.

The redistribution structure 1907 comprises a front side 1908 and a back side 1909. The redistribution structure 1907 comprises a group of third connection ends 1923 on the back side 1909. The DRAM die 1901 is connected to the front side 1908 of the redistribution structure 1907. The flash memory die 1902 is connected to the front side 1908 of the redistribution structure.

The redistribution structure 1907 comprises a group of first traces and a group of second traces. The group of first traces 1920 is connected between a first subgroup 1924 of the first connection ends 1921 and a subgroup 1926 of the third connection ends 1923. The group of second traces 1924 are connected between a second subgroup 1925 of the first connection ends 1921 and a subgroup of the second connection ends 1922. A number of the first connection ends 1921 is greater than a number of the second connection ends 1922.

In one embodiment, a semiconductor device 1900A comprises a DRAM die 1901, a flash memory die 1902, and a redistribution structure 1907. The DRAM die 1901 has a first active surface 1903 and a first back surface 1904. The DRAM die 1901 comprises a group of first connection ends 1921 located on the first active surface 1903. The flash memory die 1902 has a second active surface 1905 and a second back surface 1906. The flash memory die 1902 comprises a group of second connection ends 1922 located on the second active surface 1905.

a redistribution structure 1907, the redistribution structure 1907 comprises a front side 1908 and a back side 1909. The redistribution structure 1907 comprises a group of third connection ends 1923 on the back side 1909. The DRAM die 1901 is connected to the front side 1908 of the redistribution structure 1907.

The flash memory die 1902 is connected to the front side 1908 of the redistribution structure 1907. The redistribution structure 1907 comprises a group of first traces 1920 and a group of second traces 1924. The group of first traces 1920 is connected between a first subgroup 1924 of the first connection ends 1921 and a subgroup 1926 of the third connection ends 1923. The group of second traces 1924 is connected between a second subgroup 1925 of the first connection ends 1921 and a subgroup 1927 of the second connection ends 1922.

No solder material is placed between the DRAM die 1901 and the redistribution structure 1907. No solder material is placed between the flash memory die 1902 and the redistribution structure 1907.

In one embodiment, a semiconductor device 1800A comprises a DRAM die 1901, a flash memory die 1902, and a redistribution structure 1907. The DRAM die 1901 has a first active surface 1903 and a first back surface 1904. The DRAM die 1901 comprises a group of first connection ends 1921 located on the first active surface 1903. The flash memory die 1902 has a second active surface 1905 and a second back surface 1906. The flash memory die 1902 comprises a group of second connection ends 1922 located on the second active surface 1905.

The redistribution structure 1907 comprises a front side 1908 and a back side 1909. The redistribution structure 1907 comprises a group of third connection ends 1923 on the back side 1909. The DRAM die 1901 is connected to the front side 1908 of the redistribution structure 1907. The flash memory die 1902 is connected to the front side 1908 of the redistribution structure 1907.

The redistribution structure 1907 comprises a group of first traces 1920 and a group of second traces 1924. The group of first traces 1920 is connected between a first subgroup 1924 of the first connection ends 1921 and a subgroup 1926 of the third connection ends 1923. The group of second traces 1924 is connected between a second subgroup 1925 of the first connection ends 1921 and a subgroup 1927 of the second connection ends 1922.

A first number of the first traces 1920 are assigned as a DRAM data bus and a second number of the second traces 1924 are assigned as a flash data bus, A bus width of the DRAM data bus is wider than the flash data bus.

In an embodiment, a semiconductor device 1900A comprises a DRAM die 1901, a flash memory die 1902, a redistribution structure 1907, a connection structure 1928, and a processor 1930. The DRAM die 1901 has a first active surface 1903 and a first back surface 1904. The DRAM die 1901 comprises a group of first connection ends 1921 located on the first active surface 1903. The flash memory die 1902 has a second active surface 1905 and a second back surface 1906. The flash memory die 1902 comprises a group of second connection ends 1922 located on the second active surface 1905.

The redistribution structure 1907 comprises a front side 1908 and a back side 1909. The redistribution structure 1907 comprises a group of third connection ends 1923 on the back side 1909. The DRAM die 1901 is connected to the front side 1908 of the redistribution structure 1907. The flash memory die 1902 is connected to the front side 1908 of the redistribution structure 1907. The redistribution structure 1907 comprises a group of first traces 1920 and a group of second traces 1924.

The group of first traces 1920 is connected between a first subgroup 1924 of the first connection ends 1921 and a subgroup 1926 of the third connection ends 1923. The group of second traces 1924 is connected between a second subgroup 1925 of the first connection ends 1921 and a subgroup 1927 of the second connection ends 1922. The connection structure 1928 comprises a plurality of solder bumps 1929. The processor 1930 comprises a memory controller 1931 for controlling accesses to the DRAM die 1901 and the flash memory die 1902. The processor 1930 is connected to the back side 1909 of the redistribution structure 1907 through the connection structure 1928.

a semiconductor device 1900F comprises a DRAM die 1901, a flash memory die 1902, a redistribution structure 1907, a connection structure 1928, and a processor 1930. The DRAM die 1901 has a first active surface 1903 and a first back surface 1904. The DRAM die 1901 comprises a group of first connection ends 1921 located on the first active surface 1903. The flash memory die 1902 has a second active surface 1905 and a second back surface 1906. The flash memory die 1902 comprises a group of second connection ends 1922 located on the second active surface 1905.

The redistribution structure 1907 comprises a front side 1908 and a back side 1909. The redistribution structure 1907 comprises a group of third connection ends 1923 on the back side 1909. The DRAM die 1901 is connected to the front side 1908 of the redistribution structure 1907. The flash memory die 1902 is connected to the front side 1908 of the redistribution structure 1907.

The redistribution structure 1907 comprises a group of first traces and a group of second traces. The group of first traces 1920 is connected between a first subgroup 1924 of the first connection ends 1921 and a subgroup of the third connection ends 1923. The group of second traces 1924 is connected between a second subgroup 1925 of the first connection ends 1921 and a subgroup 1927 of the second connection ends 1922.

The connection structure 1928 comprises a plurality of conductive pillars 1932. The processor 1930 comprises a memory controller 1931 for controlling accesses to the DRAM die 1901 and the flash memory die 1902. The processor 1930 is connected to the back side 1909 of the redistribution structure 1907 through the connection structure 1928.

Figure 20A:
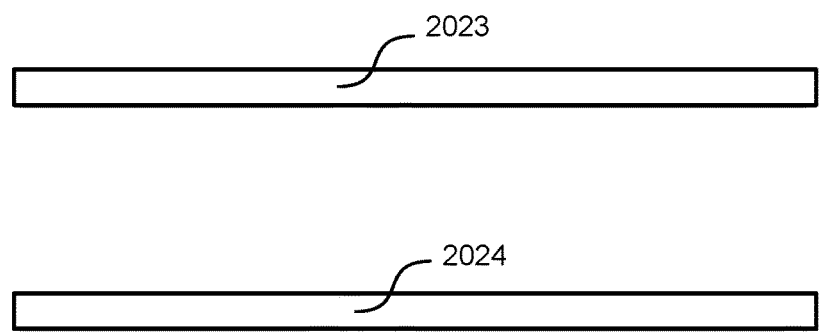
FIG. 20A shows one step of a method for manufacturing a memory module.
Figure 20B:
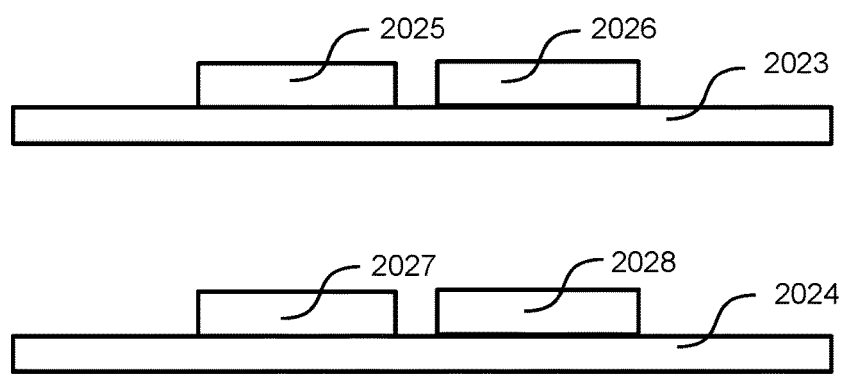
FIG. 20B shows next step of a method for manufacturing a memory module.
Figure 20C:
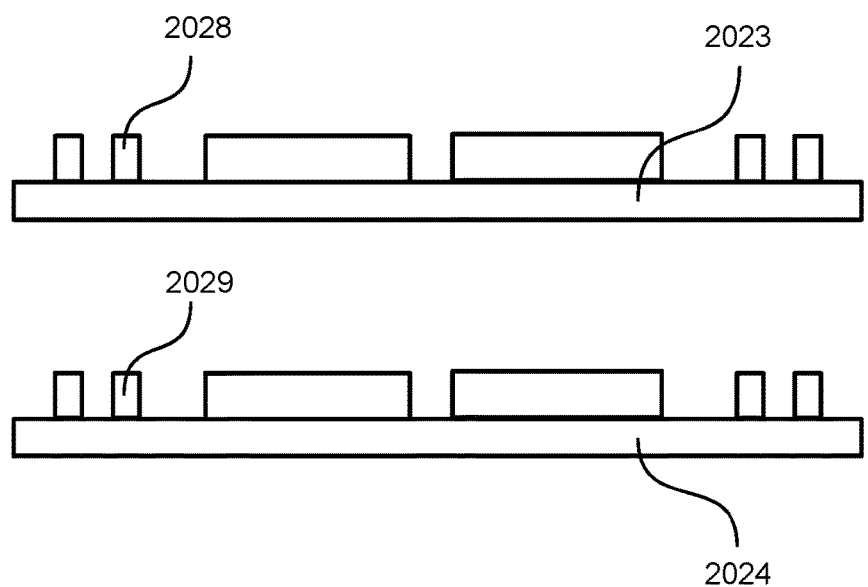
FIG. 20C shows next step of a method for manufacturing a memory module.
Figure 20D:
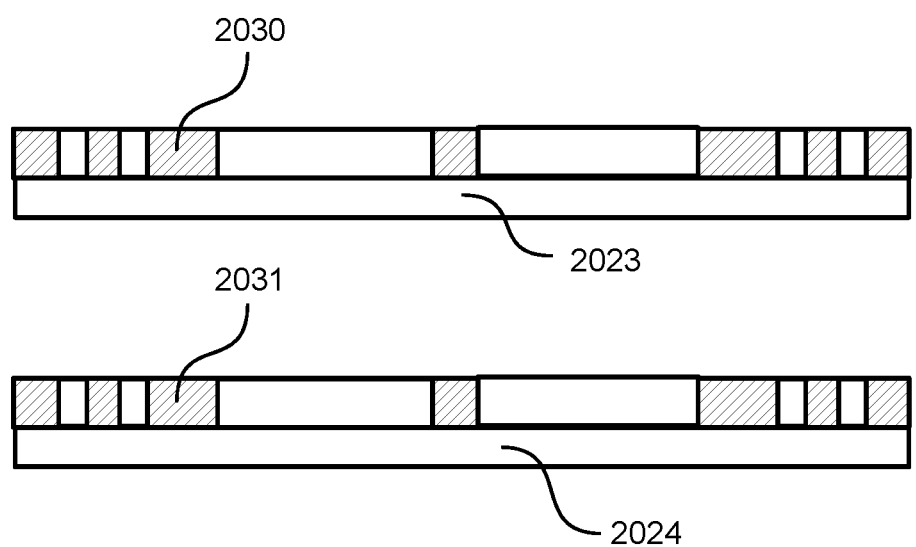
FIG. 20D shows next step of a method for manufacturing a memory module.
Figure 20E:
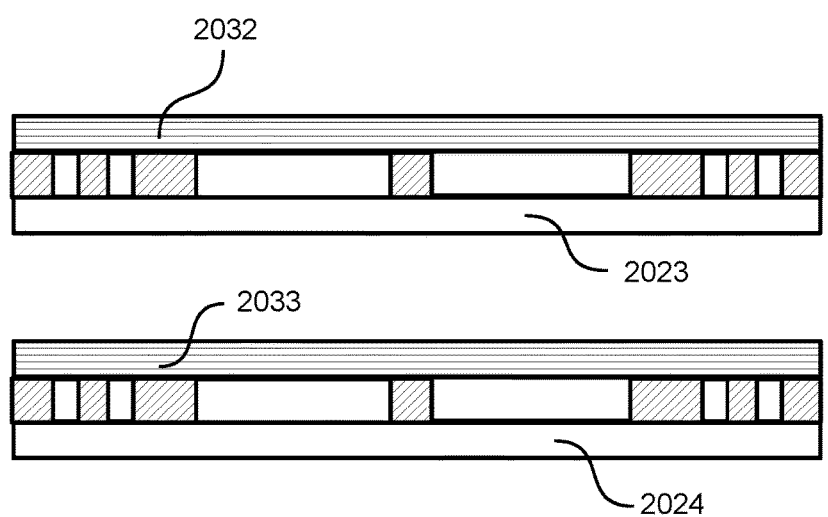
FIG. 20E shows next step of a method for manufacturing a memory module.
Figure 20F:
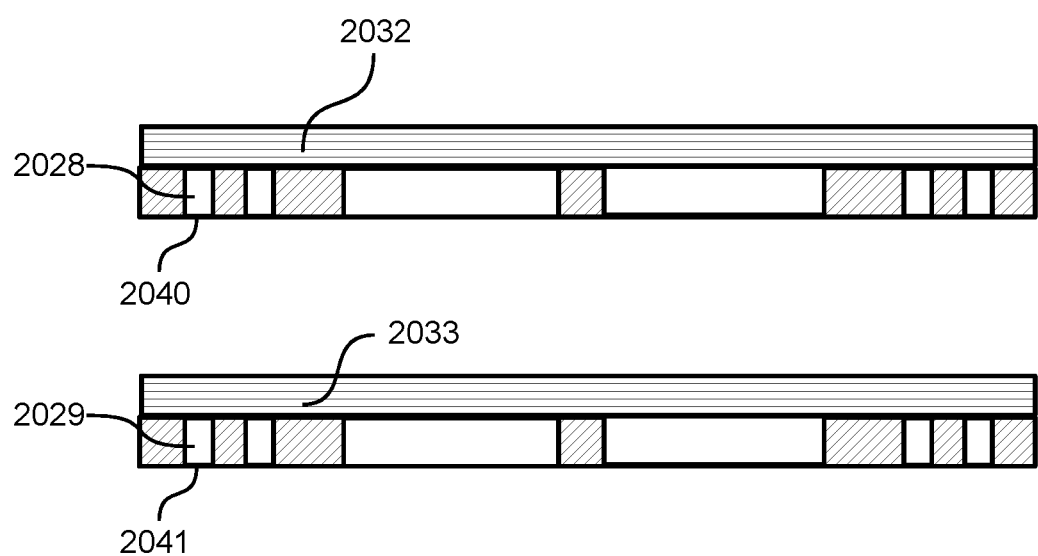
FIG. 20F shows next step of a method for manufacturing a memory module.

FIG. 20A shows one step of a method for manufacturing a memory module. FIG. 20B shows one step of a method for manufacturing a memory module. FIG. 20C shows one step of a method for manufacturing a memory module. FIG. 20D shows one step of a method for manufacturing a memory module. FIG. 20E shows one step of a method for manufacturing a memory module. FIG. 20F shows one step of a method for manufacturing a memory module.

Figure 20G:
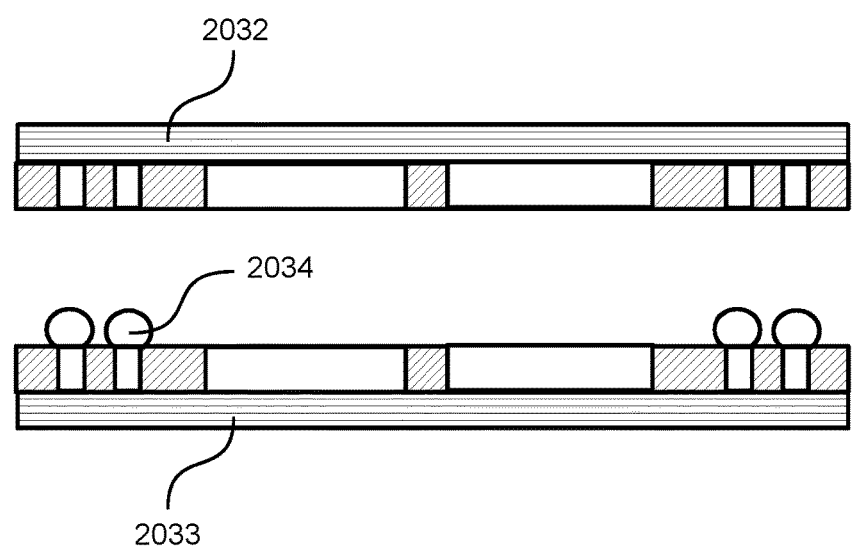
FIG. 20G shows next step of a method for manufacturing a memory module.
Figure 20H:
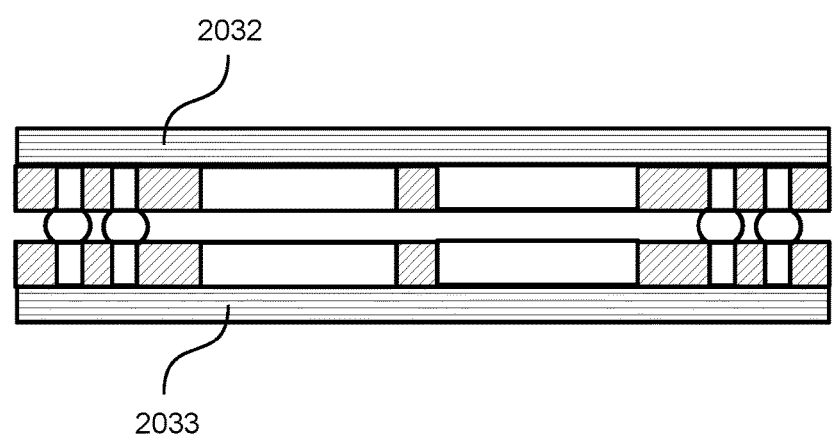
FIG. 20H shows next step of a method for manufacturing a memory module.
Figure 20I:
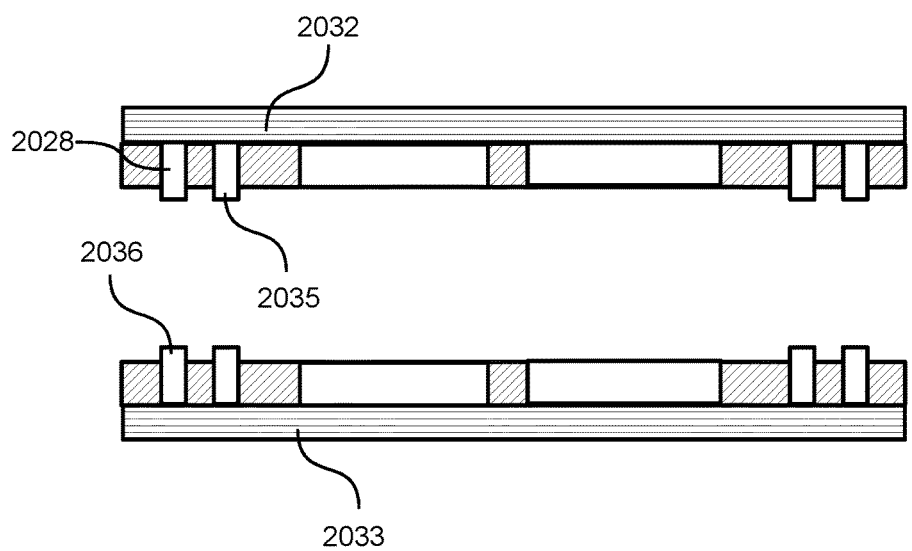
FIG. 20I shows next step of a method for manufacturing a memory module.
Figure 20J:
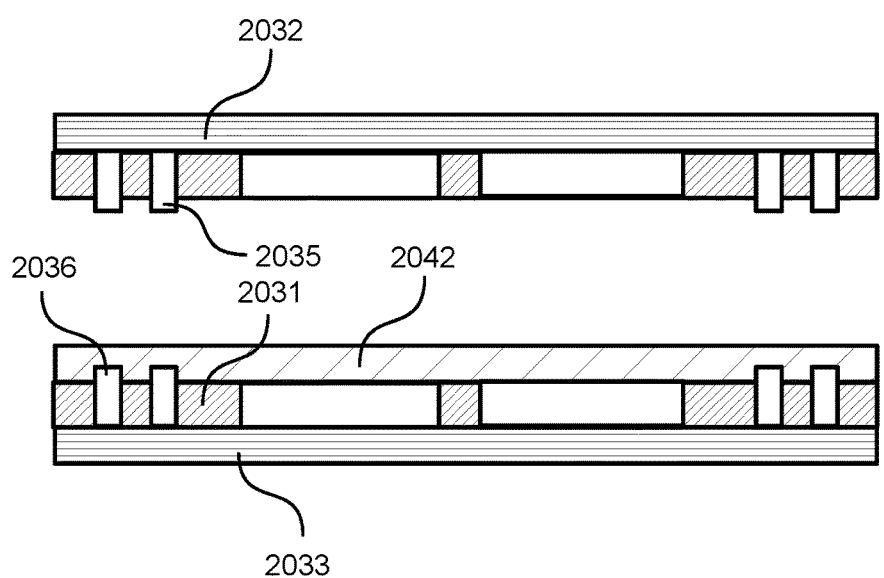
FIG. 20J shows next step of a method for manufacturing a memory module.
Figure 20K:
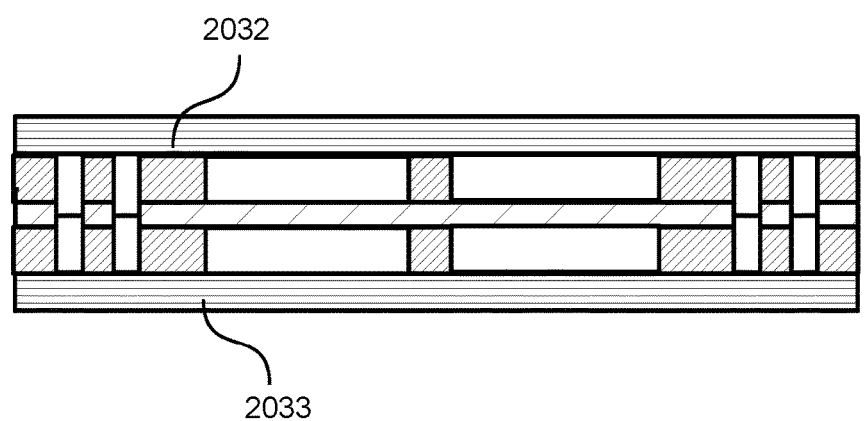
FIG. 20K shows next step of a method for manufacturing a memory module.
Figure 20L:
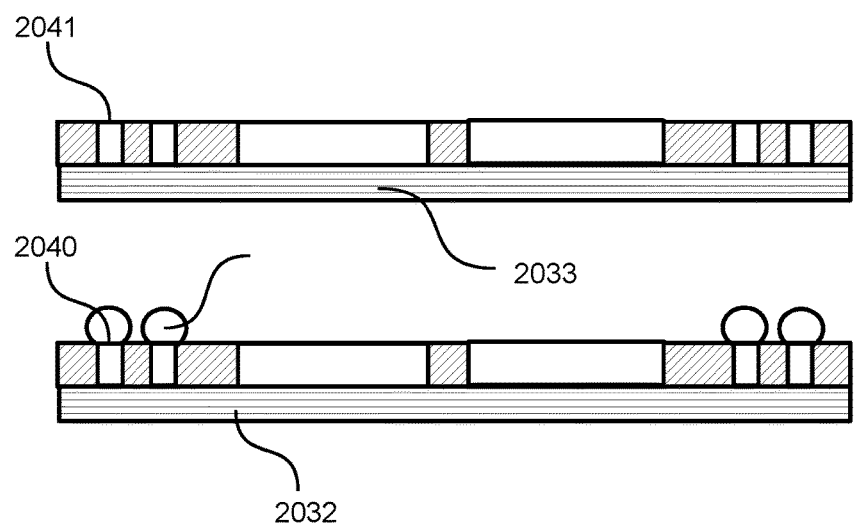
FIG. 20L shows next step of a method for manufacturing a memory module.
Figure 20M:
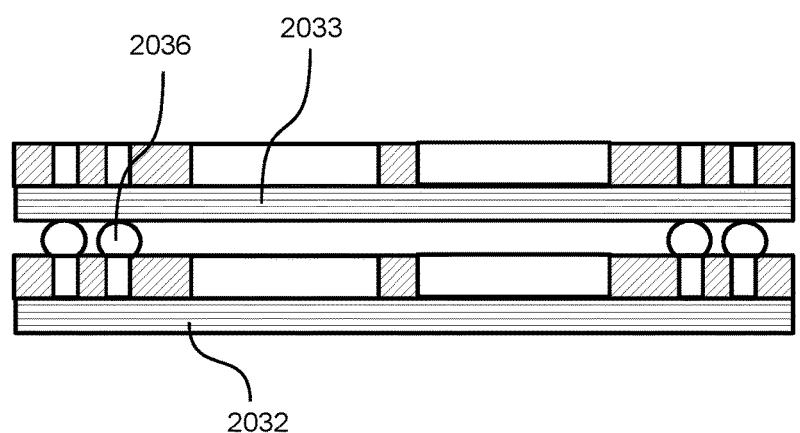
FIG. 20M shows next step of a method for manufacturing a memory module.

FIG. 20G shows one step of a method for manufacturing a memory module. FIG. 20H shows one step of a method for manufacturing a memory module. FIG. 20I shows one step of a method for manufacturing a memory module. FIG. 20J shows one step of a method for manufacturing a memory module. FIG. 20K shows one step of a method for manufacturing a memory module. FIG. 20L shows one step of a method for manufacturing a memory module. FIG. 20M shows one step of a method for manufacturing a memory module.

Figure 20N:
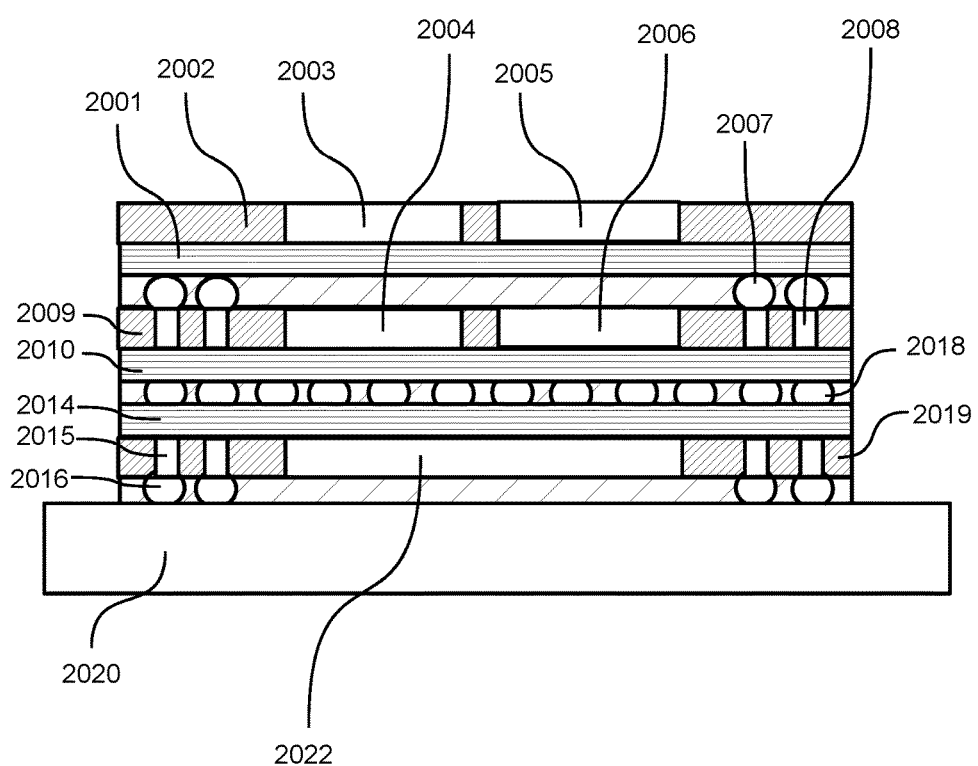
FIG. 20N shows an embodiment of a semiconductor device.
Figure 20O:
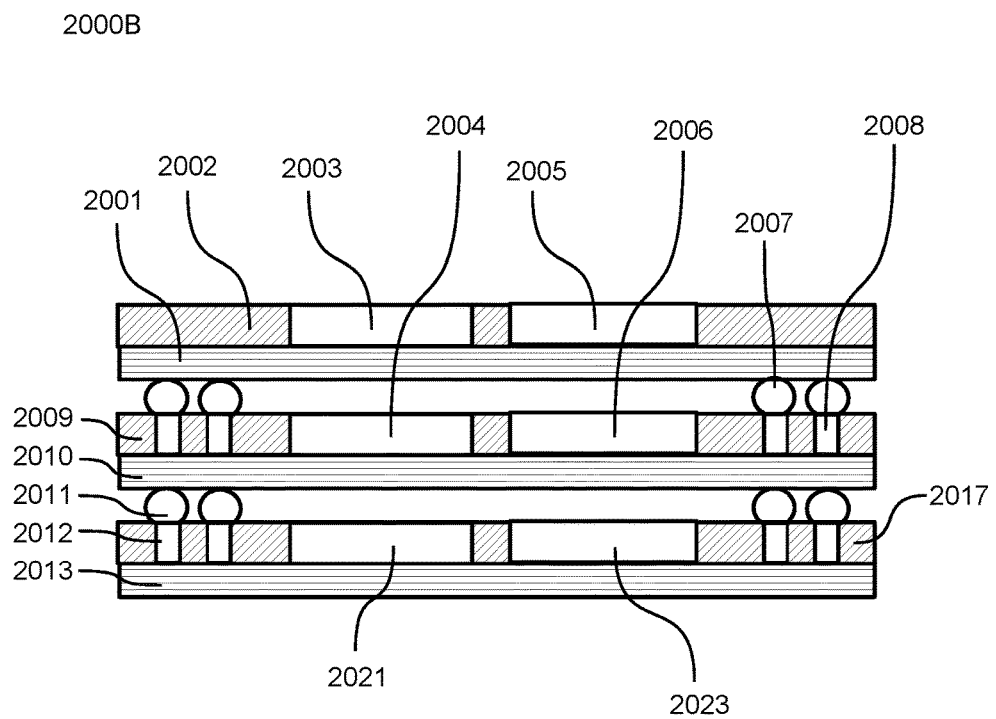
Figure 20P:
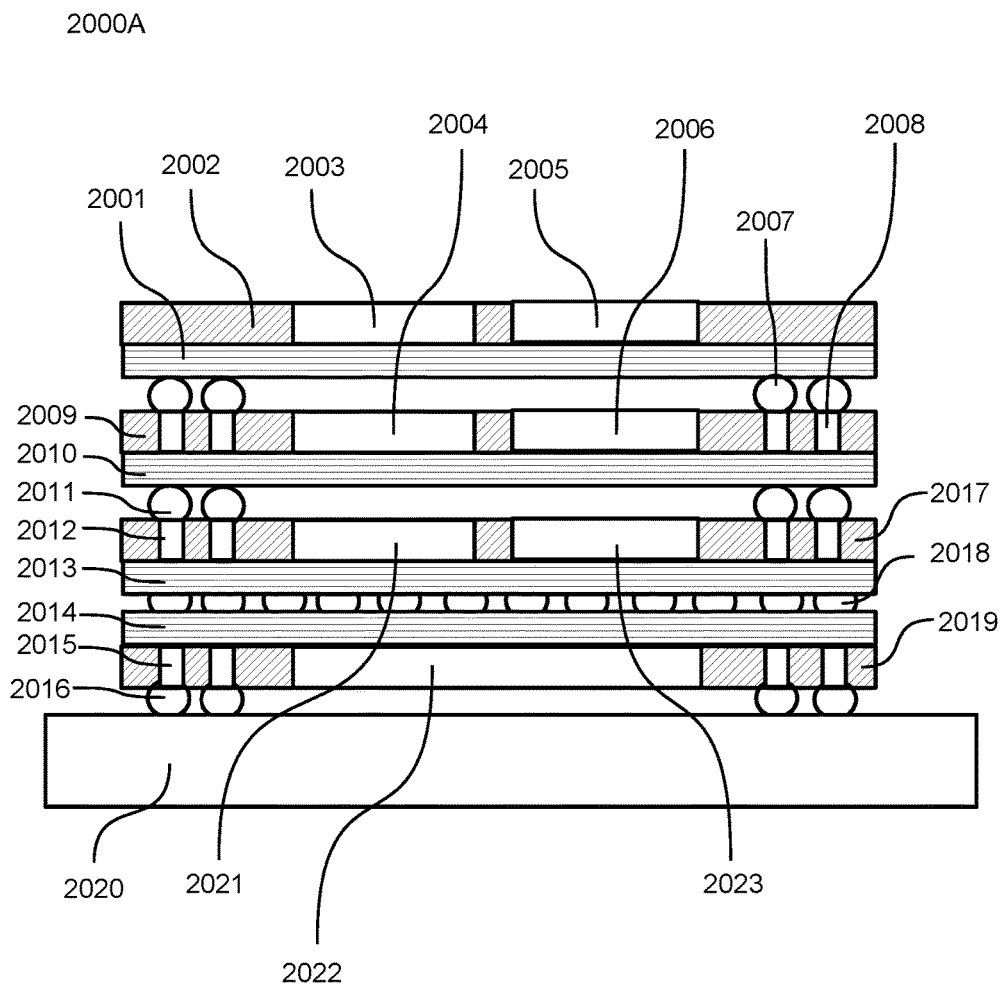
Figure 20Q:
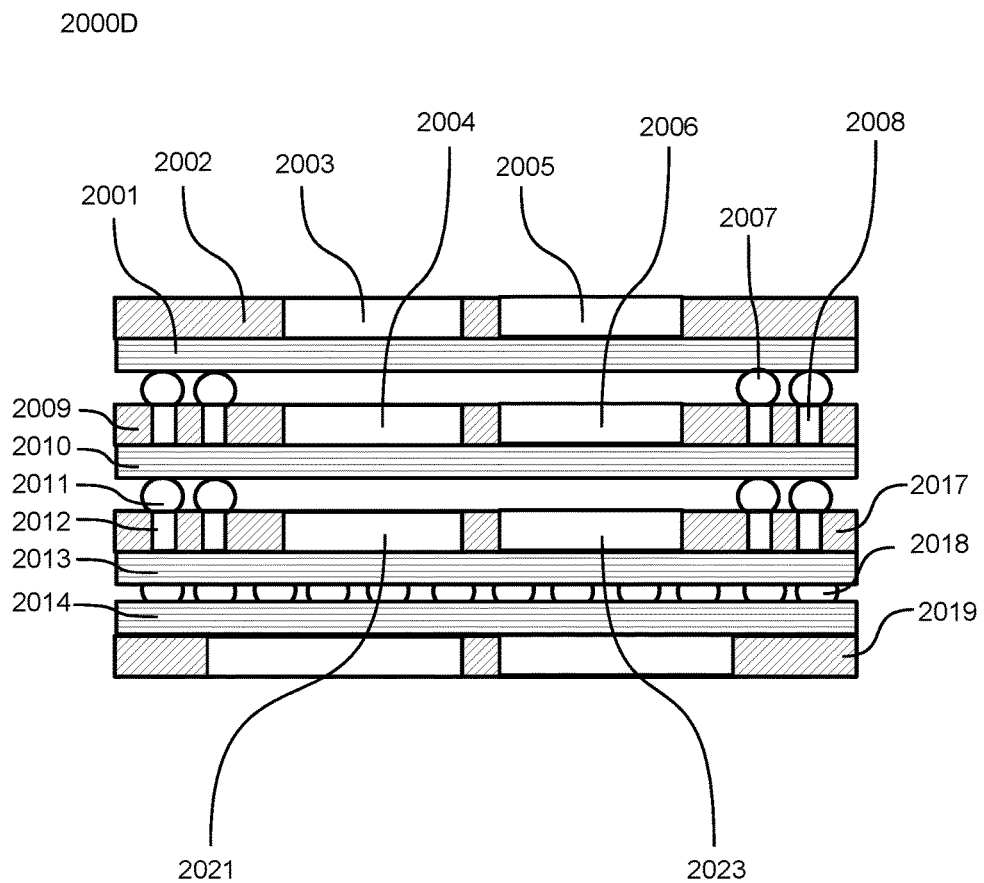
Figure 20R:
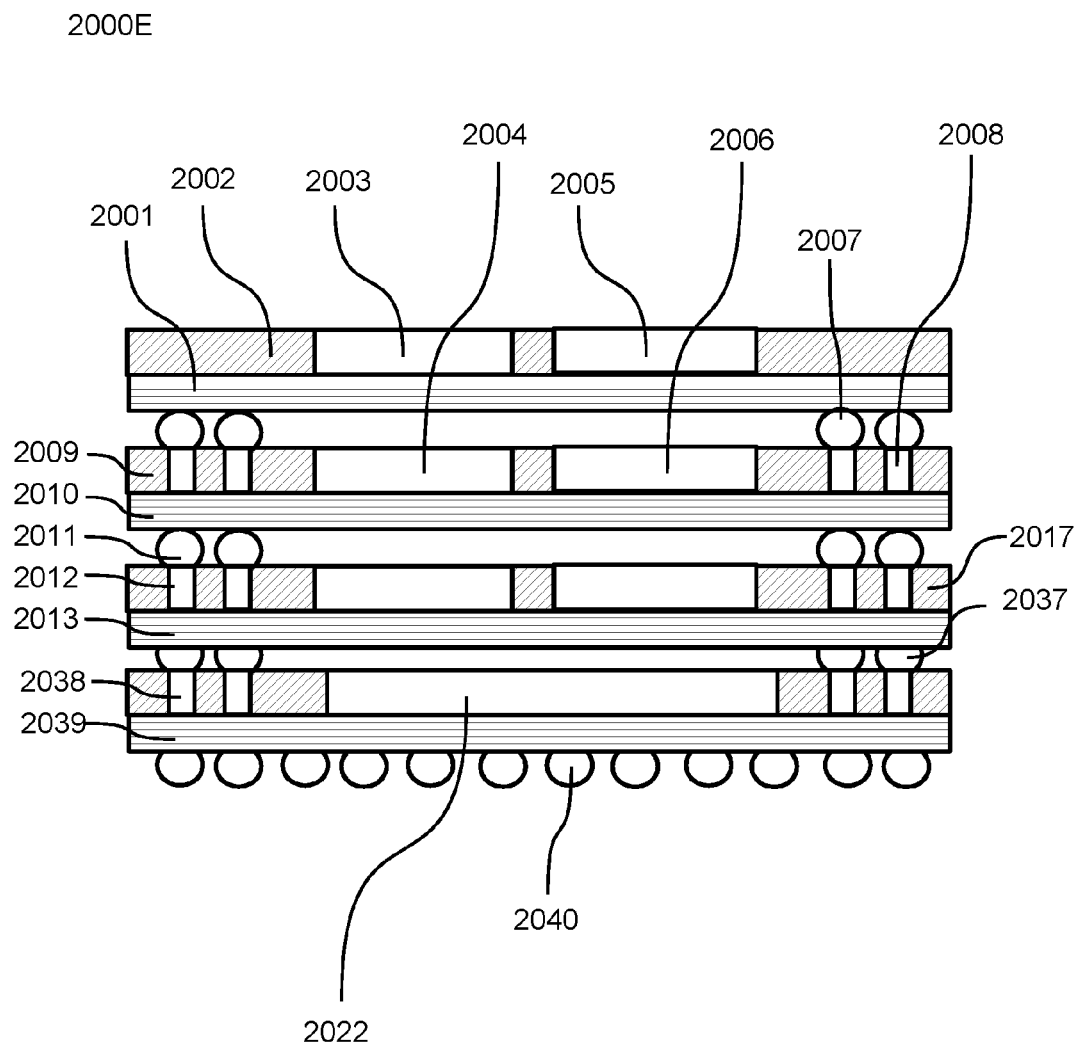
Figure 20S:
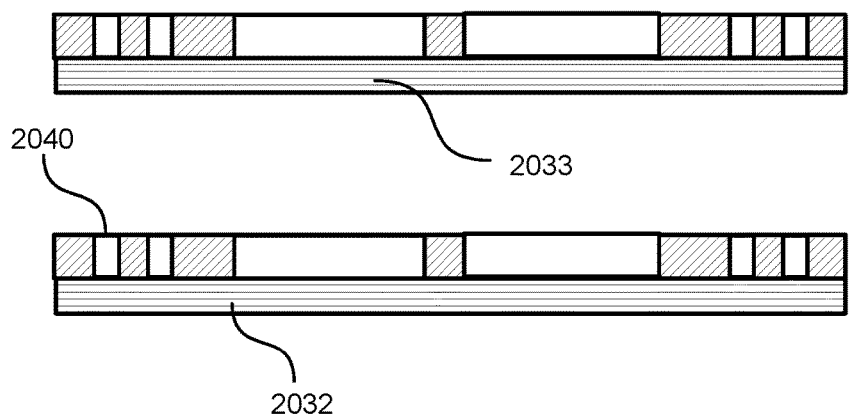
Figure 20T:
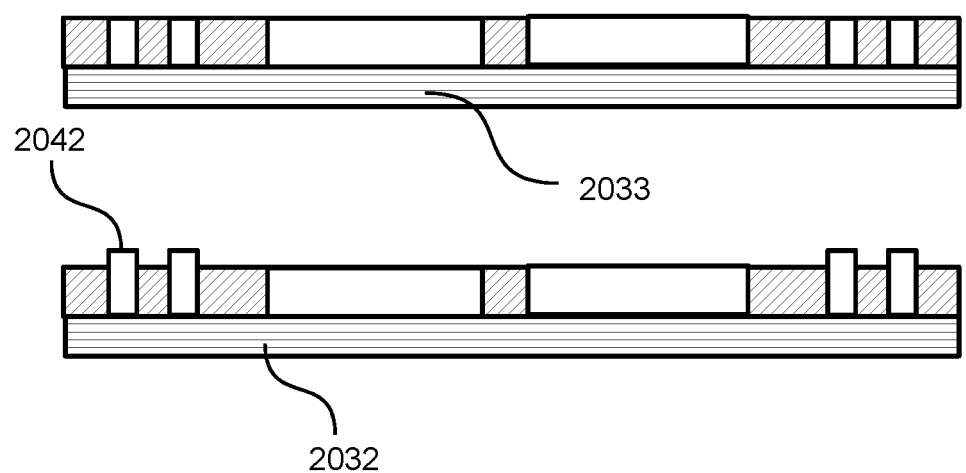
Figure 20U:
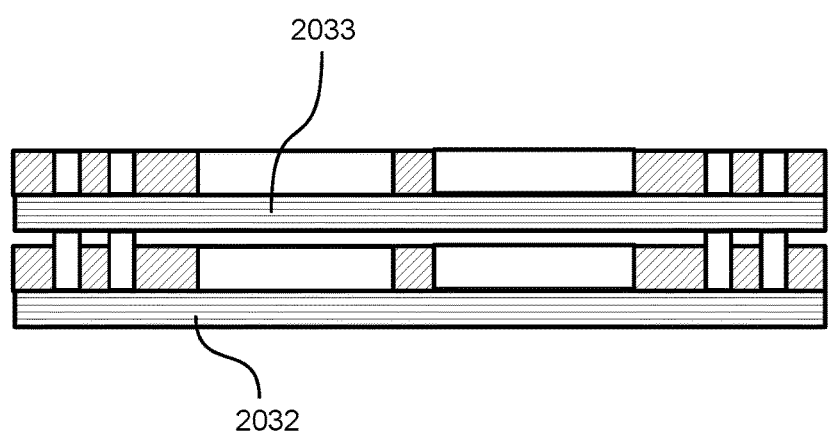

FIG. 20N shows an embodiment of a semiconductor device. FIG. 20O shows an embodiment of a semiconductor device. FIG. 20P shows an embodiment of a semiconductor device. FIG. 20Q shows an embodiment of a semiconductor device. FIG. 20R shows an embodiment of a semiconductor device. FIG. 20S shows one step of a method for manufacturing a memory module. FIG. 20T shows one step of a method for manufacturing a memory module. FIG. 20U shows one step of a method for manufacturing a memory module.

In one embodiment, a method for manufacturing a memory module 2000C is disclosed. First, a first carrier 2023 is provided. Then, a second carrier 2024 is provided. Then, a plurality of first memory dies 2025 2026 are placed on the first carrier 2023. Then, a plurality of second memory dies 2027 2028 are placed on the second carrier 2024. Then, a plurality of first vias 2028 are formed on the first carrier 2023. Then, a plurality of second vias 2029 are formed on the second carrier 2024.

Then, a first supporting material 2030 is placed on the first carrier 2023. The first supporting material 2023 is disposed among the first memory dies 2025 and 2026. Then, a second supporting material 2031 is placed on the second carrier 2024. The second supporting material 2031 is disposed among the second memory dies 2027 and 2028. Then, a first redistribution structure 2032 is formed on the first memory dies 2025 and 2026. The first redistribution structure 2032 is electrically connected to the first memory dies 2025 and 2026. The first redistribution structure 2032 is electrically connected to the first vias 2028.

Then, a second redistribution structure 2033 is formed on the second memory dies 2027 and 2028. The second redistribution structure 2033 is electrically connected to the second memory dies 2027 and 2028 and the second redistribution structure 2033 is electrically connected to the second vias 2029. Then, the first carrier 2023 is removed to expose first connection ends 2040 of the first vias 2028. Then, the second carrier 2024 is removed to expose the second connection ends 2041 of the second vias 2029. Then, the first connection ends 2040 are connected to the second connection ends 2041.

In one example, the first supporting material 2030 is a molding material. In one example, the second supporting material 2031 is a molding material. In one example, protrusions 2035 are formed on the first connection ends 2040 of the first vias 2028. In one example, protrusions 2036 are formed on the second connection ends 2041 of the second vias 2029. In one example, the protrusions 2035 are metal having surfaces that are substantially (1, 1, 1) oriented. In one example, the protrusions 2036 are metal having surfaces that are substantially (1, 1, 1) oriented.

In one example, a non conductive film 2042 is disposed on the second supporting material 2031. In one example, a pressure is applied on the first connection ends 2040 and the second connection ends 2041. In one example, the pressure for connecting the the first connection ends 2040 and the second connection ends 2041 is between 0.01 torr and 0.001 torr. In one example, the temperature of connecting the first connection ends 2040 and the second connection ends 2041 is between 150 and 250 degree Celsius.

In one embodiment, a method for manufacturing a memory module is disclosed. First, a first carrier 2023 is provided. Then, a second carrier 2024 is provided. Then, a plurality of first memory dies 2025 and 2026 are placed on the first carrier 2023. Then, a plurality of second memory dies 2027 and 2028 are placed on the second carrier 2024. Then, a plurality of first vias 2028 are formed on the first carrier 2023. Then, a first supporting material 2030 is placed on the first carrier 2023. The first supporting material 2023 is disposed among the first memory dies 2025 and 2026.

Then, a second supporting material 2031 is placed on the second carrier 2024. The second supporting material 2031 is disposed among the second memory dies 2027 and 2028. Then, a first redistribution structure 2032 is formed on the first memory dies 2025 and 2026. The first redistribution structure 2032 is electrically connected to the first memory dies 2025 and 2026 and the first redistribution structure 2032 is electrically connected to the first vias 2028. Then, a second redistribution structure 2033 is formed on the second memory dies 2027 and 2028. The second redistribution structure 2033 is electrically connected to the second memory dies 2027 and 2028 and the second redistribution structure 2033 is electrically connected to the second vias 2029.

Then, the first carrier 2023 is removed to expose first connection ends 2040 of the first vias 2028. Then, the second carrier 2024 is removed. Then, the first connection ends 2040 are electrically connected to the second redistribution structure 2033. In one example, a plurality of second vias 2029 are formed on the second carrier 2024.

In one embodiment, a semiconductor device 2000A comprises a first memory die 2003, a second memory die 2005, a first redistribution structure 2001, a plurality of first connection elements 2007, a plurality of first connection elements 2007, a third memory die 2004, a fourth memory die 2006, a second redistribution structure 2010, and a plurality of second connection elements 2018. The first memory die 2003 is electrically connected to the first redistribution structure 2001. The second memory die 2005 is electrically connected to the first redistribution structure 2001. The first connection elements 2007 is connected to the first redistribution structure 2001.

The third memory die 2004 is electrically connected to the second redistribution structure 2010. The fourth memory die 2006 is electrically connected to the second redistribution structure 2010. The plurality of second connection elements 2018 are electrically connected to the second redistribution structure 2010. A subset of the connection elements 2018 are placed beneath the third memory die 2004.

In one example, the semiconductor device 2000A further comprises a processor 2022 and a third redistribution structure 2014. The processor 2022 is electrically connected to the third redistribution structure 2014. The third redistribution structure 2014 is electrically connected to the second redistribution structure 2010 through the plurality of second connection elements 2018. In one example, the semiconductor device 2000A further comprises a plurality of conductive vias 2008. The plurality of conductive vias 2008 are electrically connected to the first connection elements 2007 and the second redistribution structure 2010.

In one example, the semiconductor device 2000A comprises a plurality of third connection elements 2016 and a plurality of conductive vias 2015. The plurality of conductive vias 2015 are electrically connected to the the third redistribution structure 2014 and the plurality of third connection elements 2016. In one example, the semiconductor device 2000A comprises a first molding material 2002. The first molding material 2002 is filled between the first memory die 2003 and the second memory die 2005.

In one example, the semiconductor device 2000A further comprises a second molding material 2009. The second molding material 2009 is filled between the third memory die 2004 and the fourth memory die 2006. In one example, the memory die 2003 is a DRAM die and the memory die 2005 is a flash memory die. In one example, the memory die 2004 is a DRAM die and the memory die 2006 is a flash memory die.

In one embodiment, a semiconductor device 2000A comprises a first memory die 2003, a second memory die 2005, a first redistribution structure 2001, a plurality of first connection elements 2007, a third memory die 2004, a fourth memory die 2006, a second redistribution structure 2010, and a plurality of second connection elements 2018. The first memory die 2003 is electrically connected the first redistribution structure 2001. The second memory die 2005 is electrically connected to the first redistribution structure 2001. The first connection elements 2007 is connected to the first redistribution structure 2001.

The third memory die 2004 is electrically connected to the second redistribution structure 2010. The fourth memory die 2006 is electrically connected to the second redistribution structure 2010. The plurality of second connection elements 2018 are electrically connected to the second redistribution structure 2010. A majority of electrical connections between the first memory die 2003 and the first redistribution structure 2001 are not through solder bumps.

In one embodiment, a semiconductor device 2000A comprises a first memory die 2003, a second memory die 2005, a first redistribution structure 2001, a plurality of first connection elements 2007, a third memory die 2004, a fourth memory die 2006, a second redistribution structure 2010, and a plurality of second connection elements 2018. The first memory die 2003 is electrically connected the first redistribution structure 2001. The second memory die 2005 is electrically connected to the first redistribution structure 2001. The first connection elements 2007 are connected to the first redistribution structure 2001.

The third memory die 2004 is electrically connected to the second redistribution structure 2010. The fourth memory die 2006 is electrically connected to the second redistribution structure 2010. The plurality of second connection elements 2018 are electrically connected to the second redistribution structure 2010. A majority of electrical connections between the third memory die 2004 and the second redistribution structure 2010 are not through solder bumps.

In one embodiment, a semiconductor device 2000E comprises a first memory die 2003, a second memory die 2005, a first redistribution structure 2001, a plurality of first connection elements 2007, a third memory die 2004, a fourth memory die 2006, a second redistribution structure 2010, and a plurality of second connection elements 2011. The first memory die 2003 is electrically connected to the first redistribution structure 2001. The second memory die 2005 is electrically connected to the first redistribution structure 2001. The first connection elements 2007 are connected to the first redistribution structure 2001.

The third memory die 2004 is electrically connected to the second redistribution structure 2010. The fourth memory die 2006 is electrically connected to the second redistribution structure 2010. The plurality of second connection elements 2011 are electrically connected to the second redistribution structure 2010. No connection elements 2011 are placed beneath the third memory die 2004.

In one example, the semiconductor device 2000E comprises a processor 2022 and a third redistribution structure 2039. The processor 2022 is electrically connected to the third redistribution structure 2038. The third redistribution structure 2039 is electrically connected to the second redistribution structure 2010 through the plurality of second connection elements 2038.

Figure 21A:
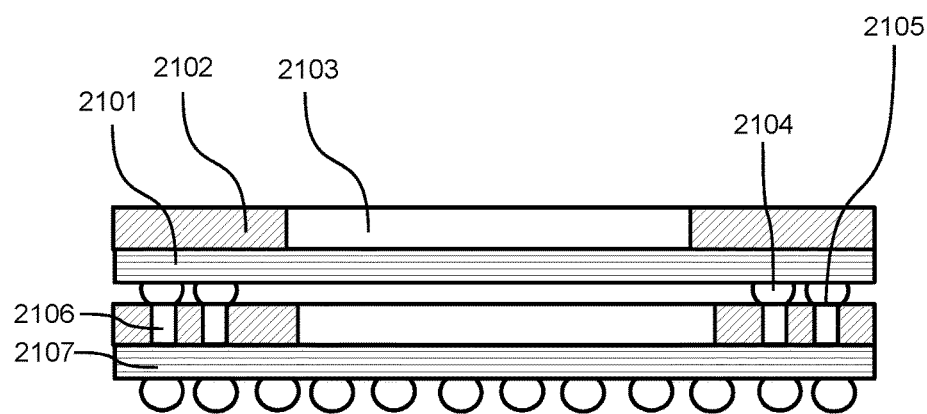
Figure 21B:
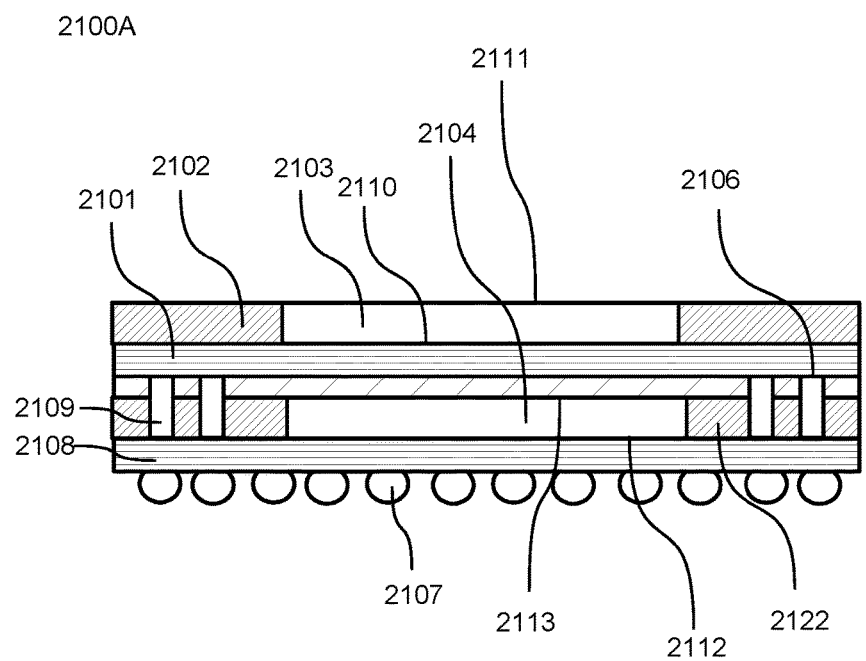
Figure 21C:
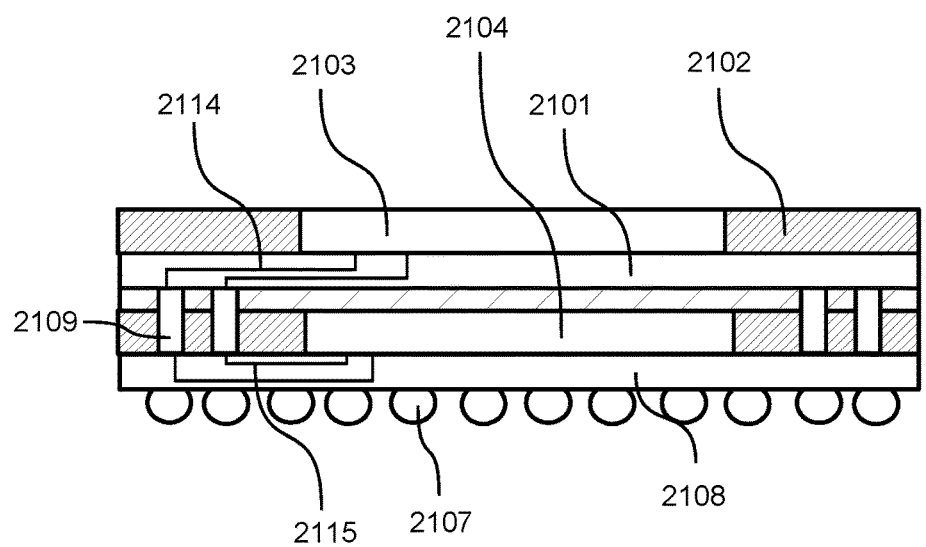
Figure 21D:
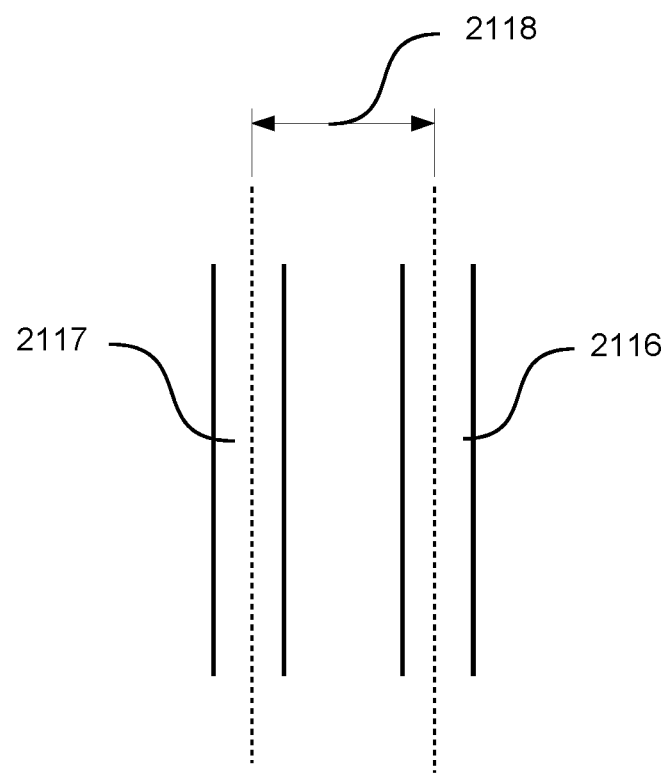
Figure 21E:
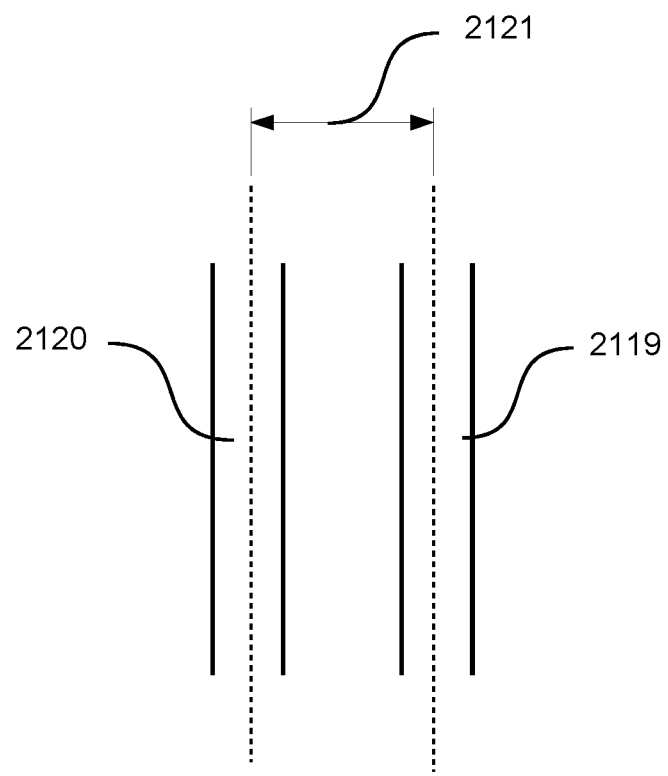

FIG. 21A shows an embodiment of a semiconductor device. FIG. 21B shows an embodiment of a semiconductor device. FIG. 21C shows an embodiment of a semiconductor device. FIG. 21D shows an example of two adjacent conductive traces. FIG. 21E shows an example of two adjacent conductive traces.

In one embodiment, a semiconductor device 2100A comprises a memory die 2103, a first redistribution structure 2101, a processor die 2104, a second redistribution structure 2108, and a plurality of first metal vias 2109.

The memory die 2103 has a first active side 2110 and a first back side 2111. The first redistribution structure 2101 is electrically connected to the first active side 2110 of the memory die 2103. The first redistribution structure 2101 comprises a plurality of first metal traces. A smallest pitch 2118 between any two adjacent first metal traces 2116 2117 is less than 10 micrometer.

The processor die 2104 has a second active side 2112 and a second back side 2113. The redistribution structure 2108 is electrically connected to the second active side 2112 of the processor die 2104. The second redistribution structure 2108 comprises a plurality of second metal traces. A smallest pitch 2121 between any two adjacent second metal traces 2119 2120 is less than 10 micrometer. The plurality of first metal vias 2109 are electrically connected to the first redistribution structure 2101. The plurality of first metal vias 2109 are electrically connected to the second redistribution structure 2108.

In one embodiment, the semiconductor device 2100A comprises a memory die 2103, a first redistribution structure 2101, a processor die 2104, a second redistribution structure 2108, and a plurality of first metal vias 2109. The memory die 2103 has a first active side 2110 and a first back side 2111. The first redistribution structure 2101 is electrically connected to the first active side 2110 of the memory die 2103. The first redistribution structure 2101 comprises a plurality of first metal traces. No soldering material is placed between the first redistribution structure 2101 and the first active side 2110 of the memory die 2103.

The processor die 2104 has a second active side 2112 and a second back side 2113. The redistribution structure 2108 is electrically connected to the second active side 2112 of the processor die 2104. The second redistribution structure 2108 comprises a plurality of second metal traces 2115. No soldering material is placed between the second redistribution structure 2108 and the second active side 2112 of the processor die 2104. The plurality of first metal vias 2109 are electrically connected to the first redistribution structure 2101. The plurality of first metal vias 2109 are electrically connected to the second redistribution structure 2108.

In one embodiment, the semiconductor device 2100A comprises a memory die 2103, a first redistribution structure 2101, a first molding material 2102, a processor die 2104, a second redistribution structure 2108, a second molding material 2122, a plurality of first metal vias 2109. The memory die 2103 has a first active side 2110 and a first back side 2111. The first redistribution structure 2101 is electrically connected to the first active side 2110 of the memory die 2103. The first redistribution structure 2101 comprises a plurality of first metal traces.

The first molding material 2102 is placed on the first distribution structure 2101. The first molding material 2102 laterally surrounds the memory die 2103. The processor die 2104 has a second active side 2112 and a second back side 2113. The redistribution structure 2108 is electrically connected to the second active side 2112 of the processor die 2104. The second redistribution structure 2108 comprises a plurality of second metal traces. The second molding material 2122 is placed on the second distribution structure 2108. The second molding material 2122 laterally surrounds the processor die 2104.

The plurality of first metal vias 2109 are electrically connected to the first redistribution structure 2101. The plurality of first metal vias 2109 are electrically connected to the second redistribution structure 2108.

FIG. 22A shows an example of direct metal bonding. FIG. 22B shows an example of direct metal bonding. FIG. 22C shows an example of direct metal bonding. FIG. 22D shows an example of direct metal bonding. FIG. 22E shows an example of direct metal bonding. FIG. 22F shows an example of direct metal bonding.

In one embodiment, a semiconductor device 2200B comprises a first die 2201, a first copper pillar 2203, a second die 2207, and a second copper pillar 2204. The first die 2201 has a first active side 2214. The first die 2201 comprises a first conduction pad 2212 on the first active side 2214. The first copper pillar 2203 is located on the first conductive pad 2212. The first copper pillar 2203 has a first surface 2210. The second die 2207 has a second active side 2215. The second die 2207 comprises a second conduction pad 2205 on the second active side 2215.

The second copper pillar 2204 is located on the second conductive pad 2205. The second copper pillar 2204 has a second surface 2209. The first copper pillar 2203 and the second copper pillar 2204 are connected via a bonding interface 2213. The bonding interface 2213 is a junction of the first surface 2210 and the second surface 2209.

In one example, no solder material is placed on the bonding surface 2113. In one example, the first surface 2210 is substantially (1, 1, 1) oriented. In one example, the second surface 2209 is substantially (1, 1, 1) oriented. In one example, the first copper pillar 2203 comprises a deposited plating seed layer 2211. In one example, the first copper pillar 2204 comprises a deposited plating seed layer 2208.

In one example, the first copper pillar 2204 further comprises a deposited plating seed layer 2208. In one example, the first die 2201 is a memory die. In one example, the second die 2207 is a processor die. In one example, the first conductive pad 2212 is an aluminium pad.

In one example, the the second copper pillar 2204 is an aluminium pad. In one example, the first conductive pad 2212 is a copper pad. In one example, the the second copper pillar 2204 is a copper pad.

In one embodiment, a semiconductor device 2200D comprises a redistribution structure 2239, a first copper pillar 2232, a die 2237, and a second copper pillar 2234. The redistribution structure 2239 comprises a plurality of metal traces 2231. The redistribution structure 2239 comprises a first polymer layer 2219 and a second polymer layer 2230. The redistribution structure 2239 comprises a metal base structure 2218. The first copper pillar 2232 is located on the metal base structure 2218. The first copper pillar 2232 having a first surface 2233.

The die 2237 has an active side 2238. The die 2237 comprises a conductive pad 2235. The second copper pillar 2234 is located on the conductive pad 2235. The second copper pillar 2204 has a second surface 2217. The first copper pillar 2232 and the second copper pillar 2234 are connected via a bonding interface 2237. The bonding interface 2237 is a junction of the first surface 2233 and the second surface 2217.

In one example, the first polymer layer 2219 is a polyimide layer. In one example, the second polymer layer 2230 is a polyimide layer. In one example, the metal base structure 2218 is a copper base structure. In one example, the conductive pad 2235 is an aluminium pad.

In one example, no solder material is placed on the bonding surface 2237. In one example, the first surface 2233 is substantially (1, 1, 1) oriented. In one example, the second surface 2217 is substantially (1, 1, 1) oriented.

FIG. 23A shows an embodiment of a semiconductor device. FIG. 23B shows an example of a via. FIG. 23C shows an example of a via. FIG. 23D shows an example of a via. FIG. 23E shows an example of a via. FIG. 23F shows an example of a via. FIG. 23G shows a comparison among a plurality of vias. FIG. 23H shows an embodiment of a semiconductor device. FIG. 23I shows an embodiment of a semiconductor device. FIG. 23J shows an embodiment of a semiconductor device. FIG. 23K shows an embodiment of a semiconductor device. FIG. 23L shows an embodiment of a semiconductor device. FIG. 23M shows an embodiment of a semiconductor device. FIG. 23N shows an embodiment of a semiconductor device. FIG. 23O shows an embodiment of a semiconductor device.

In one embodiment, a semiconductor device 2300A comprises a die 2302, a redistribution structure 2301, and a plurality of metal posts 2318. The die 2302 has an active surface 2315. The die 2302 comprises a plurality of metal pads 2316 on the active surface 2315. The redistribution structure 2301 comprises a first sub layer 2303 and a second sublayer 2304. The first sublayer 2303 comprises a plurality of first vias 2308. The first vias 2308 are cup-shaped. The second sublayer 2304 comprises a plurality of second vias 2309. The second vias are cup-shaped.

The first vias 2308 is in contact with the metal posts 2318. The metal pads 2316 are in contact with the metal posts 2318. A first average area of the first vias 2308 are smaller than a second average area of the second vias 2309.

The first via 2308 has a first rim 2320. An area of the first via 2308 is the area encircled by the first rim 2320. The second via 2309 has a second rim 2321. An area of the second via 2309 is the area encircled by the second rim 2321. The third via 2310 has a third rim 2322. An area of the third via 2310 is the area encircled by the third rim 2322. The fourth via 2311 has a fourth rim 2325. An area of the fourth via 2311 is the area encircled by the fourth rim 2325.

In one example, a height of the metal posts 2328 is between 1 micrometer and 10 micrometer. In one example, a molding material 2317 is filled between the the first sublayer 2303 and the active surface 2315 of the die 2302. In one example, the first sublayer 2303 comprises polyimide. In one example, the first sublayer 2303 comprises polybenzoxazole (PBO).

In one example, the second sublayer 2304 comprises polyimide. In one example, the second sublayer 2304 comprises polybenzoxazole (PBO). In one example, the redistribution structure 2301 further comprises a third sublayer 2305 and the third sublayer 2305 comprises third vias 2310. In one example, the redistribution structure 2301 comprises a fourth sublayer 2306 and the fourth sublayer 2306 comprises fourth vias 2311.

In one example, the redistribution structure 2301 further comprises a fifth sublayer 2307 and the fifth sublayer 2307 comprises fifth vias 2319. In one example, the second average area of the second vias 2309 is smaller than a third average area of the third vias 2310. In one example, the third average area of the third vias 2310 is smaller than a fourth average area of the fourth vias 2311. In one example, the fourth average area of the fourth vias 2311 is smaller than a fifth average area of the fifth vias 2319.

In one example, the third sublayer 2305 comprises polyimide. In one example, the third sublayer 2305 comprises polybenzoxazole (PBO).

In one embodiment, a semiconductor device 2300H comprises a first die 2312, a second die 2313, a redistribution structure 2337, and a plurality of metal posts 2339. The first die 2312 comprises a processor unit 2338. The second die 2313 is a memory die. The redistribution structure 2337 comprises a first sublayer 2333 and a second sub layer 2334. The first sublayer 2333 comprises a plurality of first vias 2329. The first vias 2329 are cup-shaped. The second sublayer 2334 comprises a plurality of second vias 2330. The second vias 2330 are cup-shaped.

A first subset of the metal posts 2339 is physically connected to the first die 2312. A second subset of the metal posts 2339 is physically connected to the second die 2313. The metal posts 2339 are physically connected to the redistribution structure 2337. A first average area of the first vias 2329 is smaller than a second average area of the second vias 2330. The first die 2312 is electrically connected to the second die 2313 through the redistribution structure 2337.

In one example, a height of the metal posts 2339 is between 1 micrometer and 10 micrometer. In one example, a molding material 2335 is filled between the the first sublayer 2333 and an active surface of the first die 2312. In one example, a molding material 2335 is filled between the the first sublayer 2333 and an active surface of the second die 2313. In one example, the first sublayer 2333 comprises polyimide.

In one example, the first sublayer 2333 comprises polybenzoxazole (PBO). In one example, the second sublayer 2334 comprises polyimide. In one example, the second sublayer 2334 comprises polybenzoxazole (PBO). In one example, the redistribution structure 2337 comprises a third sublayer 2350 and the third sublayer 2350 comprises third vias 2352.

In one example, the redistribution structure 2337 comprises a fourth sublayer 2351 and the fourth sublayer 2351 comprises fourth vias 2353. In one example, the second average area of the second vias 2330 is smaller than a third average area of the third vias 2352. In one example, the third average area of the third vias 2352 is smaller than a fourth average area of the fourth vias 2353. In one example, the third sublayer 2350 comprises polyimide. In one example, the third sublayer 2350 comprises polybenzoxazole (PBO).

In one embodiment, a semiconductor device 2300H comprises a first die 2312, a second die 2313, a redistribution structure 2337, and a plurality of metal posts 2339. The first die 2312 comprises a processor unit 2338. The second die 2313 is a memory die. The redistribution structure 2337 comprises a first sublayer 2333 and a second sub layer 2334. The first sublayer 2333 comprises a plurality of first vias 2329. The first vias 2329 are cup-shaped. The second sublayer 2334 comprises a plurality of second vias 2330. The second vias 2330 are cup-shaped.

A first subset of the metal posts 2339 is physically connected to the first die 2312. A second subset of the metal posts 2339 is physically connected to the second die 2313. The metal posts 2339 are physically connected to the redistribution structure 2337. A first minimum pitch 2340 of the first vias 2329 is smaller than a second minimum pitch 2341 of the second vias 2330. The first die 2312 is electrically connected to the second die 2313 through the redistribution structure 2337.

In one example, a height of the metal posts 2339 is between 1 micrometer and 10 micrometer. In one example, a molding material 2335 is filled between the the first sublayer 2333 and an active surface of the first die 2312. In one example, a molding material 2335 is filled between the the first sublayer 2333 and an active surface of the second die 2313. In one example, the first sublayer 2333 comprises polyimide.

In one example, the first sublayer 2333 comprises polybenzoxazole (PBO). In one example, the second sublayer 2334 comprises polyimide. In one example, the second sublayer 2334 comprises polybenzoxazole (PBO). In one example, the redistribution structure 2337 comprises a third sublayer 2350 and the third sublayer 2350 comprises third vias 2352.

In one example, the redistribution structure 2337 further comprises a fourth sublayer 2351 and the fourth sublayer 2351 comprises fourth vias 2353. In one example, the second average pitch 2341 of the second vias 2330 is smaller than a third average pitch 2342 of the third vias 2352. In one example, the third average pitch 2342 of the third vias 2352 is smaller than a fourth average pitch 2343 of the fourth vias 2353. In one example, the third sublayer 2350 comprises polyimide. In one example, the third sublayer 2350 comprises polybenzoxazole (PBO).

FIG. 24A shows a exemplary via 2400A. FIG. 24B shows an embodiment of two dies placed on a redistribution structure. FIG. 24C shows an embodiment of a semiconductor device.

The via 2400A has a rim 2401. The via 2400A comprises an inner portion 2403 and an outer portion 2405. The inner portion 2403 has an inner width 2407. The inner width 2407 is the largest width of the inner portion 2403. The outer portion 2405 has an outer width 2409. A width ratio is defined as a ratio between the outer width 2409 and the inner width 2407. The width ratio is the result of the outer width 2409 divided by the inner width 2407. In other words, the outer width 2409 is a numerator and the inner width 2407 is a denominator. The outer portion 2405 can have different widths in different locations. In this case, a smallest outer width 2409 is used for the calculation of the width ratio.

In one embodiment, a semiconductor device 2400B comprises a first die 2410, a second die 2411, a redistribution structure 2420, and a plurality of metal posts 2429. The first die 2410 comprises a processor unit 2418. The second die 2411 is a memory die. The redistribution structure 2420 comprises a first sublayer and a second sub layer. The first sublayer 2421 comprises a plurality of first vias 2425. The first vias 2425 are cup-shaped. The second sublayer 2422 comprises a plurality of second vias 2426. The second vias 2426 are cup-shaped.

A first subset of the metal posts 2429 is physically connected to the first die 2410. A second subset of the metal posts 2429 is physically connected to the second die 2411. The metal posts 2429 are physically connected to the redistribution structure 2420. A first width ratio of the first vias 2425 is greater than a second width ratio of the second vias 2426. The first die 2410 is electrically connected to the second die 2411 through the redistribution structure 2420.

In one example, a height of the metal posts 2429 is between 1 micrometer and 10 micrometer. In one example, a molding material 2412 is filled between the the first sublayer and an active surface of the first die 2410. In one example, a molding material 2412 is filled between the the first sublayer 2412 and an active surface of the second die 2411. In one example, the first sublayer 2412 comprises polyimide.

In one example, the first sublayer 2412 comprises polybenzoxazole (PBO). In one example, the second sublayer 2422 comprises polyimide. In one example, the second sublayer 2422 comprises polybenzoxazole (PBO). In one example, the redistribution structure 2420 comprises a third sublayer 2423 and the third sublayer 2423 comprises third vias 2427.

In one example, the redistribution structure 2420 further comprises a fourth sublayer 2424 and the fourth sublayer 2420 comprises fourth vias 2428. In one example, the second width ratio of the second vias 2426 is greater than a third width ratio of the third vias 2427. In one example, the third width ratio of the third vias 2427 is smaller than a fourth width ratio of the fourth vias 2428. In one example, the third sublayer 2423 comprises polyimide. In one example, the third sublayer 2423 comprises polybenzoxazole (PBO).

What is claimed is:

1. A semiconductor package, comprising:
   a first die, the first die having an active side and a back side;
   a first adhesive layer, the first adhesive layer being located on the back side of the first die;
   a first redistribution structure, the first redistribution structure comprising at least two insulating layers;
   a first set of metal pillars, the first set of metal pillars being connected between the active side of the first die and the first redistribution structure, wherein no solder material is located between the first die and the first redistribution structure;
   a second die, the second die having an active side and a back side;
   a second adhesive layer, the second adhesive layer being located on the back side of the second die, the second adhesive layer being in direct contact with the first redistribution structure;
   a second redistribution structure, the second redistribution structure comprising at least two insulating layers;
   a second set of metal pillars, the second set of metal pillars being connected between the active side of the second die and the second redistribution structure, wherein no solder material is located between the second die and the second redistribution structure;
   a set of conductive posts, the set of conductive posts being located beside the second die, the set of conductive posts being not located beside the first die, the set of conductive posts being connected between the first redistribution structure and the second redistribution structure;
   a first molding material, wherein the first molding material is beside the first die and the first molding material does not cover the first adhesive layer, no conductive posts are located in the first molding material; and
   a second molding material, the second molding material being beside the second die;
   wherein there is no solder bump placed between the first redistribution structure and the second redistribution structure.

2. The semiconductor package of claim 1, wherein the second redistribution structure further comprises a via, the via is cup-shaped, and a bottom side of the via is in direct contact with at least one of the set of conductive posts.

3. The semiconductor package of claim 1, wherein the first redistribution structure further comprises a via, the via is cup-shaped, and a front side of the via is in direct contact with at least one of the set of conductive posts.

4. The semiconductor package of claim 1, wherein the insulating layers of the first redistribution structure comprise polyimide, and the insulating layers of the second redistribution structures comprise polyimide.

5. The semiconductor package of claim 1, wherein the first set of metal pillars comprise copper, the second set of metal pillars comprise copper, and the conductive posts comprise copper.

6. A semiconductor package, comprising:
   a first die, the first die having an active side and a back side;

a first adhesive layer, the first adhesive layer being located on the back side of the first die;
a first redistribution structure, the first redistribution structure comprising at least two insulating layers;
a first set of metal pillars, the first set of metal pillars being connected between the active side of the first die and the first redistribution structure, wherein no solder material is located between the first die and the first redistribution structure;
a second die, the second die having an active side and a back side;
a second adhesive layer, the second adhesive layer being located on the back side of the second die, wherein the second adhesive layer is not in direct contact with the first redistribution structure;
a second redistribution structure, the second redistribution structure comprising at least two insulating layers;
a second set of metal pillars, the second set of metal pillars being connected between the active side of the second die and the second redistribution structure, wherein no solder material is located between the second die and the second redistribution structure;
a set of conductive posts, the set of conductive posts being located beside the second die, the set of conductive posts being connected between the first redistribution structure and the second redistribution structure;
a first molding material, wherein the first molding material is beside the first die, the first molding material does not cover the first adhesive layer, and no conductive posts are located in the first molding material; and
a second molding material, the second molding material being beside the second die;
wherein there is no solder bump placed between the first redistribution structure and the second redistribution structure.

7. The semiconductor package of claim 6, wherein the second molding material covers the second adhesive layer.

8. The semiconductor package of claim 6, wherein the second redistribution structure further comprises a via, the via is cup-shaped, and a bottom side of the via is in direct contact with at least one of the set of conductive posts.

9. The semiconductor package of claim 6, wherein the first redistribution structure further comprises a via, the via is cup-shaped, and a front side of the via is in direct contact with at least one of the set of conductive posts.

10. The semiconductor package of claim 6, wherein the insulating layers of the first redistribution structure comprise polyimide, and the insulating layers of the second redistribution structures comprise polyimide.

11. The semiconductor package of claim 6, wherein the first set of metal pillars comprise copper, the second set of metal pillars comprise copper, and the conductive posts comprise copper.

12. A semiconductor package, comprising:
a first die, the first die having an active side and a back side;
a first adhesive layer, the first adhesive layer being located on the back side of the first die;
a second die, the second die having an active side and a back side;
a second adhesive layer, the second adhesive layer being located on the back side of the second die;
a first set of metal pillars;
a second set of metal pillars;
a first redistribution structure, the first redistribution structure comprising at least two insulating layers, the first die being connected to the first redistribution structure through the first set of metal pillars, the second die being connected to the first redistribution structure through the second set of metal pillars;
a third die, the third die having an active side and a back side;
a third adhesive layer, the third adhesive layer being located on the back side of the third die;
a third set of metal pillars;
a second redistribution structure, the second redistribution structure comprising at least two insulating layers, the third die being connected to the second redistribution structure through the third set of metal pillars;
a set of conductive posts, the set of conductive posts being located beside the third die, the set of conductive posts being connected between the first redistribution structure and the second redistribution structure;
a first molding material, the first molding material filling a space between the first die and the second die; and
a second molding material, the second molding material being beside the third die.

13. The semiconductor package of claim 12, wherein the second molding material covers the third adhesive layer.

14. The semiconductor package of claim 12, wherein the second redistribution structure further comprises a via, the via is cup-shaped, and a bottom side of the via is in direct contact with at least one of the set of conductive posts.

15. The semiconductor package of claim 12, wherein the first redistribution structure further comprises a via, the via is cup-shaped, and a front side of the via is in direct contact with at least one of the set of conductive posts.

16. The semiconductor package of claim 12, wherein the insulating layers of the first redistribution structure comprise polyimide, and the insulating layers of the second redistribution structures comprise polyimide.

17. The semiconductor package of claim 12, wherein the first set of metal pillars comprise copper, the second set of metal pillars comprise copper, the third set of metal pillars comprise copper, and the conductive posts comprise copper.

18. A semiconductor package, comprising:
a processor die, the processor die having an active side and a back side;
a first redistribution structure, the first redistribution structure comprising at least two insulating layers;
a set of metal pillars, the set of metal pillars being connected between the active side of the processor die and the redistribution structure, wherein no solder bump is located between the processor die and the redistribution structure;
a second redistribution structure, the second redistribution structure comprising at least two insulating layers;
a set of conductive posts, the set of conductive posts being beside the processor die, the set of conductive posts being connected between the first redistribution structure and the second redistribution structure;
a first memory module;
a second memory module;
a substrate, the first memory module being connected to the substrate through a first set of bonding wires, the second memory module being connected to the substrate through a second set of bonding wires; and
a set of solder bumps, the set of solder bumps being connected between the second redistribution structure and the substrate;
wherein there is no under bump metallization structure between the set of solder bumps and the second redistribution structure.

19. The semiconductor structure of claim 18, further comprising an adhesive layer, the adhesive layer being located on the back side of the processor die.

20. The semiconductor structure of claim 19, wherein the adhesive layer is in direct contact with the second redistribution structure.

* * * * *